US012757627B2

(12) United States Patent
Lee et al.

(10) Patent No.: US 12,757,627 B2
(45) Date of Patent: Oct. 6, 2026

(54) LIGHT-EMITTING DEVICE INCLUDING ORGANOMETALLIC COMPOUND, ELECTRONIC DEVICE INCLUDING THE LIGHT-EMITTING DEVICE, AND THE ORGANOMETALLIC COMPOUND

(71) Applicant: Samsung Display Co., Ltd., Yongin-si (KR)

(72) Inventors: Hyunjung Lee, Yongin-si (KR); Iljoon Kang, Yongin-si (KR); Soobyung Ko, Yongin-si (KR); Sungbum Kim, Yongin-si (KR); Eunsoo Ahn, Yongin-si (KR); Eunyoung Lee, Yongin-si (KR); Mina Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 819 days.

(21) Appl. No.: 18/315,356

(22) Filed: May 10, 2023

(65) Prior Publication Data

US 2024/0180022 A1 May 30, 2024

(30) Foreign Application Priority Data

Oct. 11, 2022 (KR) ........................ 10-2022-0129757

(51) Int. Cl.
*C07F 15/00* (2006.01)
*C09K 11/06* (2006.01)
*H10K 85/30* (2023.01)
*H10K 50/12* (2023.01)

(52) U.S. Cl.
CPC ....... *H10K 85/346* (2023.02); *C07F 15/0086* (2013.01); *C09K 11/06* (2013.01); *C07B 2200/05* (2013.01); *C09K 2211/1044* (2013.01); *C09K 2211/185* (2013.01); *H10K 50/12* (2023.02)

(58) Field of Classification Search
None
See application file for complete search history.

(56) References Cited

U.S. PATENT DOCUMENTS

| | | | | |
|---|---|---|---|---|
| 9,238,668 B2 | 1/2016 | Li et al. | | |
| 9,318,725 B2 | 4/2016 | Li | | |
| 9,425,415 B2 | 8/2016 | Li et al. | | |
| 9,461,254 B2 | 10/2016 | Tsai et al. | | |
| 9,698,359 B2 | 7/2017 | Li et al. | | |
| 9,899,614 B2 | 2/2018 | Li et al. | | |
| 2013/0048963 A1 | 2/2013 | Beers et al. | | |
| 2014/0364605 A1 | 12/2014 | Li et al. | | |
| 2015/0194616 A1 | 7/2015 | Li et al. | | |
| 2019/0071574 A1* | 3/2019 | Abdallh | ................... | C09D 4/00 |
| 2020/0140471 A1 | 5/2020 | Chen et al. | | |

FOREIGN PATENT DOCUMENTS

| | | | | |
|---|---|---|---|---|
| CN | 112062783 A * | 12/2020 | ............. | C08G 64/34 |
| CN | 112250708 A | 1/2021 | | |
| KR | 10-2020-0116039 A | 10/2020 | | |

OTHER PUBLICATIONS

Trouts, Tamara D., et al. "Dinuclear Metal-Organic Material for Binary Optical Recording." Advanced Functional Materials 13.5 (2003): 398-402. (Year: 2003).*

Wang, Xin, et al. "Palladium-catalyzed desymmetric intermolecular C—N coupling enabled by a chiral monophosphine ligand derived from anthracene photodimer." Organic Letters 23.14 (2021): 5485-5490. (Year: 2021).*

* cited by examiner

*Primary Examiner* — Robert S Loewe
(74) *Attorney, Agent, or Firm* — Womble Bond Dickinson (US) LLP

(57) ABSTRACT

A light-emitting device includes a first electrode, a second electrode, and an interlayer between the first electrode and the second electrode and including an emission layer that includes an organometallic compound represented by Formula 1. In addition, an electronic device including the light-emitting device, and the organometallic compound represented by Formula 1 are disclosed.

Formula 1

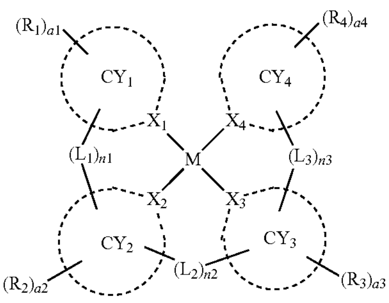

20 Claims, 8 Drawing Sheets

LIGHT-EMITTING DEVICE INCLUDING ORGANOMETALLIC COMPOUND, ELECTRONIC DEVICE INCLUDING THE LIGHT-EMITTING DEVICE, AND THE ORGANOMETALLIC COMPOUND

CROSS-REFERENCE TO RELATED APPLICATION

This application claims priority to and the benefit of Korean Patent Application No. 10-2022-0129757, filed on Oct. 11, 2022, in the Korean Intellectual Property Office, the content of which is incorporated by reference herein in its entirety.

BACKGROUND

1. Field

One or more embodiments of the present disclosure relate to a light-emitting device including an organometallic compound, an electronic device including the light-emitting device, and the organometallic compound.

2. Description of the Related Art

Among light-emitting devices, self-emissive devices have wide viewing angles, high contrast ratios, short response times, and excellent or suitable characteristics in terms of luminance, driving voltage, and response speed.

In a light-emitting device, a first electrode is located on a substrate, and a hole transport region, an emission layer, an electron transport region, and a second electrode are sequentially arranged on the first electrode. Holes may be provided from the first electrode to move toward the emission layer through the hole transport region, and electrons may be provided from the second electrode to move toward the emission layer through the electron transport region. Carriers, such as holes and electrons, recombine in the emission layer to produce excitons. These excitons transition and decay from an excited state to a ground state to thus generate light.

SUMMARY

One or more aspects of embodiments of the present disclosure are directed toward a light-emitting device including an organometallic compound, an electronic device including the light-emitting device, and the organometallic compound.

Additional aspects will be set forth in part in the description which follows and, in part, will be apparent from the description, or may be learned by practice of the presented embodiments of the disclosure.

According to one or more embodiments of the present disclosure, a light-emitting device includes:

a first electrode;

a second electrode facing the first electrode;

an interlayer between the first electrode and the second electrode and including an emission layer; and an organometallic compound represented by Formula 1:

Formula 1

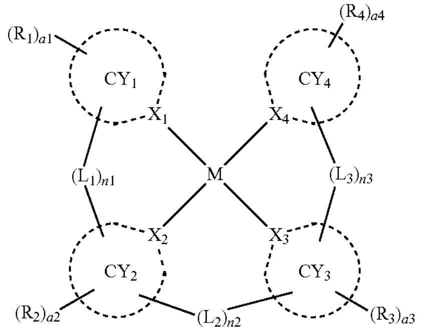

Formula 2-1

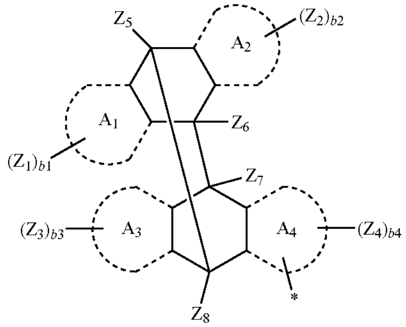

Formula 2-2

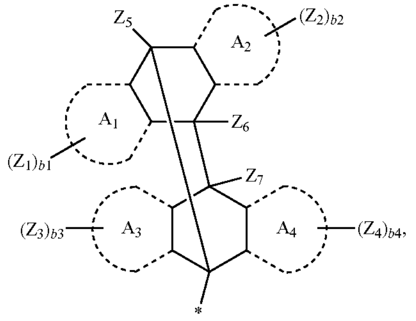

wherein, in Formula 1,

M may be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $X_1$ to $X_4$ may each independently be C or N, ring $CY_1$ to ring $CY_4$ may each independently be a $C_5$-$C_{30}$ carbocyclic group or a $C_1$-$C_{30}$ heterocyclic group, $L_1$ to $L_3$ may each independently be a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—N($R_{1a}$)—*', *—O—*', *—P($R_{1a}$)—*', *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' may each indicate a binding site to a neighboring atom, n1 to n3 may each independently be an integer from 1 to 5, $R_1$ to $R_4$, $R_{1a}$, and $R_{1b}$ may each independently be a group represented by Formula 2-1, a group represented by Formula 2-2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_1$-$C_{60}$ aryloxy group unsubstituted or substituted with at least one $R_{10a}$, a $C_1$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a1 to a4 may each independently be an integer from 1 to 10, at least one of $R_1$(s) in the number of a1, at least one of $R_2$(s) in the number of a2, at least one $R_3$(s) in the number of a3, at least one of $R_4$(s) in the number of a4, or any combination thereof may each be the group represented by Formula 2-1 or the group represented by Formula 2-2, in Formulae 2-1 and 2-2, ring $A_1$ to ring $A_4$ may each independently be a $C_5$-$C_{30}$ carbocyclic group or a $C_1$-$C_{30}$ heterocyclic group, $Z_1$ to $Z_8$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b1 to b4 may each independently be an integer from 1 to 4,

* may indicate a binding site to a neighboring atom, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_1$-$C_{60}$ aryloxy group, a $C_1$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_1$-$C_{60}$ aryloxy group, or a $C_1$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_1$-$C_{60}$ aryloxy group, a $C_1$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

According to one or more embodiments of the present disclosure, an electronic device includes the light-emitting device.

According to one or more embodiments of the present disclosure, an electronic apparatus includes the light-emitting device.

According to one or more embodiments of the present disclosure, provided is an organometallic compound represented by Formula 1.

BRIEF DESCRIPTION OF THE DRAWINGS

The accompanying drawings are included to provide a further understanding of the present disclosure and are incorporated in and constitute a part of the present disclosure. The drawings illustrate embodiments of the present disclosure and, together with the description, serve to explain principles of the present disclosure. The above and other aspects, features, and advantages of certain embodiments of the disclosure will be more apparent from the following description taken in conjunction with the accompanying drawings, in which.

DETAILED DESCRIPTION

Figure 1:
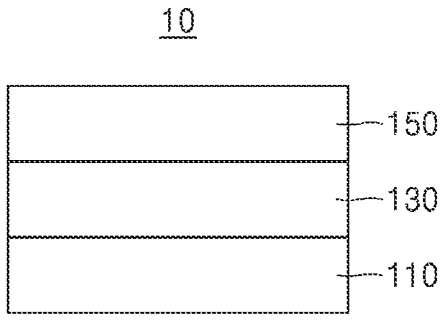
FIG. 1 is a schematic view of a structure of a light-emitting device according to one or more embodiments of the present disclosure.

Reference will now be made in more detail to embodiments, examples of which are illustrated in the accompanying drawings, wherein like reference numerals refer to like elements throughout the present disclosure, and duplicative descriptions thereof may not be provided for conciseness. In this regard, the embodiments of the present disclosure may have different forms and should not be construed as being limited to the descriptions set forth herein. Accordingly, the embodiments of the present disclosure are merely described, by referring to the drawings, to explain aspects of the present disclosure. As utilized herein, the term "and/or" or "or" may include any and all combinations of one or more of the associated listed items. Throughout the disclosure, the expression "at least one of a, b, or c" indicates only a, only b, only c, both (e.g., simultaneously) a and b, both (e.g., simultaneously) a and c, both (e.g., simultaneously) b and c, all of a, b, and c, or variations thereof.

According to one or more aspects of embodiments of the present disclosure, a light-emitting device may include:

a first electrode;

the second electrode facing the first electrode;

an interlayer between the first electrode and the second electrode and including an emission layer; and an organometallic compound represented by Formula 1 as a first compound:

Formula 1

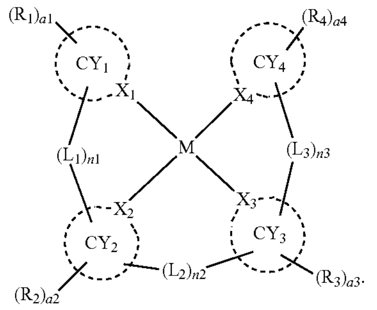

The detailed description of Formula 1 is the same as described in the specification.

In one or more embodiments, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In one or more embodiments, the interlayer of the light-emitting device may include the organometallic compound represented by Formula 1.

In one or more embodiments, the emission layer of the light-emitting device may include the organometallic compound represented by Formula 1.

In one or more embodiments, the emission layer of the light-emitting device may include a dopant and a host, and the organometallic compound represented by Formula 1 may be included in the dopant. For example, the organometallic compound may act as (e.g., function as) a dopant. For example, in some embodiments, the emission layer may be to emit blue light. The blue light may have a maximum emission wavelength in a range of, for example, about 430 nm to about 470 nm.

In one or more embodiments, the electron transport region of the light-emitting device may include a hole-blocking layer, and the hole-blocking layer may include a phosphine oxide-containing compound, a silicon-containing compound, or any combination thereof. In some embodiments, the hole blocking layer may directly contact the emission layer.

In one or more embodiments, the light-emitting device may further include a second compound including at least one π electron-deficient nitrogen-containing $C_1$-$C_{60}$ heterocyclic group, a third compound including a group represented by Formula 3, a fourth compound capable of emitting delayed fluorescence, or any combination thereof, and the organometallic compound, the second compound, the third compound, and the fourth compound in the light-emitting device may be different from each other:

Formula 3

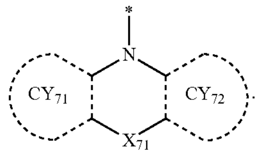

In Formula 3, ring $CY_{71}$ and ring $CY_{72}$ may each independently be a π electron-rich $C_3$-$C_{60}$ cyclic group or a pyridine group, $X_{71}$ may be a single bond or a linking group including O, S, N, B, C, Si, or any combination thereof, and

* may indicate a binding site to an atom included in a part of the third compound excluding a part represented by Formula 3.

In one or more embodiments, the organometallic compound may include at least one deuterium.

In one or more embodiments, the second compound, the third compound, and the fourth compound may each include at least one deuterium.

In one or more embodiments, the second compound may include at least one silicon.

In one or more embodiments, the third compound may include at least one silicon.

In one or more embodiments, the light-emitting device may further include a second compound and a third compound in addition to the organometallic compound represented by Formula 1, wherein at least one selected from among the second compound and the third compound may include at least one deuterium, at least one silicon, or a combination thereof.

In one or more embodiments, the light-emitting device (for example, the emission layer in the light-emitting device) may further include a second compound, in addition to the organometallic compound. At least one selected from among the organometallic compound and the second compound may include at least one deuterium. For example, in some embodiments, a composition and the light-emitting device (for example, the emission layer in the light-emitting device) may each further include a third compound, a fourth compound, or any combination thereof, in addition to the organometallic compound and the second compound.

In one or more embodiments, the light-emitting device (for example, the emission layer in the light-emitting device) may further include a third compound, in addition to the organometallic compound. At least one selected from among the organometallic compound and the third compound may include at least one deuterium. In some embodiments, a composition and the light-emitting device (for example, the emission layer in the light-emitting device) may each further include a second compound, a fourth compound, or any combination thereof, in addition to the organometallic compound and the third compound.

In one or more embodiments, the light-emitting device (for example, the emission layer in the light-emitting device) may further include a fourth compound, in addition to the organometallic compound. At least one selected from among the organometallic compound and the fourth compound may include at least one deuterium. The fourth compound may serve to improve color purity, luminescence efficiency, and lifespan characteristics of the light-emitting device. In some embodiments, a composition and the light-emitting device (for example, the emission layer in the light-emitting device) may each further include a second compound, a third compound, or any combination thereof, in addition to the organometallic compound and the fourth compound.

In one or more embodiments, the light-emitting device (for example, the emission layer in the light-emitting device) may further include a second compound and a third compound, in addition to the organometallic compound. The second compound and the third compound may form an exciplex. At least one selected from the organometallic compound, the second compound, and the third compound may include at least one deuterium.

In one or more embodiments, the emission layer of the light-emitting device may include: i) the organometallic compound; and ii) the second compound, the third compound, the fourth compound, or any combination thereof, and the emission layer may be to emit blue light.

In one or more embodiments, a maximum emission wavelength of the blue light may be in a range of about 430 nm to about 475 nm, about 440 nm to about 475 nm, about 450 nm to about 475 nm, about 430 nm to about 470 nm, about 440 nm to about 470 nm, about 450 nm to about 470 nm, about 430 nm to about 465 nm, about 440 nm to about 465 nm, about 450 nm to about 465 nm, about 430 nm to about 460 nm, about 440 nm to about 460 nm, or about 450 nm to about 460 nm.

In one or more embodiments, the second compound may include a pyridine group, a pyrimidine group, a pyrazine group, a pyridazine group, a triazine group, or any combination thereof.

In one or more embodiments, the following compounds may be excluded from the third compound:

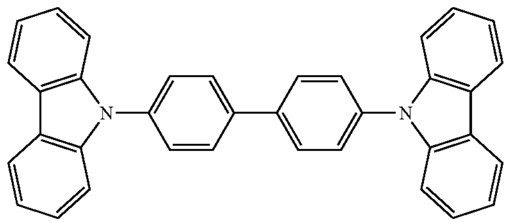

CBP

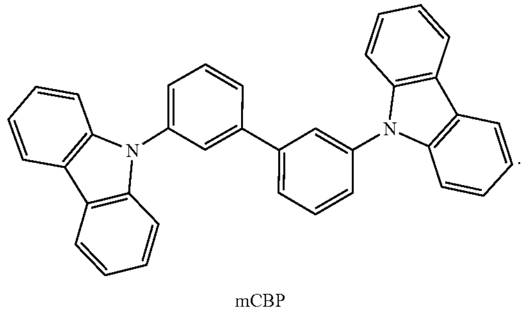

mCBP

In one or more embodiments, a difference between a triplet energy level (eV) of the fourth compound and a singlet energy level (eV) of the fourth compound may be about 0 eV or higher and about 0.5 eV or lower (or, about 0 eV or higher and about 0.3 eV or lower).

In one or more embodiments, the fourth compound may be a compound including at least one cyclic group including each of boron (B) and nitrogen (N) as a ring-forming atom.

In one or more embodiments, the fourth compound may be a $C_8$-$C_{60}$ polycyclic group-containing compound including at least two condensed cyclic groups that share a boron atom (B).

In one or more embodiments, the fourth compound may include a condensed ring in which at least one third ring may be condensed with at least one fourth ring, for example, to form the condensed ring including four or more rings, the third ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In one or more embodiments, the third compound may not include (e.g., may exclude) a compound represented by Formula 3-1 described in the specification.

In some embodiments, the second compound may include a compound represented by Formula 2:

Formula 2

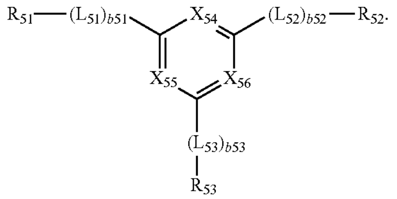

In Formula 2, $L_{51}$ to $L_{53}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b51 to b53 may each independently be an integer from 1 to 5, $X_{54}$ may be N or $C(R_{54})$, $X_{55}$ may be N or $C(R_{55})$, $X_{56}$ may be N or $C(R_{56})$, and at least one selected from among $X_{54}$ to $X_{56}$ may be N, and $R_{51}$ to $R_{56}$ and $R_{10a}$ may each be the same as described herein.

In one or more embodiments, the third compound may include a compound represented by Formula 3-1, a compound represented by Formula 3-2, a compound represented by Formula 3-3, a compound represented by Formula 3-4, a compound represented by Formula 3-5, or any combination thereof:

Formula 3-1

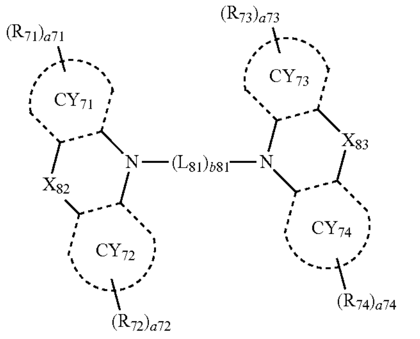

Formula 3-2

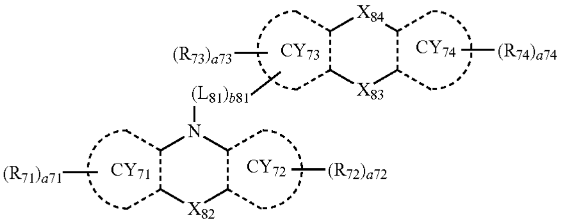

Formula 3-3

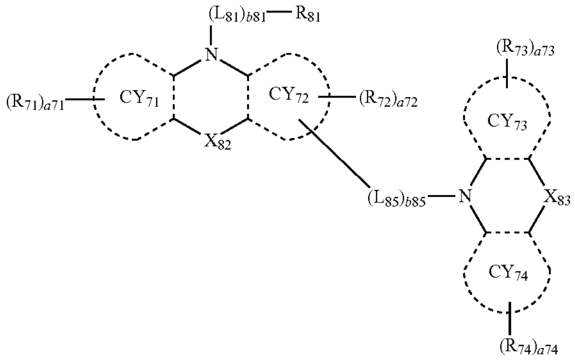

Formula 3-4

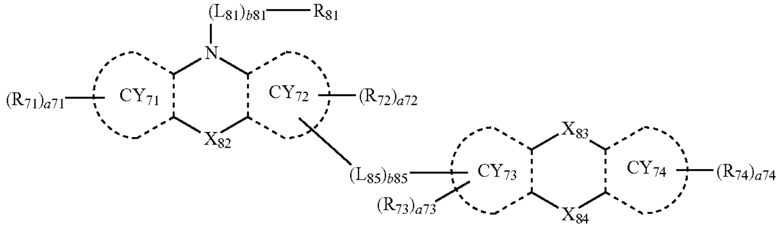

Formula 3-5

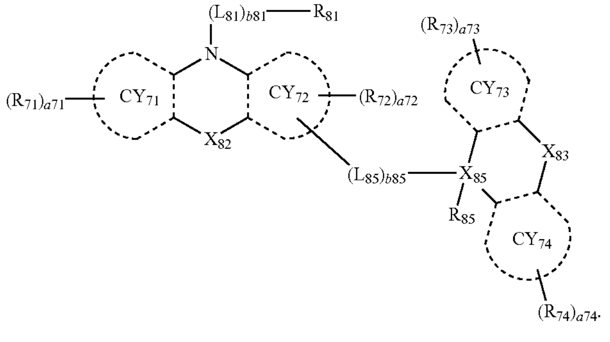

In Formulae 3-1 to 3-5, ring $CY_{71}$ to ring $CY_{74}$ may each independently be a π electron-rich $C_3$-$C_{60}$ cyclic group or a pyridine group, $X_{82}$ may be a single bond, O, S, N-[$(L_{82})_{b82}$-$R_{82}$], C($R_{82a}$)($R_{82b}$), or Si($R_{82a}$)($R_{82b}$), $X_{83}$ may be a single bond, O, S, N-[$(L_{83})_{b83}$-$R_{83}$], C($R_{83a}$)($R_{83b}$), or Si($R_{83a}$)($R_{83b}$), $X_{84}$ may be O, S, N-[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group unsubstituted or substituted with at least one $R_{10a}$, or a pyridine group unsubstituted or substituted with at least one $R_{10a}$, and $Q_4$ and $Q_5$ may be the same as described with respect to $Q_1$ in the specification, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each be the same as described herein, a71 to a74 may each independently be an integer from 0 to 20, and $R_{10a}$ may be understood by referring to the description of $R_{10a}$ provided herein.

In some embodiments, the fourth compound may be a compound represented by Formula 502, a compound represented by Formula 503, or any combination thereof:

Formula 502

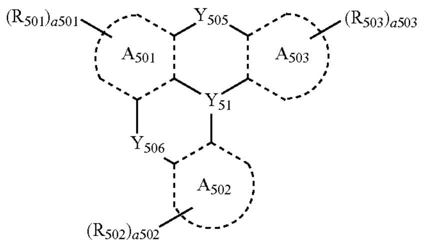

Formula 503

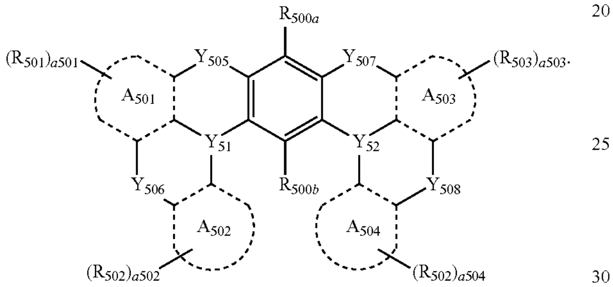

In Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{508}$ may be O, S, $N(R_{508})$, $B(R_{508})$, $C(R_{508a})(R_{508b})$, or $Si(R_{508a})(R_{508b})$, $Y_{51}$ and $Y_{52}$ may each independently be B, P(═O), or S(═O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each be the same as described herein, and a501 to a504 may each independently be an integer from 0 to 20.

In some embodiments, the light-emitting device may satisfy at least one selected from among Conditions 1 to 4:

Condition 1

A lowest unoccupied molecular orbital (LUMO) energy level (eV) of the third compound>a LUMO energy level (eV) of the organometallic compound;

Condition 2

A LUMO energy level (eV) of the organometallic compound>a LUMO energy level (eV) of the second compound;

Condition 3

A highest occupied molecular orbital (HOMO) energy level (eV) of the organometallic compound>a HOMO energy level (eV) of the third compound; and Condition 4

A HOMO energy level (eV) of the third compound>a HOMO energy level (eV) of the second compound.

Each of a HOMO energy level and a LUMO energy level of each of the organometallic compound, the second compound, and the third compound may be a negative value, which is measured according to a suitable method in the art.

In one or more embodiments, an absolute value of a difference between a LUMO energy level of the organometallic compound and a LUMO energy level of the second compound may be about 0.1 eV or higher and about 1.0 eV or lower, an absolute value of a difference between a LUMO energy level of the organometallic compound and a LUMO energy level of the third compound may be about 0.1 eV or higher and about 1.0 eV or lower, an absolute value of a difference between a HOMO energy level of the organometallic compound and a HOMO energy level of the second compound may be about 1.25 eV or lower (for example, about 1.25 eV or lower and about 0.2 eV or higher), and/or an absolute value of a difference between a HOMO energy level of the organometallic compound and a HOMO energy level of the third compound may be about 1.25 eV or lower (for example, about 1.25 eV or lower and about 0.2 eV or higher).

When the relationships between LUMO energy level and HOMO energy level satisfy the conditions as described above, the balance between holes and electrons injected into the emission layer can be made.

In one or more embodiments, the light-emitting device may have a structure of a first embodiment or a second embodiment.

First Embodiment

According to the first embodiment, the organometallic compound may be included in the emission layer in the interlayer of the light-emitting device, wherein the emission layer may further include a host, the organometallic compound may be different from the host, and the emission layer may be to emit phosphorescence or fluorescence emitted from the organometallic compound. For example, according to the first embodiment, the organometallic compound may be a dopant or an emitter. In one or more embodiments, the organometallic compound may be a phosphorescent dopant or a phosphorescent emitter.

Phosphorescence or fluorescence emitted from the organometallic compound may be blue light.

In some embodiments, the emission layer may further include an auxiliary dopant. The auxiliary dopant may serve to improve luminescence efficiency from the first compound by effectively transferring energy to the organometallic compound as a dopant or an emitter.

The auxiliary dopant may be different from the organometallic compound and the host.

In some embodiments, the auxiliary dopant may be a delayed fluorescence-emitting compound.

In some embodiments, the auxiliary dopant may be a compound including at least one cyclic group including boron (B) and nitrogen (N) as ring-forming atoms.

Second Embodiment

According to the second embodiment, the organometallic compound may be included in the emission layer in the interlayer of the light-emitting device, wherein the emission layer may further include a host and a dopant, the organometallic compound, the host, and the dopant may be different from one another, and the emission layer may be to emit phosphorescence or fluorescence (e.g., delayed fluorescence) from the dopant.

In one or more embodiments, the organometallic compound in the second embodiment may serve as an auxiliary dopant that transfers energy to a dopant (or an emitter), not as a dopant.

In one or more embodiments, the organometallic compound in the second embodiment may serve as an emitter and as an auxiliary dopant that transfers energy to a dopant (or an emitter).

For example, phosphorescence or fluorescence emitted from the dopant (or the emitter) in the second embodiment may be blue phosphorescence or blue fluorescence (e.g., blue delayed fluorescence).

The dopant (or the emitter) in the second embodiment may be a phosphorescent dopant material (e.g., the organometallic compound represented by Formula 1, the organometallic compound represented by Formula 401, or any combination thereof) or any fluorescent dopant material (e.g., the compound represented by Formula 501, the compound represented by Formula 502, the compound represented by Formula 503, or any combination thereof).

In the first embodiment and the second embodiment, the blue light may be blue light having a maximum emission wavelength in a range of about 390 nm to about 500 nm, about 410 nm to about 490 nm, about 430 nm to about 480 nm, about 440 nm to about 475 nm, or about 455 nm to about 470 nm.

The auxiliary dopant in the first embodiment may include, e.g., the fourth compound represented by Formula 502 or Formula 503.

The host in the first embodiment and the second embodiment may be any host material (e.g., the compound represented by Formula 301, the compound represented by 301-1, the compound represented by Formula 301-2, or any combination thereof).

In some embodiments, the host in the first embodiment and the second embodiment may be the second compound, the third compound, or any combination thereof.

In some embodiments, the light-emitting device may further include a capping layer located outside the first electrode and/or outside the second electrode.

In some embodiments, the light-emitting device may further include at least one of a first capping layer located outside the first electrode or a second capping layer located outside the second electrode, and the organometallic compound represented by Formula 1 may be included in at least one selected from among the first capping layer and the second capping layer. More details for the first capping layer and/or second capping layer may each independently be the same as described in the specification.

In one or more embodiments, the light-emitting device may further include:

a first capping layer located outside the first electrode and including the organometallic compound represented by Formula 1;

a second capping layer located outside the second electrode and including the organometallic compound represented by Formula 1; or the first capping layer and the second capping layer.

The expression that an "(interlayer and/or a capping layer) includes (including) at least one organometallic compound represented by Formula 1" as utilized herein may be construed as meaning that the "(interlayer and/or the capping layer) may include one organometallic compound of Formula 1 or two or more different organometallic compounds of Formula 1".

For example, in some embodiments, the interlayer and/or the capping layer may include Compound 1 only as the organometallic compound. In these embodiments, Compound 1 may be included in the emission layer of the light-emitting device. In some embodiments, the interlayer may include, as the organometallic compound, Compound 1 and Compound 2. In this regard, Compound 1 and Compound 2 may exist in an identical layer (for example, Compound 1 and Compound 2 may all exist in the emission layer), or may exist in different layers (for example, Compound 1 may exist in the emission layer and Compound 2 may exist in the electron transport region).

The term "interlayer" as utilized herein may refer to a single layer and/or all of a plurality of layers between the first electrode and the second electrode of the light-emitting device.

One or more aspects of embodiments of the present disclosure provides an electronic device including the light-emitting device. The electronic device may further include a thin-film transistor. For example, the electronic device may further include a thin-film transistor including a source electrode and a drain electrode, wherein the first electrode of the light-emitting device may be electrically connected to the source electrode or the drain electrode. In some embodiments, the electronic device may further include a color filter, a color conversion layer, a touch screen layer, a polarizing layer, or any combination thereof. For more details on the electronic device, related descriptions provided herein may be referred to.

According to one or more aspects of embodiments of the present disclosure, provided is an electronic apparatus including the light-emitting device.

For example, the electronic apparatus may be at least one selected from a flat panel display, a curved display, a computer monitor, a medical monitor, a TV, a billboard, indoor or outdoor illuminations and/or signal light, a head-up display, a fully or partially transparent display, a flexible display, a rollable display, a foldable display, a stretchable display, a laser printer, a phone, a cell phone, a tablet, a phablet, a personal digital assistant (PDA), a wearable device, laptop computers, digital cameras, camcorders, viewfinders, micro displays, 3D displays, virtual or augmented reality displays, vehicles, a video wall including multiple displays tiled together, a theater or stadium screen, a phototherapy device, and a signage.

One or more embodiments of the present disclosure may include an organometallic compound represented by Formula 1. The detailed description of Formula 1 is the same as described in the specification.

Methods of synthesizing the organometallic compound may be easily understood to those of ordinary skill in the art by referring to Synthesis Examples and/or Examples described herein.

Description of Formula 1

Formula 1

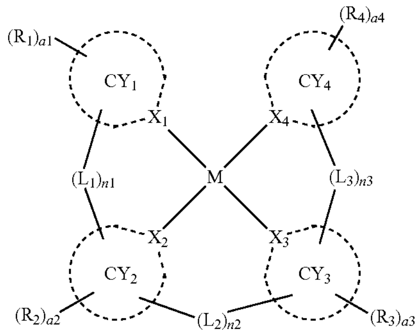

-continued

Formula 2-1

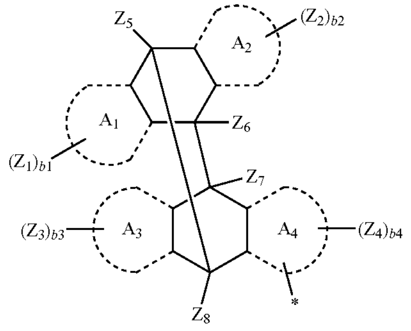

Formula 2-2

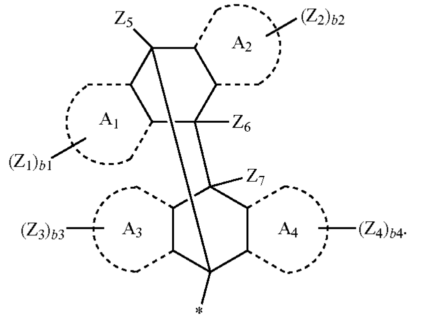

In Formula 1, M may be platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm).

In one or more embodiments, M may be Pt.

In Formula 1, $X_1$ to $X_4$ may each independently be C or N.

In some embodiments, $X_1$ may be C. In some embodiments, $X_1$ in Formula 1 may be C, and C may be carbon of a carbene moiety.

For example, in some embodiments, $X_1$ in Formula 1 may be N.

In one or more embodiments, $X_2$ and $X_3$ may each be C, and $X_4$ may be N.

In Formula 1, i) a bond between $X_1$ and M may be a coordinate bond, ii) one selected from a bond between $X_2$ and M, a bond between $X_3$ and M, and a bond between $X_4$ and M may be a coordinate bond, and the other two may each be a covalent bond.

For example, in some embodiments, each of a bond between $X_1$ and M and a bond between $X_4$ and M may be a coordinate bond, and each of a bond between $X_2$ and M and a bond between $X_3$ and M may be a covalent bond.

According to one or more embodiments of the present disclosure, $X_1$ may be C and a bond between $X_1$ and M may be a coordinate bond.

In Formula 1, ring $CY_1$ to ring $CY_4$ may each independently be a $C_5$-$C_{30}$ carbocyclic group or a $C_1$-$C_{30}$ heterocyclic group.

For example, in some embodiments, ring $CY_1$ may be a nitrogen-containing $C_1$-$C_{60}$ heterocyclic group.

In Formula 1, ring $CY_1$ may be i) an $X_1$-containing 5-membered ring, ii) an $X_1$-containing 5-membered ring in which at least one 6-membered ring is condensed, or iii) an $X_1$-containing 6-membered ring. In one or more embodiments, ring $CY_1$ in Formula 1 may be i) an $X_1$-containing 5-membered ring or ii) an $X_1$-containing 5-membered ring in which at least one 6-membered ring is condensed. For example, in some embodiments, ring $CY_1$ may include a 5-membered ring bonded to M in Formula 1 via $X_1$. Here, the $X_1$-containing 5-membered ring may be a pyrrole group, a pyrazole group, an imidazole group, a triazole group, an oxazole group, an iso-oxazole group, a thiazole group, an isothiazole group, an oxadiazole group, or a thiadiazole group, and the $X_1$-containing 6-membered ring and the 6-membered ring which may be optionally condensed to the $X_1$-containing 5-membered ring may each independently be a benzene group, a pyridine group, or a pyrimidine group.

In one or more embodiments, ring $CY_1$ may be an $X_1$-containing 5-membered ring, and the $X_1$-containing 5-membered ring may be an imidazole group or a triazole group.

In one or more embodiments, ring $CY_1$ may be an $X_1$-containing 5-membered ring in which at least one 6-membered ring is condensed, and the $X_1$-containing 5-membered ring in which the at least one 6-membered ring is condensed may be a benzimidazole group or an imidazopyridine group.

In one or more embodiments, ring $CY_1$ may be an imidazole group, a triazole group, a benzimidazole group, or an imidazopyridine group.

In one or more embodiments, $X_1$ may be C, and ring $CY_1$ may be an imidazole group, a triazole group, a benzimidazole group, a naphthoimidazole group, or an imidazopyridine group.

In one or more embodiments, ring $CY_2$ may be a benzene group, a pyridine group, a pyrimidine group, a naphthalene group, a dibenzofuran group, a dibenzothiophene group, a carbazole group, a fluorene group, a dibenzosilole group, a naphthobenzofuran group, a naphthobenzothiophene group, a benzocarbazole group, a benzofluorene group, a naphthobenzosilole group, a dinaphthofuran group, a dinaphthothiophene group, a dibenzocarbazole group, a dibenzofluorene group, a dinaphthosilole group, an azadibenzofuran group, an azadibenzothiophene group, an azacarbazole group, an azafluorene group, an azadibenzosilole group, an azanaphthobenzofuran group, an azanaphthobenzothiophene group, an azabenzocarbazole group, an azabenzofluorene group, an azanaphthobenzosilole group, an azadinaphthofuran group, an azadinaphthothiophene group, an azadibenzocarbazole group, an azadibenzofluorene group, or an azadinaphthosilole group.

For example, in some embodiments, ring $CY_2$ may be a benzene group, a pyridine group, a pyrimidine group, a naphthalene group, a dibenzofuran group, a dibenzothiophene group, a carbazole group, a fluorene group, or a dibenzosilole group.

In Formula 1, ring $CY_3$ may be a $C_2$-$C_8$ monocyclic group or a $C_4$-$C_{20}$ polycyclic group in which two or three $C_2$-$C_8$ monocyclic groups are condensed with each other.

For example, in some embodiments, in Formula 1, ring $CY_3$ may be a $C_4$-$C_6$ monocyclic group or a $C_4$-$C_8$ polycyclic group in which two or three $C_4$-$C_6$ monocyclic groups are condensed with each other.

In the present disclosure, a $C_2$-$C_8$ monocyclic group refers to a non-condensed cyclic group and may include, for example, a cyclopentadiene group, a pyrrole group, a pyrazole group, an imidazole group, a triazole group, an oxazole group, an isooxazole group, a thiazole group, an isothiazole group, an oxadiazole group, a thiadiazole group, a benzene group, a pyridine group, a pyrimidine group, a pyrazine group, a pyridazine group, a triazine group, a cycloheptadiene group, or a cyclooctadiene group.

For example, in some embodiments, ring $CY_3$ may be a benzene group, a pyridine group, a pyrimidine group, a naphthalene group, a dibenzofuran group, a dibenzothiophene group, a carbazole group, a fluorene group, a dibenzosilole group, an azadibenzofuran group, an azadibenzothiophene group, an azacarbazole group, an azafluorene group, or an azadibenzosilole group.

In Formula 1, ring $CY_4$ may be a nitrogen-containing $C_1$-$C_{60}$ heterocyclic group.

For example, in one or more embodiments, ring $CY_4$ may be a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a benzopyrazole group, a benzimidazole group, or a benzothiazole group.

In Formula 1, $L_1$ to $L_3$ may each independently be a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—N($R_{1a}$)—*', *—O—*', *—P($R_{1a}$)—*', *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' may each indicate a binding site to a neighboring atom.

$R_{1a}$ and $R_{1b}$ may each be the same as described herein.

In one or more embodiments, $L_1$ and $L_3$ may each be a single bond, and $L_2$ may be *—C($R_{1a}$)($R_{1b}$)—*', *—B($R_{1a}$)—*', *—N($R_{1a}$)—*', *—O—*', *—P($R_{1a}$)—*', *—Si($R_{1a}$)($R_{1b}$)—*', or *—S—*'.

In one or more embodiments, $L_2$ may be *—O—*' or *—S—*'.

In Formula 1, n1 to n3 indicate the number of $L_1$(s) to the number of $L_3$(s), respectively, and may each independently be an integer from 1 to 5. When n1 to n3 are 2 or greater, each of two or more $L_1$(s) to $L_3$(s) may be identical to or different from each other.

In one or more embodiments, n2 may be 1.

In Formula 1, $R_1$ to $R_4$, $R_{1a}$, and $R_{1b}$ may each independently be a group represented by Formula 2-1, a group represented by Formula 2-2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_1$-$C_{60}$ aryloxy group unsubstituted or substituted with at least one $R_{10a}$, a $C_1$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$).

$R_{10a}$ and $Q_1$ to $Q_3$ may each be the same as described herein.

In one or more embodiments, $R_1$ to $R_4$, $R_{1a}$, and $R_{1b}$ may each independently be:

a group represented by Formula 2-1 or a group represented by Formula 2-2;

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a —O($Q_{31}$), a —S($Q_{31}$), a —Si($Q_{31}$)($Q_{32}$)($Q_{33}$), a —N($Q_{31}$)($Q_{32}$), a —B($Q_{31}$)($Q_{32}$), a —P($Q_{31}$)($Q_{32}$), a —C(═O)($Q_{31}$), a —S(═O)$_2$($Q_{31}$), a —P(═O)($Q_{31}$)($Q_{32}$), or any combination thereof; or —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$).

$Q_1$ to $Q_3$ and $Q_{31}$ to $Q_{33}$ may each be the same as described herein.

In one or more embodiments, $R_1$ to $R_4$, $R_{1a}$, and $R_{1b}$ may each independently be:

a group represented by Formula 2-1 or a group represented by Formula 2-2;

hydrogen, deuterium, —F, —Cl, —Br, —I, or a $C_1$-$C_{20}$ alkyl group;

a $C_1$-$C_{20}$ alkyl group unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof; or a phenyl group, a biphenyl group, a terphenyl group, a ($C_1$-$C_{10}$ alkyl)phenyl group, or a naphthyl group, each unsubstituted or substituted with deuterium, —F, —Cl, —Br, —I, —$CD_3$, —$CD_2H$, —$CDH_2$, —$CF_3$, —$CF_2H$, —$CFH_2$, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, a ($C_1$-$C_{10}$ alkyl)phenyl group, or any combination thereof.

In Formula 1, a1 to a4 indicate the number of $R_1$(s) to the number of $R_4$(s), respectively, and may each independently be an integer from 1 to 10. When a1 to a4 are 2 or greater, each of two or more $R_1$(s) to $R_4$(s) may be identical to or different from each other.

In one or more embodiments, at least one of $R_1$(s) in the number of a1, at least one of $R_2$(s) in the number of a2, at least one $R_3$(s) in the number of a3, at least one of $R_4$(s) in the number of a4, or any combination thereof may each be a group represented by Formula 2-1 or a group represented by Formula 2-2.

In one or more embodiments, in Formula 1, at least one of $R_1$(s) in the number of a1 may be the group represented by Formula 2-1 or the group represented by Formula 2-2.

In Formulae 2-1 and 2-2, ring $A_1$ to ring $A_4$ may each independently be a $C_5$-$C_{30}$ carbocyclic group or a $C_1$-$C_{30}$ heterocyclic group.

In one or more embodiments, ring $A_1$ to ring $A_4$ may each independently be a benzene group, a naphthalene group, an anthracene group, a phenanthrene group, a triphenylene group, a pyrene group, a chrysene group, cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, ring $A_1$ to ring $A_4$ may each independently be a benzene group, a naphthalene group, or a pyridine group.

In Formulae 2-1 and 2-2, $Z_1$ to $Z_8$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_1$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$).

$R_{10a}$ and $Q_1$ to $Q_3$ may each be the same as described herein.

In one or more embodiments, $Z_1$ to $Z_8$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a $—O(Q_{31})$, a $—S(Q_{31})$, a $—Si(Q_{31})(Q_{32})(Q_{33})$, a $—N(Q_{31})(Q_{32})$, a $—B(Q_{31})(Q_{32})$, a $—P(Q_{31})(Q_{32})$, a $—C(=O)(Q_{31})$, a $—S(=O)_2(Q_{31})$, a $—P(=O)(Q_{31})(Q_{32})$, or any combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$.

$Q_1$ to $Q_3$ and $Q_{31}$ to $Q_{33}$ may each be the same as described herein.

In one or more embodiments, $Z_1$ to $Z_8$ may each independently be:

hydrogen, deuterium, —F, —Cl, —Br, —I, a hydroxyl group, a cyano group, or a nitro group;

a $C_1$-$C_{20}$ alkyl group or a $C_1$-$C_{20}$ alkoxy group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a phenyl group, a biphenyl group, a naphthyl group, a pyridinyl group, a pyrimidinyl group, or any combination thereof; or a phenyl group, a biphenyl group, a terphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, or any combination thereof.

In one or more embodiments, $Z_1$ to $Z_8$ may each independently be:

hydrogen, deuterium, —F, —Cl, —Br, —I, or a $C_1$-$C_{20}$ alkyl group;

a $C_1$-$C_{20}$ alkyl group unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a phenyl group, a biphenyl group, a naphthyl group, a pyridinyl group, a pyrimidinyl group, or any combination thereof; or a phenyl group, a biphenyl group, a terphenyl group, a ($C_1$-$C_{10}$ alkyl)phenyl group, or a naphthyl group, each unsubstituted or substituted with deuterium, —F, —Cl, —Br, —I, $—CD_3$, $—CD_2H$, $—CDH_2$, $—CF_3$, $—CF_2H$, $—CFH_2$, a $C_1$-$C_{20}$ alkyl group, a phenyl group, a biphenyl group, a ($C_1$-$C_{10}$ alkyl)phenyl group, a naphthyl group, or any combination thereof.

In Formulae 2-1 and 2-2, b1 to b4 respectively indicate numbers of $Z_1$ to $Z_4$, and may each independently be an integer from 1 to 4. When b1 to b4 are 2 or greater, each of two or more $Z_1$(s) to $Z_4$(s) may be identical to or different from each other.

In one or more embodiments, in Formulae 2-1 and 2-2, at least one of $Z_3$(s) in the number of b3, at least one of $Z_4$(s) in the number of b4, $Z_5$, $Z_6$, $Z_7$, or any combination thereof may not be hydrogen.

In Formulae 2-1 and 2-2, * may indicate a binding site to a neighboring atom.

In one or more embodiments, a group represented by

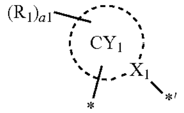

in Formula 1 may be a group represented by one selected from Formulae CY1(1) to CY1(5):

CY1(1)

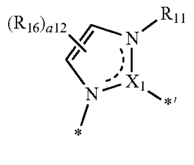

-continued

CY1(2)

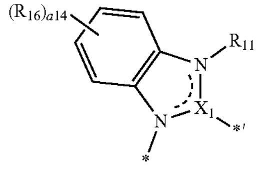

CY1(3)

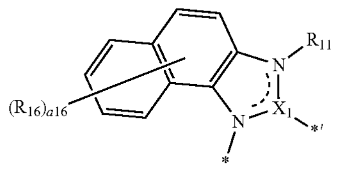

CY1(4)

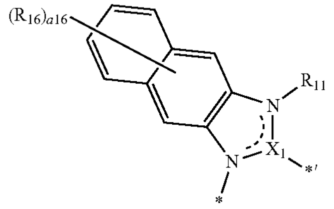

CY1(5)

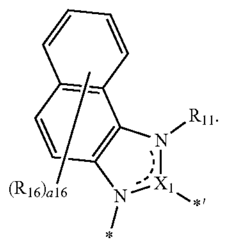

In Formulae CY1(1) to CY1(5), $X_1$ may be the same as described with respect to $X_1$ in Formula 1, $R_{11}$ and $R_{16}$ may each be the same as described herein with respect to $R_1$, a12 may be an integer from 1 to 2, a14 may be an integer from 1 to 4, a16 may be an integer from 1 to 6,

* may indicate a binding site to $L_1$ in Formula 1, and

*' may indicate a binding site to M in Formula 1.

In one or more embodiments, in Formulae CY1(1) to CY1(5), $R_{11}$ may be the group represented by Formula 2-1 or the group represented by Formula 2-2.

In one or more embodiments, a group represented by

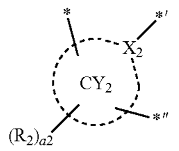

in Formula 1 may be a group represented by one selected from Formulae CY2(1) to CY2(8):

CY2(1)

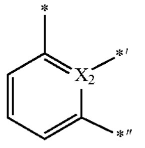

CY2(2)

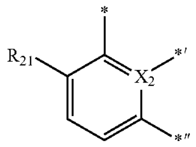

CY2(3)

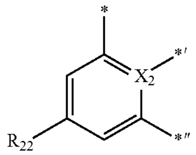

CY2(4)

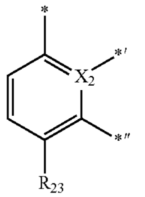

CY2(5)

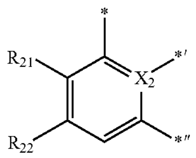

CY2(6)

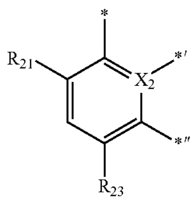

CY2(7)

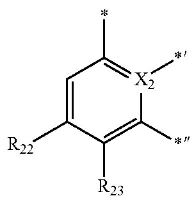

CY2(8)

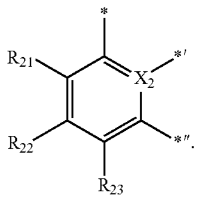

In Formulae CY2(1) to CY2(8), $X_2$ may be the same as described with respect to $X_2$ in Formula 1, $R_{21}$ to $R_{23}$ may each be the same as described herein with respect to $R_2$, wherein $R_{21}$ to $R_{23}$ are each not hydrogen,

* may indicate a binding site to $L_1$ in Formula 1, *' may indicate a binding site to M in Formula 1, and *" may indicate a binding site to $L_2$ in Formula 1.
In one or more embodiments, a group represented by
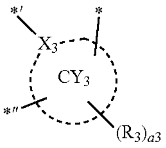
in Formula 1 may be a group represented by one of Formulae CY3(1) to CY3(15):
CY3(1)
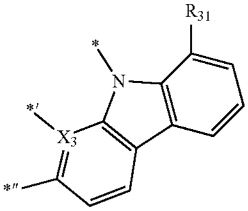
CY3(2)
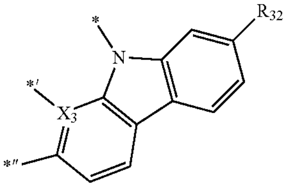
CY3(3)
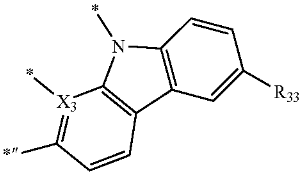
CY3(4)
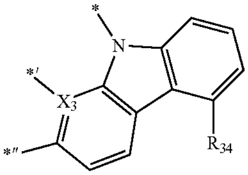
CY3(5)
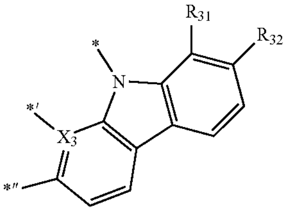
CY3(6)
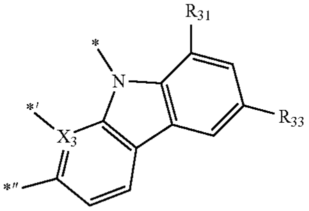
-continued
CY3(7)
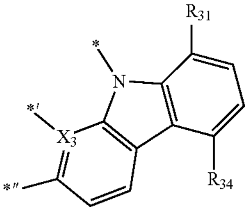
CY3(8)
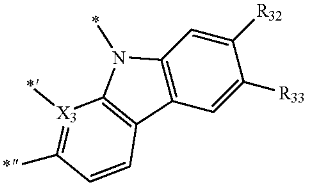
CY3(9)
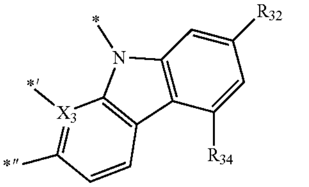
CY3(10)
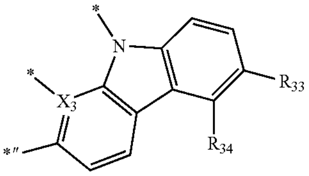
CY3(11)
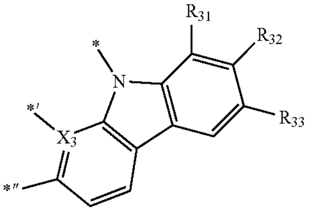
CY3(12)
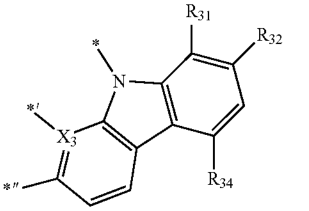
CY3(13)
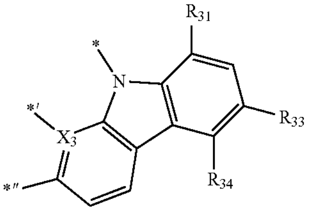

-continued

CY3(14)

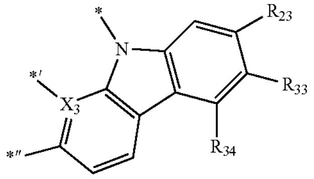

CY3(15)

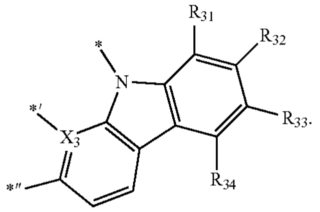

In Formulae CY3(1) to CY3(15), $X_3$ may be the same as described with respect to $X_3$ in Formula 1, $R_{31}$ to $R_{34}$ may each be the same as described herein with respect to $R_3$, wherein $R_{31}$ to $R_{34}$ are each not hydrogen,

* may indicate a binding site to $L_3$ in Formula 1,

*' may indicate a binding site to M in Formula 1, and

*" may indicate a binding site to $L_2$ in Formula 1.

In one or more embodiments, a group represented by

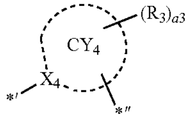

in Formula 1 may be a group represented by one selected from Formulae CY4(1) to CY4(14):

CY4(1)

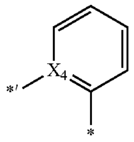

CY4(2)

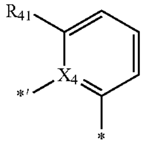

CY4(3)

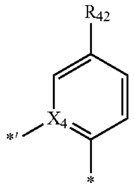

-continued

CY4(4)

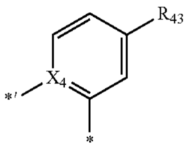

CY4(5)

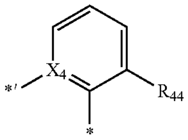

CY4(6)

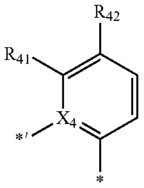

CY4(7)

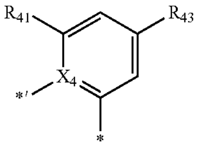

CY4(8)

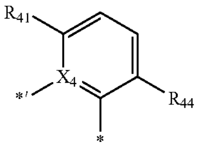

CY4(9)

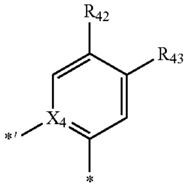

CY4(10)

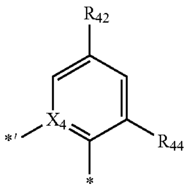

CY4(11)

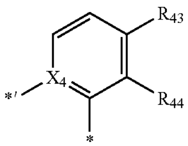

CY4(12)

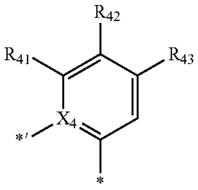

-continued

CY4(13)

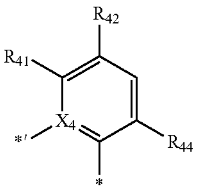

CY4(14)

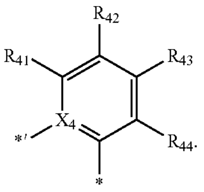

In Formulae CY4(1) to CY4(14), $X_4$ may be the same as described with respect to $X_4$ in Formula 1, $R_{41}$ to $R_{44}$ may each be the same as described herein with respect to $R_4$, wherein $R_{41}$ to $R_{44}$ are each not hydrogen,

* may indicate a binding site to $L_3$ in Formula 1, and

*' may indicate a binding site to M in Formula 1.

In one or more embodiments, a group represented by Formula 2-1 may be a group represented by one selected from Formulae 2-1(1) to 2-1(12), and a group represented by Formula 2-2 may be a group represented by one selected from Formulae 2-2(1) to 2-2(6):

2-1(1)

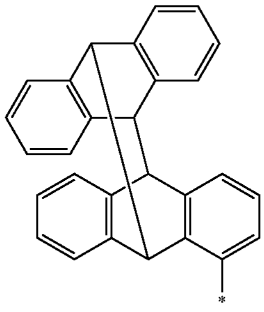

2-1(2)

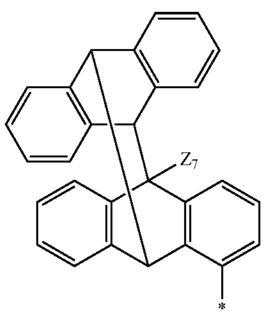

-continued 2-1(3)

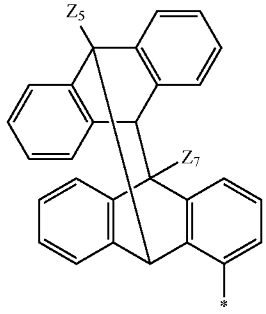

2-1(4)

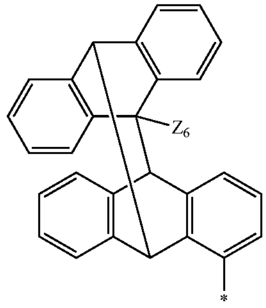

2-1(5)

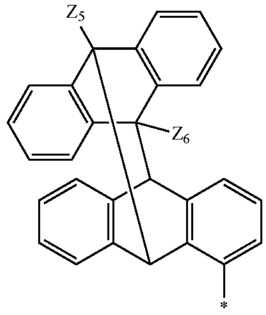

2-1(6)

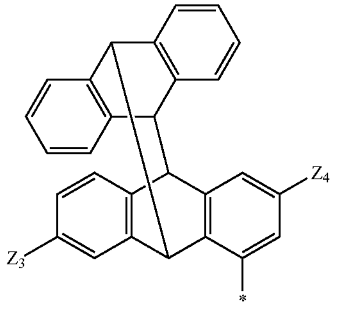

2-1(7)

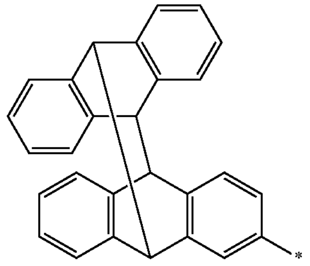

-continued
2-1(8)
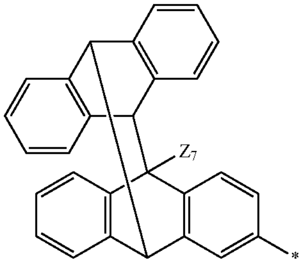
2-1(9)
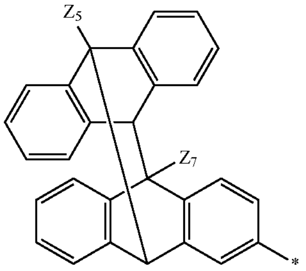
2-1(10)
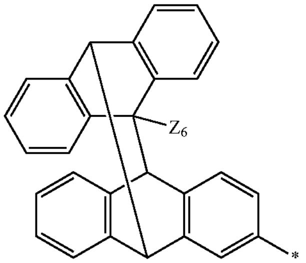
2-1(11)
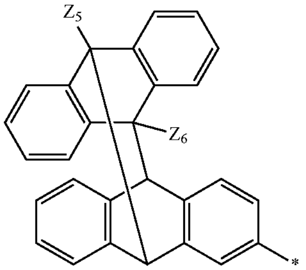
2-1(12)
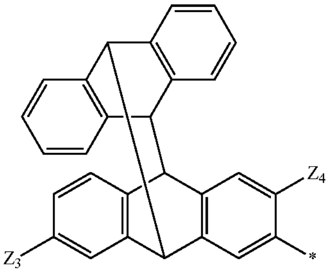
-continued
2-2(1)
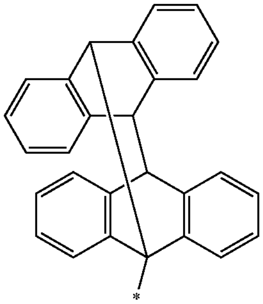
2-2(2)
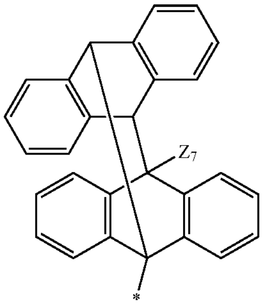
2-2(3)
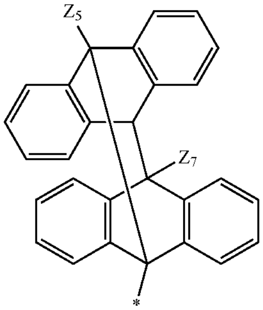
2-2(4)
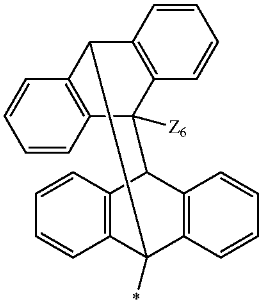
2-2(5)
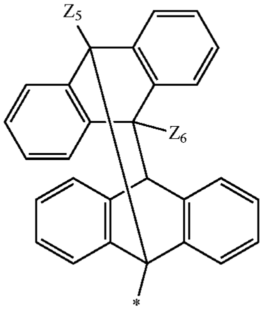

-continued 2-2(6)

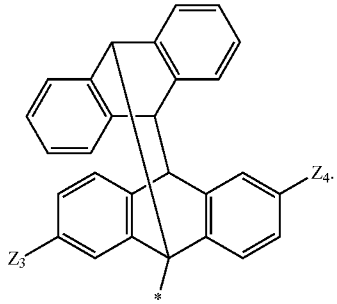

In Formulae 2-1(1) to 2-1(12) and 2-2(1) to 2-2(6), $Z_3$ to $Z_7$ may each be the same as described herein with respect to each of $Z_3$ to $Z_7$, respectively, wherein $Z_3$ to $Z_7$ are each not hydrogen, and

* may indicate a binding site to a neighboring atom in Formula 1.

In one or more embodiments, the organometallic compound represented by Formula 1 may be an organometallic compound represented by Formula 1-1:

Formula 1-1

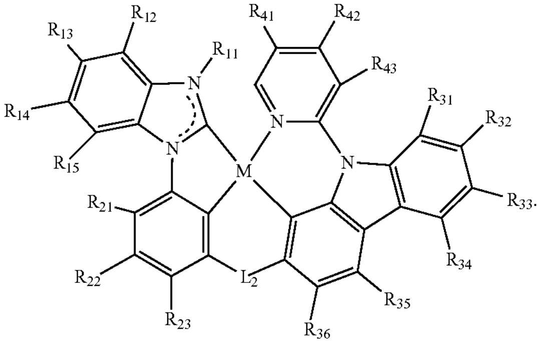

In Formula 1-1, M and $L_2$ may each be the same as described herein with respect to M and $L_2$, respectively, $R_{11}$ to $R_{15}$ may each be the same as described herein with respect to $R_1$, $R_{21}$ to $R_{23}$ may each be the same as described herein with respect to $R_2$, $R_{31}$ to $R_{36}$ may each be the same as described herein with respect to $R_3$, $R_{41}$ to $R_{44}$ may each be the same as described herein with respect to $R_4$, and at least one selected from among $R_{11}$ to $R_{15}$, at least one selected from among $R_{21}$ to $R_{23}$, at least one selected from among $R_{31}$ to $R_{36}$, at least one selected from among $R_{41}$ to $R_{44}$, or any combination thereof may be a group represented by Formula 2-1 or a group represented by Formula 2-2.

In one or more embodiments, in Formula 1-1, $R_{11}$ may be a group represented by Formula 2-1 or a group represented by Formula 2-2.

As the organometallic compound represented by Formula 1 includes a group represented by Formula 2-1 or a group represented by Formula 2-2, by applying the organometallic compound represented by Formula 1 to the emission layer of the light-emitting device, the color purity and emission efficiency may be improved. Accordingly, by utilizing the organometallic compound, an electronic device (for example, an organic light-emitting device) having high color purity, high efficiency, and low driving voltage characteristics may be implemented.

Description of Formulae 2 to 4 b51 to b53 in Formula 2 indicate numbers of $L_{51}$ to $L_{53}$, respectively, and may each be an integer from 1 to 5. When b51 is 2 or more, two or more of $L_{51}$(s) may be identical to or different from each other, when b52 is 2 or more, two or more of $L_{52}$(s) may be identical to or different from each other, and when b53 is 2 or more, two or more of $L_{53}$(s) may be identical to or different from each other. In one or more embodiments, b51 to b53 may each independently be 1 or 2.

$L_{51}$ to $L_{53}$ in Formula 2 may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodihydrodisiline group, a dibenzodihydrosiline group, a dibenzodioxine group, a dibenzooxathiine group, a dibenzooxazine group, a dibenzopyran group, a dibenzodithiine group, a dibenzotiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(═O)($Q_{31}$), —S(═O)$_2$($Q_{31}$), —P(═O)($Q_{31}$)($Q_{32}$), or any combination thereof, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In one or more embodiments, in Formula 2, a bond between $L_{51}$ and $R_{51}$, a bond between $L_{52}$ and $R_{52}$, a bond between $L_{53}$ and $R_{53}$, a bond between two $L_{51}$(s), a bond between two $L_{52}$(s), a bond between two $L_{53}$(s), a bond between $L_{51}$ and carbon between $X_{54}$ and $X_{55}$ in Formula 2, a bond between $L_{52}$ and carbon between $X_{54}$ and $X_{56}$ in Formula 2, and a bond between $L_{53}$ and carbon between $X_{55}$ and $X_{56}$ in Formula 2 may each be a "carbon-carbon single bond".

In Formula 2, $X_{54}$ may be N or $C(R_{54})$, $X_{55}$ may be N or $C(R_{55})$, $X_{56}$ may be N or $C(R_{56})$, and at least one selected from $X_{54}$ to $X_{56}$ may be N. $R_{54}$ to $R_{56}$ may each be the same as described herein. In some embodiments, two or three selected from $X_{54}$ to $X_{56}$ may be N.

$R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in the specification may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$. $Q_1$ to $Q_3$ may each be the same as described herein.

For example, i) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and ii) $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a $—O(Q_{31})$, a $—S(Q_{31})$, a $—Si(Q_{31})(Q_{32})(Q_{33})$, a $—N(Q_{31})(Q_{32})$, a $—B(Q_{31})(Q_{32})$, a $—P(Q_{31})(Q_{32})$, a $—C(=O)(Q_{31})$, a $—S(=O)_2(Q_{31})$, a $—P(=O)(Q_{31})(Q_{32})$, or any combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

Formula 91

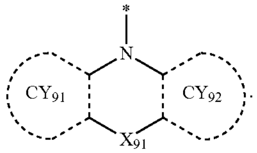

In Formula 91, ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ may respectively be the same as the descriptions of $R_{82}$, $R_{82a}$, and $R_{82b}$ provided herein, $R_{10a}$ may be understood by referring to the description of $R_{10a}$ provided herein, and

* may indicate a binding site to a neighboring atom.

For example, in some embodiments, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, and $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, i) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, and $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and ii) $R_{10a}$ may each independently be hydrogen, deuterium, —F, a cyano group, a nitro group, —$CH_3$, —$CD_3$, —$CD_2H$, —$CDH_2$, —$CF_3$, —$CF_2H$, —$CFH_2$, a group represented by one selected from Formulae 9-1 to 9-19, a group represented by one selected from Formulae 10-1 to 10-246, —$C(Q_1)(Q_2)(Q_3)$, —$Si(Q_1)(Q_2)(Q_3)$, or —$P(=O)(Q_1)(Q_2)$ ($Q_1$ to $Q_3$ may each independently be the same as described in the specification):

9-1

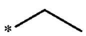

9-2

9-3

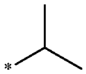

9-4

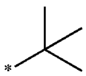

9-5

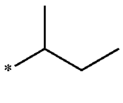

-continued 9-6

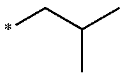

9-7

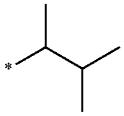

9-8

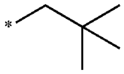

9-9

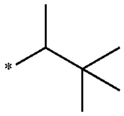

9-10

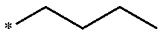

9-11

9-12

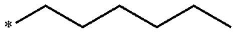

9-13

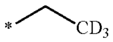

9-14

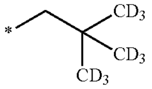

9-15

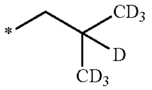

9-16

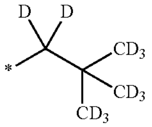

9-17

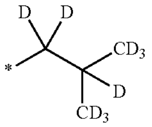

9-18

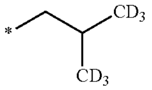

9-19

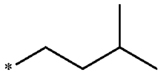

10-1

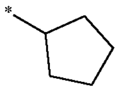

10-2

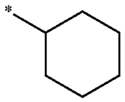

-continued
10-3
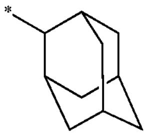
10-4
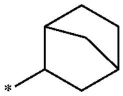
10-5
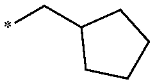
10-6
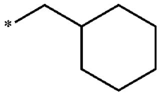
10-7
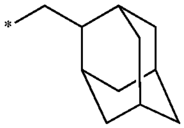
10-8
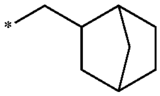
10-9
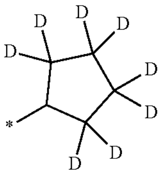
10-10
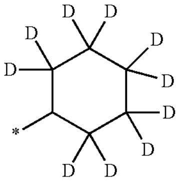
10-11
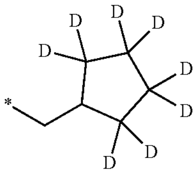
10-12
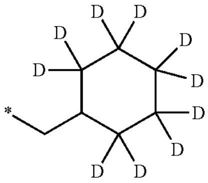
10-13
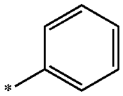
-continued
10-14
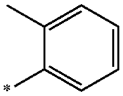
10-15
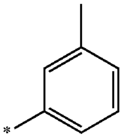
10-16
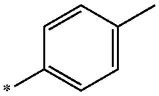
10-17
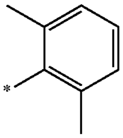
10-18
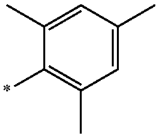
10-19
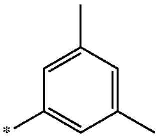
10-20
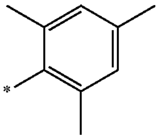
10-21
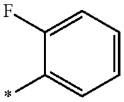
10-22
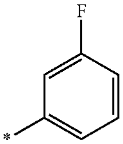
10-23
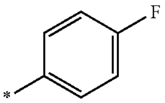
10-24
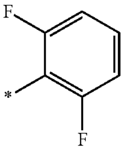

-continued
10-25
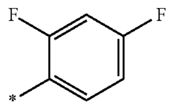
10-26
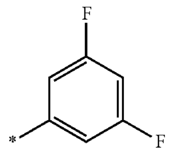
10-27
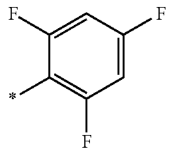
10-28
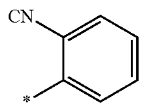
10-29
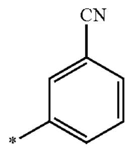
10-30
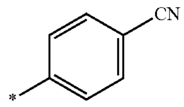
10-31
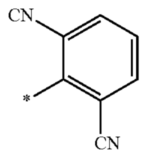
10-32
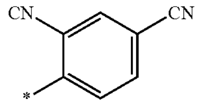
10-33
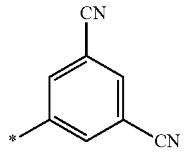
10-34
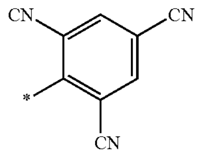
10-35
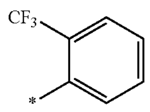
-continued
10-36
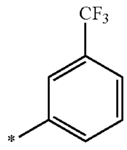
10-37
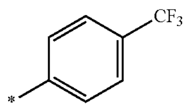
10-38
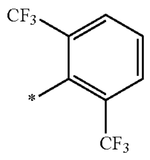
10-39
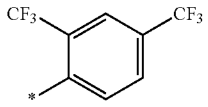
10-40
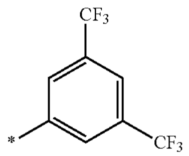
10-41
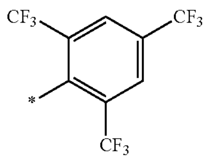
10-42
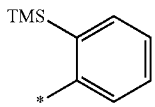
10-43
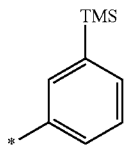
10-44
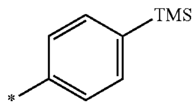
10-45
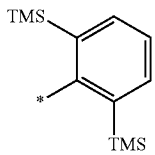
10-46
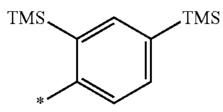

-continued
10-47
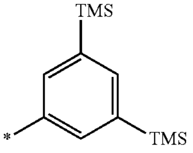
10-48
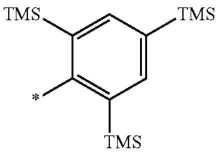
10-49
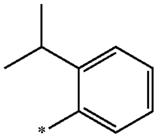
10-50
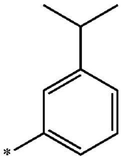
10-51
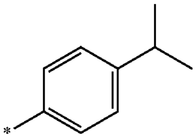
10-52
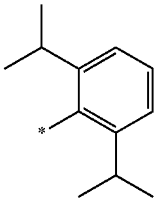
10-53
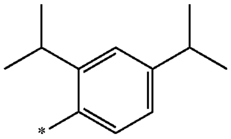
10-54
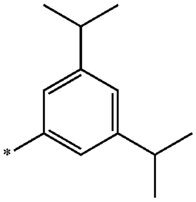
10-55
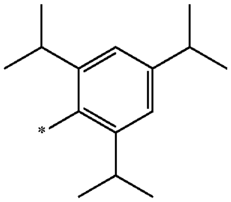
-continued
10-56
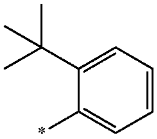
10-57
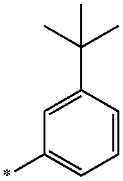
10-58
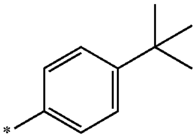
10-59
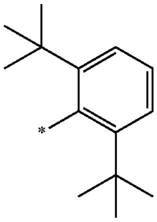
10-60
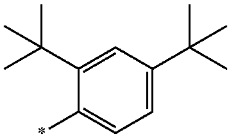
10-61
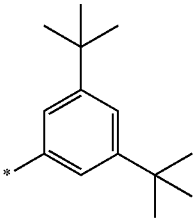
10-62
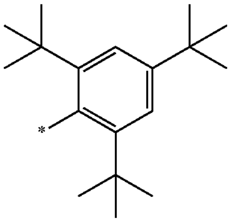
10-63
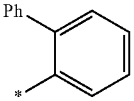
10-64
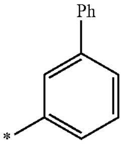

-continued
10-65
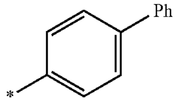
10-66
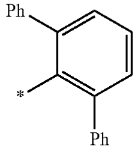
10-67
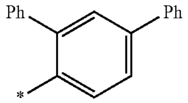
10-68
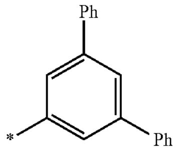
10-69
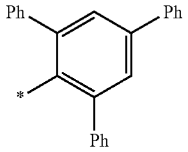
10-70
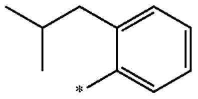
10-71
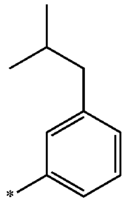
10-72
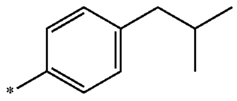
10-73
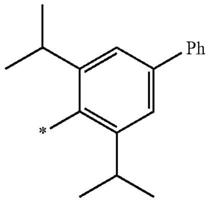
10-74
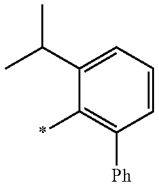
-continued
10-75
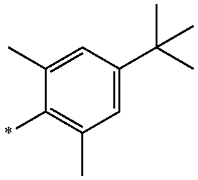
10-76
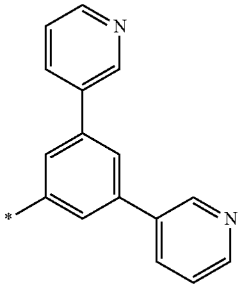
10-77
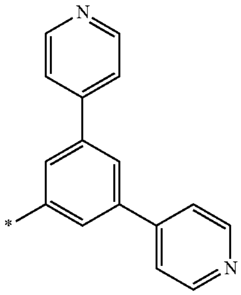
10-78
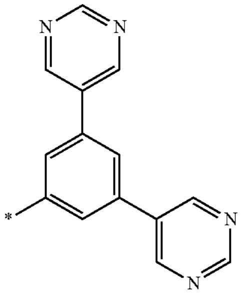
10-79
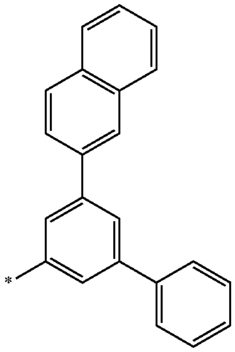

-continued
10-80
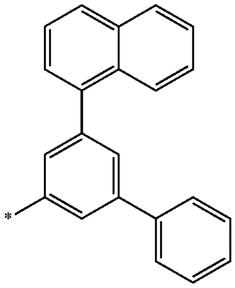
10-81
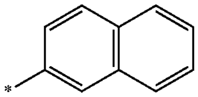
10-82
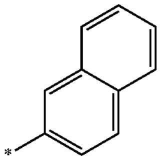
10-83
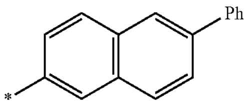
10-84
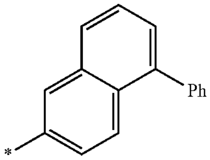
10-85
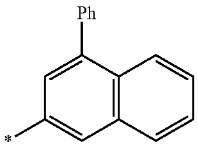
10-86
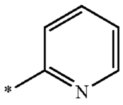
10-87
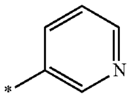
10-88
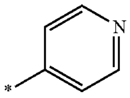
10-89
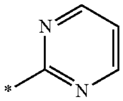
10-90
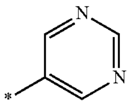
-continued
10-91
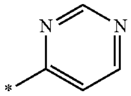
10-92
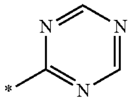
10-93
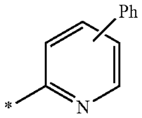
10-94
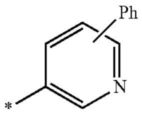
10-95
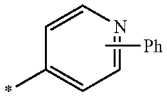
10-96
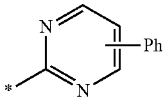
10-97
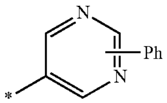
10-98
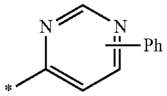
10-99
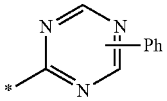
10-100
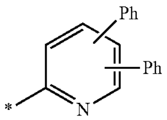
10-101
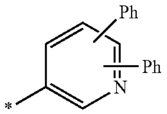
10-102
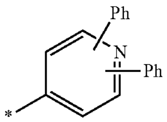
10-103
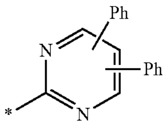

-continued
10-104
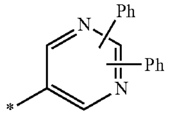
10-105
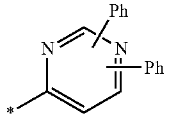
10-106
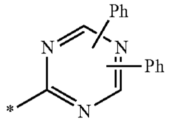
10-107
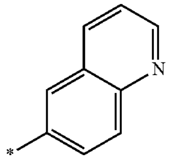
10-108
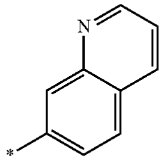
10-109
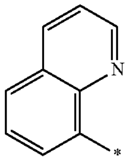
10-110
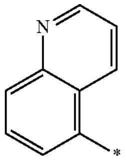
10-111
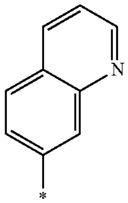
10-112
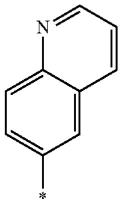
-continued
10-113
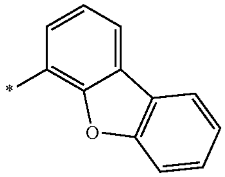
10-114
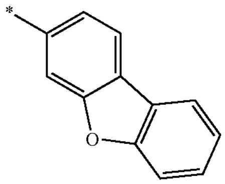
10-115
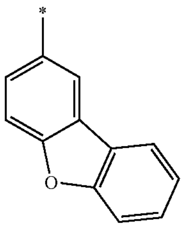
10-116
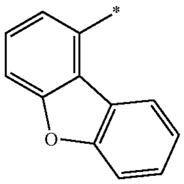
10-117
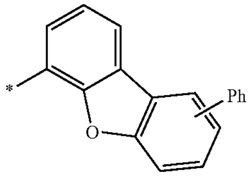
10-118
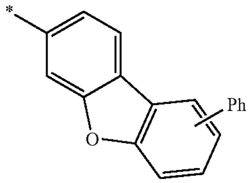
10-119
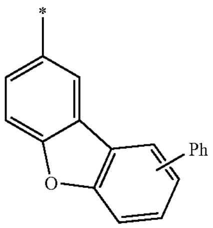
10-120
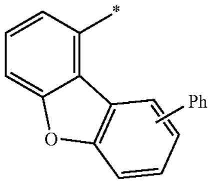

-continued
10-121
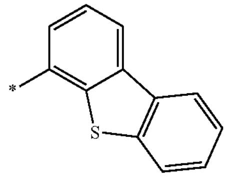
10-122
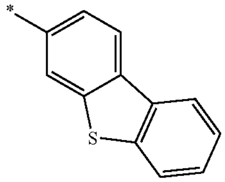
10-123
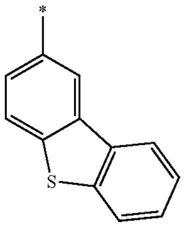
10-124
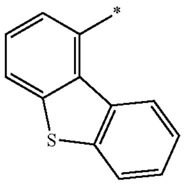
10-125
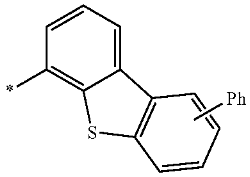
10-126
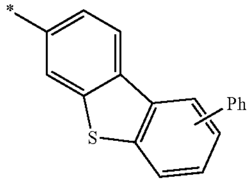
10-127
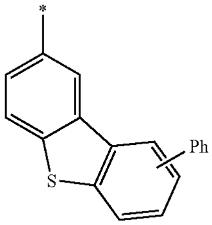
10-128
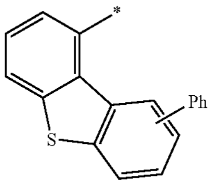
-continued
10-129
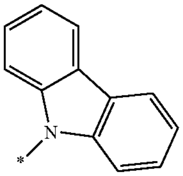
10-130
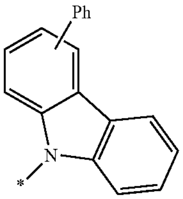
10-131
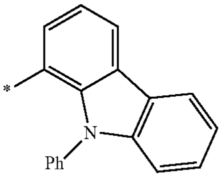
10-132
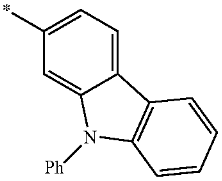
10-133
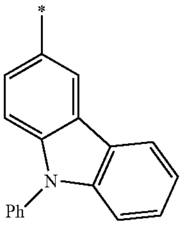
10-134
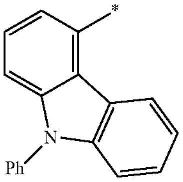
10-135
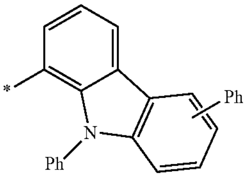
10-136
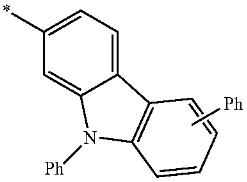

-continued
10-137
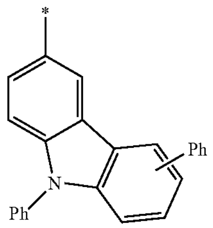
10-138
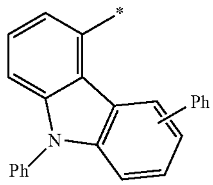
10-139
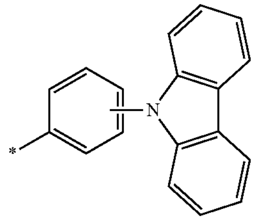
10-140
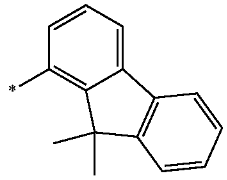
10-141
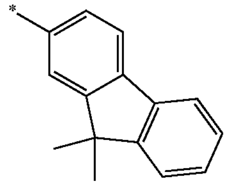
10-142
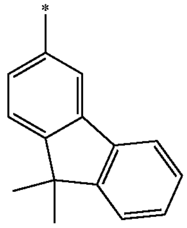
10-143
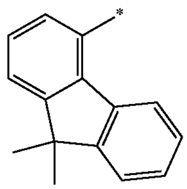
-continued
10-144
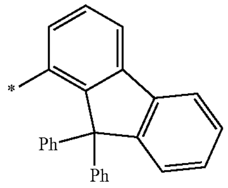
10-145
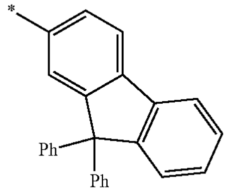
10-146
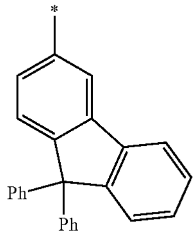
10-147
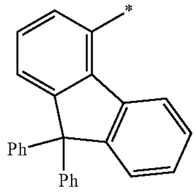
10-148
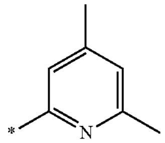
10-149
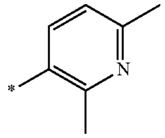
10-150
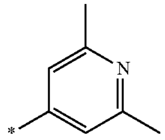
10-151
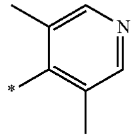
10-152
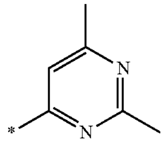

-continued
10-153
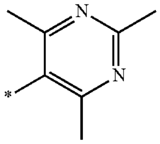
10-154
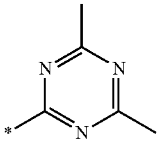
10-155
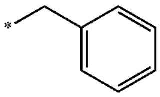
10-156
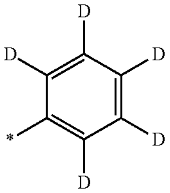
10-157
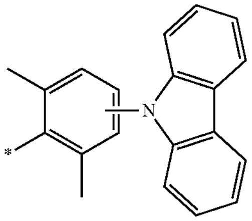
10-158
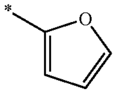
10-159
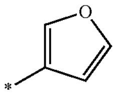
10-160
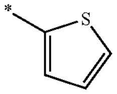
10-161
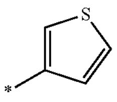
10-162
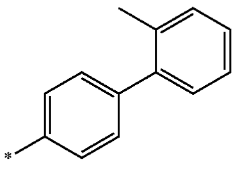
-continued
10-163
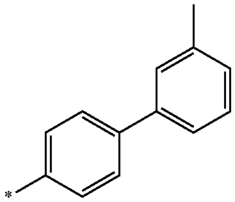
10-164
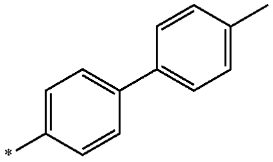
10-165
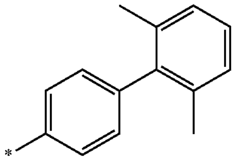
10-166
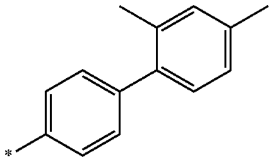
10-167
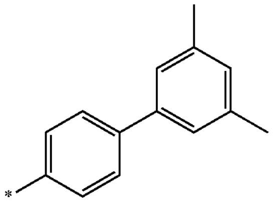
10-168
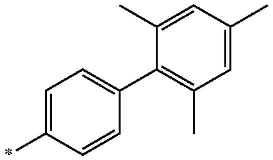
10-169
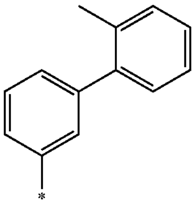
10-170
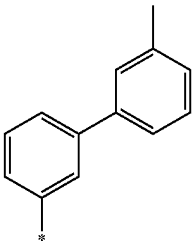

-continued
10-171
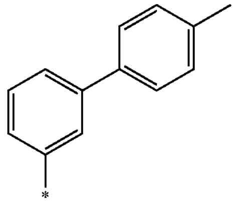
10-172
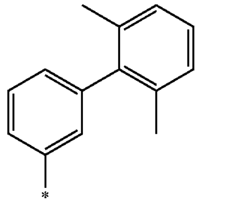
10-173
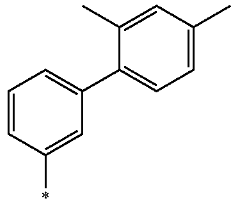
10-174
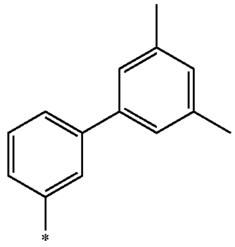
10-175
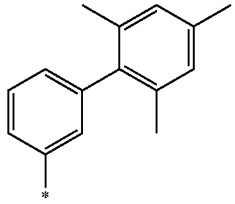
10-176
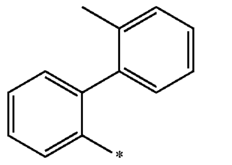
10-177
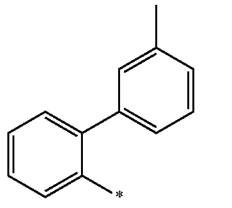
-continued
10-178
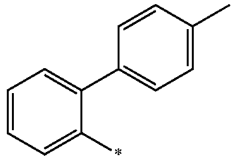
10-179
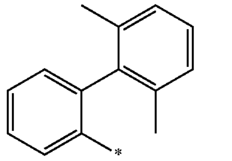
10-180
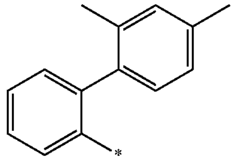
10-181
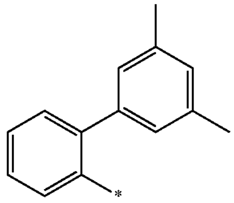
10-182
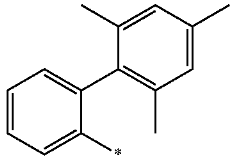
10-183
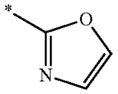
10-184
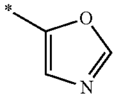
10-185
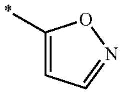
10-186
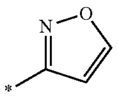
10-187
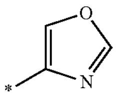
10-188
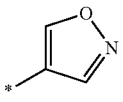

-continued
10-189
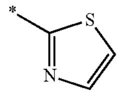
10-190
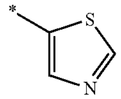
10-191
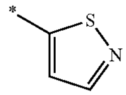
10-192
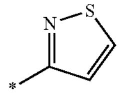
10-193
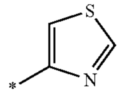
10-194
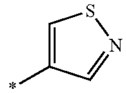
10-195
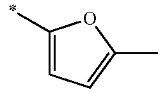
10-196
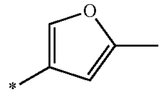
10-197
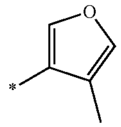
10-198
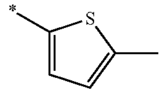
10-199
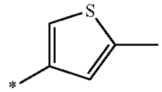
10-200
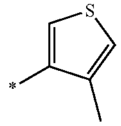
10-201
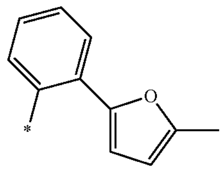
-continued
10-202
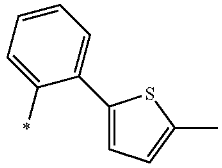
10-203
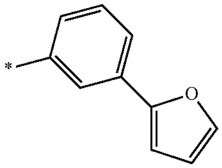
10-204
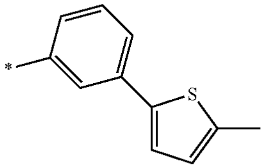
10-205
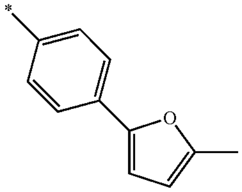
10-206
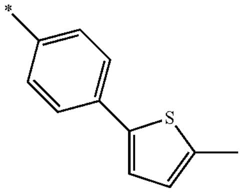
10-207
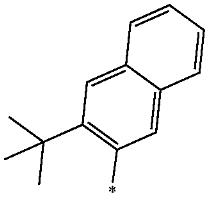
10-208
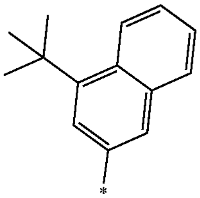
10-209
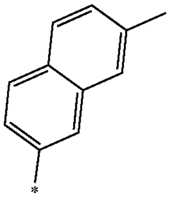

-continued
10-210
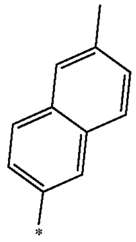
10-211
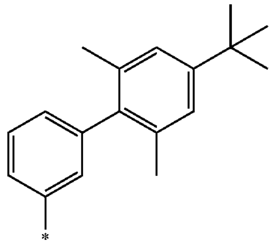
10-212
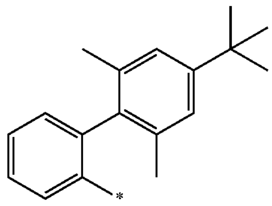
10-213
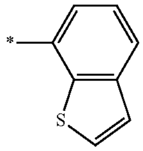
10-214
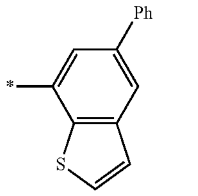
10-215
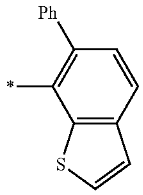
10-216
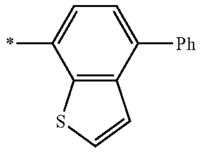
-continued
10-217
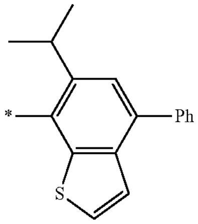
10-219
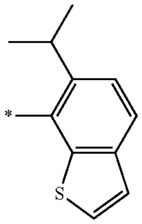
10-220
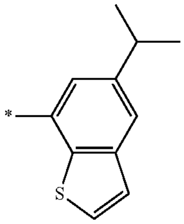
10-221
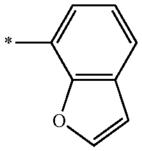
10-222
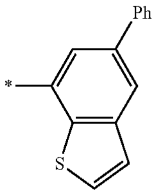
10-223
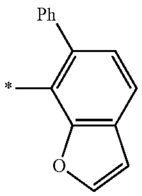
10-224
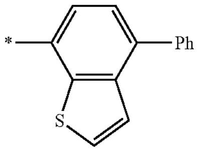

-continued
10-225
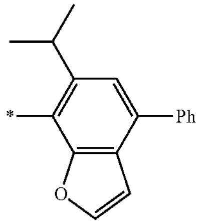
10-226
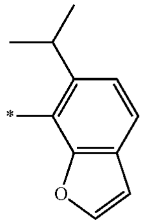
10-227
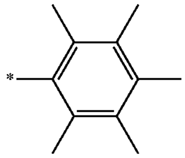
10-228
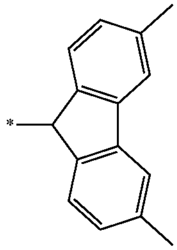
10-229
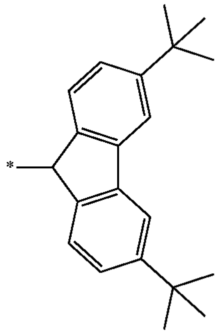
10-230
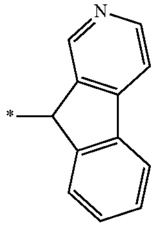
-continued
10-231
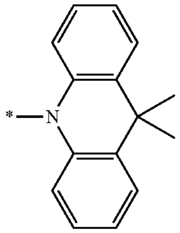
10-232
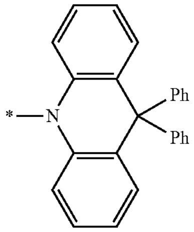
10-233
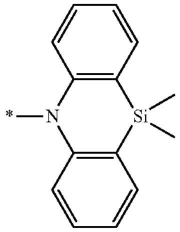
10-234
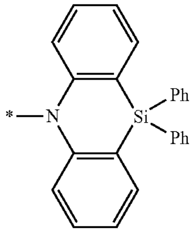
10-235
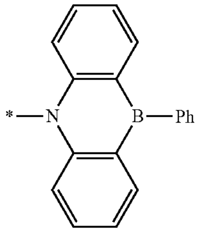
10-236
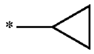
10-267
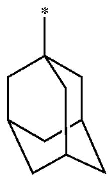

-continued 10-268

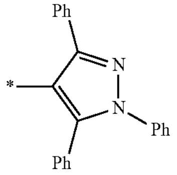

10-239

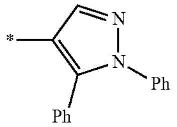

10-240

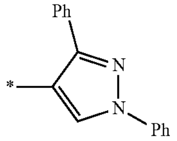

10-241

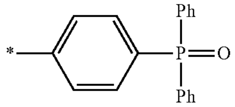

10-242

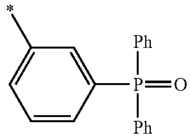

10-243

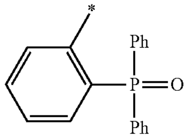

10-244

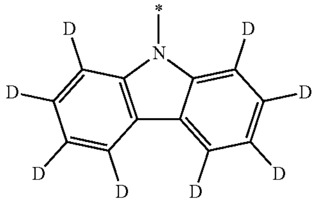

10-245

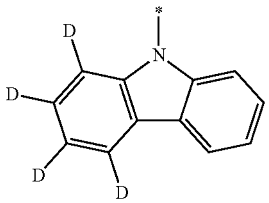

10-246

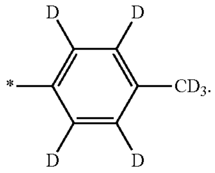

In Formulae 9-1 to 9-19 and 10-1 to 10-246, * indicates a binding site to an adjacent atom, "D" represents deuterium, "Ph" represents a phenyl group, and "TMS" represents a trimethylsilyl group.

In Formulae 3-1 to 3-5, 502, and 503, a71 to a74 and a501 to a504 may respectively indicate the number of $R_{71}$(s) to $R_{74}$(s) and $R_{501}$ (s) to $R_{504}$(s), and a71 to a74 and a501 to a504 may each independently be an integer from 0 to 20. When a71 is 2 or greater, at least two $R_{71}$(s) may be identical to or different from each other, when a72 is 2 or greater, at least two $R_{72}$(s) may be identical to or different from each other, when a73 is 2 or greater, at least two $R_{73}$(s) may be identical to or different from each other, when a74 is 2 or greater, at least two $R_{74}$(s) may be identical to or different from each other, when a501 is 2 or greater, at least two $R_{501}$ (s) may be identical to or different from each other, when a502 is 2 or greater, at least two $R_{502}$(s) may be identical to or different from each other, when a503 is 2 or greater, at least two $R_{503}$(s) may be identical to or different from each other, and when a504 is 2 or greater, at least two $R_{504}$(s) may be identical to or different from each other. In some embodiments, a71 to a74 and a501 to a504 may each independently be an integer from 0 to 8.

In Formula 2, a group represented by $*\text{-}(L_{51})_{b51}\text{-}R_{51}$ and a group represented by $*\text{-}(L_{52})_{b52}\text{-}R_{52}$ may each not be a phenyl group.

In one or more embodiments, a group represented by $*\text{-}(L_{51})_{b51}\text{-}R_{51}$ and a group represented by $*\text{-}(L_{52})_{b52}\text{-}R_{52}$ in Formula 2 may be identical to each other.

In one or more embodiments, a group represented by $*\text{-}(L_{51})_{b51}\text{-}R_{51}$ and a group represented by $*\text{-}(L_{52})_{b52}\text{-}R_{52}$ in Formula 2 may be different from each other.

In one or more embodiments, b51 and b52 in Formula 2 may each be 1, 2, or 3, and $L_{51}$ and $L_{52}$ may each independently be a benzene group, a pyridine group, a pyrimidine group, a pyridazine group, a pyrazine group, or a triazine group, each unsubstituted or substituted with at least one $R_{10a}$.

In one or more embodiments, $R_{51}$ and $R_{52}$ in Formula 2 may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_1$-$C_{60}$ aryloxy group unsubstituted or substituted with at least one $R_{10a}$, a $C_1$-$C_{60}$ arylthio group unsubstituted or substituted with at least one $R_{10a}$, —$C(Q_1)(Q_2)(Q_3)$, or —$Si(Q_1)(Q_2)(Q_3)$, and $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, a group represented by $*\text{-}(L_{51})_{b51}\text{-}R_{51}$ in Formula 2 may be a group represented by one selected from Formulae CY51-1 to CY51-26, and/or a group represented by $*\text{-}(L_{52})_{b52}\text{-}R_{52}$ in Formula 2 may be a group represented by one selected from Formulae CY52-1 to CY52-26, and/or a group represented by $*\text{-}(L_{53})_{b53}\text{-}R_{53}$ in Formula 2 may be a group represented by one selected from Formulae CY53-1 to CY53-27, —$C(Q_1)(Q_2)(Q_3)$, or —$Si(Q_1)(Q_2)(Q_3)$:

CY51-1

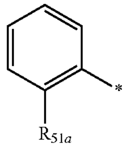

-continued
CY51-2
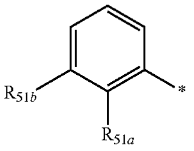
CY51-3
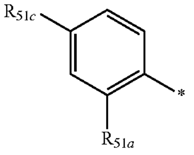
CY51-4
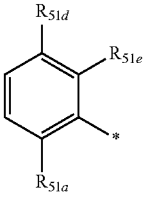
CY51-5
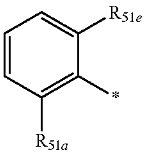
CY51-6
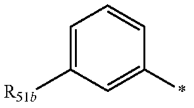
CY51-7
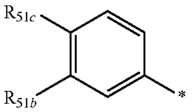
CY51-8
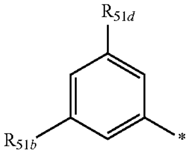
CY51-9
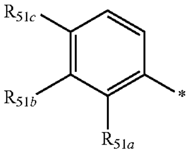
CY51-10
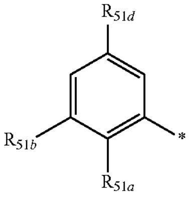
-continued
CY51-11
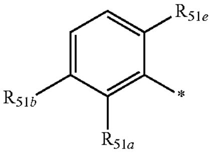
CY51-12
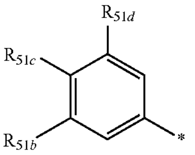
CY51-13
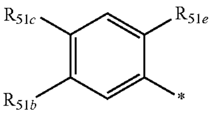
CY51-14
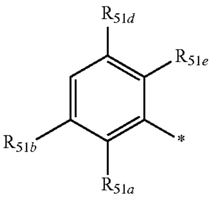
CY51-15
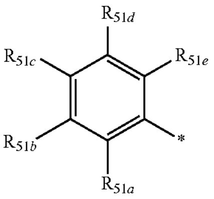
CY51-16
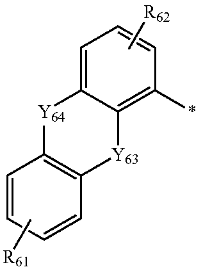
CY51-17
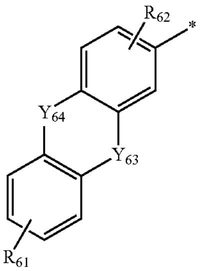

-continued
CY51-18
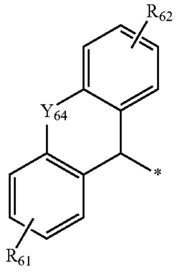
CY51-19
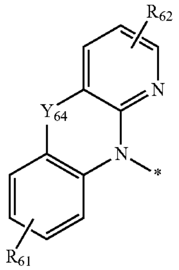
CY51-20
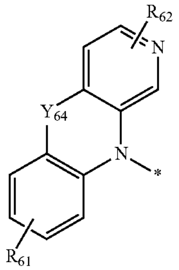
CY51-21
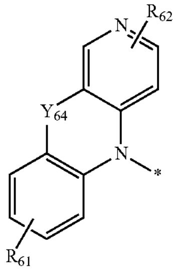
CY51-22
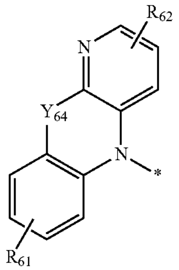
-continued
CY51-23
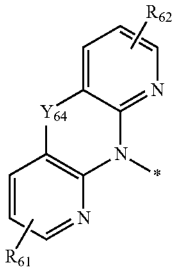
CY51-24
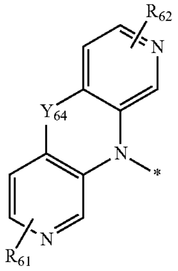
CY51-25
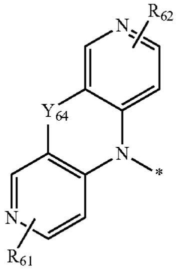
CY51-26
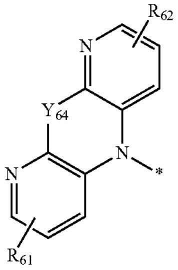
CY52-1
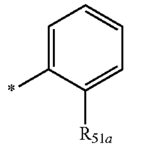
CY52-2
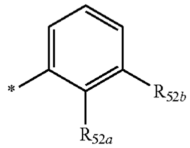
CY52-3
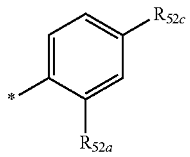

-continued
CY52-4
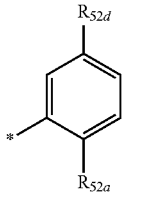
CY52-5
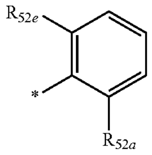
CY52-6
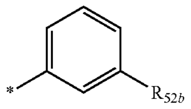
CY52-7
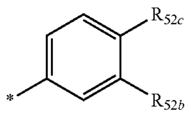
CY52-8
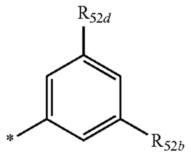
CY52-9
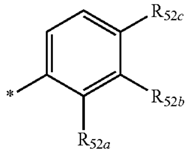
CY52-10
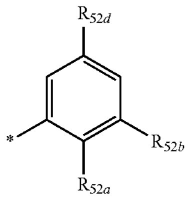
CY52-11
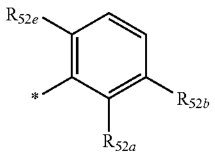
CY52-12
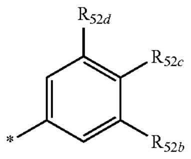
CY52-13
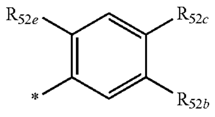
-continued
CY52-14
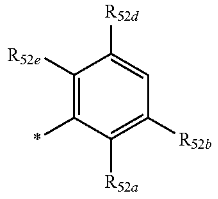
CY52-15
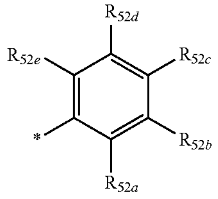
CY52-16
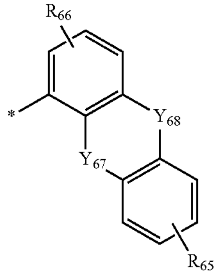
CY52-17
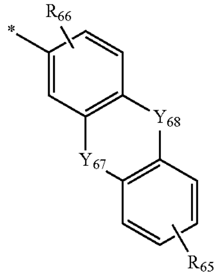
CY52-18
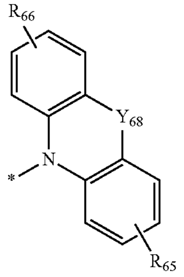
CY52-19
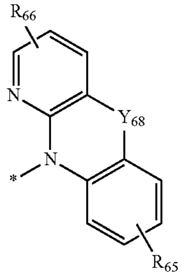

-continued
CY52-20
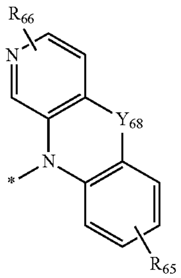
CY52-21
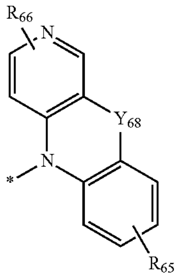
CY52-22
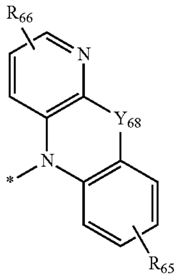
CY52-23
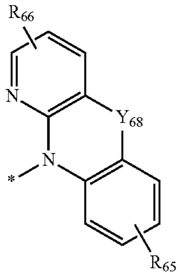
CY52-24
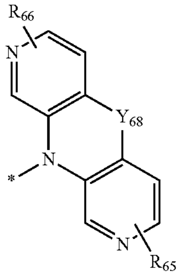
-continued
CY52-25
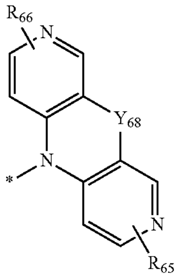
CY52-26
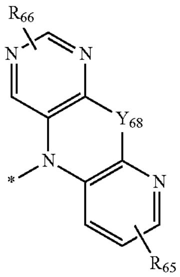
CY53-1
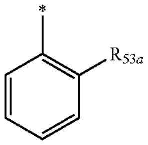
CY53-2
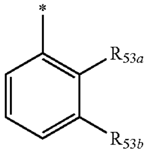
CY53-3
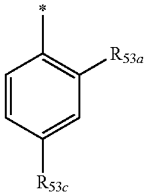
CY53-4
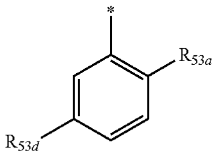
CY53-5
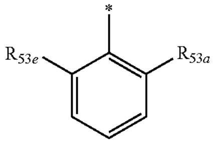
CY53-6
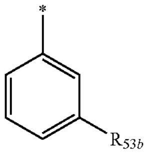

-continued
CY53-7
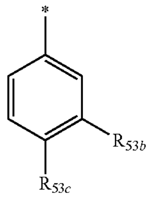
CY53-8
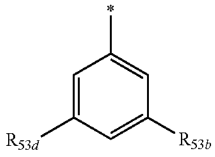
CY53-9
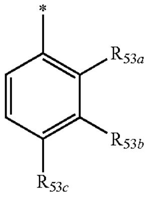
CY53-10
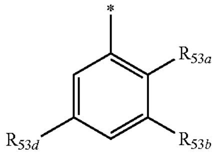
CY53-11
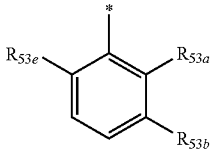
CY53-12
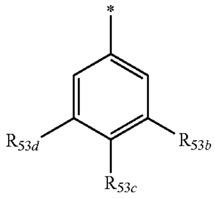
CY53-13
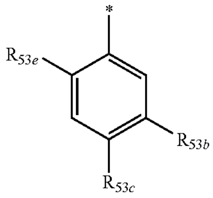
CY53-14
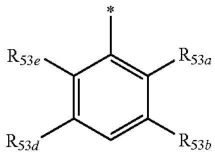
-continued
CY53-15
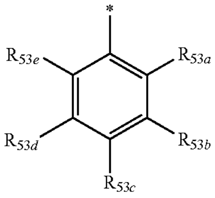
CY53-16
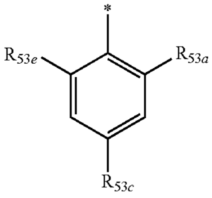
CY53-17
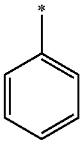
CY53-18
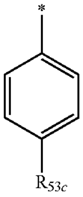
CY53-19
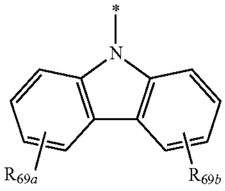
CY53-20
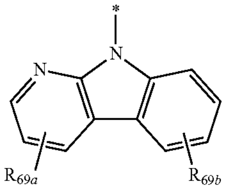
CY53-21
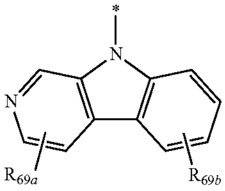
CY53-22
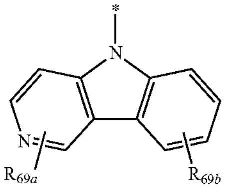

-continued

CY53-23

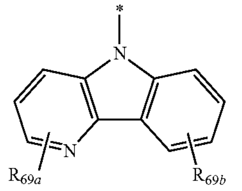

CY53-24

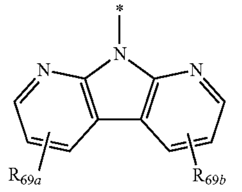

CY53-25

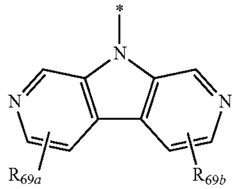

CY53-26

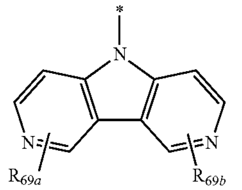

CY53-27

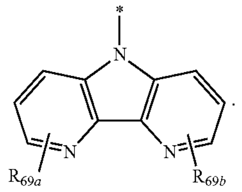

In Formulae CY51-1 to CY51-26, CY52-1 to CY52-26, and CY53-1 to CY53-27, $Y_{63}$ may be a single bond, O, S, $N(R_{63})$, $B(R_{63})$, $C(R_{63a})(R_{63b})$, or $Si(R_{63a})(R_{63b})$, $Y_{64}$ may be a single bond, O, S, $N(R_{64})$, $B(R_{64})$, $C(R_{64a})(R_{64b})$, or $Si(R_{64a})(R_{64b})$, $Y_{67}$ may be a single bond, O, S, $N(R_{67})$, $B(R_{67})$, $C(R_{67a})(R_{67b})$, or $Si(R_{6a})(R_{67})$, $Y_{68}$ may be a single bond, O, S, $N(R_{68})$, $B(R_{68})$, $C(R_{68a})(R_{68b})$, or $Si(R_{68a})(R_{68b})$, each of $Y_{63}$ and $Y_{64}$ in Formulae CY51-16 and CY51-17 may not be a single bond, each of $Y_{67}$ and $Y_{68}$ in Formulae CY52-16 and CY52-17 may not be a single bond, $R_{51a}$ to $R_{51e}$, $R_{61}$ to $R_{64}$, $R_{63a}$, $R_{63b}$, $R_{64a}$, and $R_{64b}$ may each be the same as the description of $R_{51}$, and $R_{51a}$ to $R_{51e}$ may not each be hydrogen, $R_{52a}$ to $R_{52e}$, $R_{65}$ to $R_{68}$, $R_{67a}$, $R_{67b}$, $R_{68a}$, and $R_{68b}$ may each be the same as the description of $R_{52}$, and $R_{52a}$ to $R_{52e}$ may not each be hydrogen, $R_{53a}$ to $R_{53e}$, $R_{69a}$, and $R_{69b}$ may each be the same as the description of $R_{53}$, and $R_{53a}$ to $R_{53e}$ may not each be hydrogen, and

* may indicate a binding site to a neighboring atom.

For example, in some embodiments, $R_{51a}$ to $R_{51e}$ and $R_{52a}$ to $R_{52e}$ in Formulae CY51-1 to CY51-26 and Formulae CY52-1 to 52-26 may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, in Formulae CY51-16 and CY51-17, i) $Y_{63}$ may be O or S and $Y_{64}$ may be $Si(R_{64a})(R_{64b})$, or ii) $Y_{63}$ may be $Si(R_{63a})(R_{63b})$ and $Y_{64}$ may be O or S, and in Formulae CY52-16 and CY52-17, i) $Y_{67}$ may be O or S, and Yes may be $Si(R_{68a})(R_{68b})$, or ii) $Y_{67}$ may be $Si(R_{67a})(R_{67b})$, and Yes may be O or S.

In Formulae 3-1 to 3-5, $L_{81}$ to $L_{85}$ may each independently be:

a single bond;

*—$C(Q_4)(Q_5)$-*' or *—$Si(Q_4)(Q_5)$-*'; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof, and $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In some embodiments, in Formulae 3-1 and 3-2, a group represented by

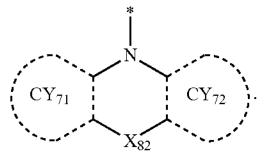

may be represented by one selected from Formulae CY71-1(1) to CY71-1(8), and/or in Formulae 3-1 and 3-3, a group represented by

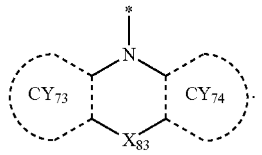

may be represented by one selected from Formulae CY71-2(1) to CY71-2(8), and/or in Formulae 3-2 and 3-4, a group represented by

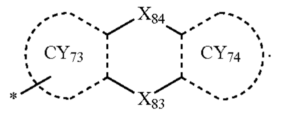

may be represented by one selected from Formulae CY71-31) to CY71-3(32), and/or in Formulae 3-3 to 3-5, a group represented by

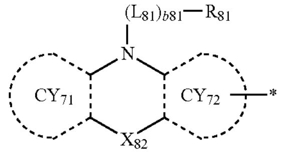

may be represented by one selected from Formulae CY71-4(1) to CY71-4(32), and/or in Formula 3-5, a group represented by

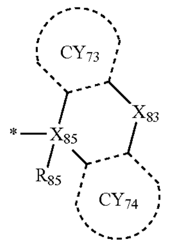

may be represented by one selected from Formulae CY71-5(1) to CY71-5(8):

CY71-1(1)

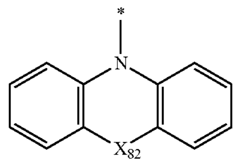

-continued
CY71-1(2)
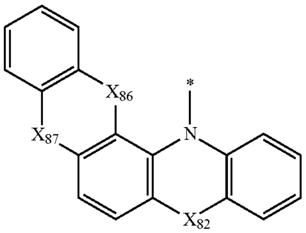
CY71-1(3)
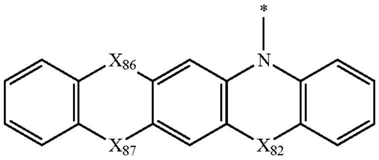
CY71-1(4)
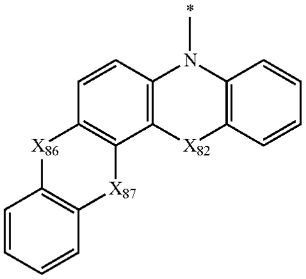
CY71-1(5)
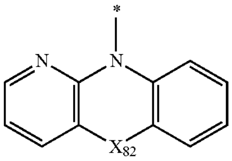
CY71-1(6)
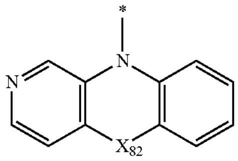
CY71-1(7)
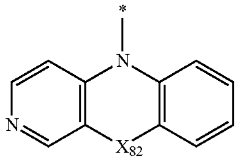
CY71-1(8)
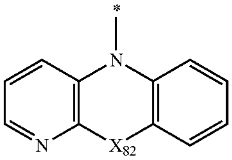
CY71-2(1)
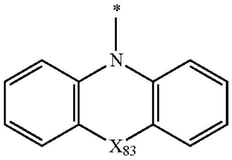
-continued
CY71-2(2)
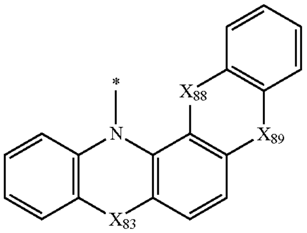
CY71-2(3)
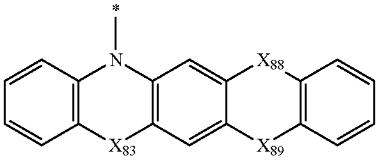
CY71-2(4)
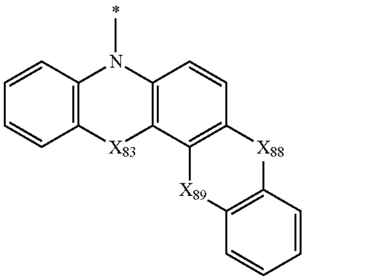
CY71-2(5)
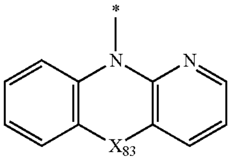
CY71-2(6)
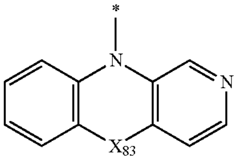
CY71-2(7)
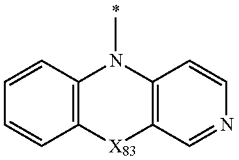
CY71-2(8)
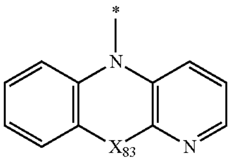
CY71-3(1)
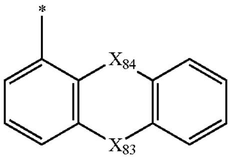

-continued
CY71-3(2)
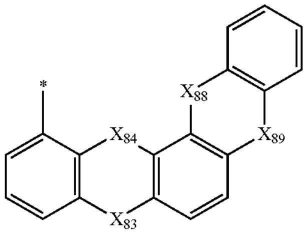
CY71-3(3)
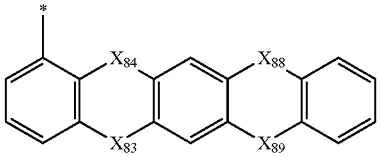
CY71-3(4)
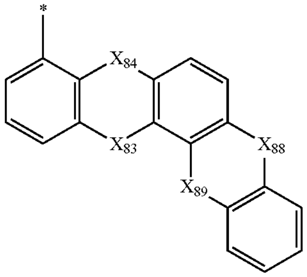
CY71-3(5)
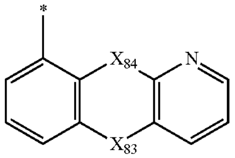
CY71-3(6)
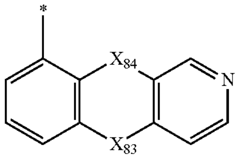
CY71-3(7)
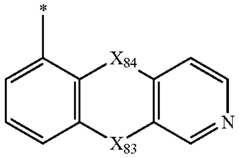
CY71-3(8)
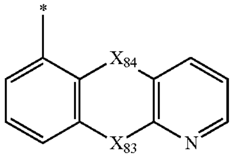
CY71-3(9)
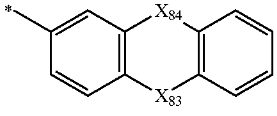
-continued
CY71-3(10)
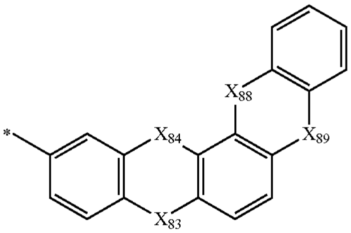
CY71-3(11)
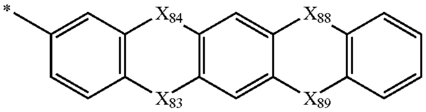
CY71-3(12)
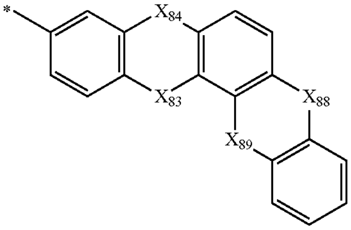
CY71-3(13)
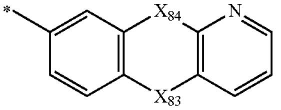
CY71-3(14)
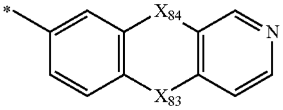
CY71-3(15)
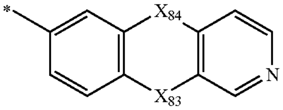
CY71-3(16)
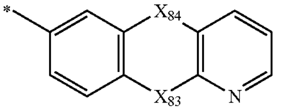
CY71-3(17)
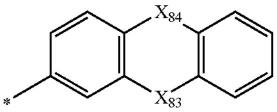
CY71-3(18)
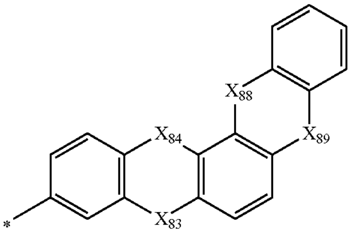

-continued
CY71-3(19)
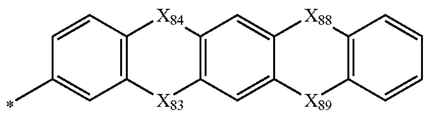
CY71-3(20)
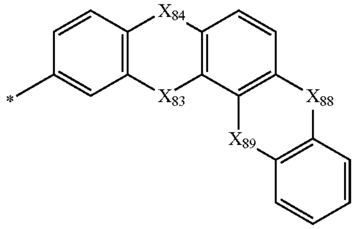
CY71-3(21)
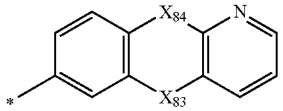
CY71-3(22)
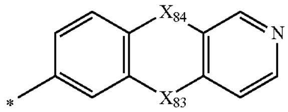
CY71-3(23)
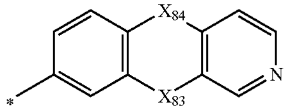
CY71-3(24)
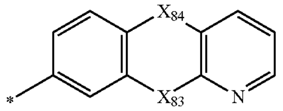
CY71-3(25)
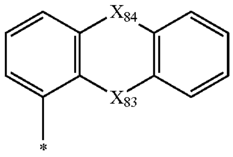
CY71-3(26)
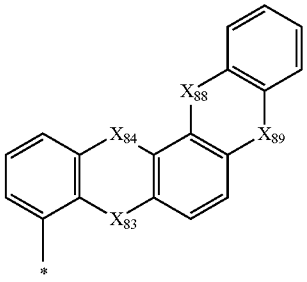
CY71-3(27)
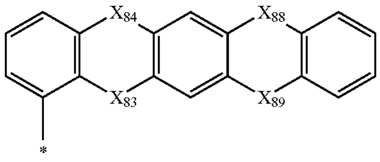
-continued
CY71-3(28)
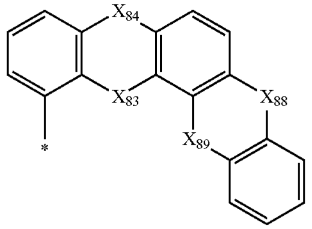
CY71-3(29)
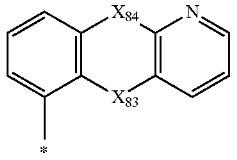
CY71-3(30)
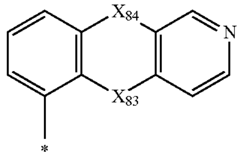
CY71-3(31)
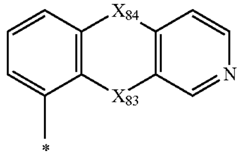
CY71-3(32)
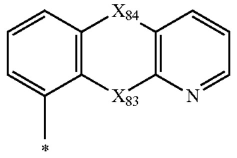
CY71-4(1)
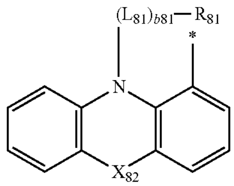
CY71-4(2)
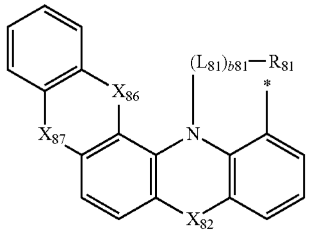
CY71-4(3)
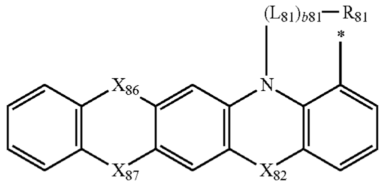

-continued
CY71-4(4)
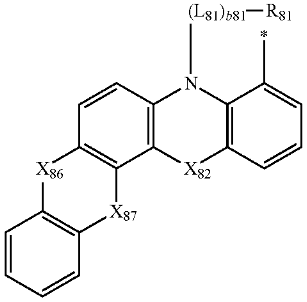
CY71-4(5)
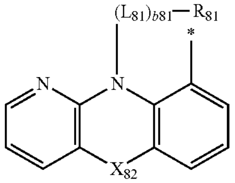
CY71-4(6)
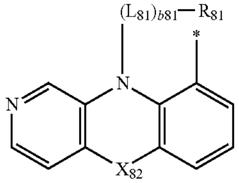
CY71-3(7)
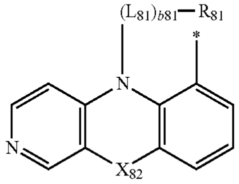
CY71-3(8)
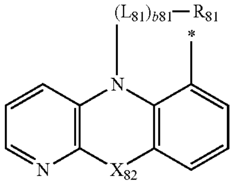
CY71-4(9)
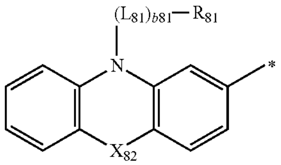
CY71-4(10)
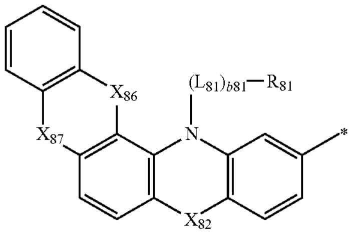
-continued
CY71-4(11)
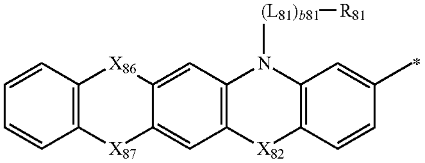
CY71-4(12)
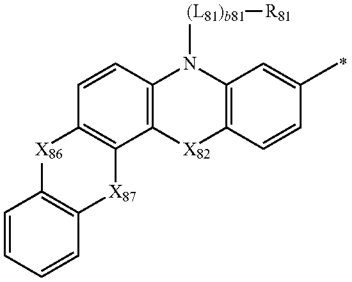
CY71-4(13)
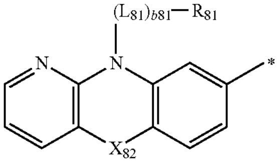
CY71-4(14)
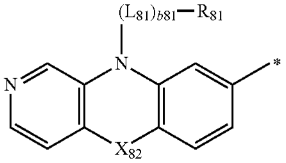
CY71-4(15)
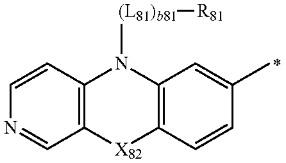
CY71-4(16)
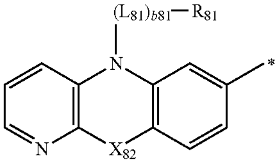
CY71-4(17)
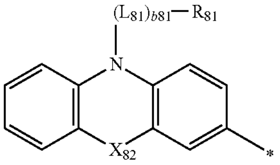
CY71-4(18)
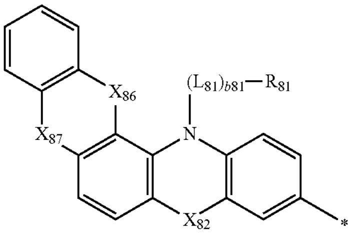

-continued
CY71-4(19)
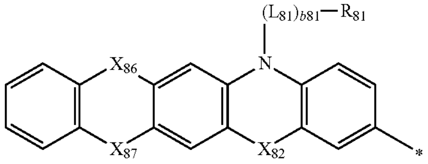
CY71-4(20)
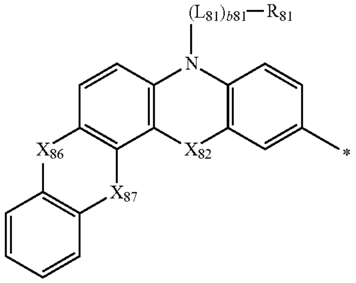
CY71-4(21)
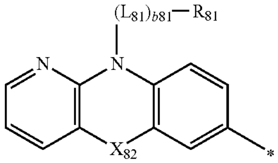
CY71-4(22)
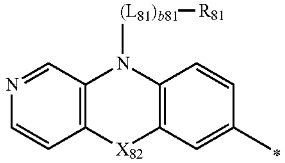
CY71-4(23)
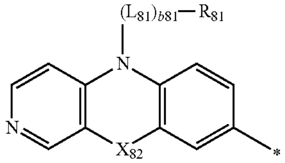
CY71-4(24)
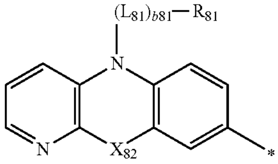
CY71-4(25)
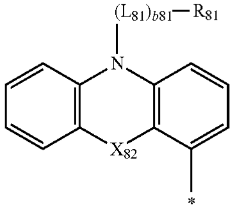
-continued
CY71-4(26)
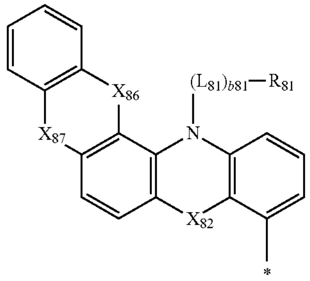
CY71-4(27)
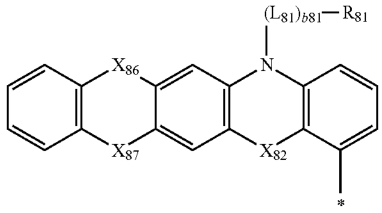
CY71-4(28)
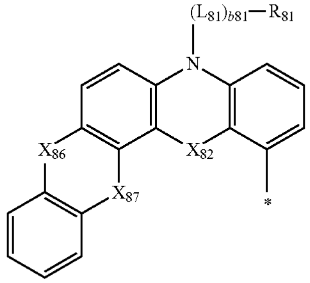
CY71-4(29)
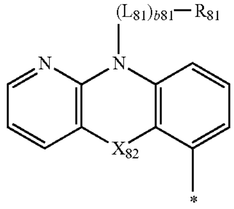
CY71-4(30)
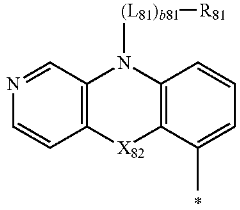
CY71-4(31)
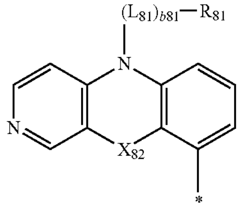

-continued

CY71-4(32)

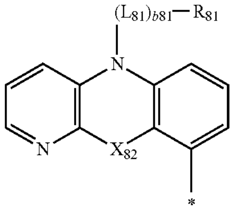

CY71-5(1)

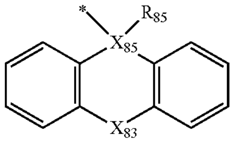

CY71-5(2)

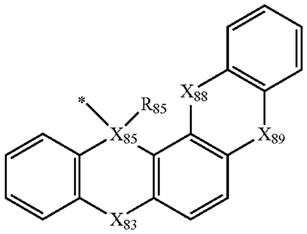

CY71-5(3)

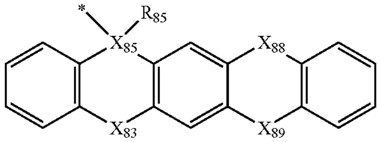

CY71-5(4)

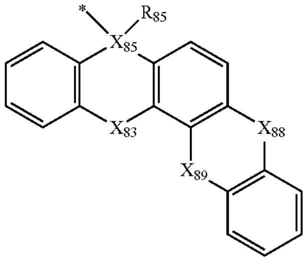

CY71-5(5)

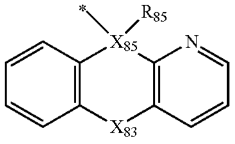

-continued

CY71-5(6)

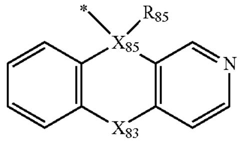

CY71-5(7)

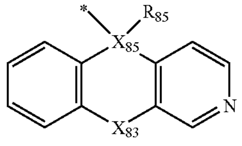

CY71-5(8)

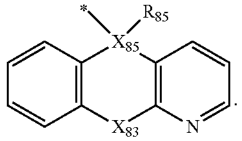

In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{85}$, $L_{81}$, b81, $R_{81}$, and $R_{85}$ may respectively be understood by referring to the descriptions of $X_{81}$ to $X_{85}$, $L_{81}$, b81, $R_{81}$, and $R_{85}$ provided herein, $X_{86}$ may be a single bond, O, S, $N(R_{86})$, $B(R_{86})$, $C(R_{86a})(R_{86b})$, or $Si(R_{86a})(R_{86b})$, $X_{87}$ may be a single bond, O, S, $N(R_{87})$, $B(R_{87})$, $C(R_{87a})(R_{87b})$, or $Si(R_{87a})(R_{87b})$, and in Formulae CY71-1(1) to CY71-1(8) and CY71-4(1) to CY71-4(32), $X_{86}$ and $X_{87}$ may not be a single bond at the same time, $X_{88}$ may be a single bond, O, S, $N(R_{88})$, $B(R_{88})$, $C(R_{88a})(R_{88b})$, or $Si(R_{88a})(R_{88b})$, $X_{89}$ may be a single bond, O, S, $N(R_{89})$, $B(R_{89})$, $C(R_{89a})(R_{89b})$, or $Si(R_{89a})(R_{89b})$, in Formulae CY71-2(1) to CY71-2(8), CY71-3(1) to CY71-3(32), and CY71-5(1) to CY71-5(8), $X_{88}$ and $X_{89}$ may not be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{88b}$ may each be the same as the description of $R_{81}$ provided herein.

Examples of Compounds

In one or more embodiments, the organometallic compound represented by Formula my be one selected from among Compounds 1 to 72:

1
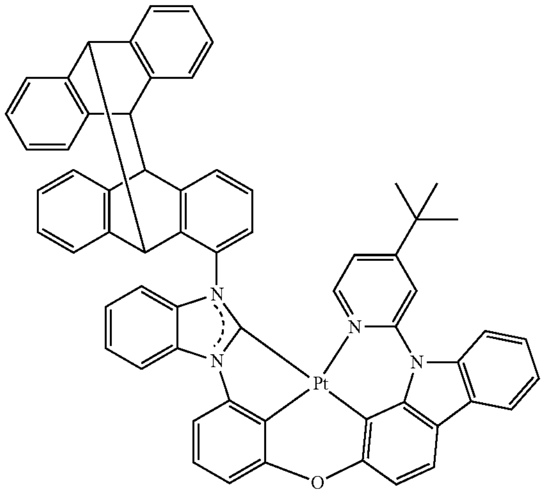
2
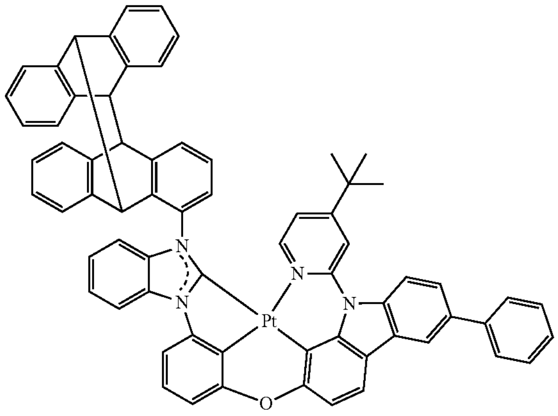
3
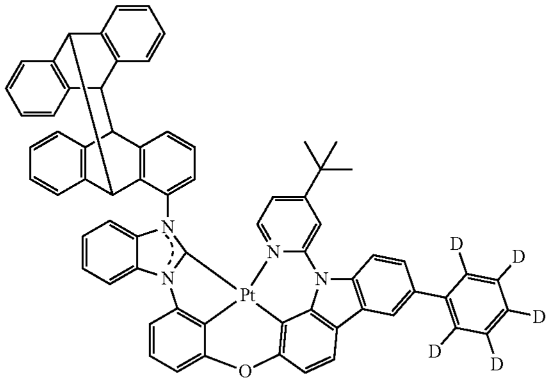
4
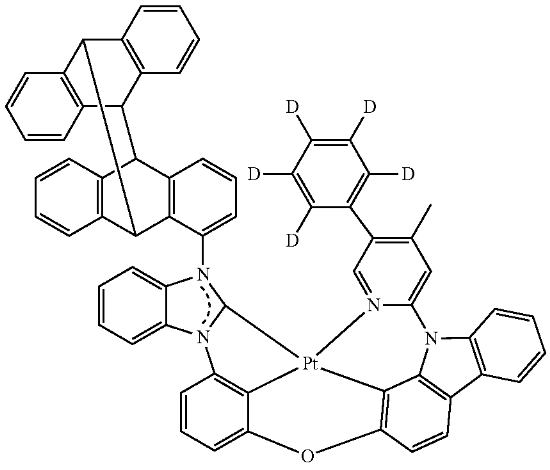
5
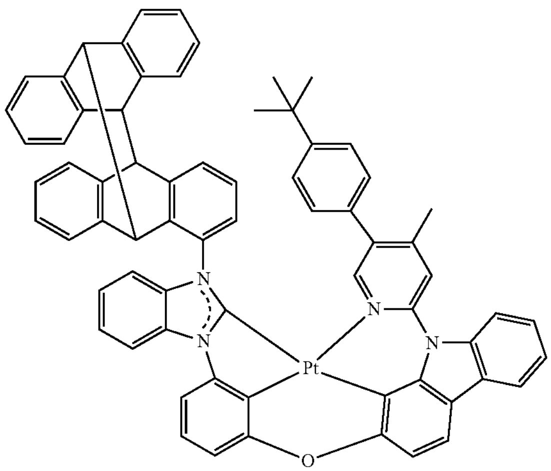
6
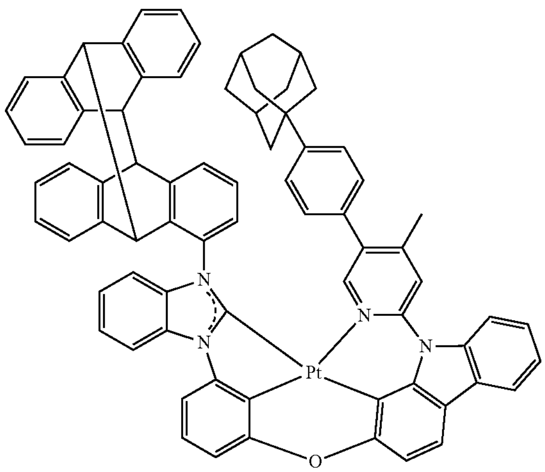

-continued
7
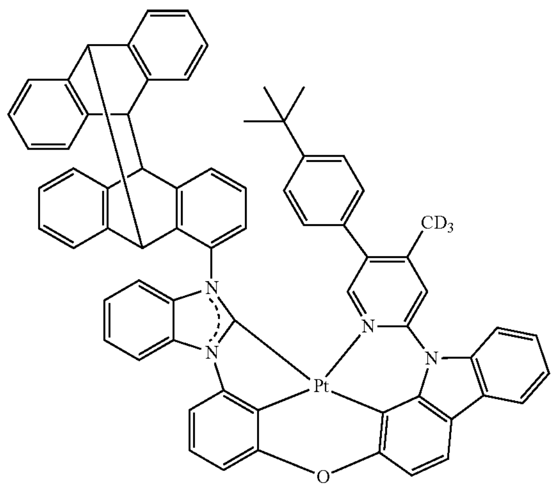
8
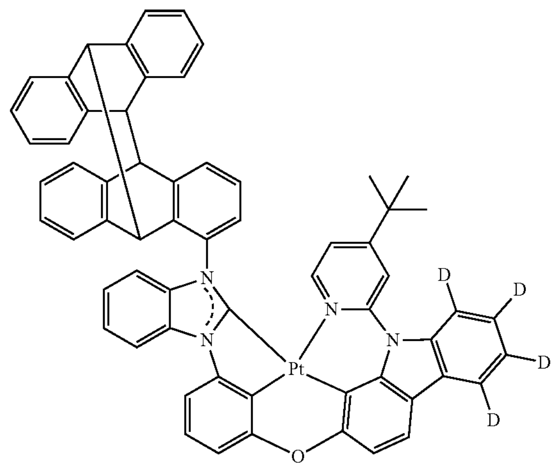
9
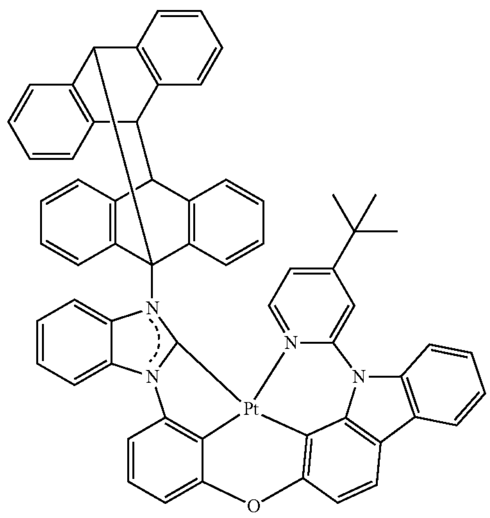
10
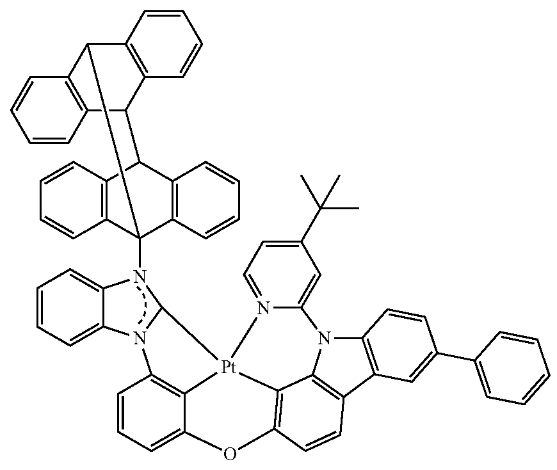
11
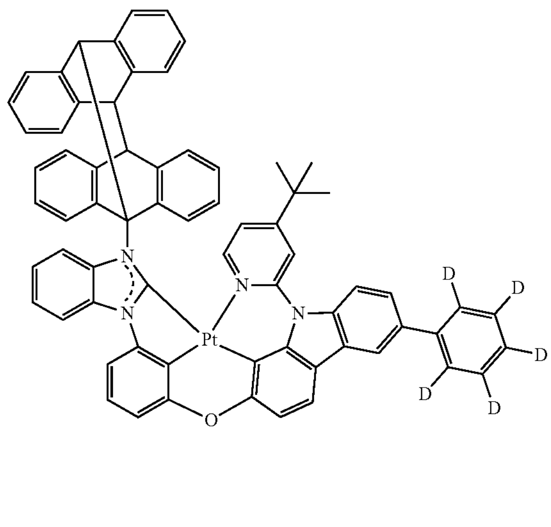
12
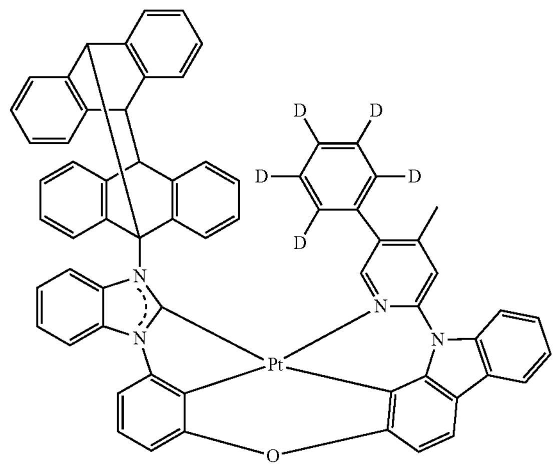

-continued
13
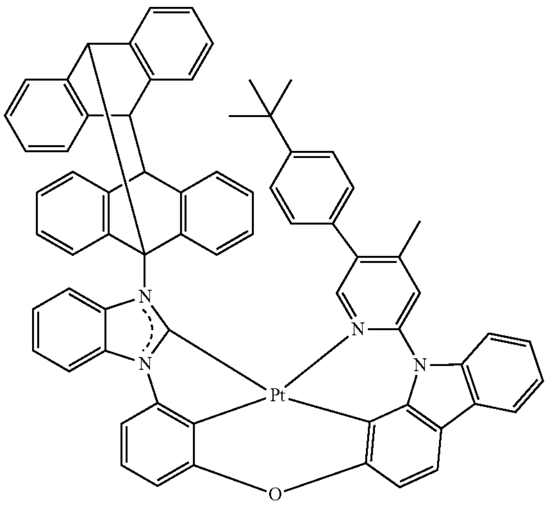
14
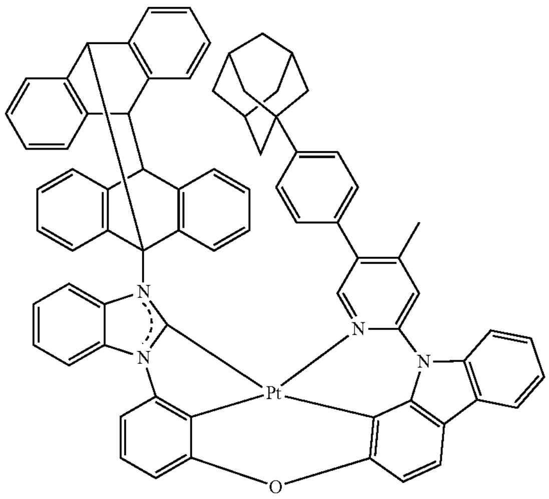
15
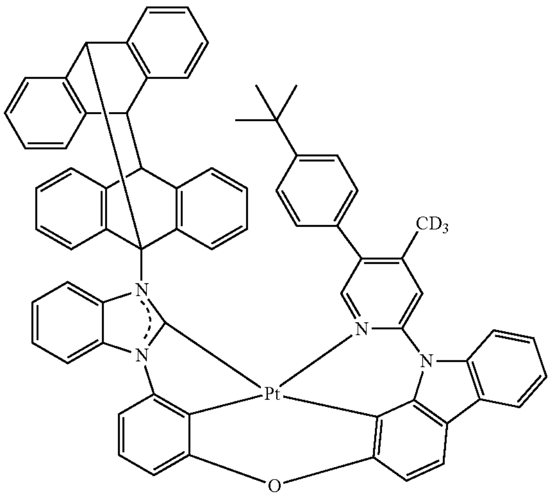
16
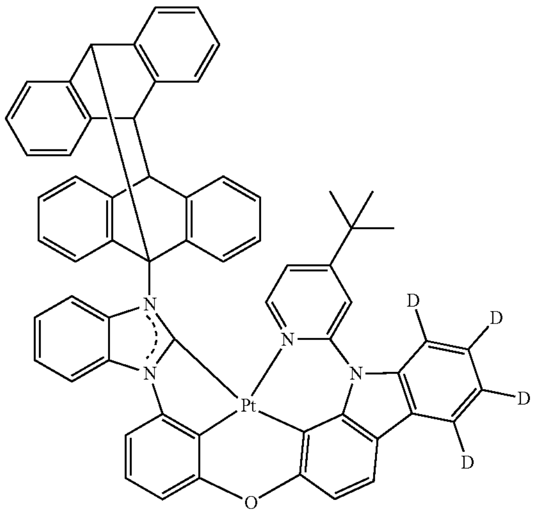
17
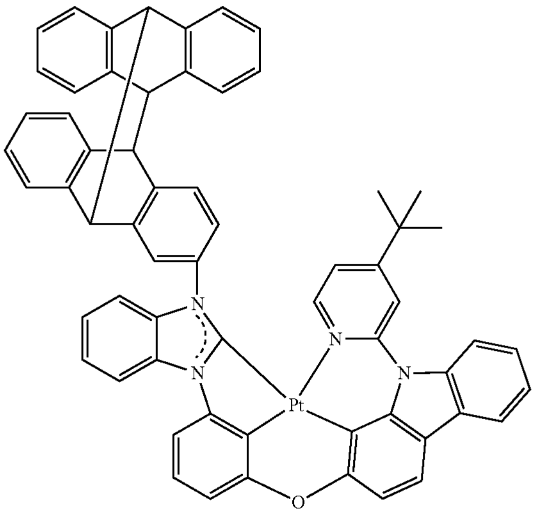
18
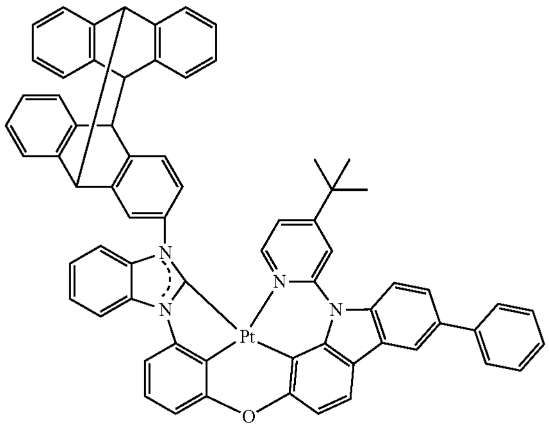

-continued
19
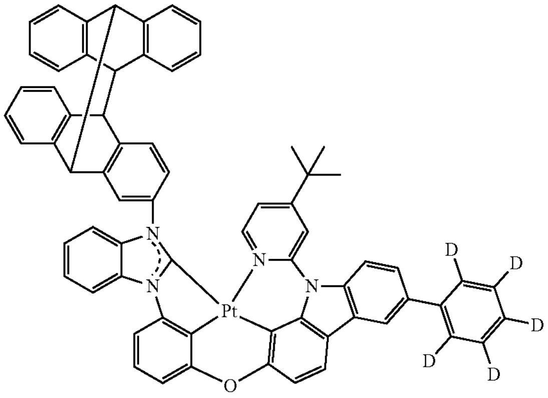
20
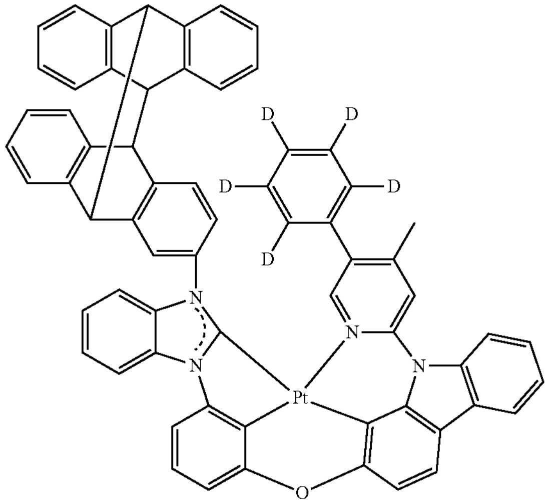
21
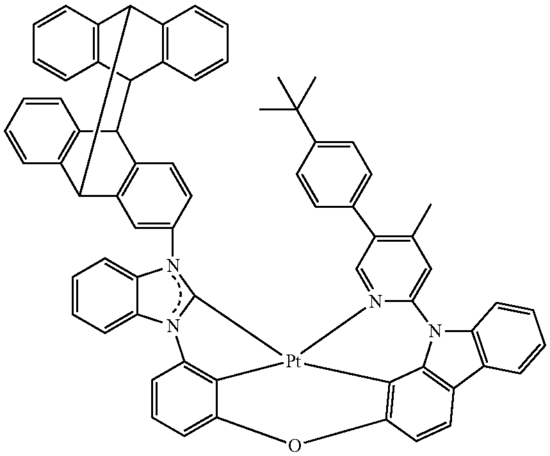
22
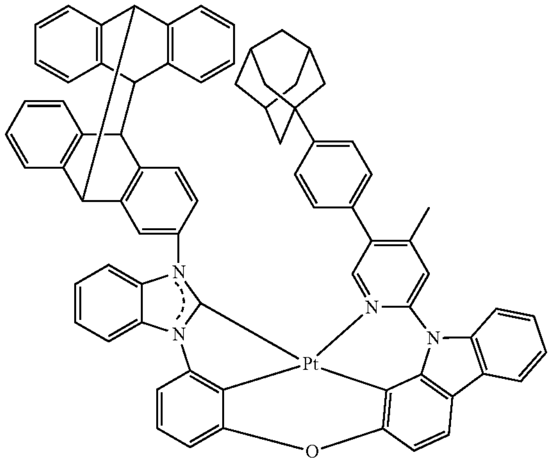
23
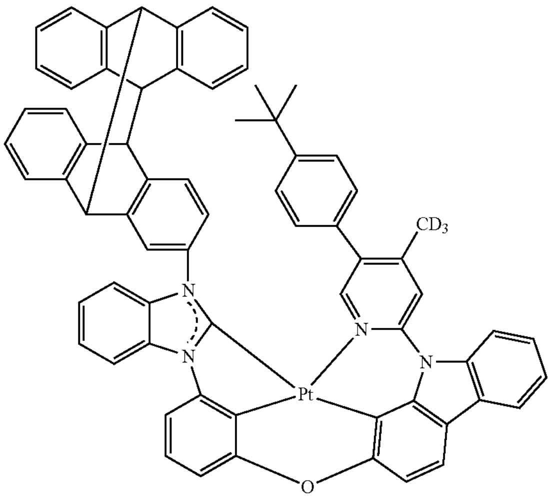
24
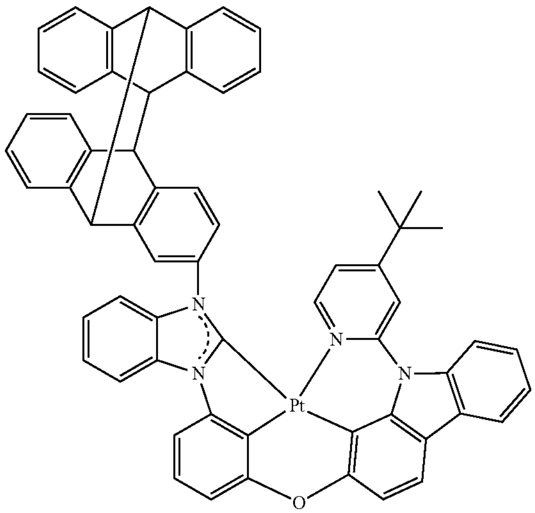

-continued
25
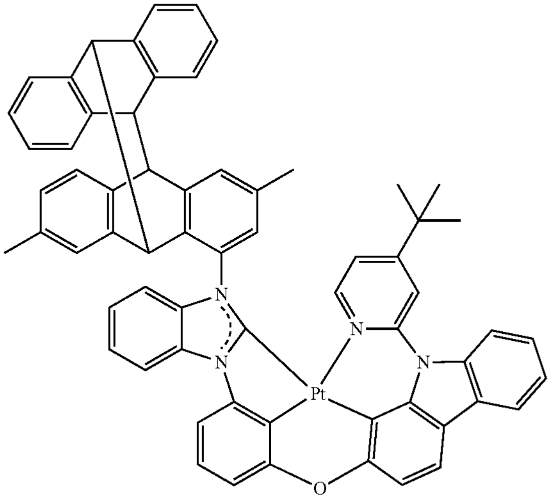
26
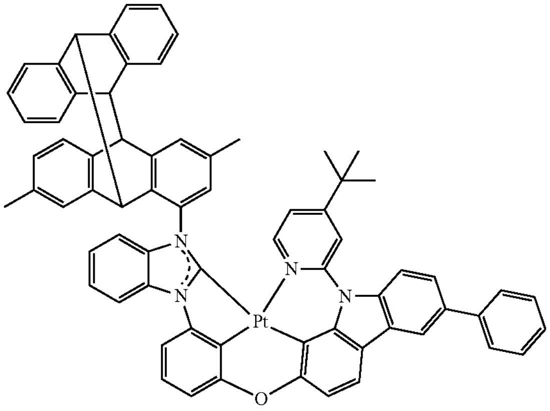
27
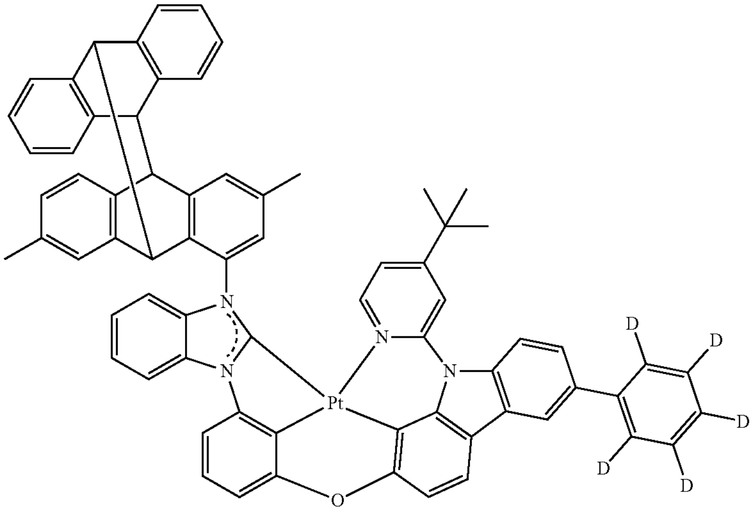
28
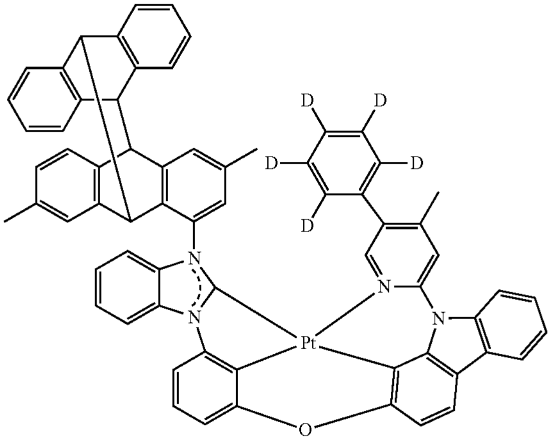
29
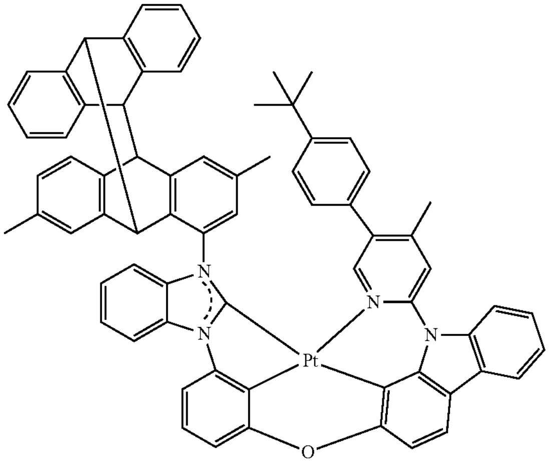

-continued
30
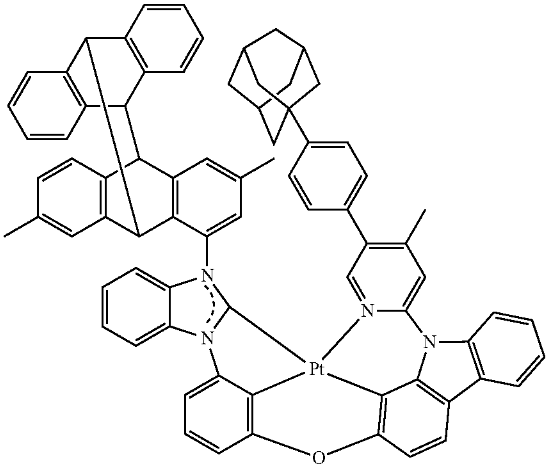
31
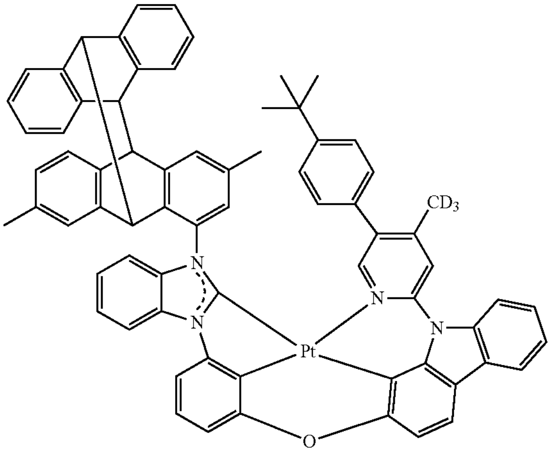
32
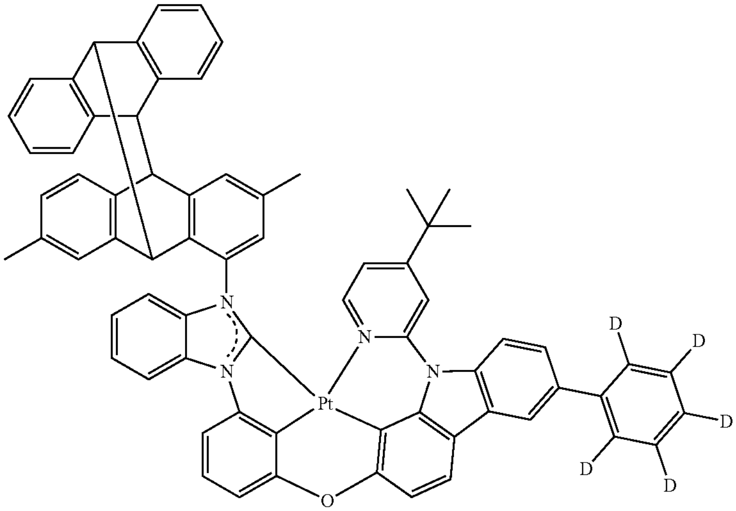
33
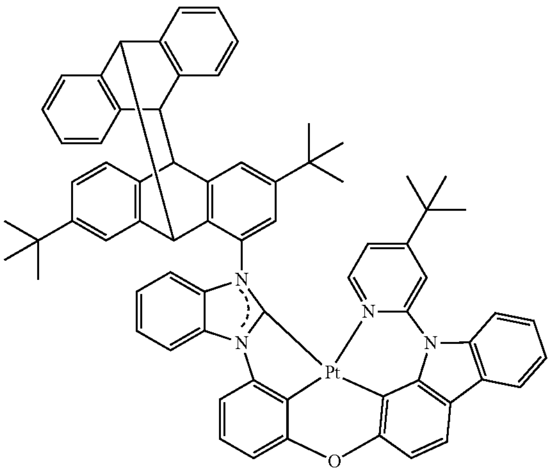
34
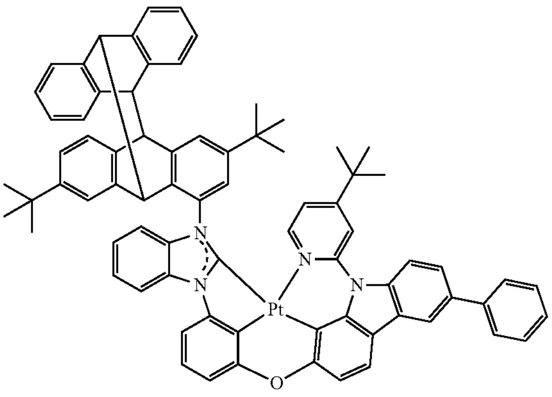

-continued
35
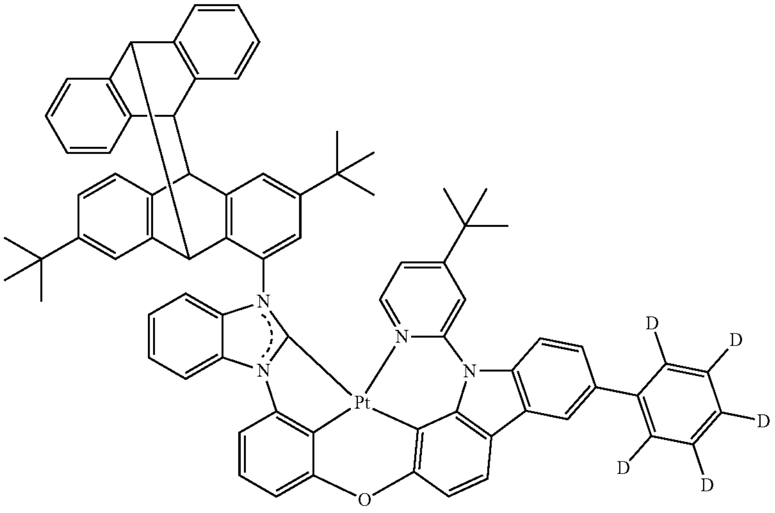
36
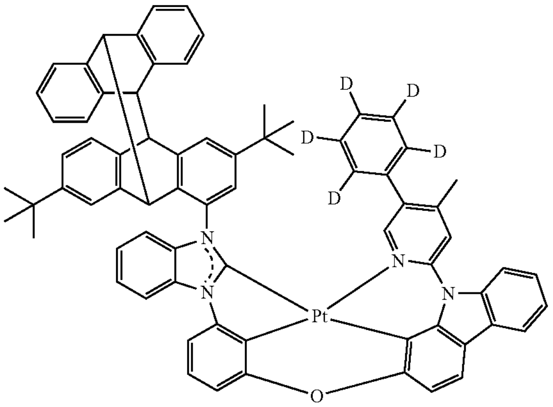
37
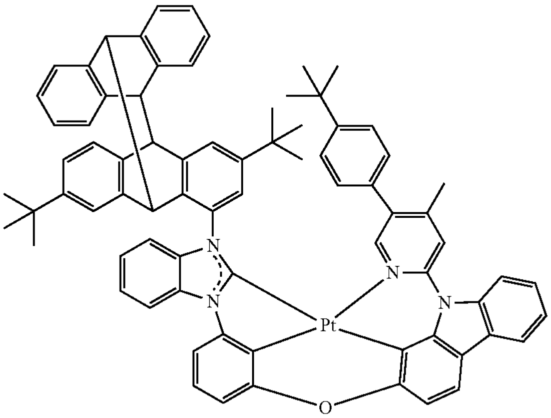
38
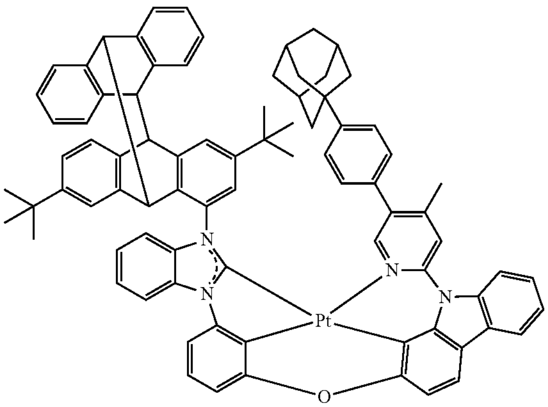
39
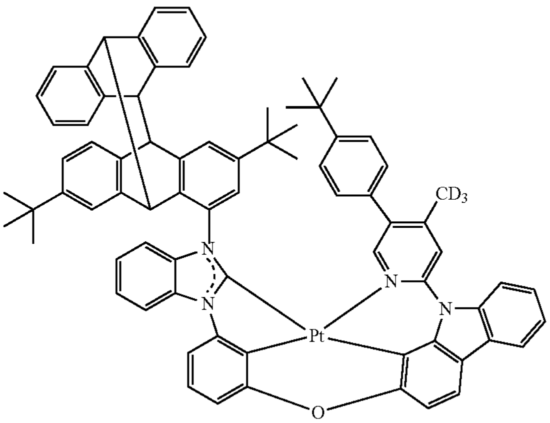

-continued
40
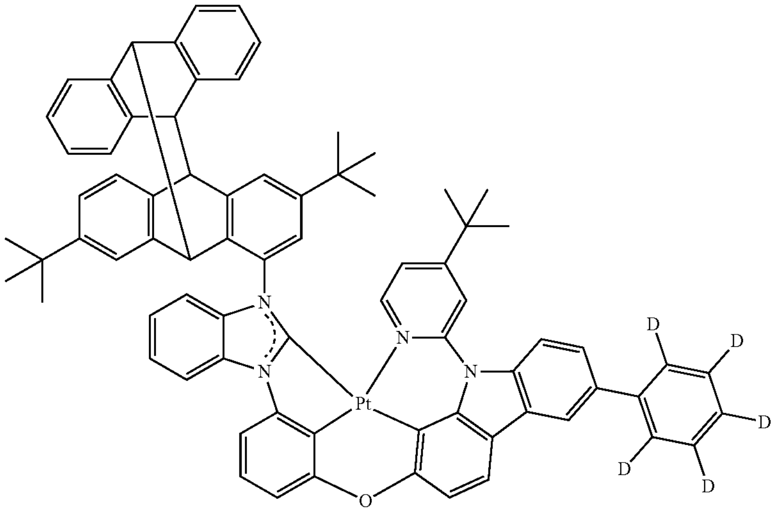
41
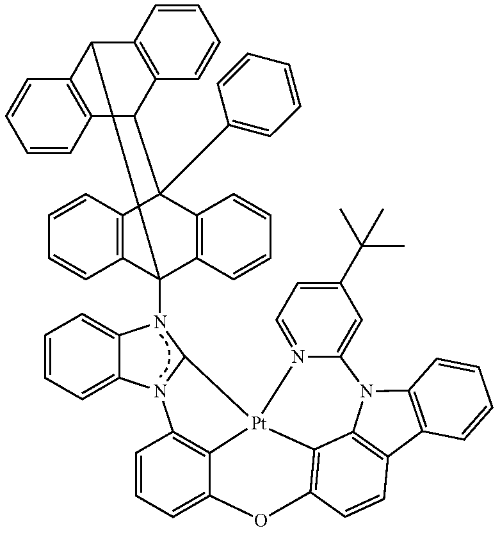
42
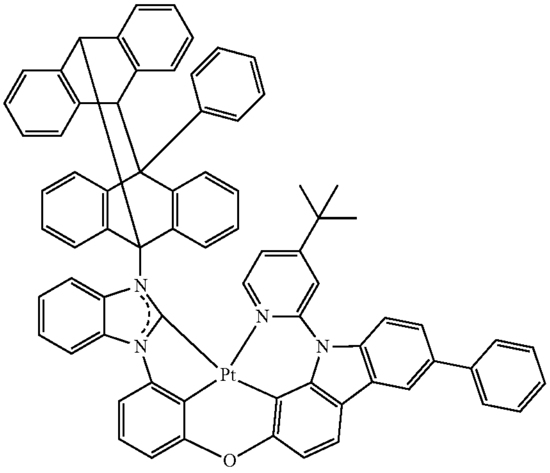
43
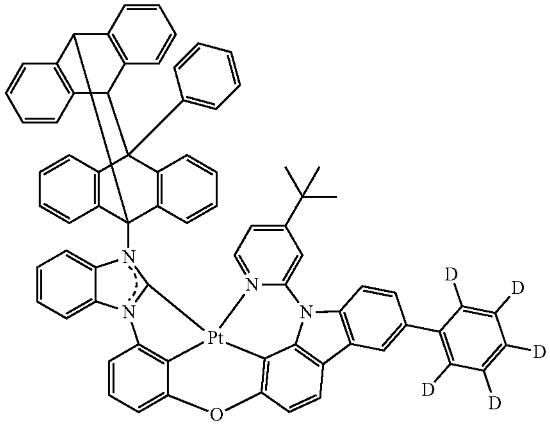
44
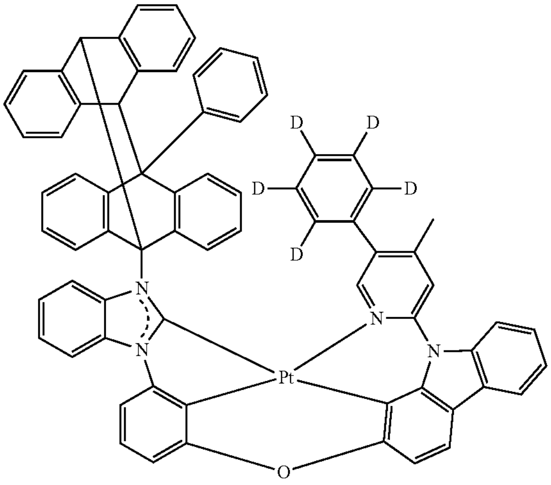

-continued
45
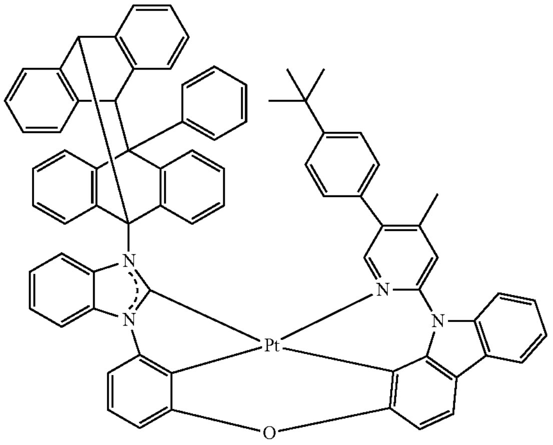
46
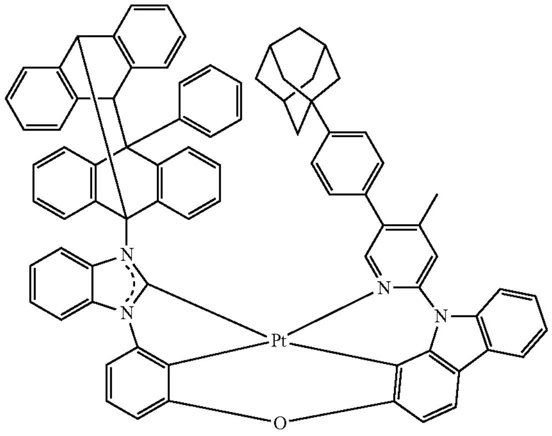
47
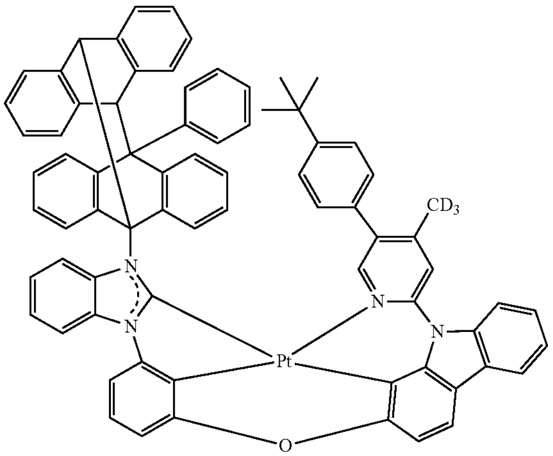
48
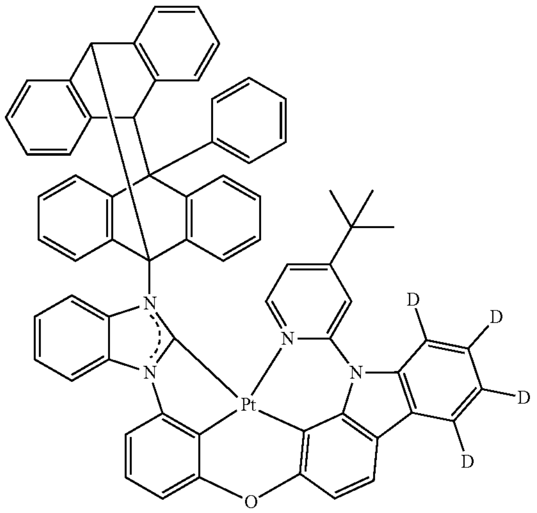
49
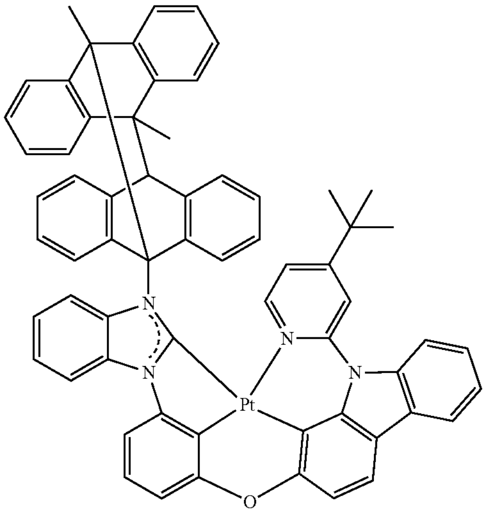
50
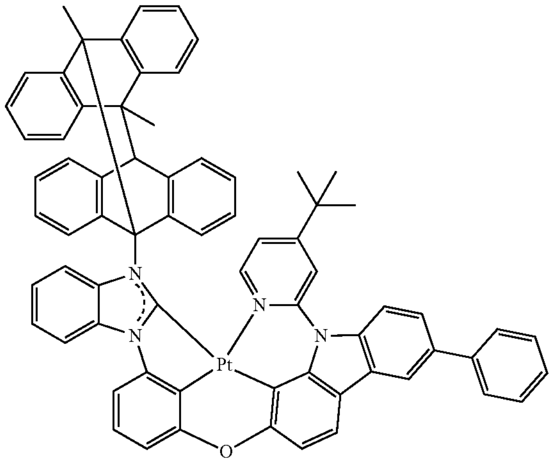

-continued
51
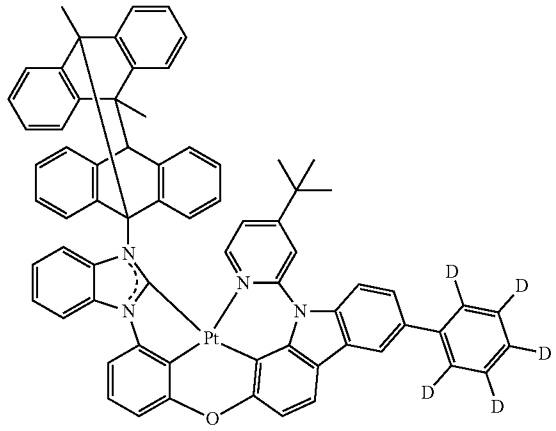
52
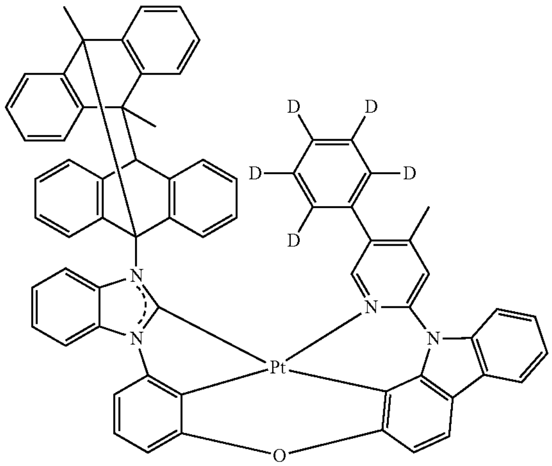
53
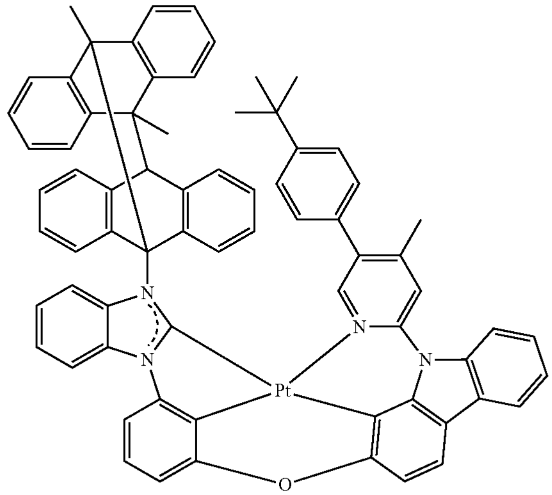
54
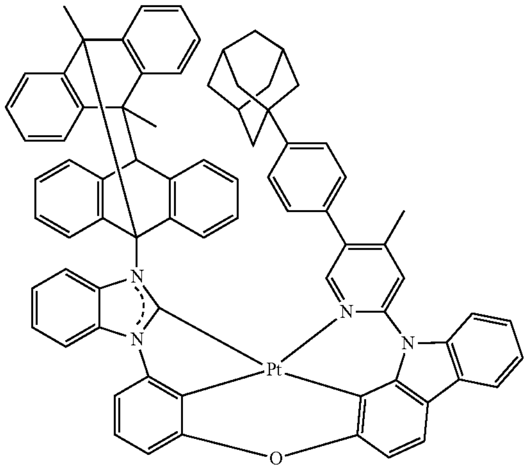
55
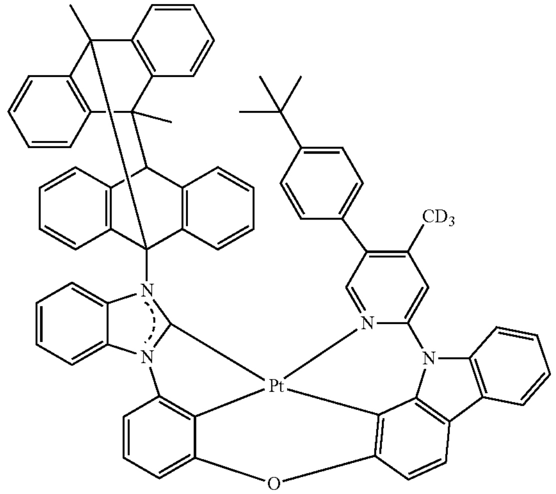
56
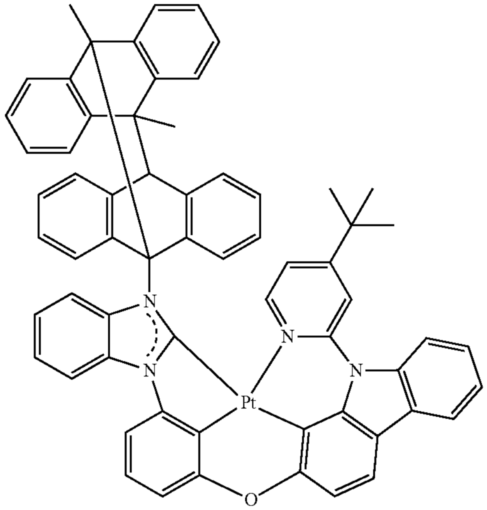

-continued
57
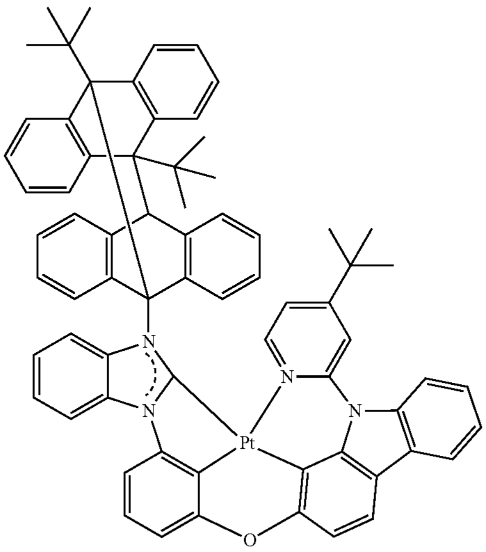
58
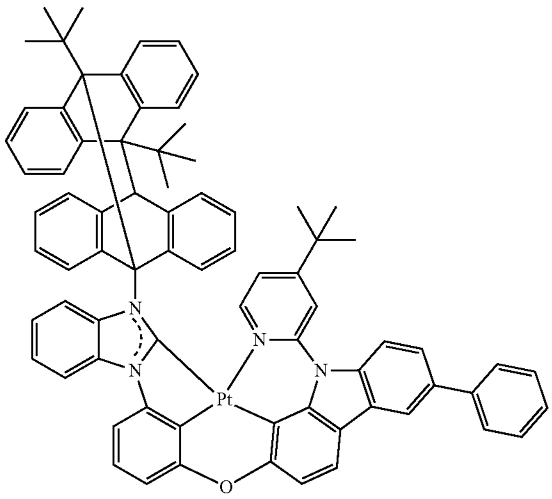
59
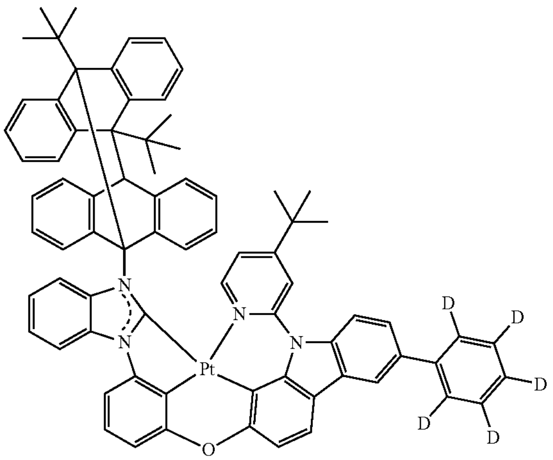
60
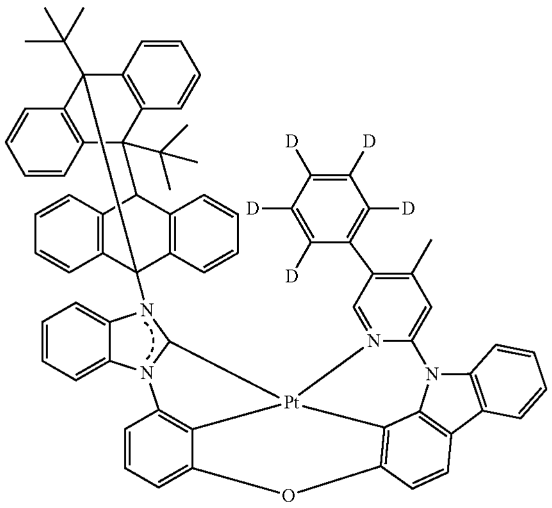
61
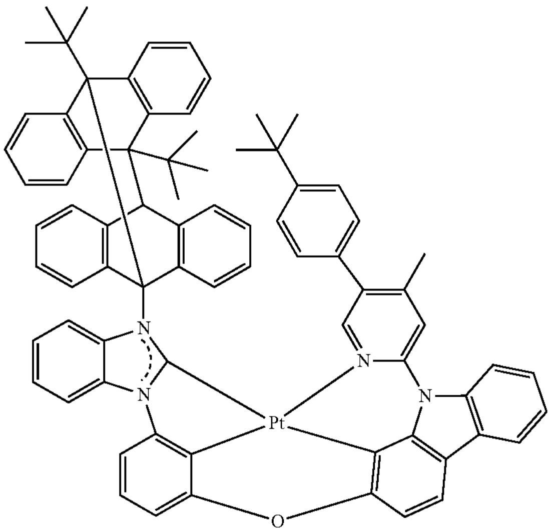
62
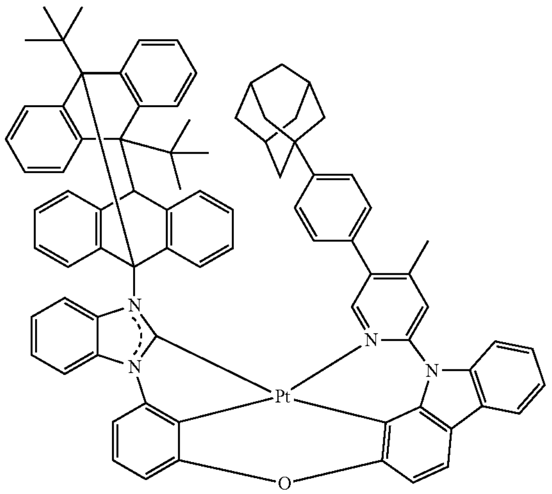

-continued
63
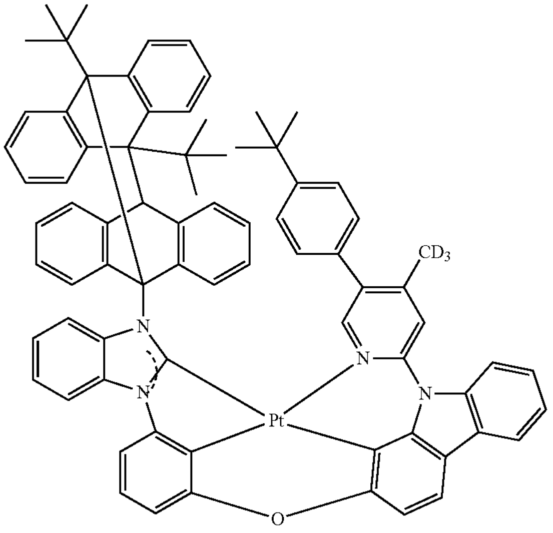
64
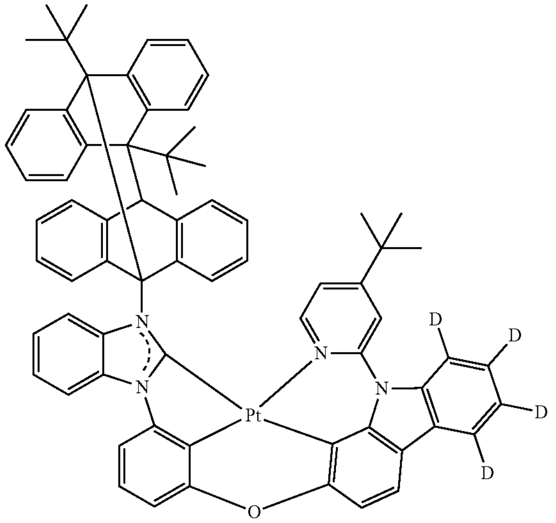
65
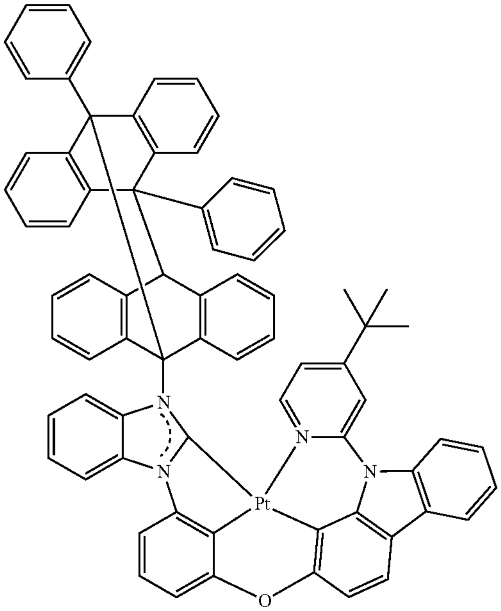
66
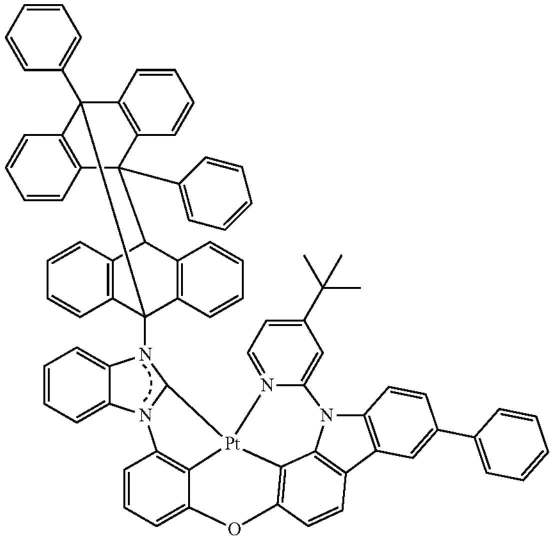

-continued
67
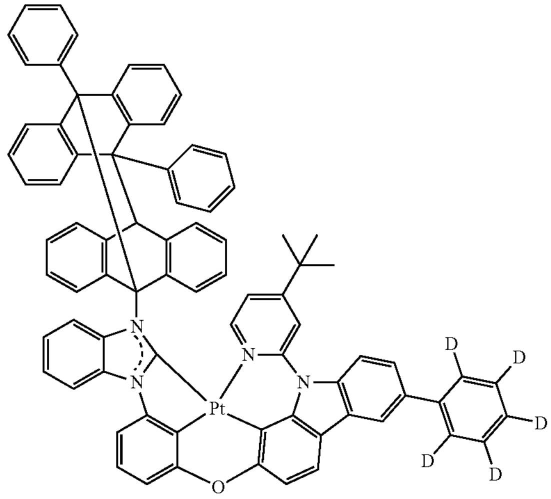
68
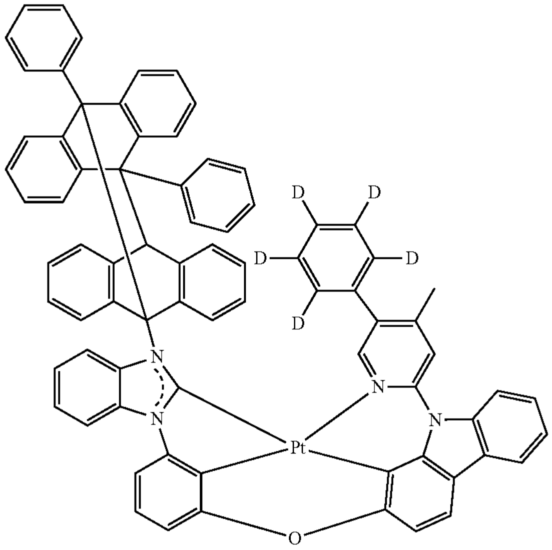
69
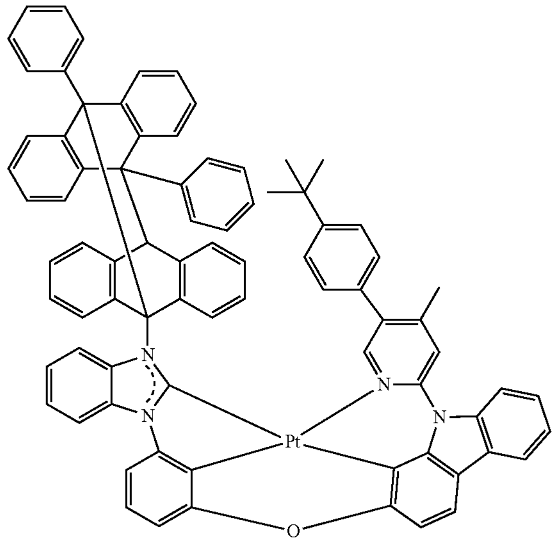
70
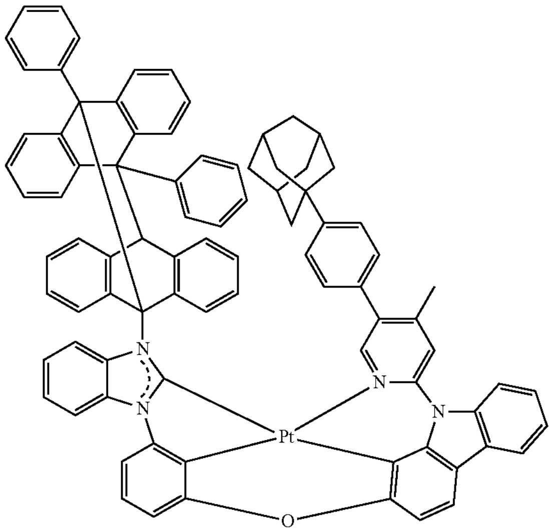

-continued
71
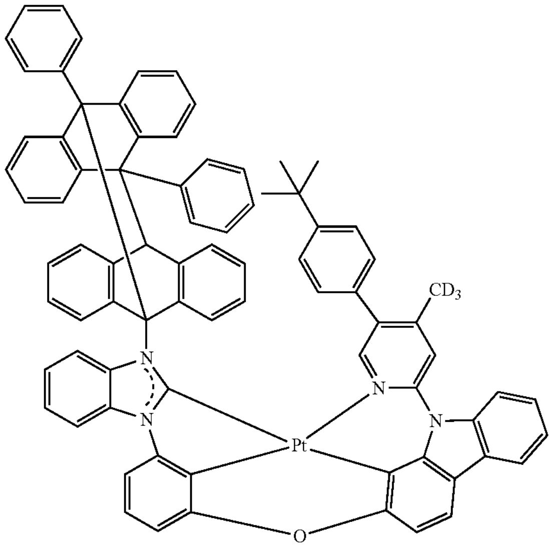
72
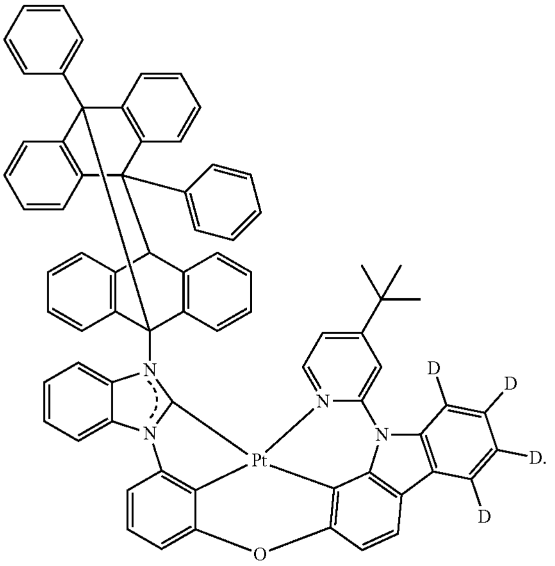
In one or more embodiments, the second compound may be at least one selected from among Compounds ETH1 to ETH100:
ETH1
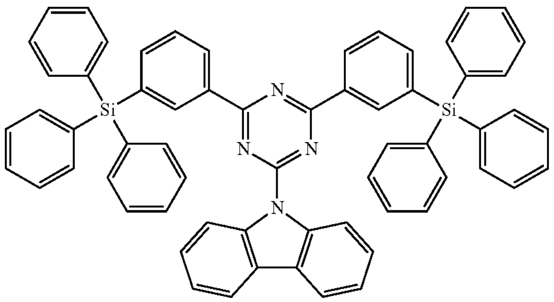
ETH2
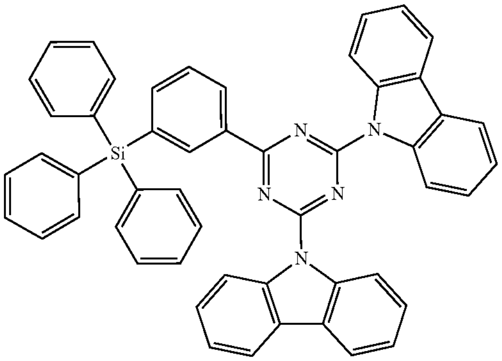
ETH3
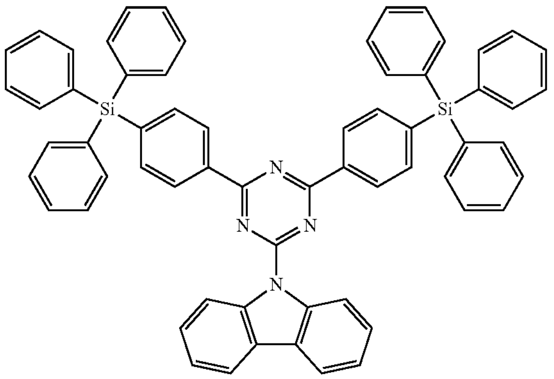
ETH4
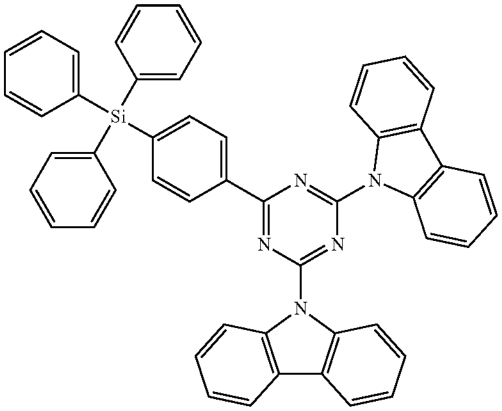

-continued
ETH5
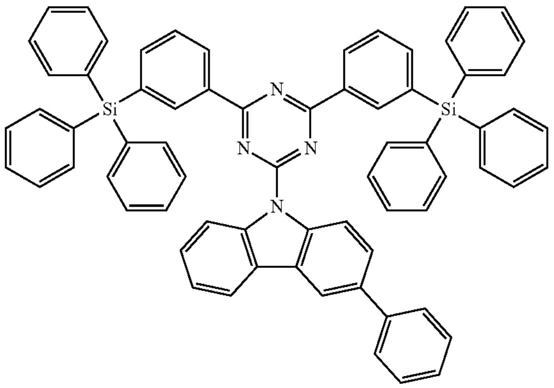
ETH6
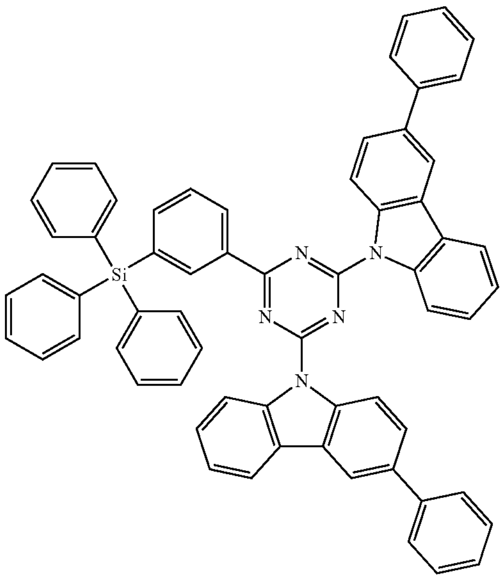
ETH7
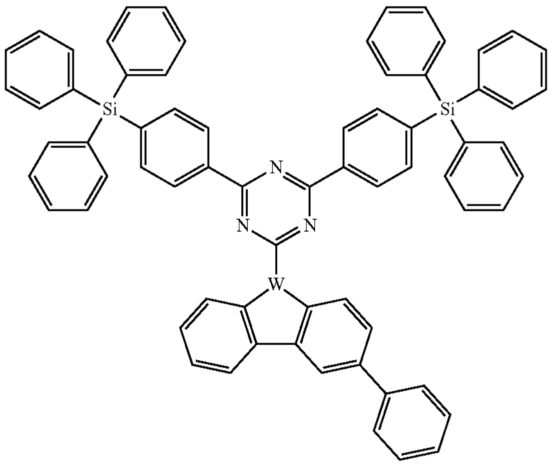
ETH8
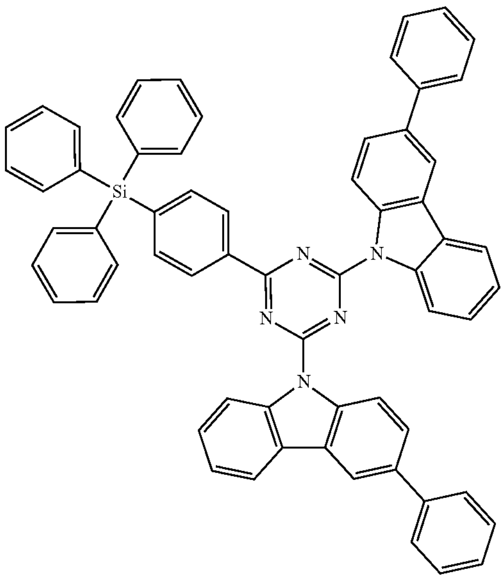
ETH9
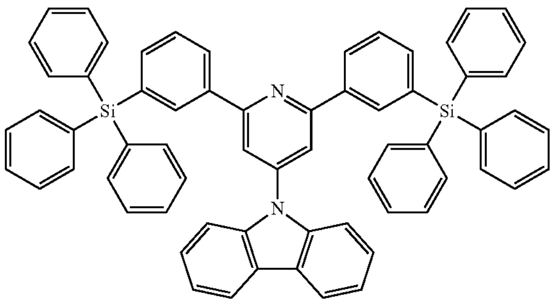
ETH10
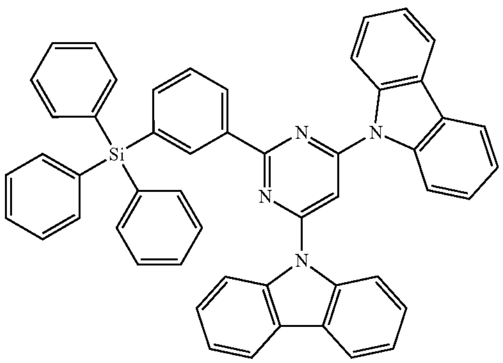

-continued
ETH11
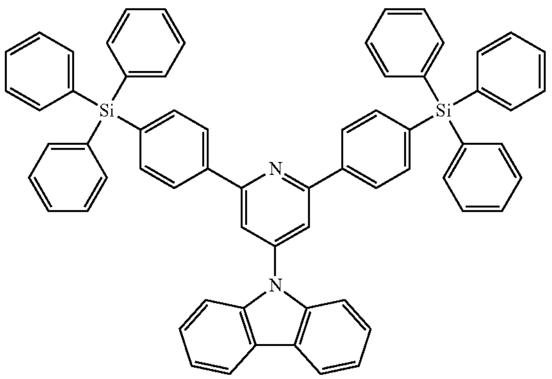
ETH12
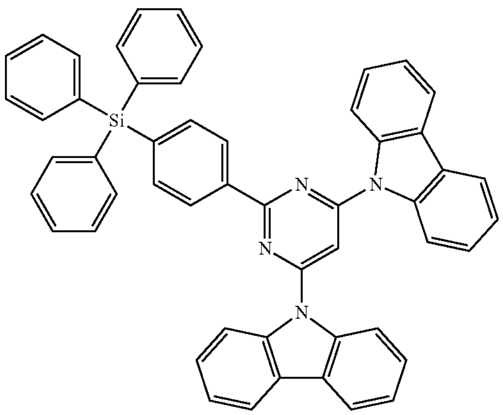
ETH13
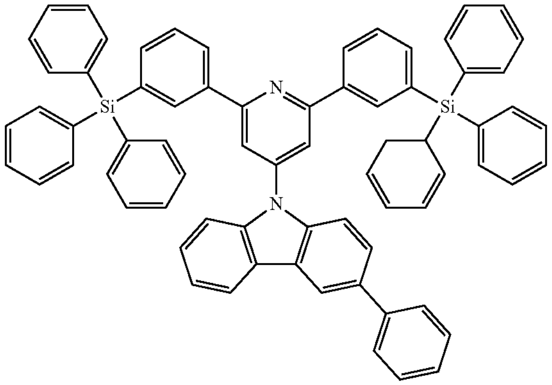
ETH14
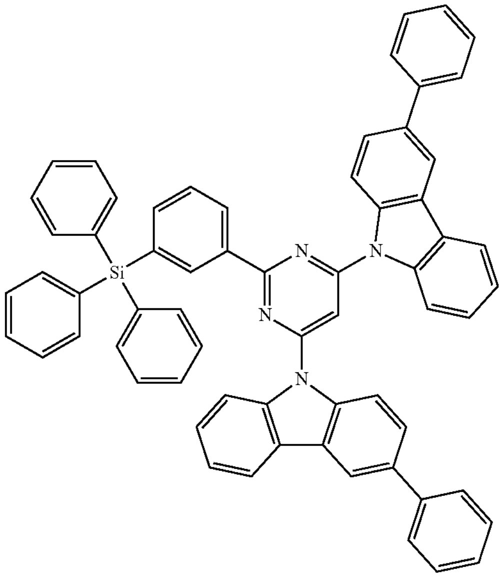
ETH15
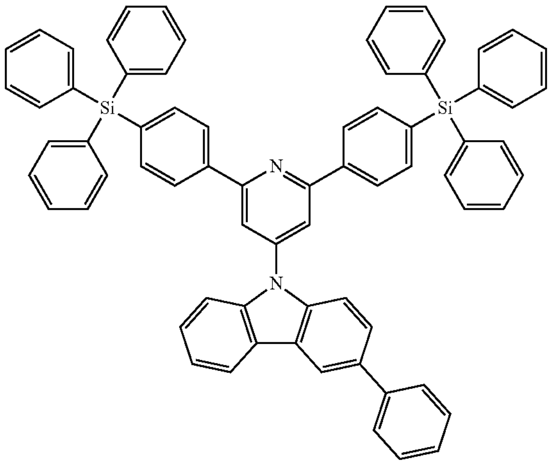
ETH16
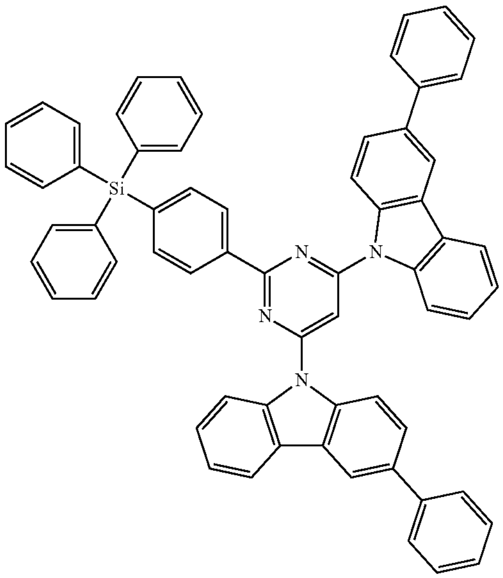

-continued
ETH17
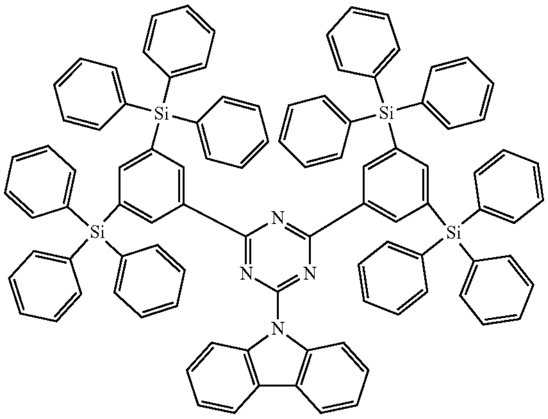
ETH18
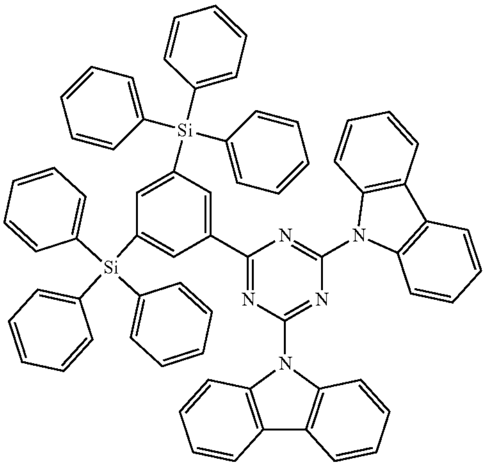
ETH19
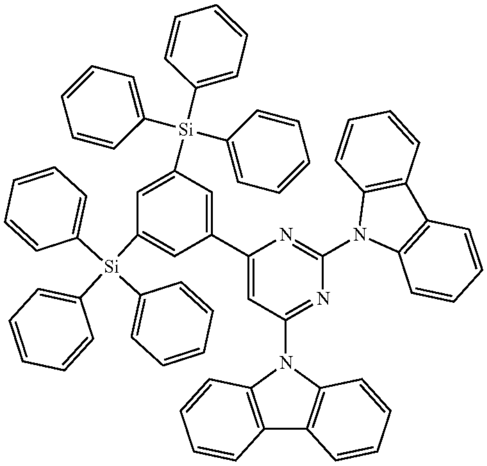
ETH20
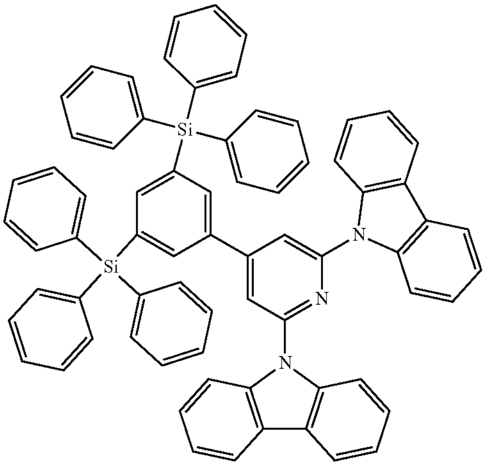
ETH21
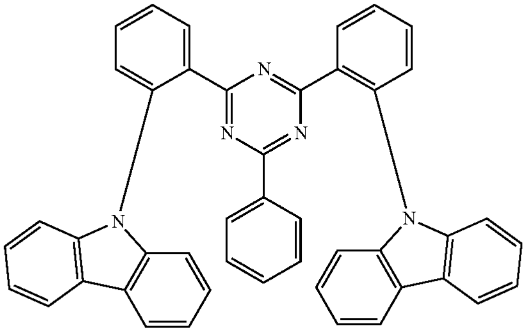
ETH22
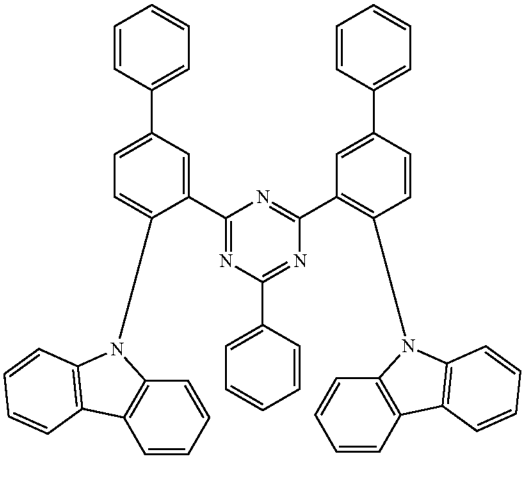

-continued
ETH23
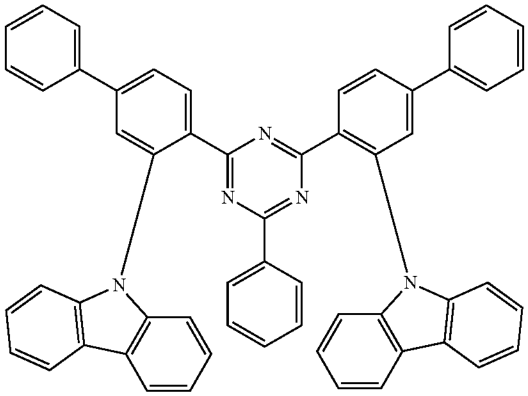
ETH24
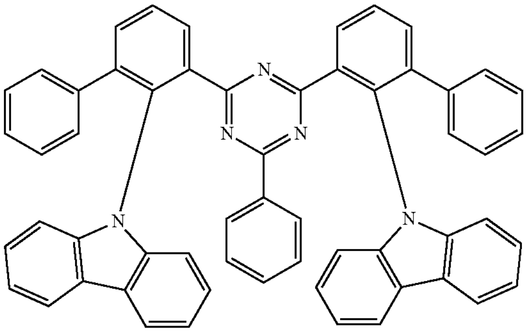
ETH25
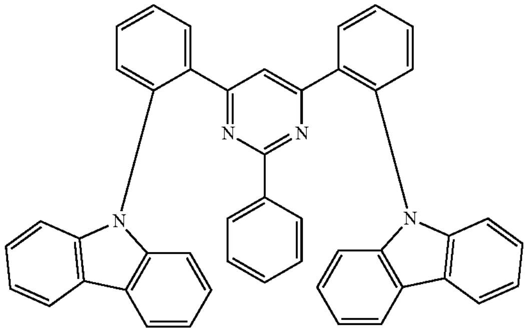
ETH26
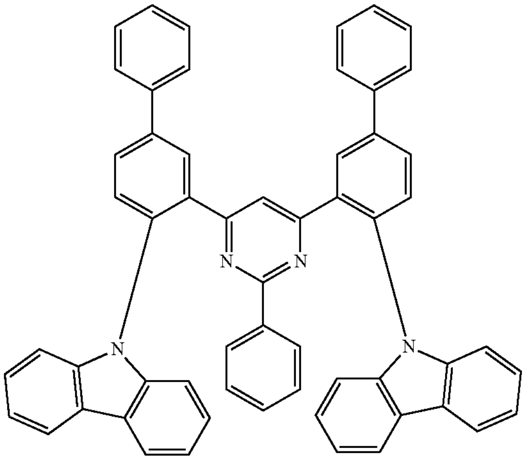
ETH27
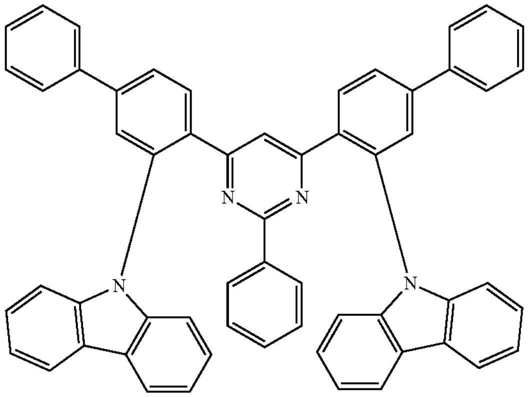
ETH28
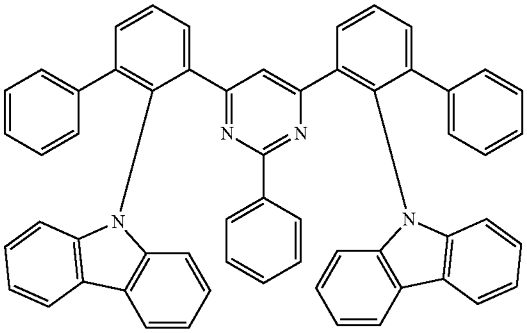

-continued
ETH29
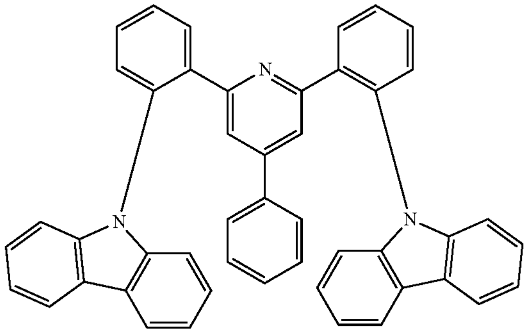
ETH30
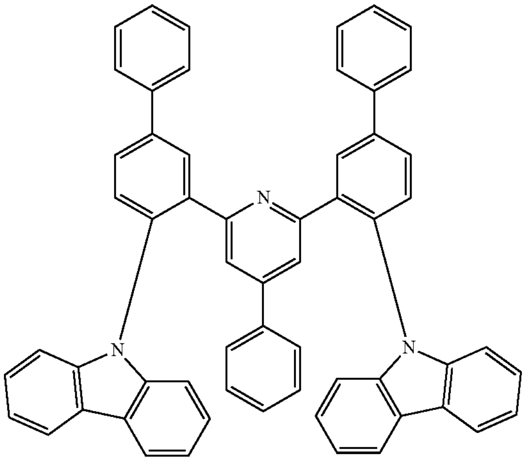
ETH31
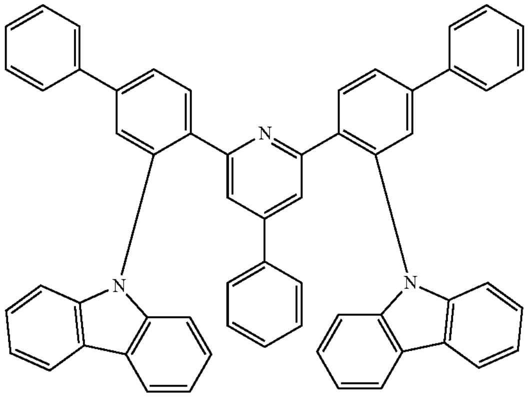
ETH32
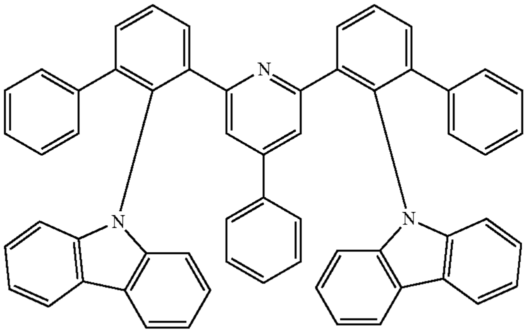
ETH33
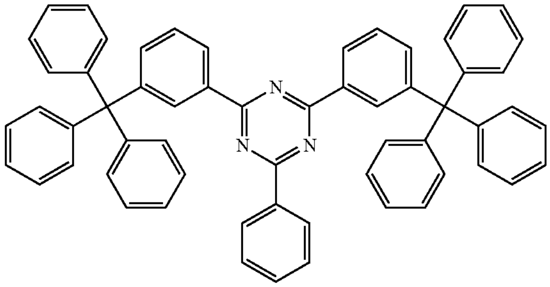
ETH34
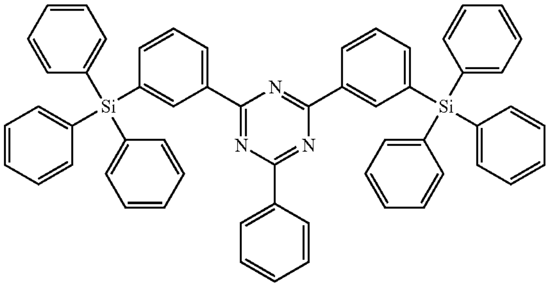
ETH5
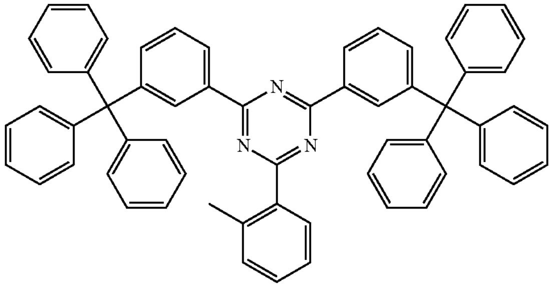
ETH36
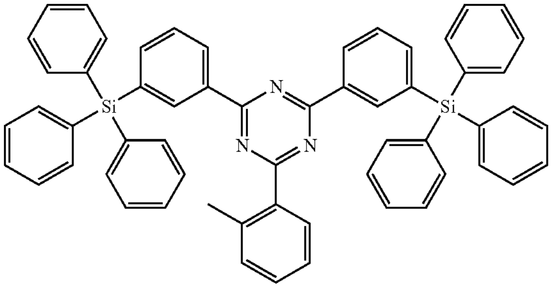

-continued
ETH37
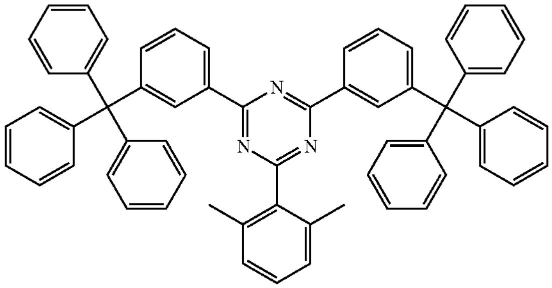
ETH38
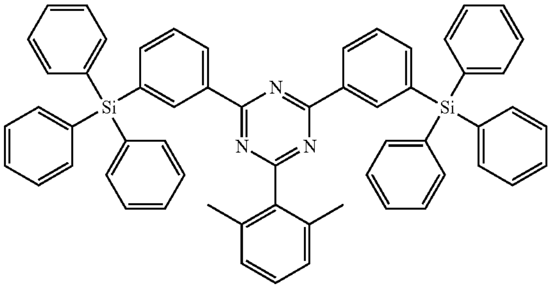
ETH39
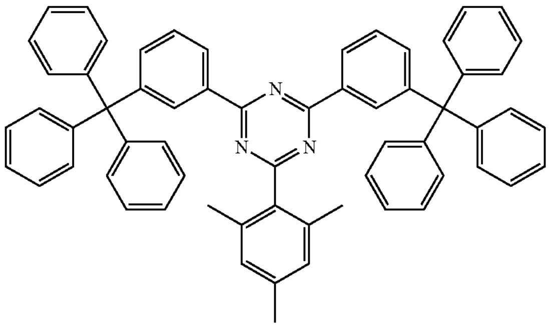
ETH40
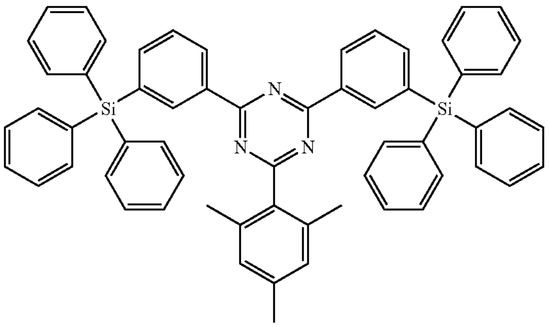
ETH41
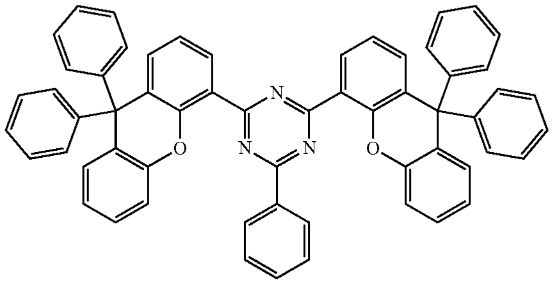
ETH42
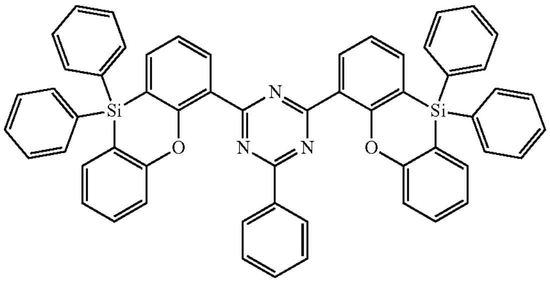
ETH43
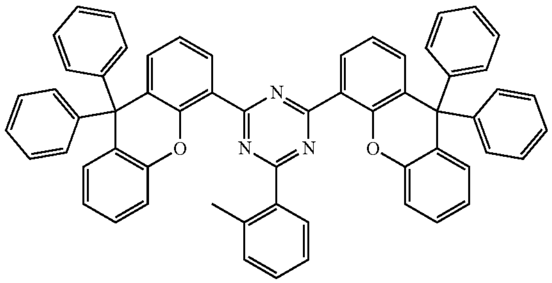
ETH44
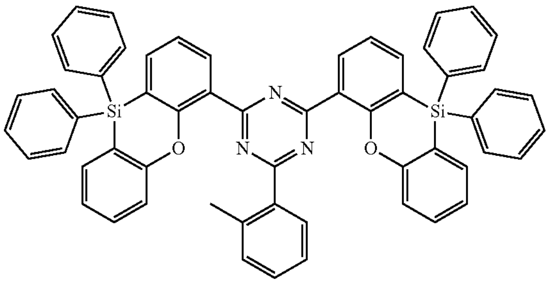
ETH45
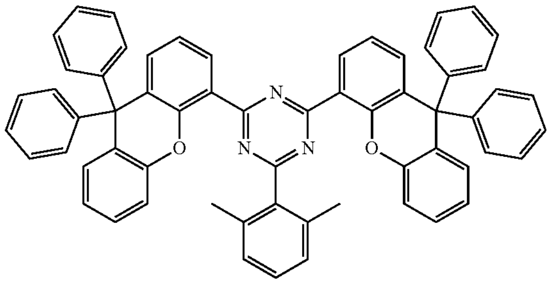
ETH46
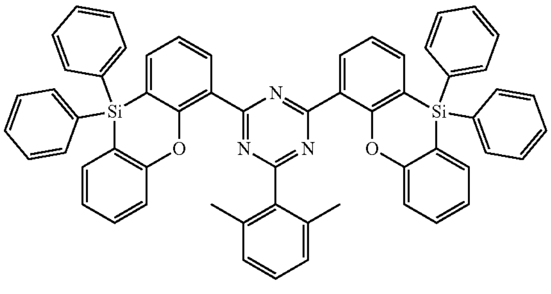

-continued
ETH47
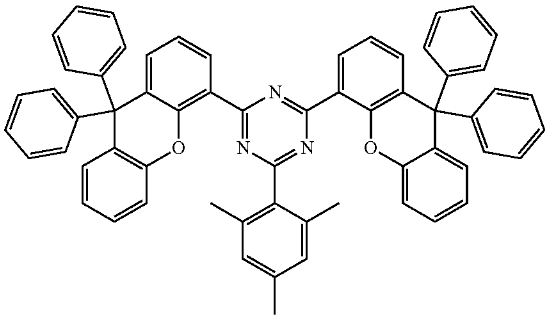
ETH48
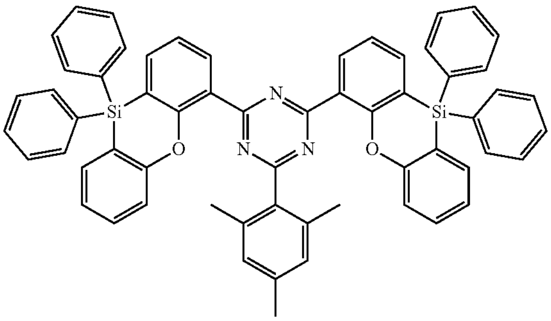
ETH49
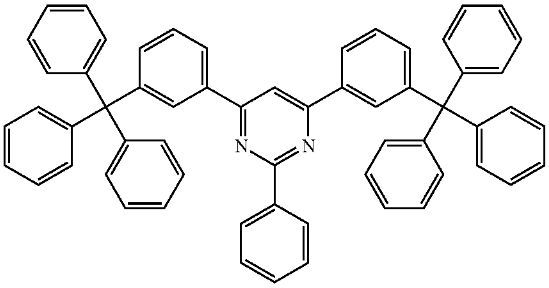
ETH50
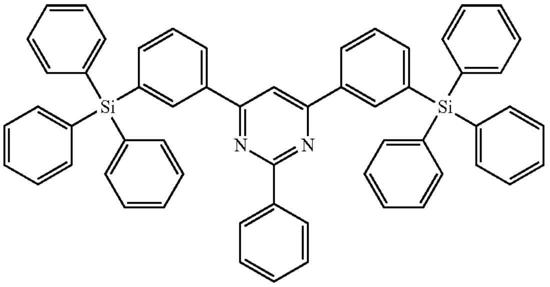
ETH51
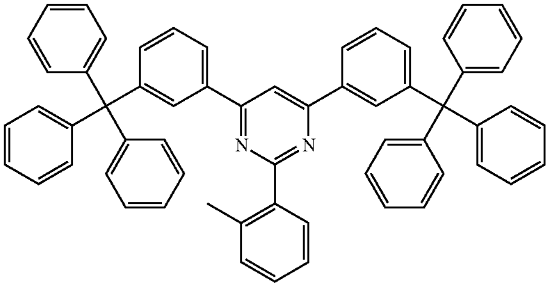
ETH52
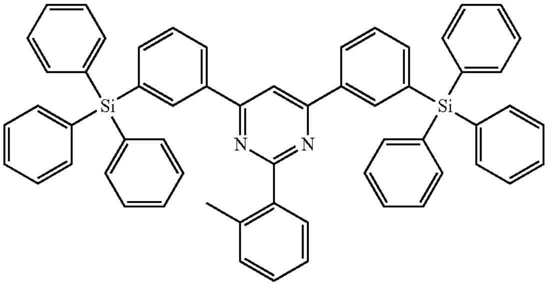
ETH53
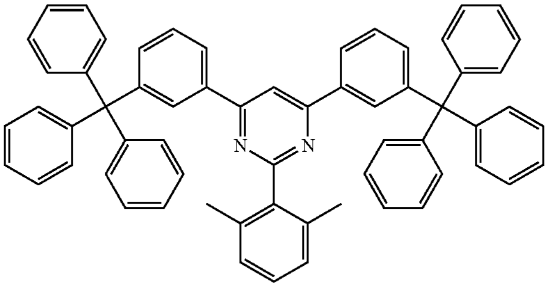
ETH54
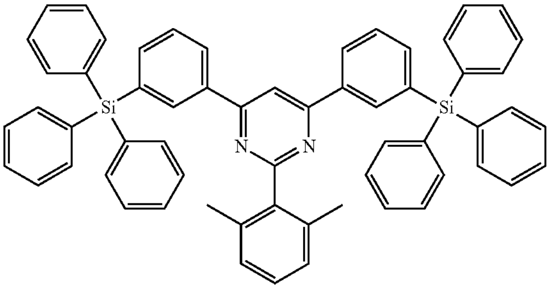
ETH55
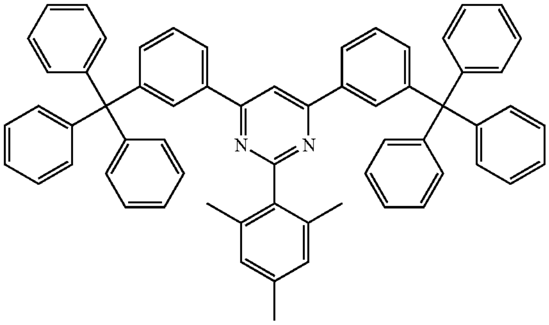
ETH56
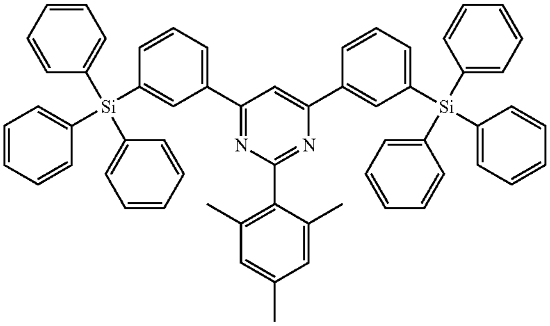

-continued
ETH57
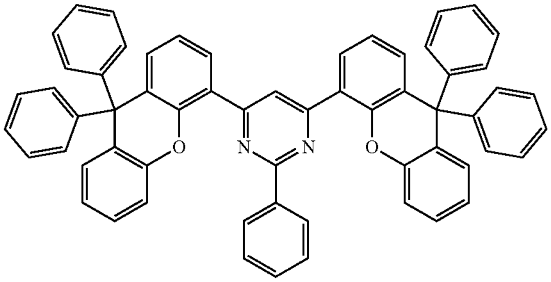
ETH58
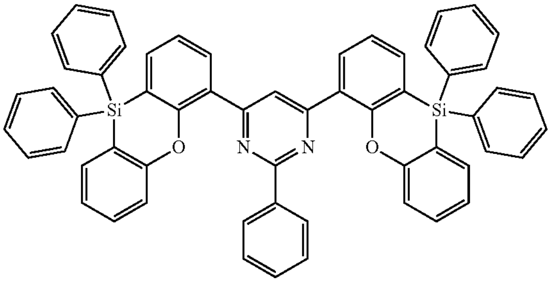
ETH59
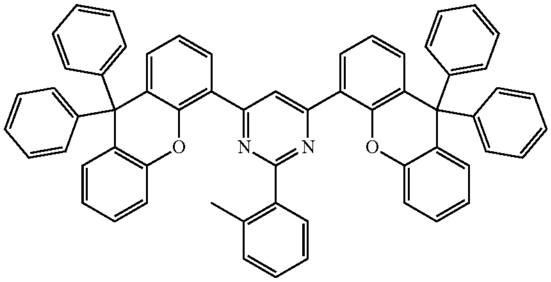
ETH60
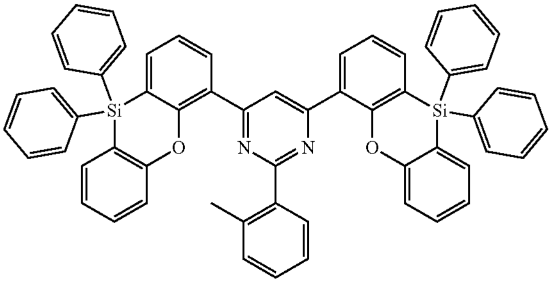
ETH61
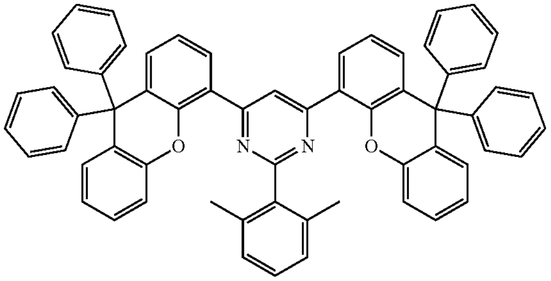
ETH62
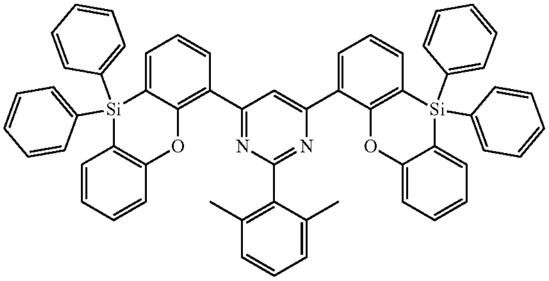
ETH63
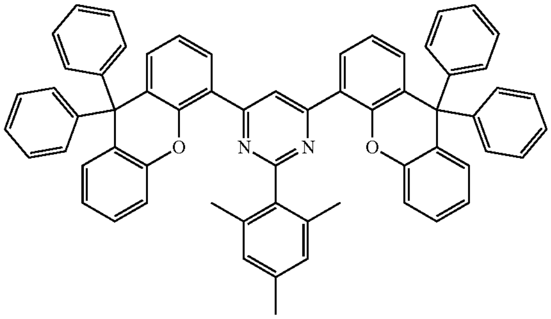
ETH64
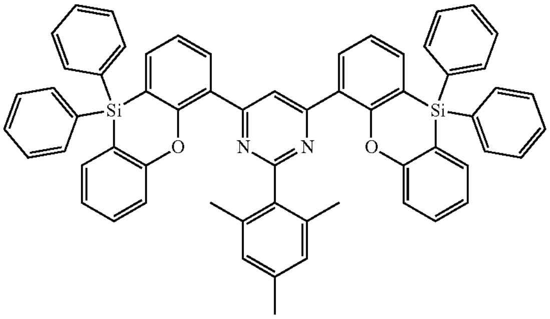
ETH65
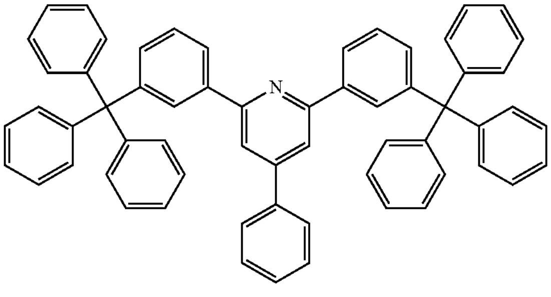
ETH66
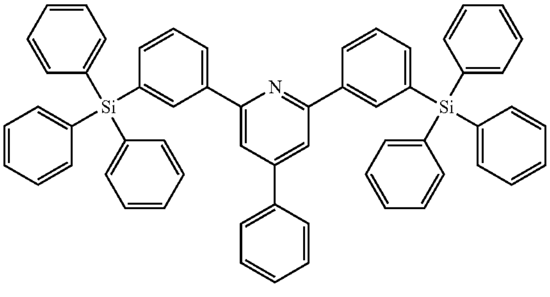

-continued
ETH67
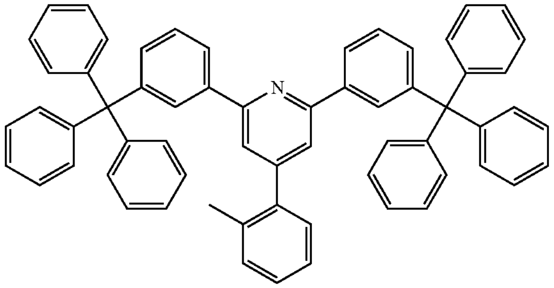
ETH68
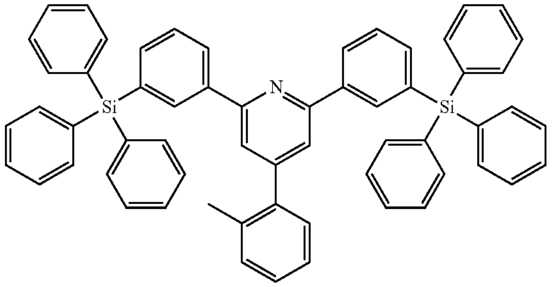
ETH69
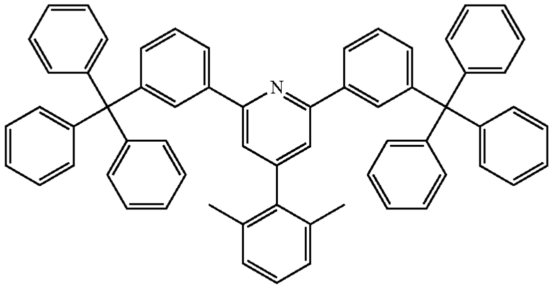
ETH70
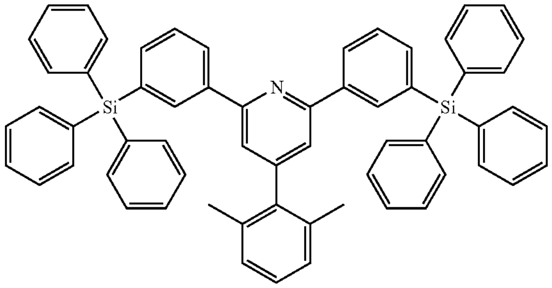
ETH71
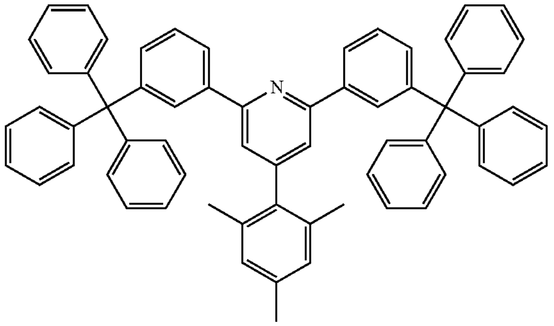
ETH72
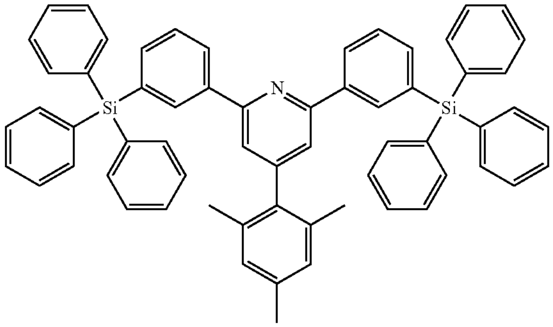
ETH73
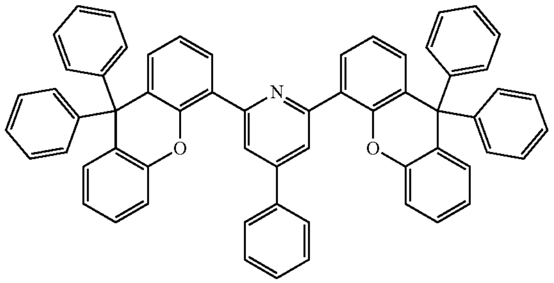
ETH74
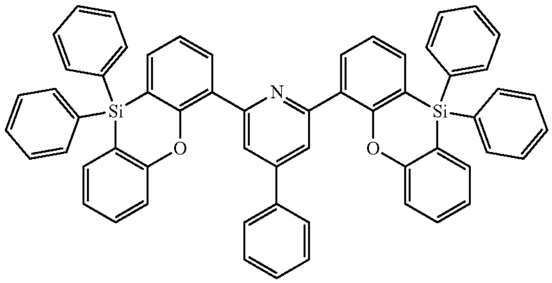
ETH75
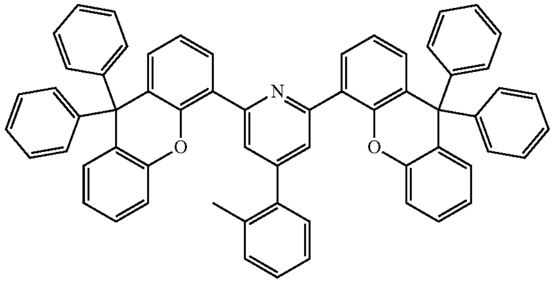
ETH76
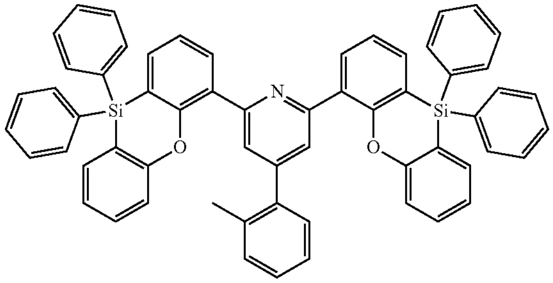

-continued
ETH77
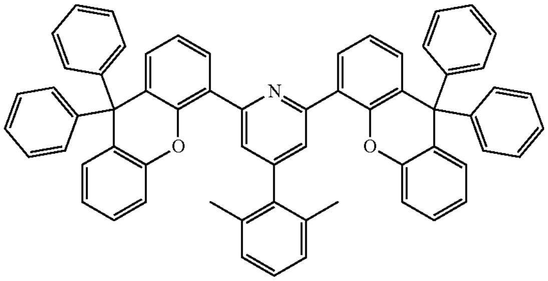
ETH78
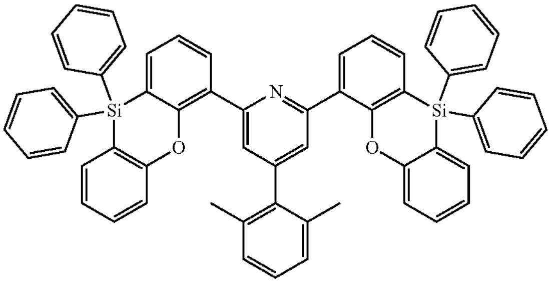
ETH79
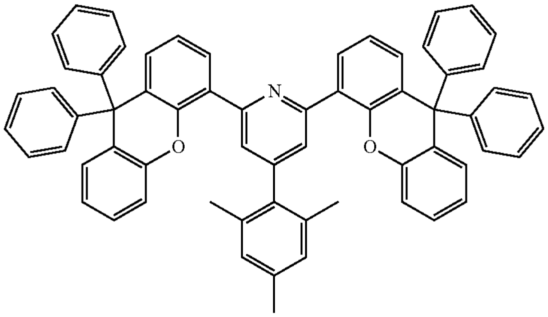
ETH80
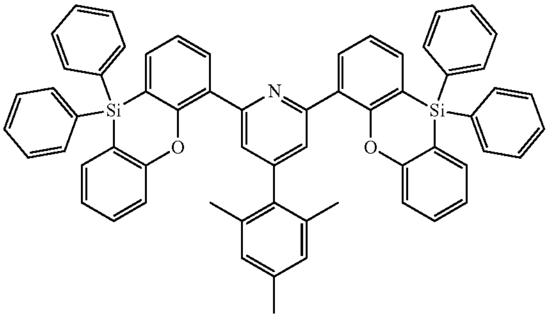
ETH81
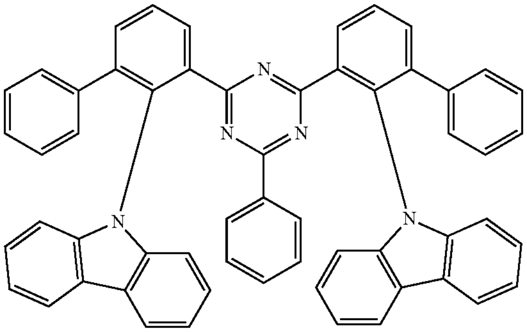
ETH82
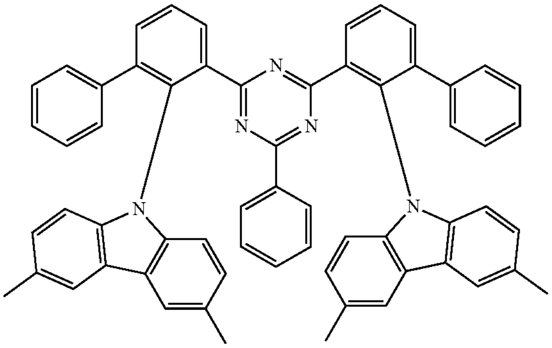
ETH83
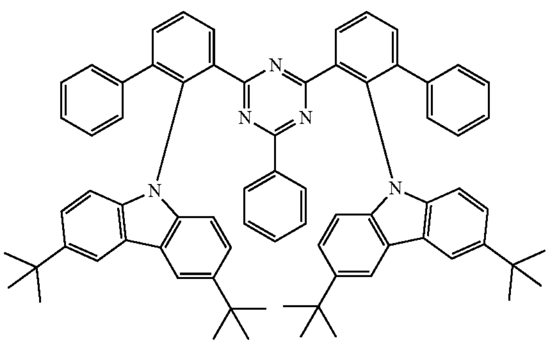
ETH84
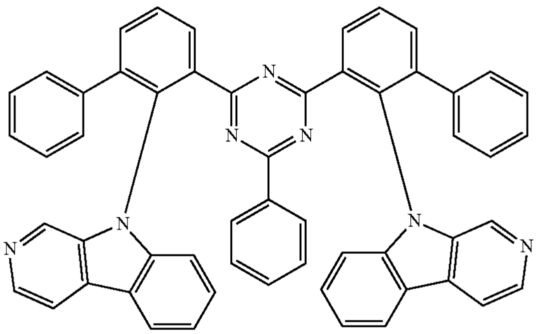

-continued
ETH85
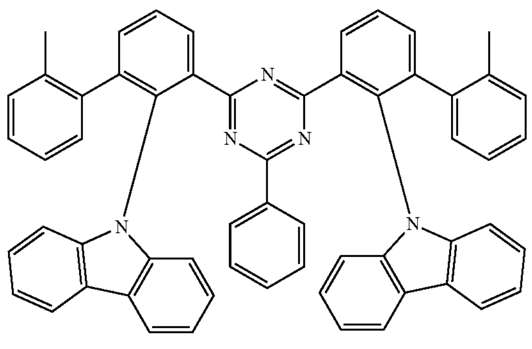
ETH86
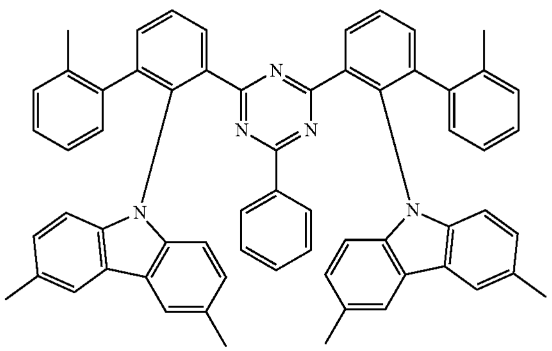
ETH87
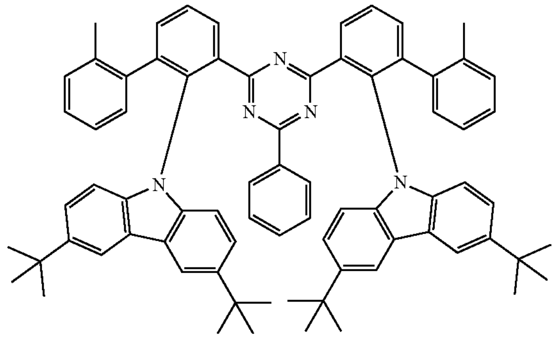
ETH88
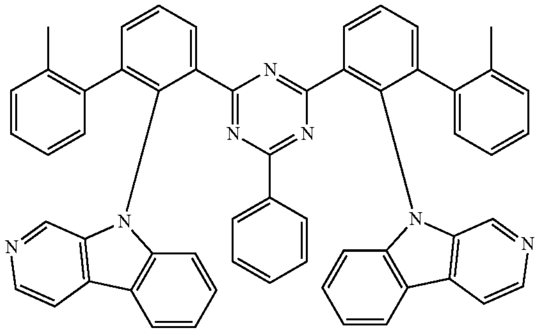
ETH89
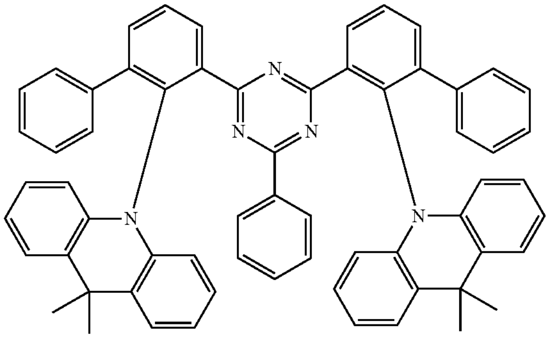
ETH90
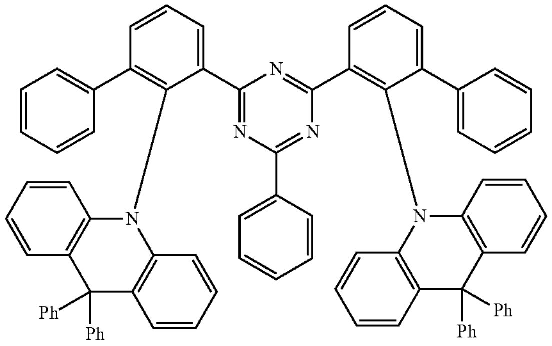
ETH91
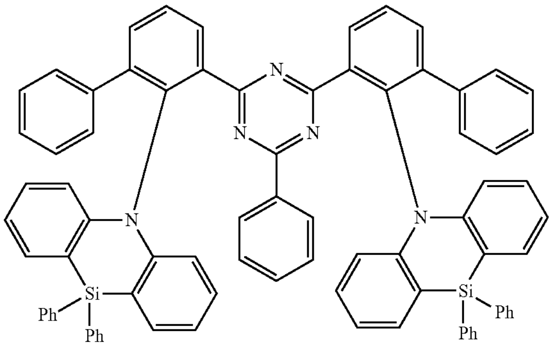
ETH92
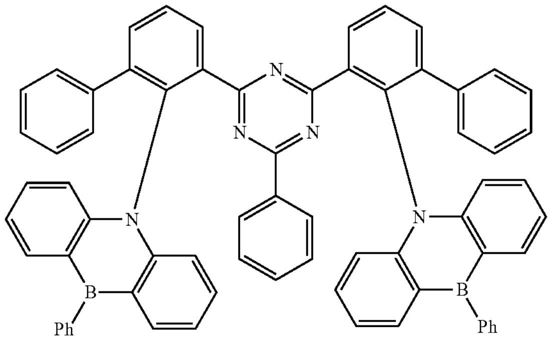

-continued
ETH93
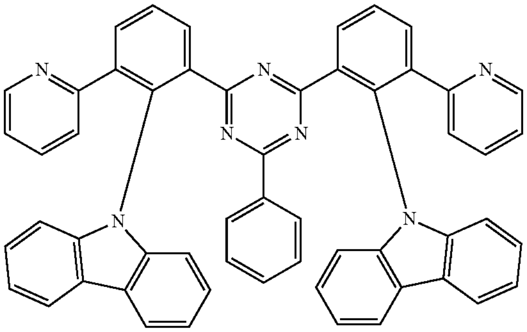
ETH94
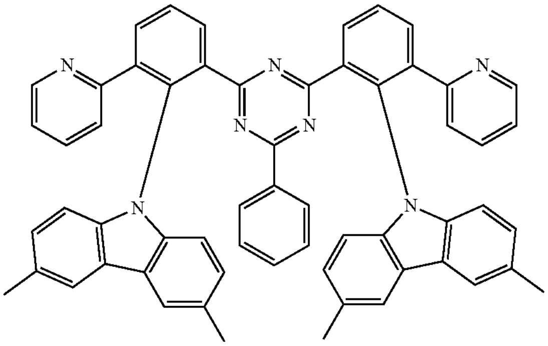
ETH95
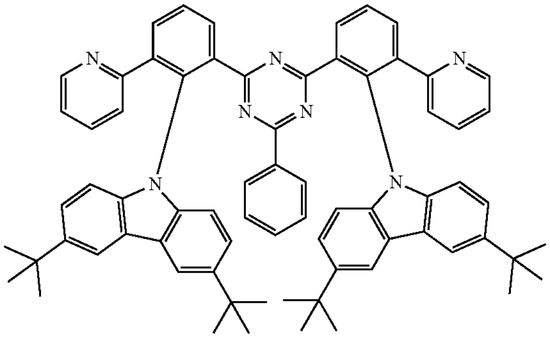
ETH96
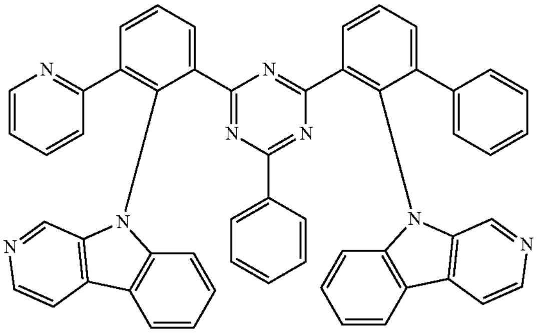
ETH97
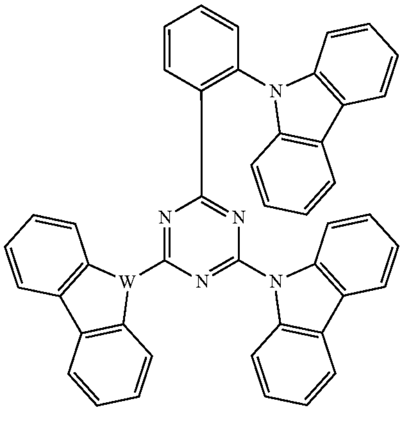
ETH98
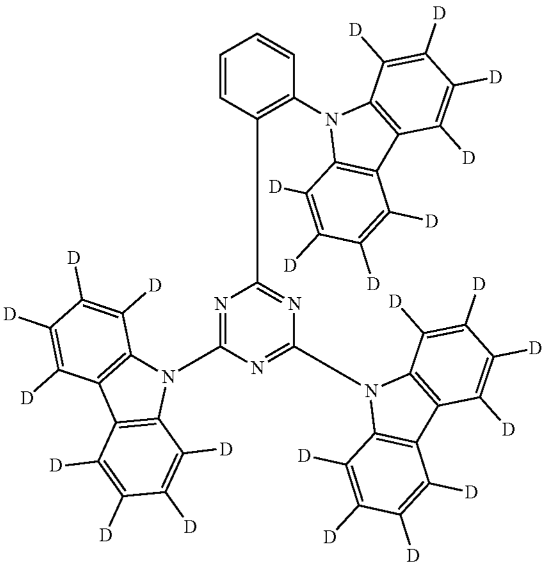

-continued
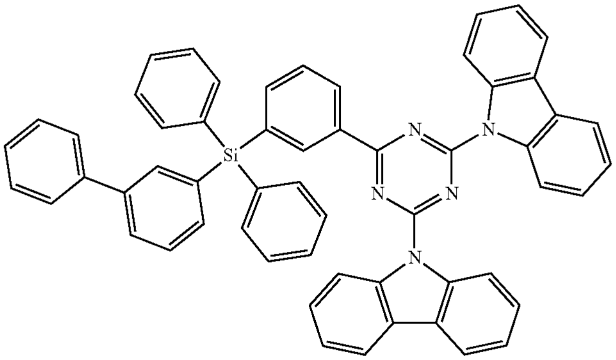
ETH99
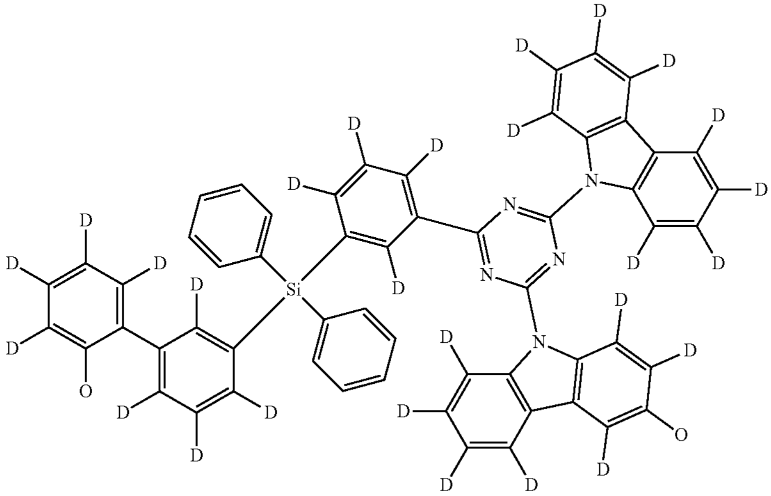
ETH100
In one or more embodiments, the third compound may be at least one selected from among Compounds HTH1 to HTH40:
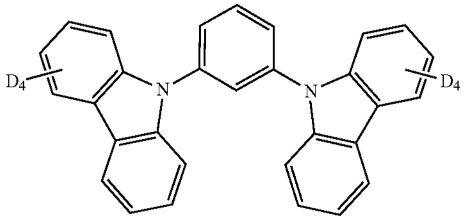
HTH1
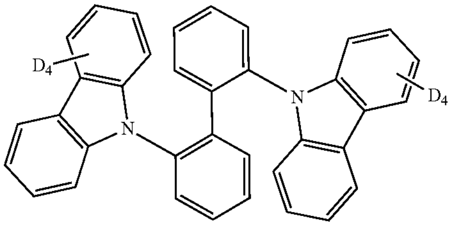
HTH2
-continued
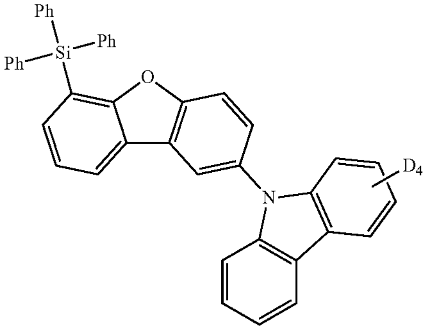
HTH3
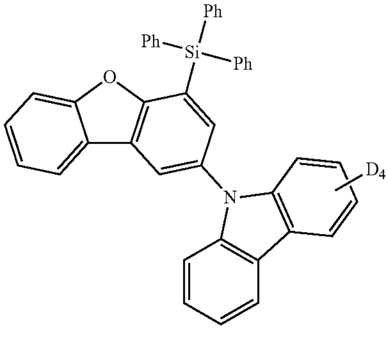
HTH4

-continued
HTH5
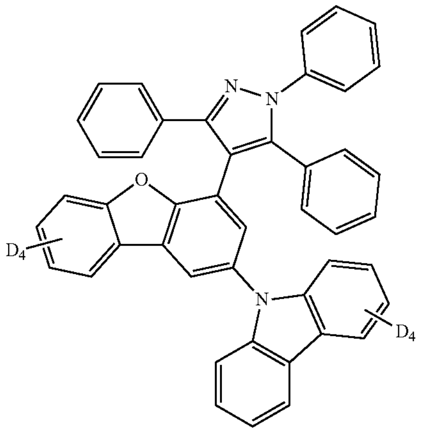
HTH6
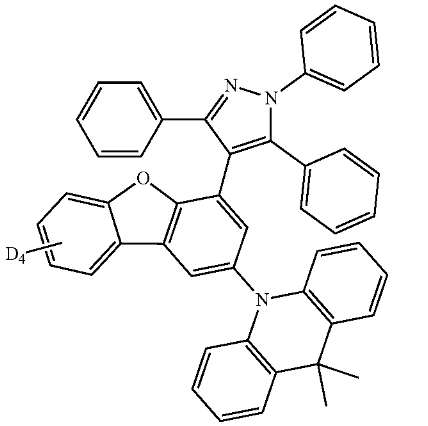
HTH7
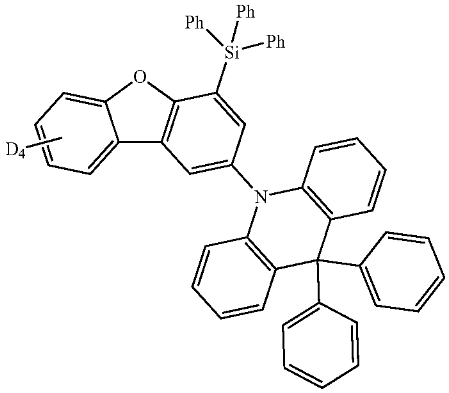
HTH8
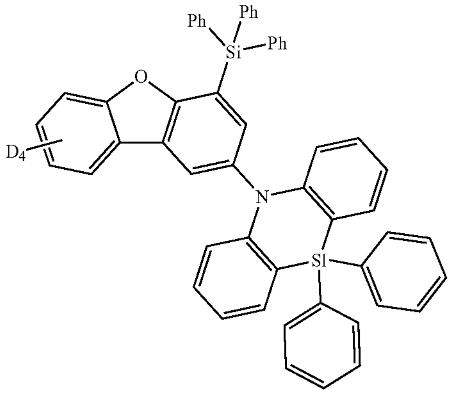
-continued
HTH9
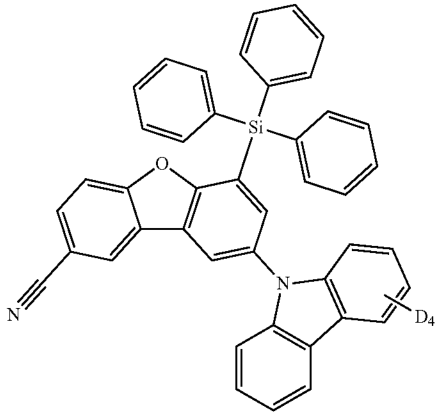
HTH10
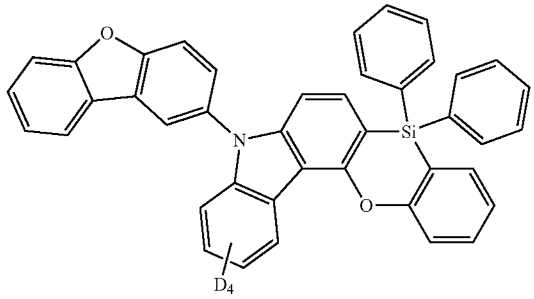
HTH11
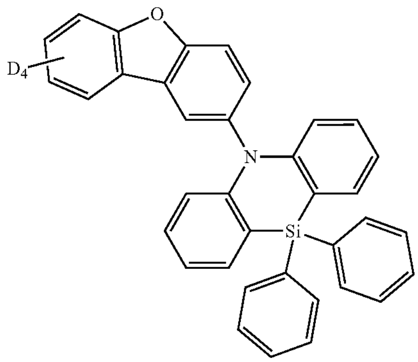
HTH12
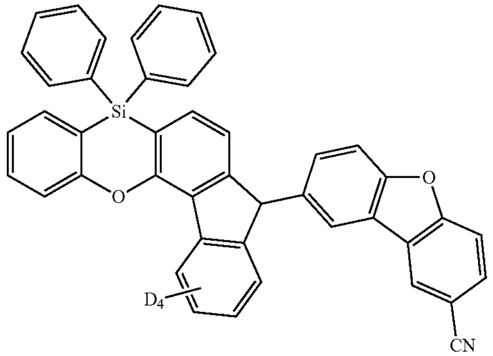

-continued
HTH13
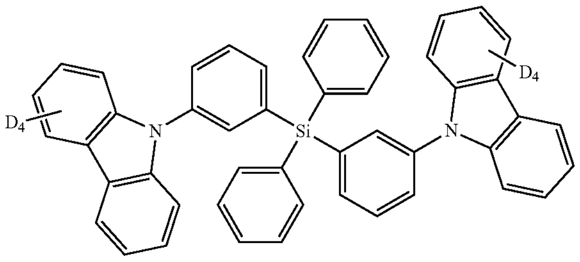
HTH14
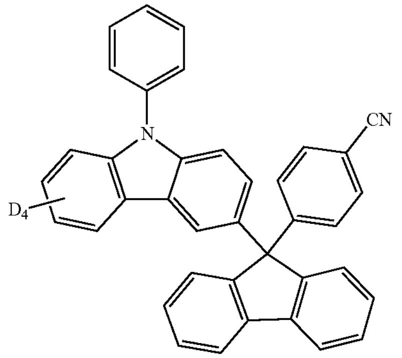
HTH15
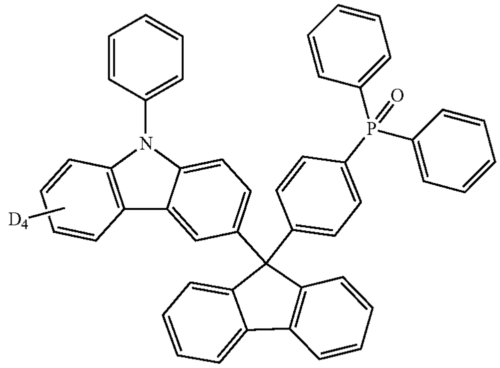
HTH16
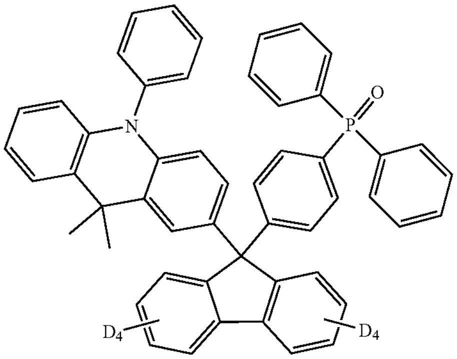
-continued
HTH17
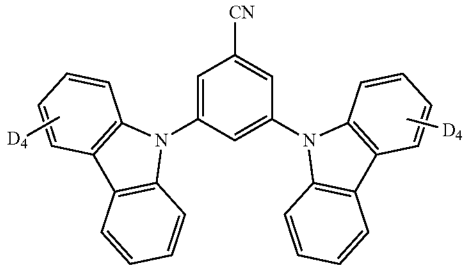
HTH18
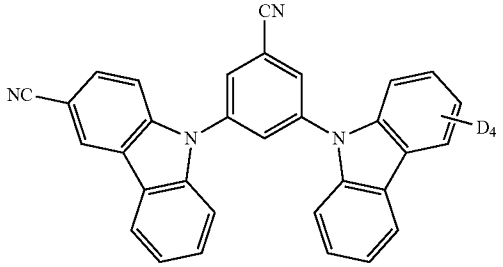
HTH19
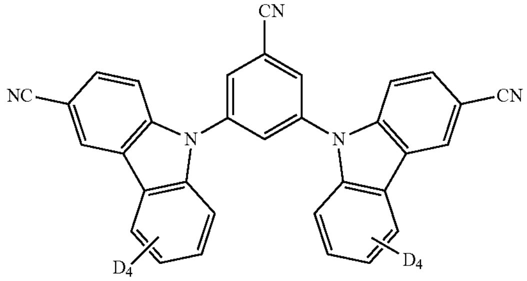
HTH20
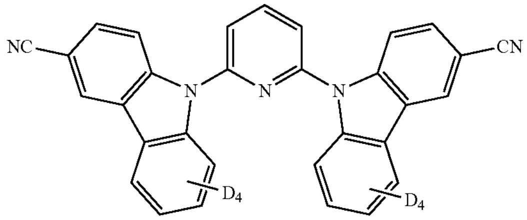
HTH21
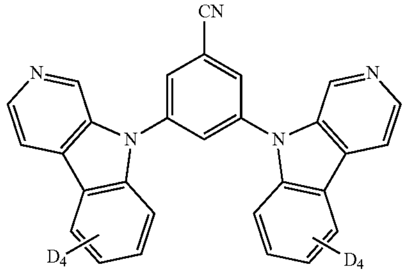

-continued
HTH22
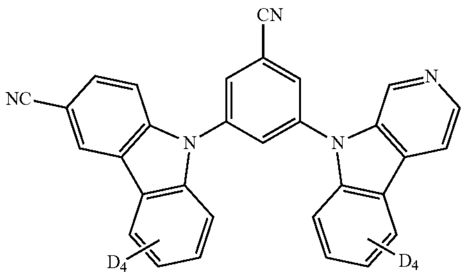
HTH23
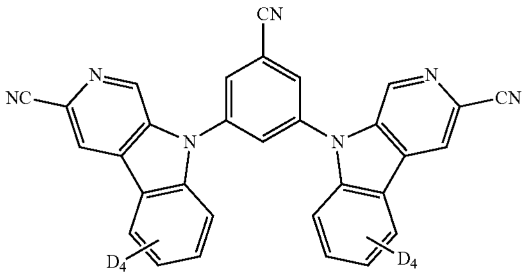
HTH24
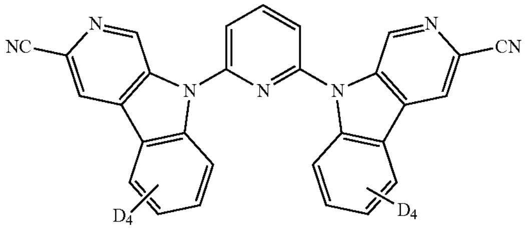
HTH25
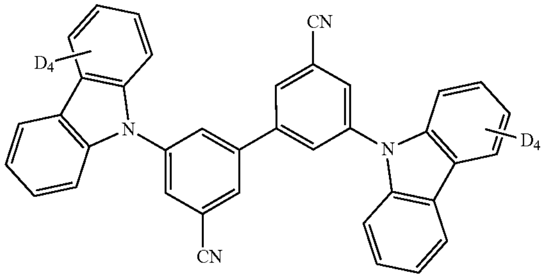
HTH26
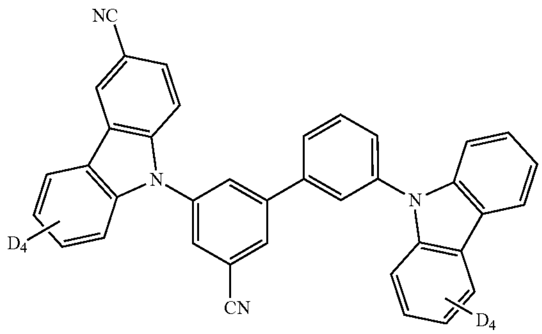
-continued
HTH27
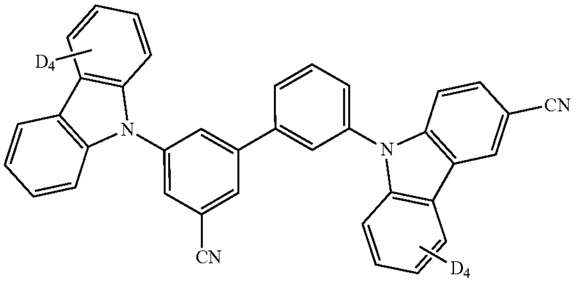
HTH28
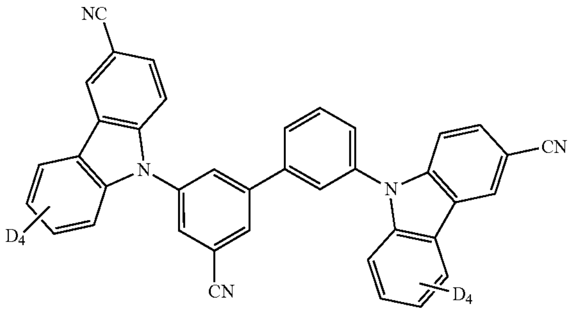
HTH29
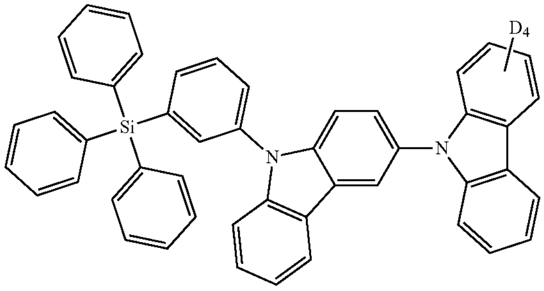
HTH30
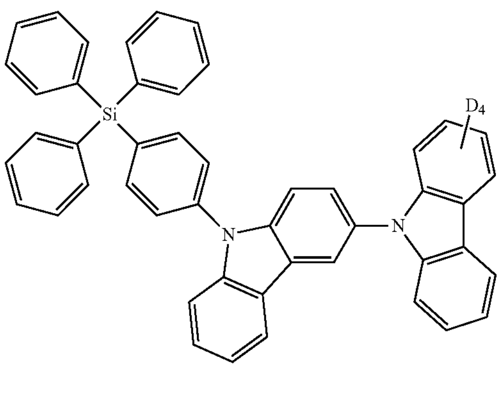

-continued
HTH31
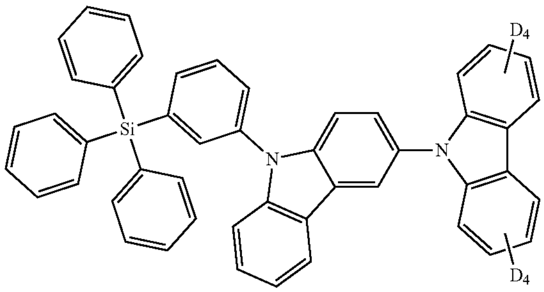
HTH32
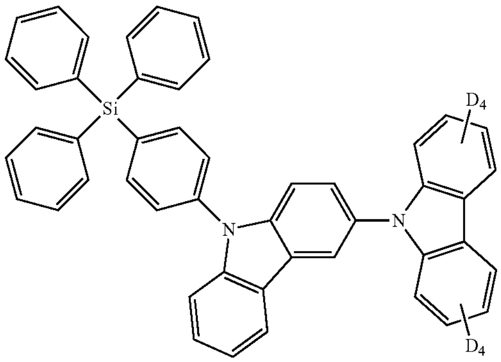
HTH33
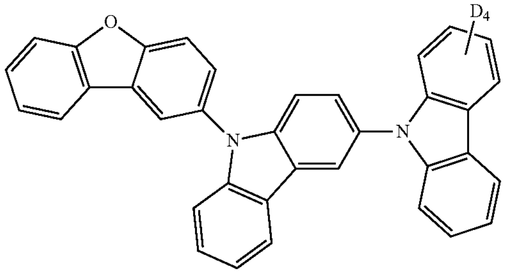
HTH34
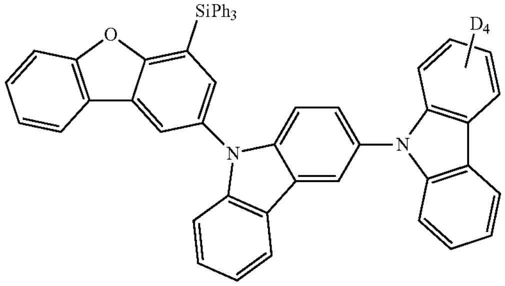
HTH35
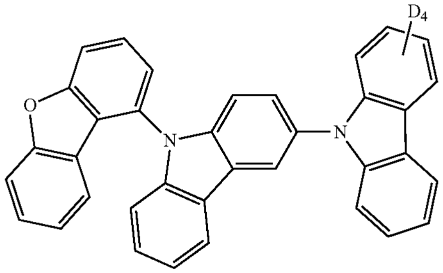
-continued
HTH36
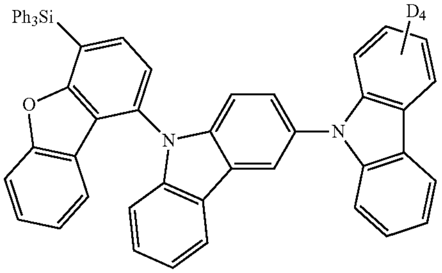
HTH37
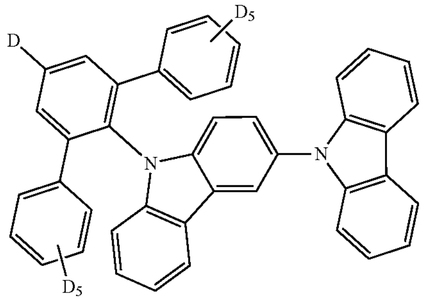
HTH38
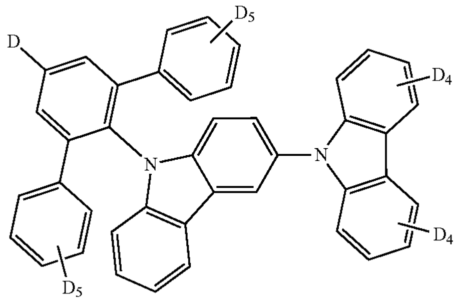
HTH39
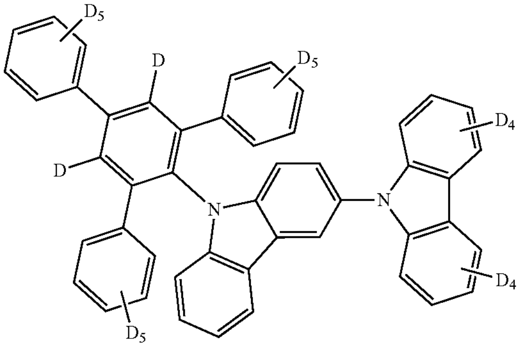

-continued
HTH40
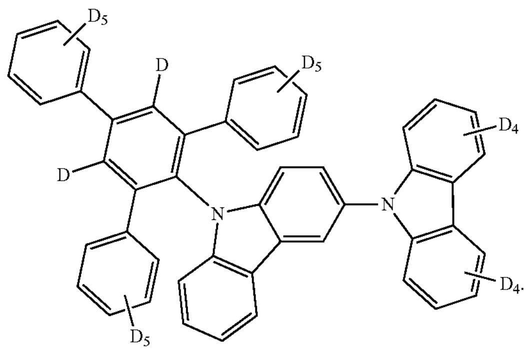
In one or more embodiments, the fourth compound may be at least one selected from among Compounds DFD1 to DFD29:
DFD1
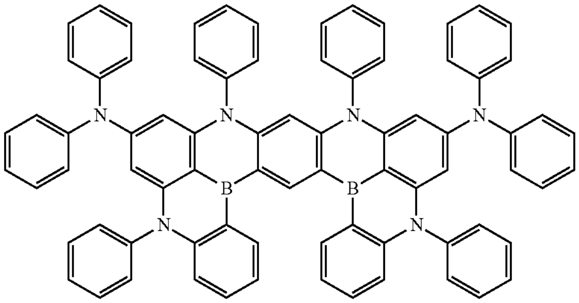
DFD2
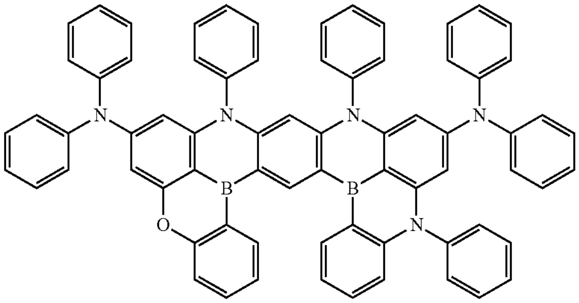
DFD3
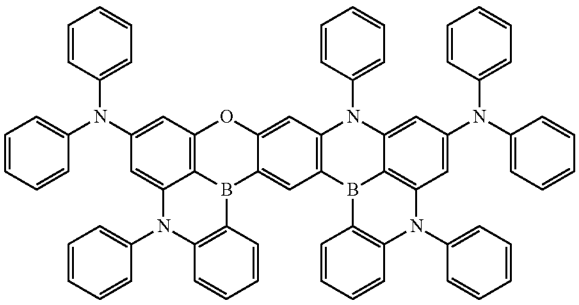
-continued
DFD4
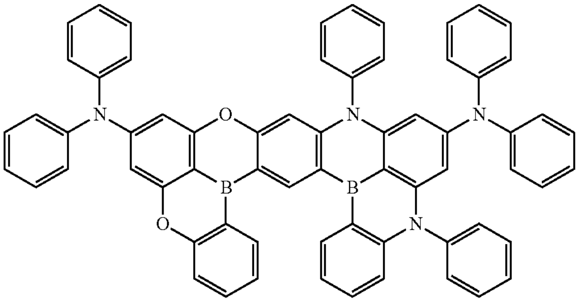
DFD5
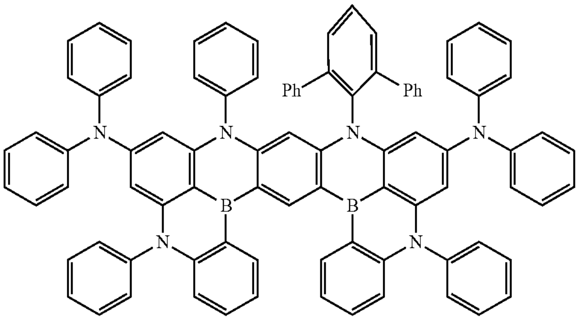
DFD6
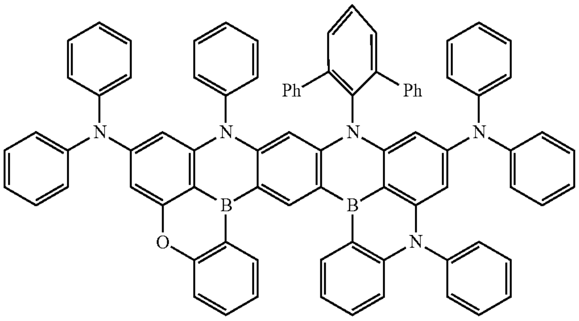
DFD7
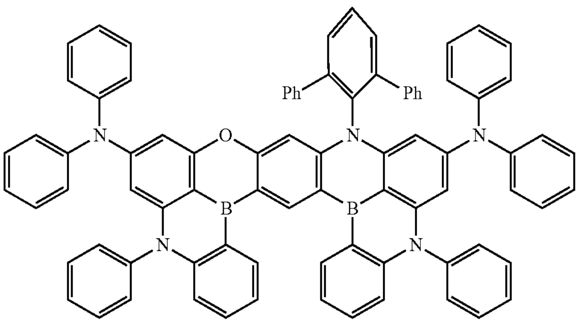

-continued
DFD8
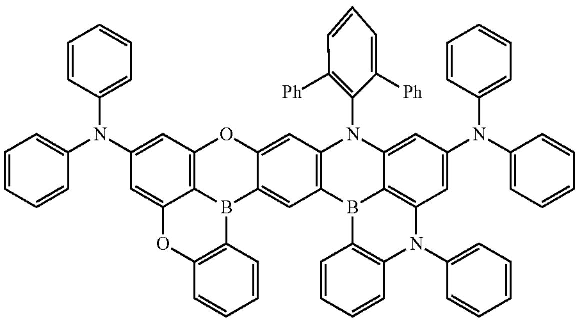
DFD9
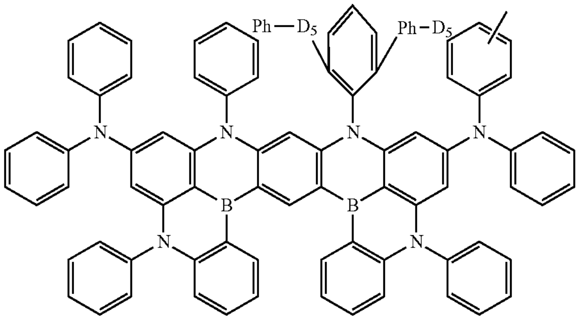
DFD10
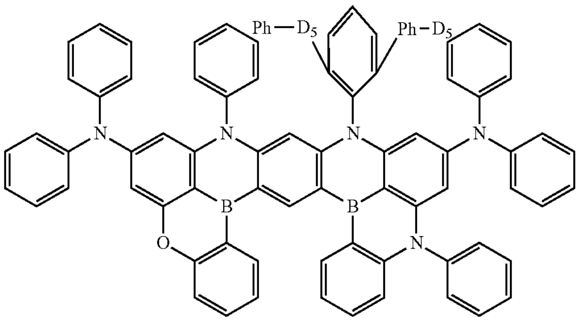
DFD11
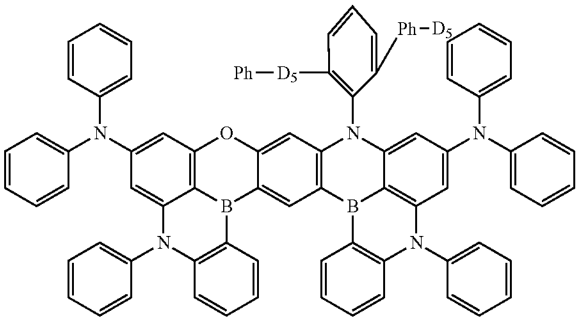
-continued
DFD12
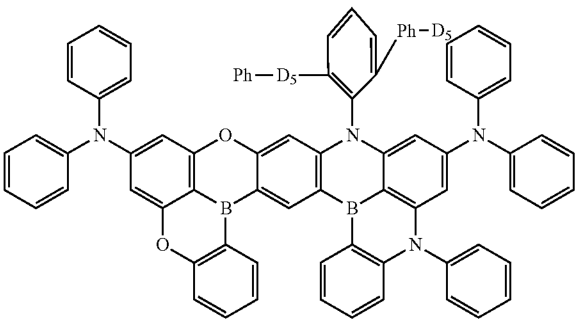
DFD13
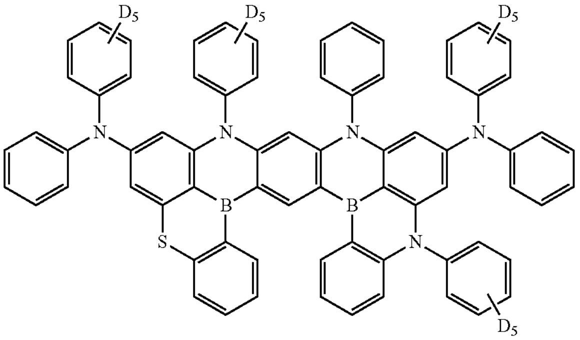
DFD14
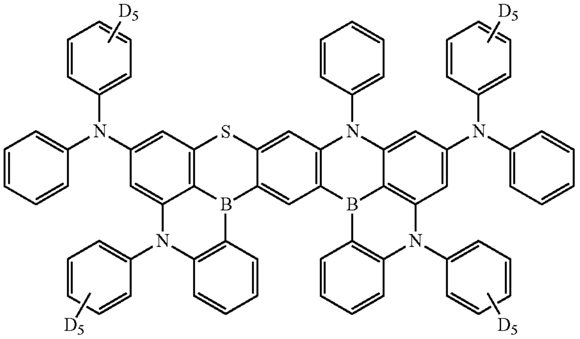
DFD15
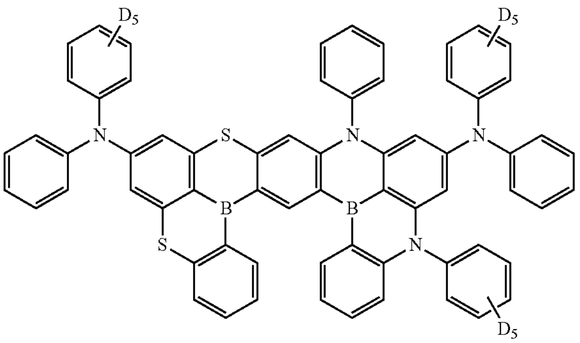

-continued
DFD16
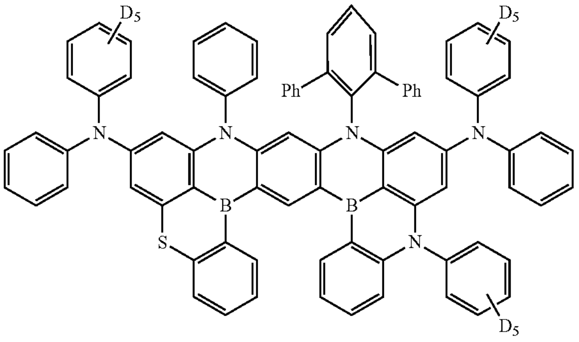
DFD17
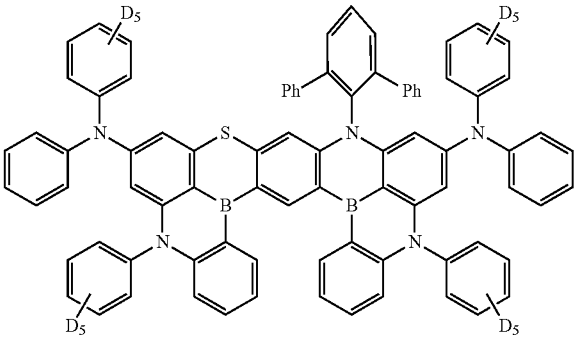
DFD18
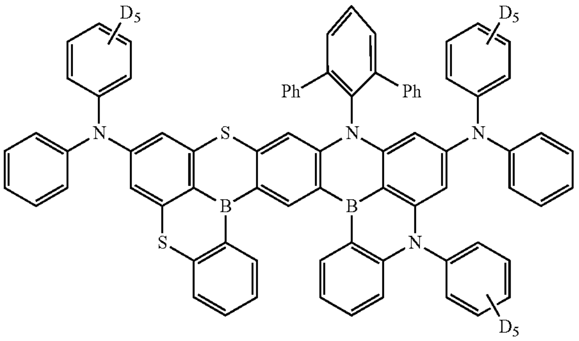
DFD19
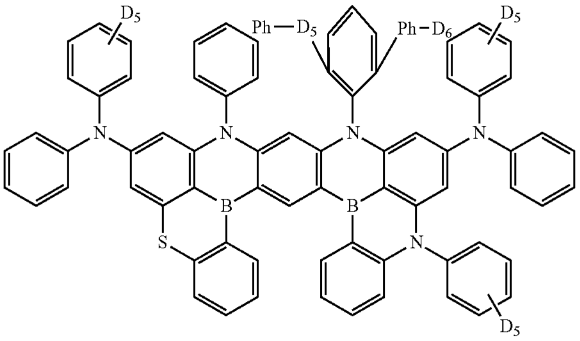
-continued
DFD20
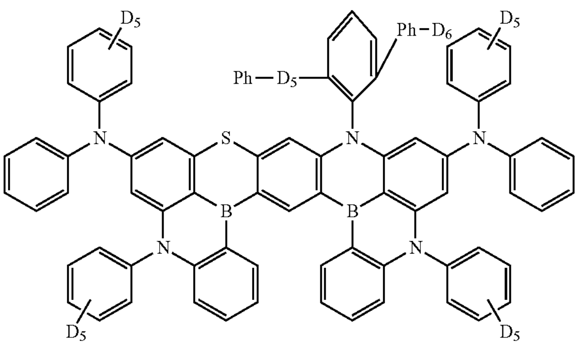
DFD21
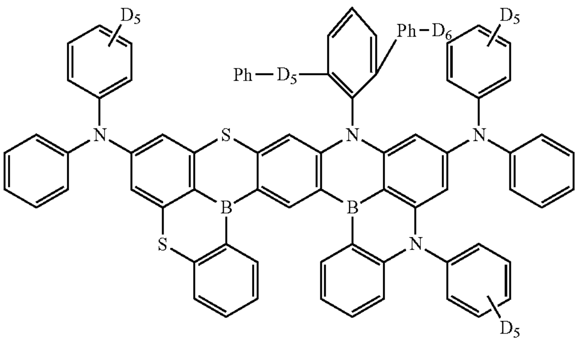
DFD22
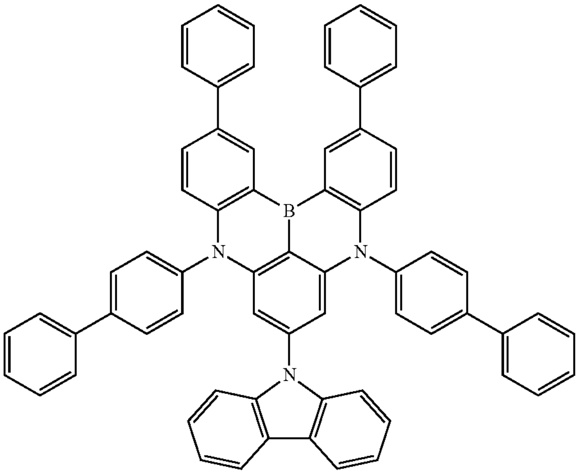

DFD23
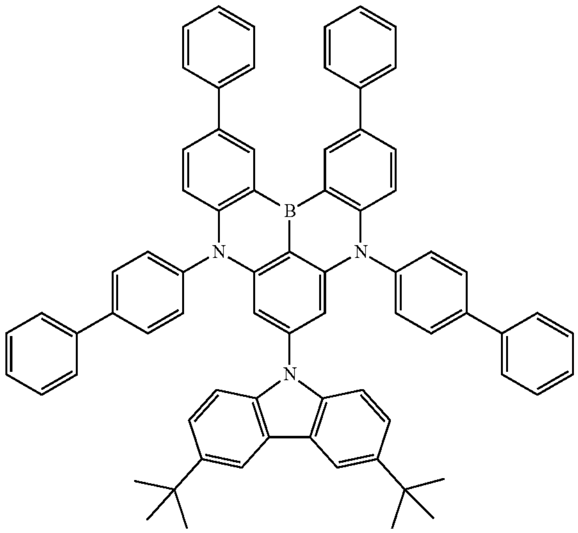
DFD24
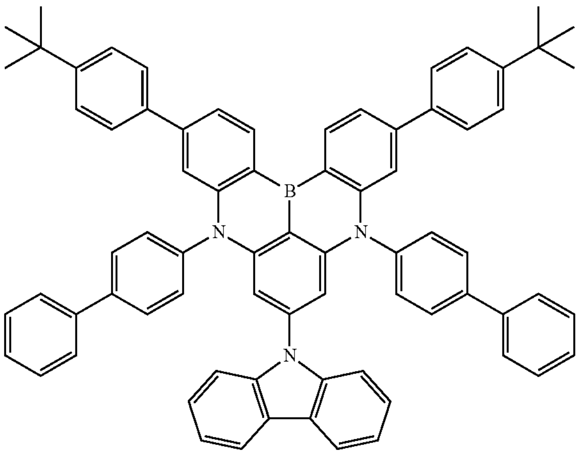
DFD25
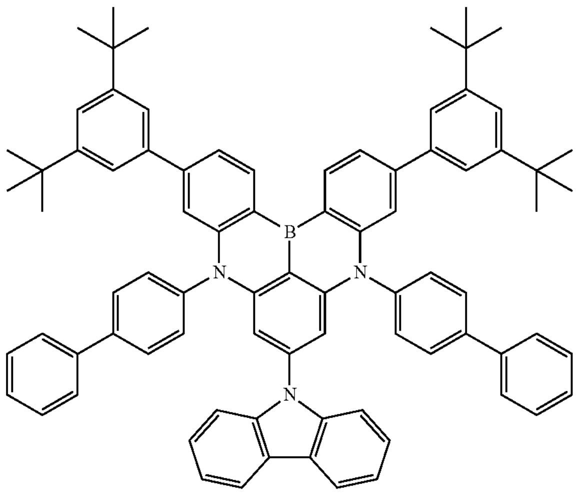
DFD26
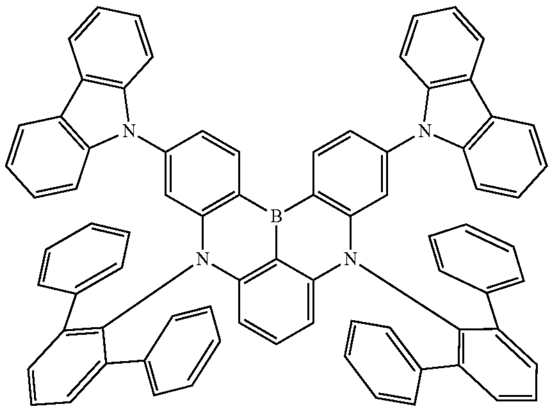
DFD27
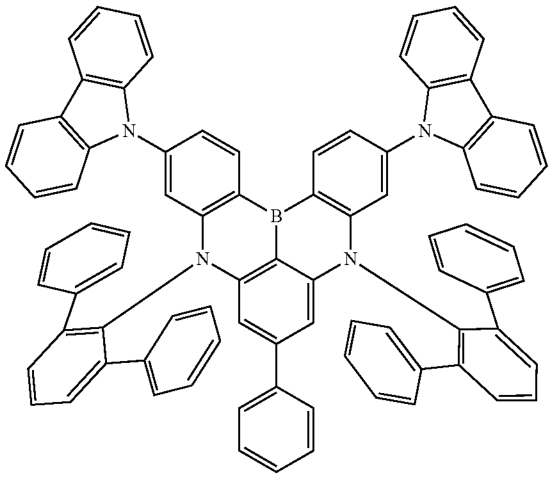
DFD28
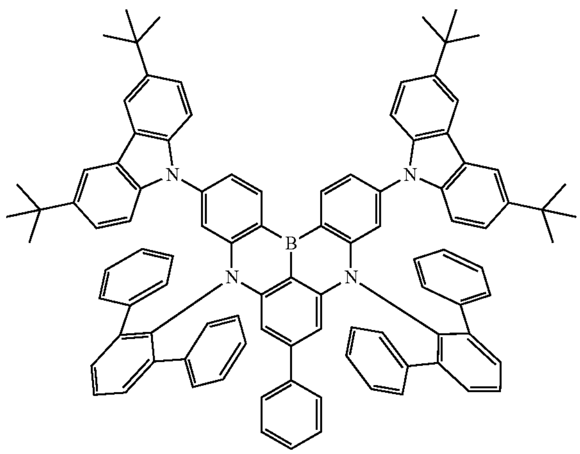

-continued

DFD29

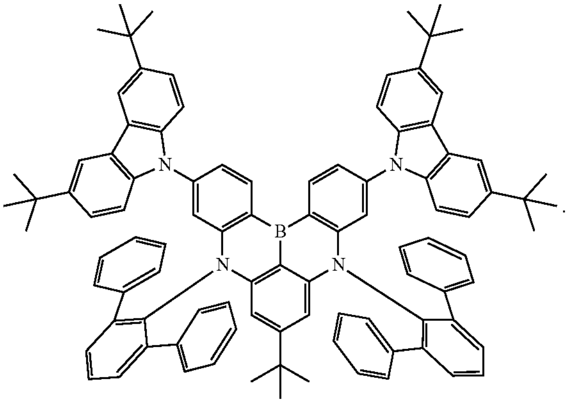

In the compounds described above, Ph represents a phenyl group, $D_5$ represents substitution with five deuterium, and $D_4$ represents substitution with four deuterium. For example, a group represented by

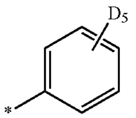

may be identical to a group represented by

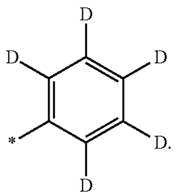

Description of FIG. 1

FIG. 1 is a schematic cross-sectional view of a light-emitting device 10 according to one or more embodiments of the present disclosure. The light-emitting device 10 may include a first electrode 110, an interlayer 130, and a second electrode 150.

Hereinafter, the structure of the light-emitting device 10 according to one or more embodiments and a method of manufacturing the light-emitting device 10 will be described with reference to FIG. 1.

First Electrode 110

In FIG. 1, in some embodiments, a substrate may be additionally provided and located under the first electrode 110 and/or on the second electrode 150. As the substrate, a glass substrate or a plastic substrate may be utilized. In one or more embodiments, the substrate may be a flexible substrate, and may include plastics with excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In one or more embodiments, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including (e.g., consisting of) a single layer or a multi-layered structure including a plurality of layers. For example, in some embodiments, the first electrode 110 may have a three-layered structure of ITO/Ag/ITO.

Interlayer 130

The interlayer 130 may be located on the first electrode 110. The interlayer 130 may include an emission layer.

In one or more embodiments, the interlayer 130 may further include a hole transport region located between the first electrode 110 and the emission layer, and an electron transport region located between the emission layer and the second electrode 150.

In one or more embodiments, the interlayer 130 may further include, in addition to one or more suitable organic materials, a metal-containing compound such as an organometallic compound, an inorganic material such as quantum dots, and/or the like.

In one or more embodiments, the interlayer 130 may include i) two or more emitting units sequentially stacked between the first electrode 110 and the second electrode 150, and ii) a charge generation layer located between two neighboring emitting units. When the interlayer 130 includes emitting units and the charge generation layer as described above, the light-emitting device 10 may be a tandem light-emitting device.

Hole Transport Region in Interlayer 130

The hole transport region may have: i) a single-layered structure including (e.g., consisting of) a single layer consisting of a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron-blocking layer, or any combination thereof.

For example, in some embodiments, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, the layers of each structure being stacked sequentially from the first electrode 110 in each stated order.

The hole transport region may include a compound represented by Formula 201, a compound represented by Formula 202, or any combination thereof:

Formula 201

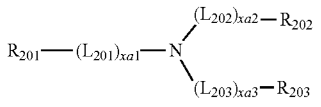

Formula 202

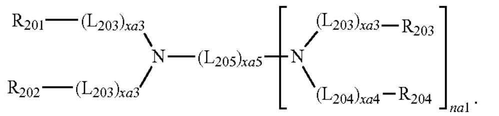

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, see Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, in some embodiments, each of Formulae 201 and 202 may include at least one selected from groups represented by Formulae CY201 to CY217:

CY201

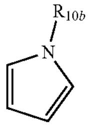

-continued

CY202

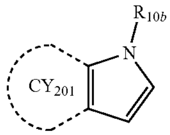

CY203

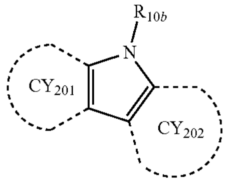

CY204

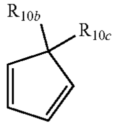

CY205

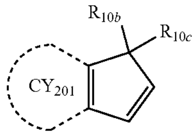

CY206

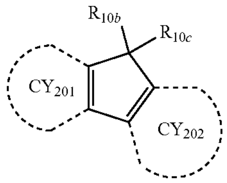

CY207

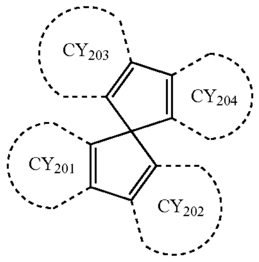

CY208

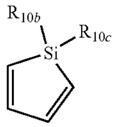

CY209

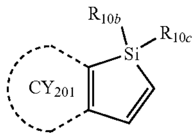

-continued

CY210

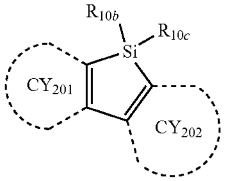

CY211

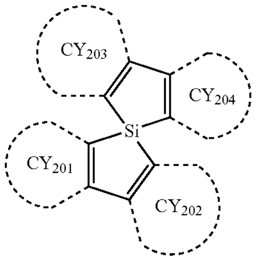

CY212

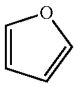

CY213

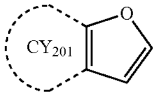

CY214

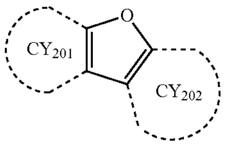

CY215

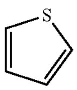

CY216

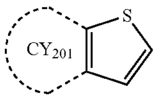

-continued

CY217

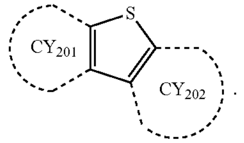

$R_{10b}$ and $R_{10c}$ in Formulae CY201 to CY217 may each independently be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one selected from groups represented by Formulae CY201 to CY203.

In one or more embodiments, Formula 201 may include at least one selected from the groups represented by Formulae CY201 to CY203 and at least one selected from the groups represented by Formulae CY204 to CY217.

In one or more embodiments, in Formula 201, xa1 may be 1, $R_{201}$ may be a group represented by one selected from Formulae CY201 to CY203, xa2 may be 0, and $R_{202}$ may be a group represented by one selected from Formulae CY204 to CY207.

In one or more embodiments, each of Formulae 201 and 202 may not include (e.g., may exclude) a group represented by one selected from Formulae CY201 to CY203.

In one or more embodiments, each of Formulae 201 and 202 may not include (e.g., may exclude) a group represented by one selected from Formulae CY201 to CY203, and may include at least one selected from the groups represented by Formulae CY204 to CY217.

In one or more embodiments, each of Formulae 201 and 202 may not include (e.g., may exclude) a group represented by one selected from Formulae CY201 to CY217.

In one or more embodiments, the hole transport region may include at least one selected from Compounds HT1 to HT46, 4,4',4"-[tris(3-methylphenyl)phenylamino]triphenylamine (m-MTDATA), 4,4',4"-tris(N,N-diphenylamino) triphenylamine (TDATA), 4,4',4"-tris[N(2-naphthyl)-N-phenylamino]-triphenylamine (2-TNATA), N,N'-di(1-naphthalene-1-yl)-N,N'-diphenyl-benzidine (NPB(NPD)), β-NPB, N,N'-bis(3-methylphenyl)-N,N'-diphenyl-[1,1'-biphenyl]-4,4'-diamine (TPD), Spiro-TPD, Spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl) triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), and/or any combination thereof:

HT1
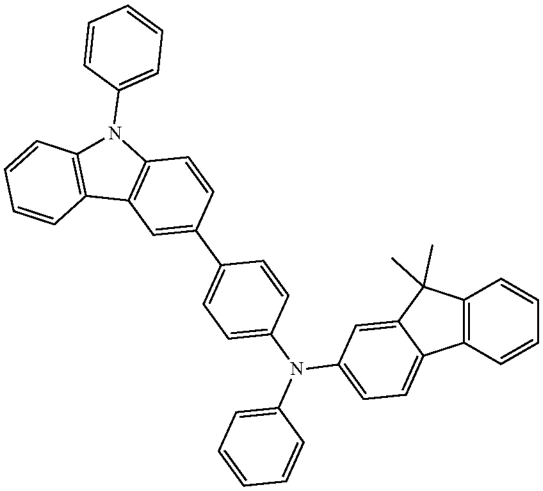
HT2
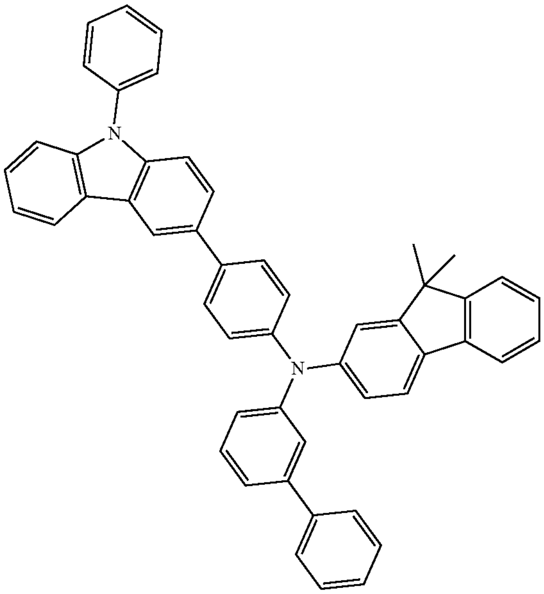
HT3
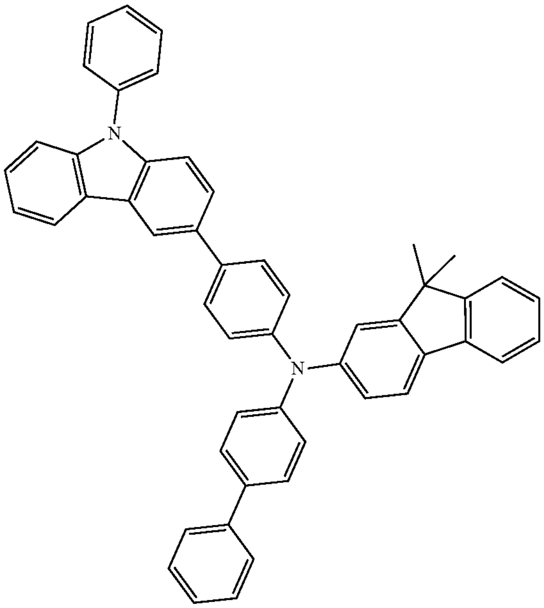
HT4
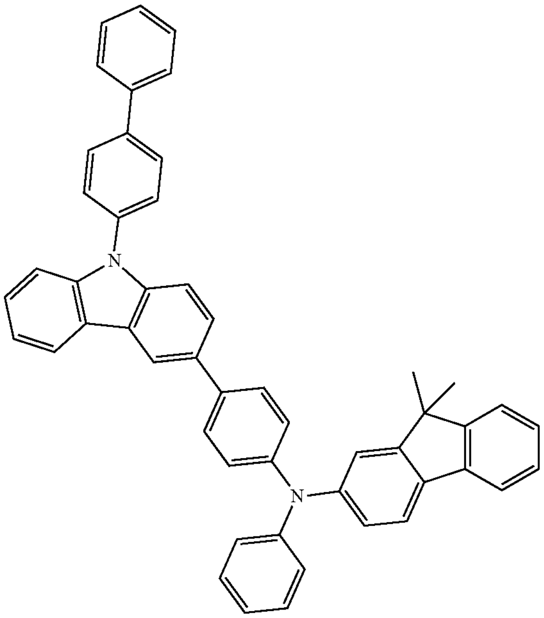

-continued
HT5
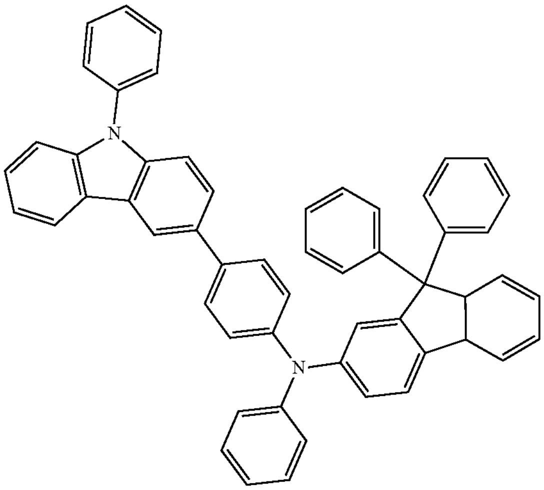
HT6
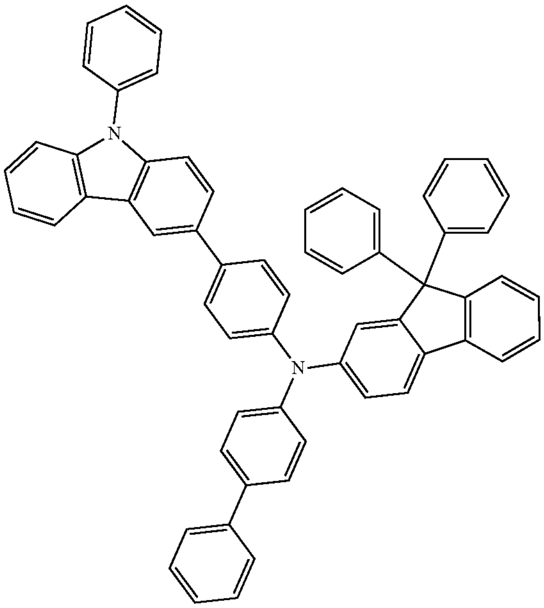
HT7
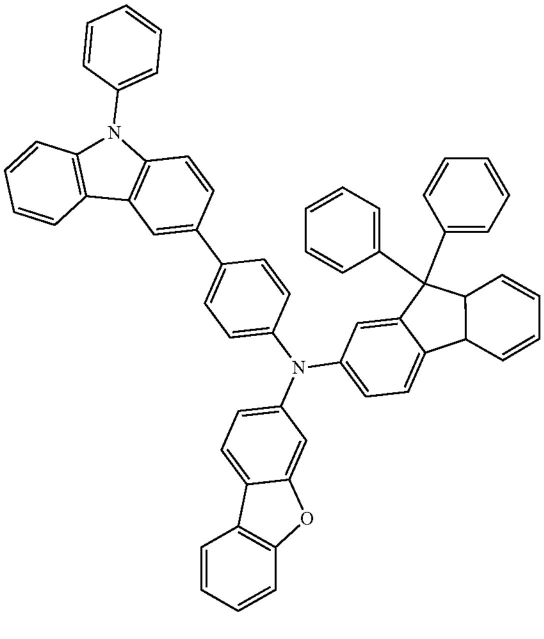
HT8
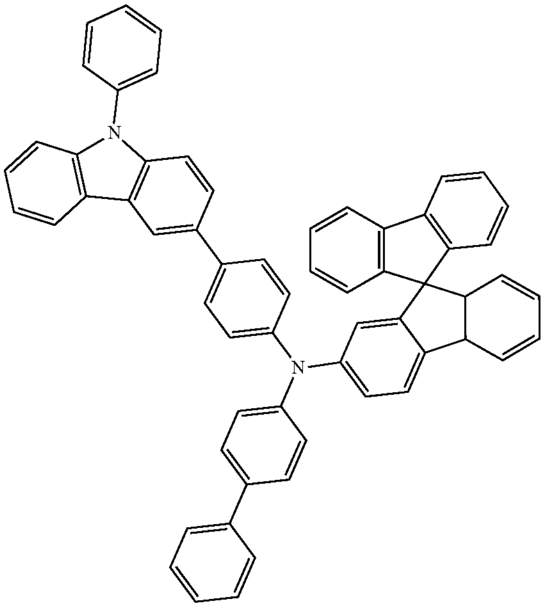

-continued
HT9
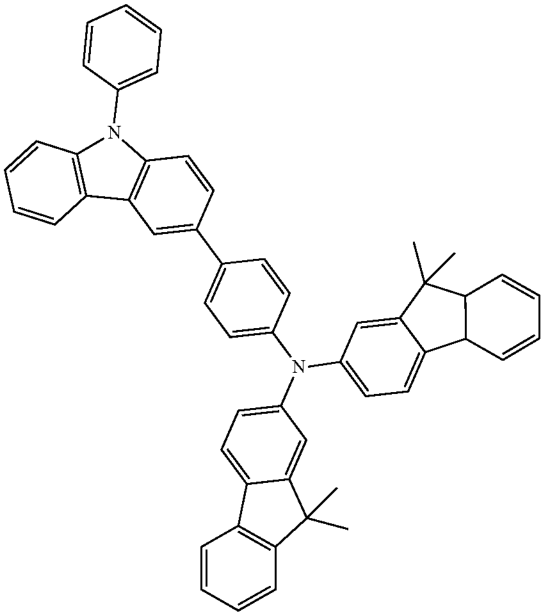
HT10
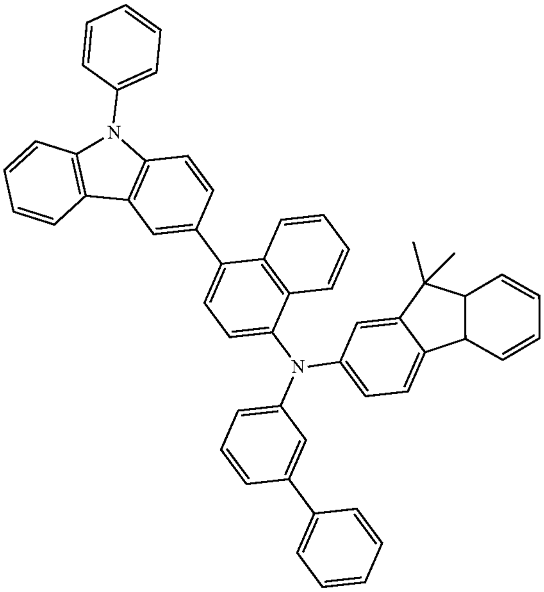
HT11
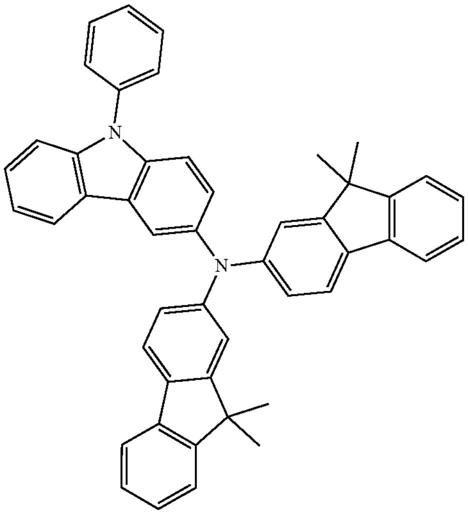
HT12
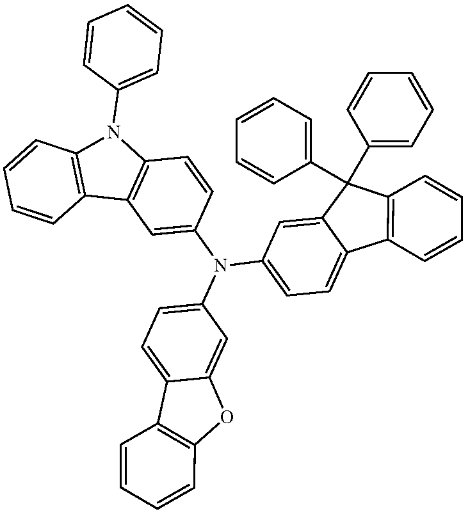

-continued
HT13
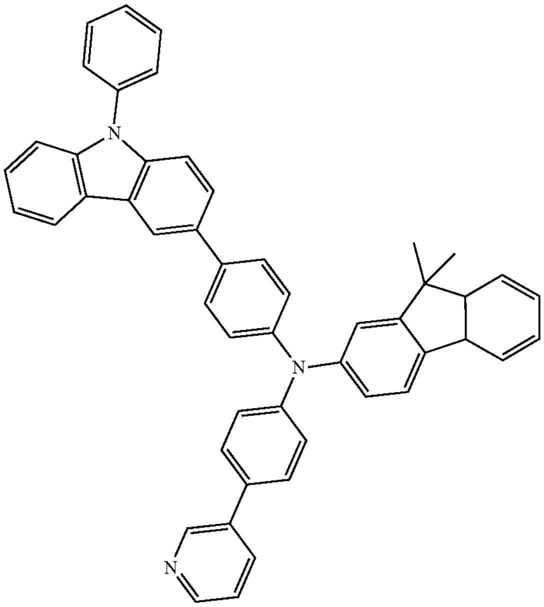
HT14
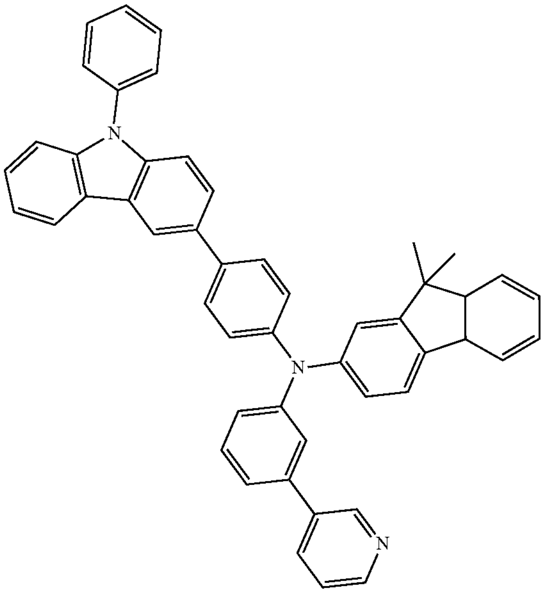
HT15
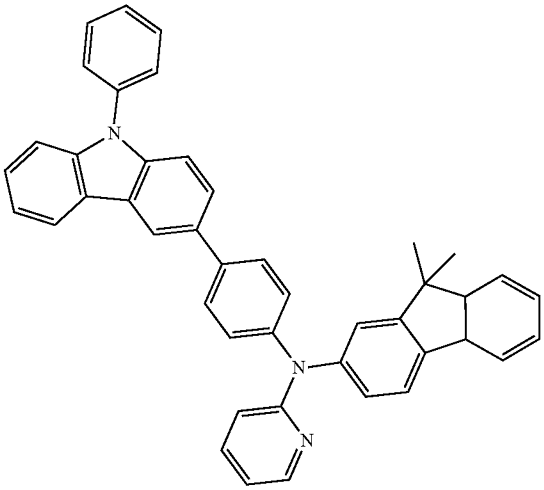
HT16
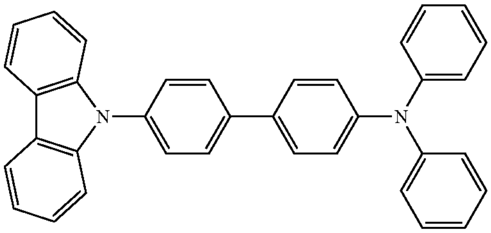
HT17
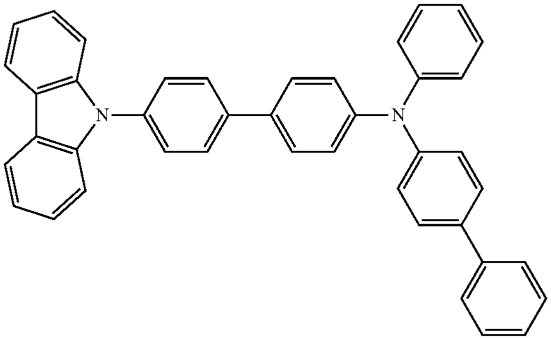
HT18
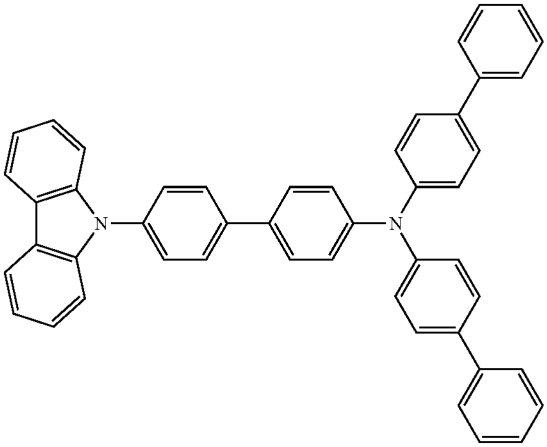

-continued
HT19
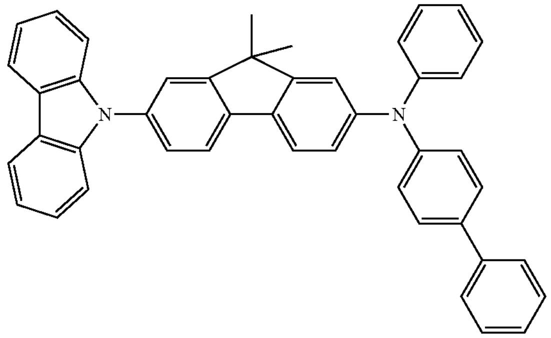
HT20
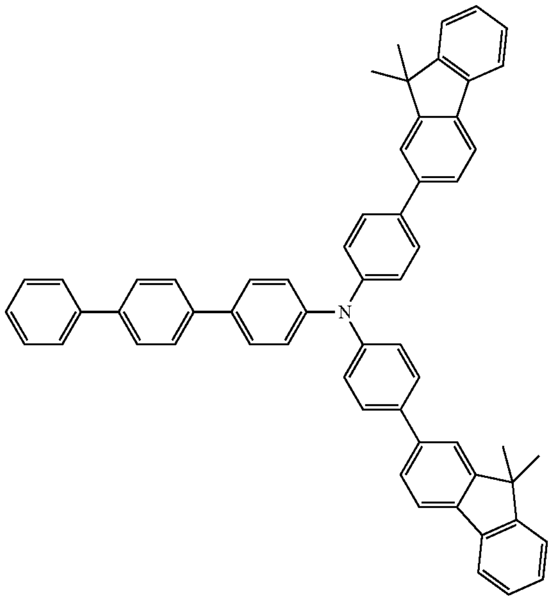
HT21
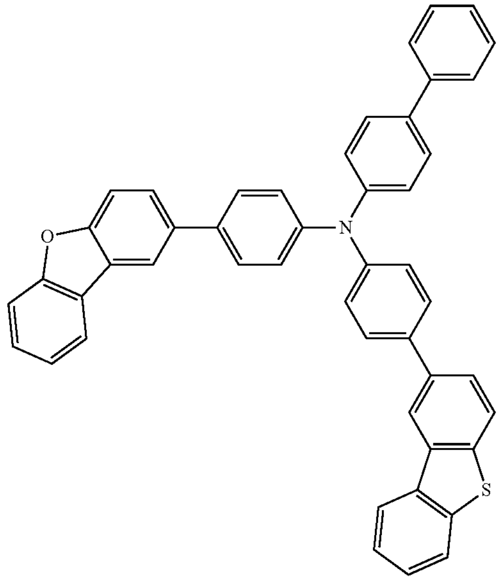
HT22
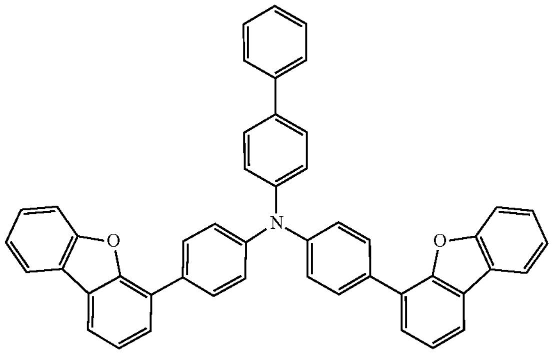

-continued
HT23
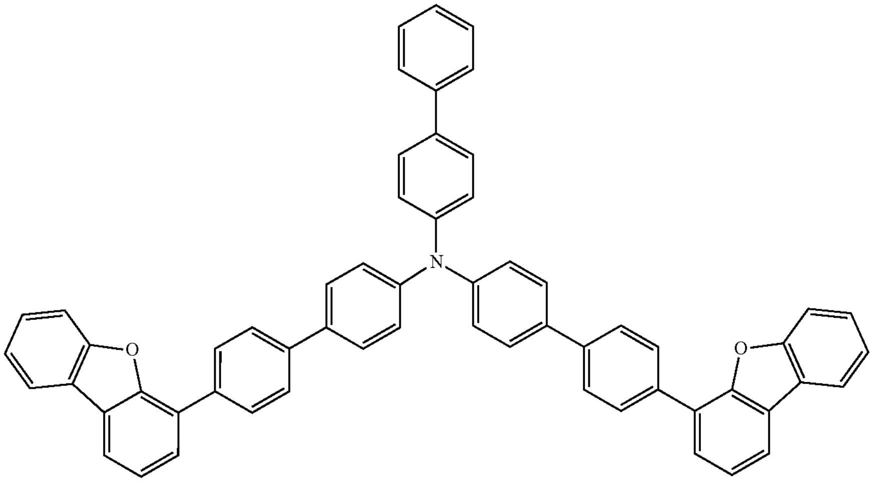
HT24
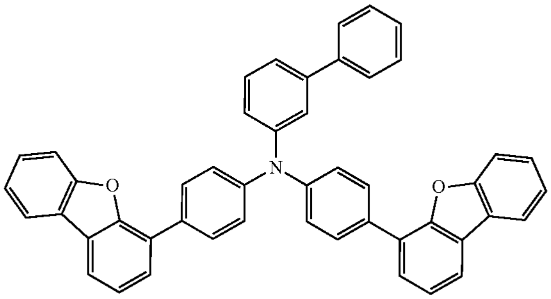
HT25
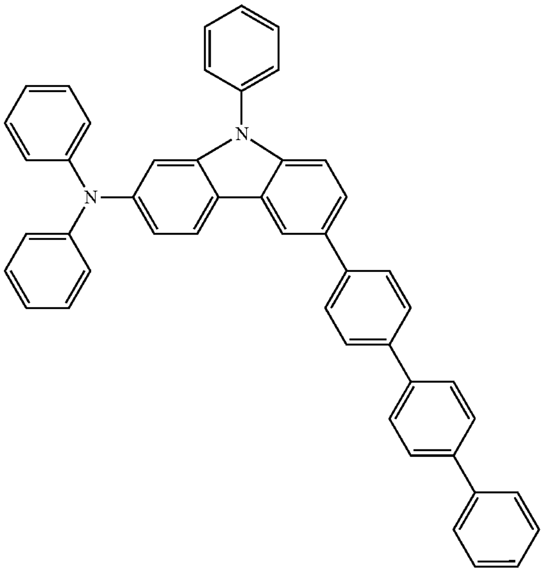

-continued
HT26
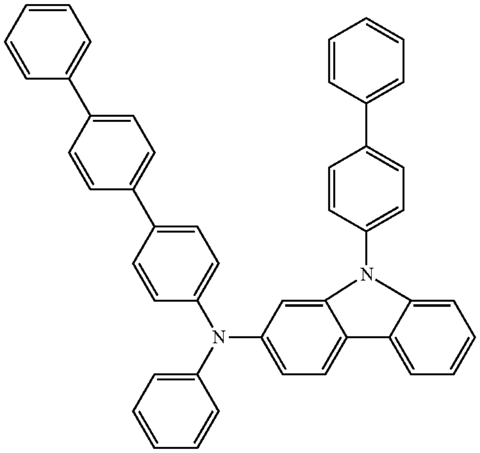
HT27
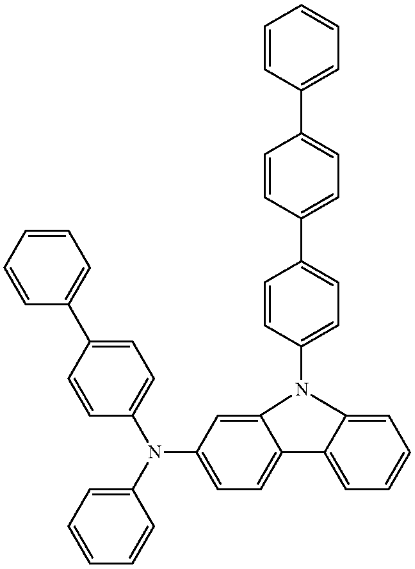
HT28
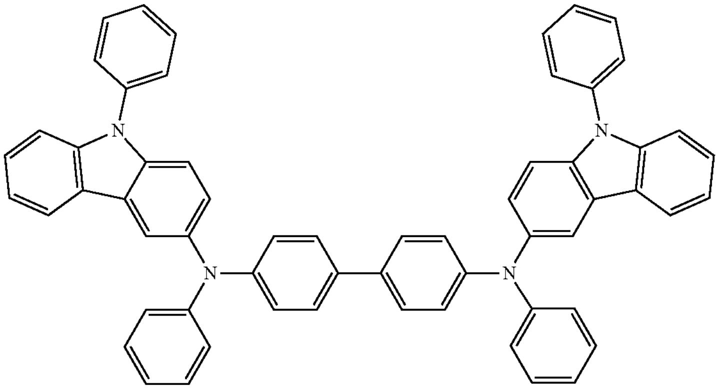
HT29
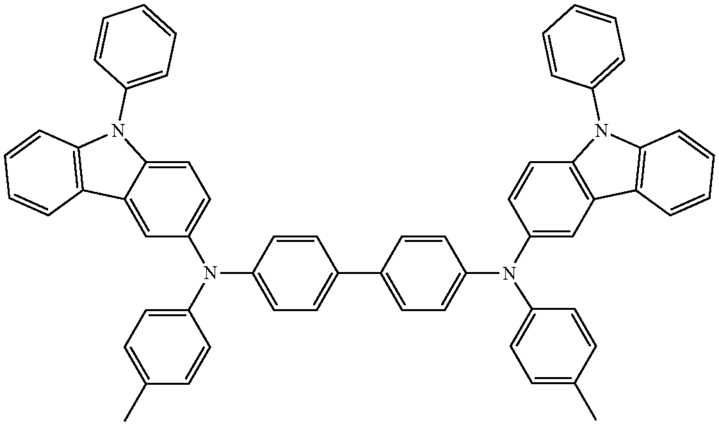

-continued
HT30
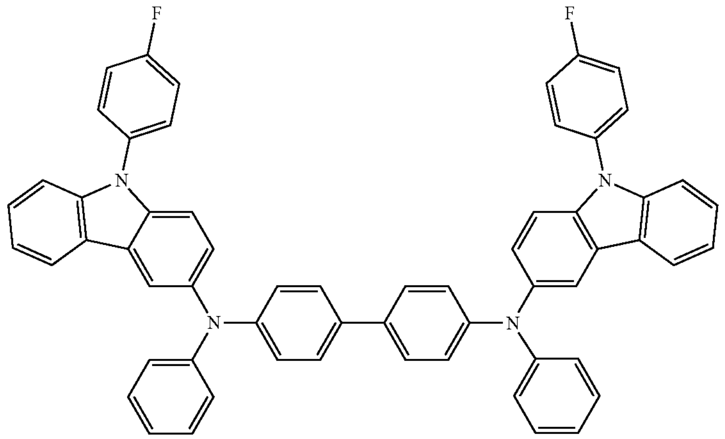
HT31
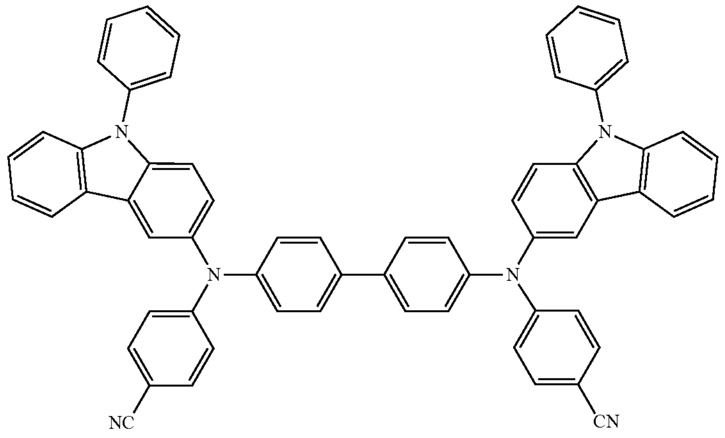
HT32
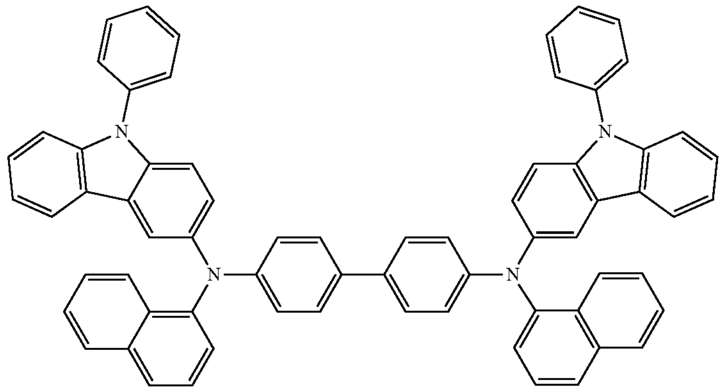

-continued
HT33
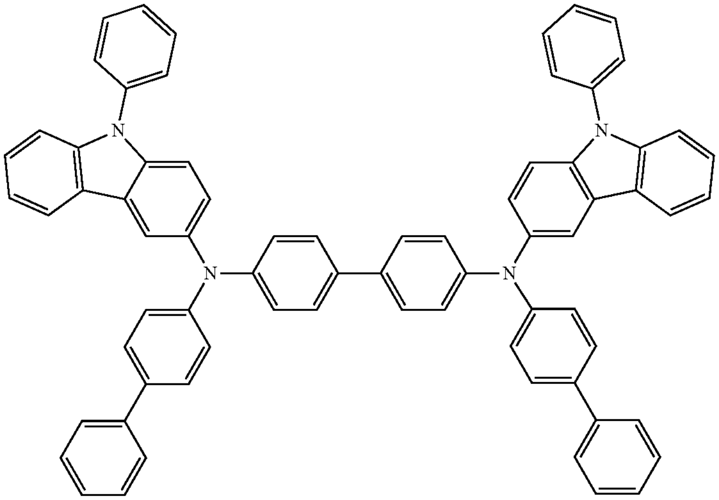
HT34
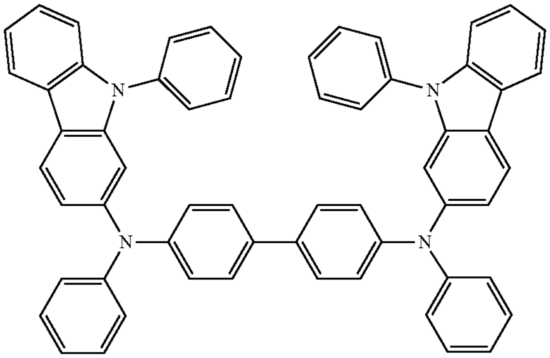
HT35
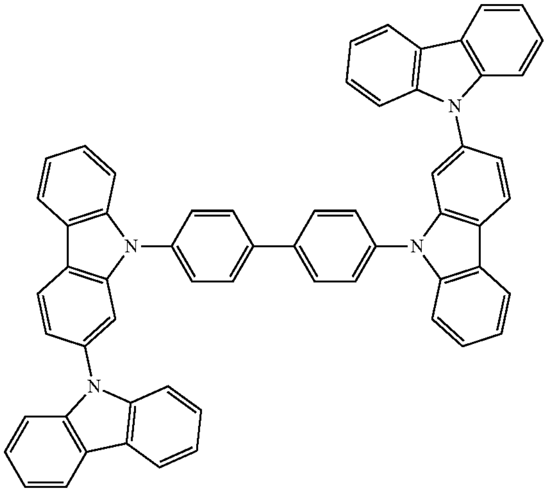
HT36
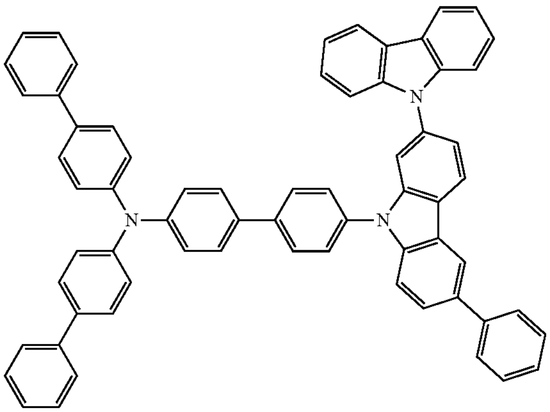
HT37
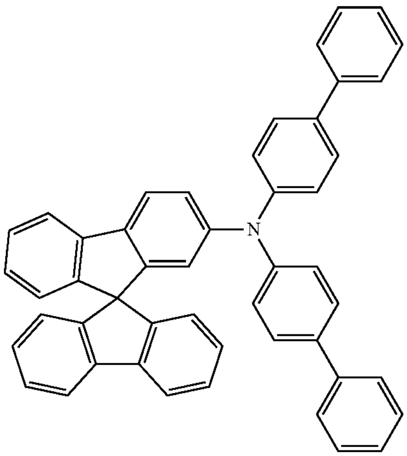

-continued
HT38
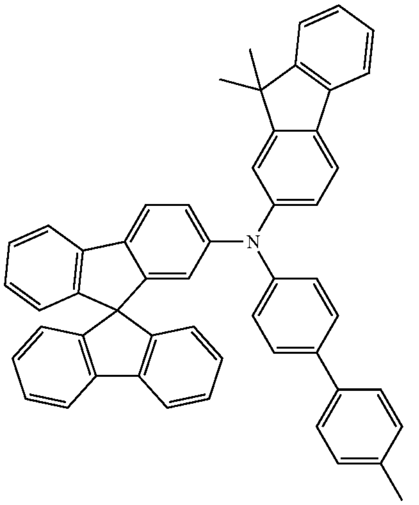
HT39
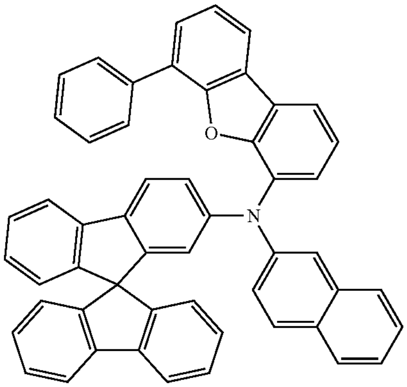
HT40
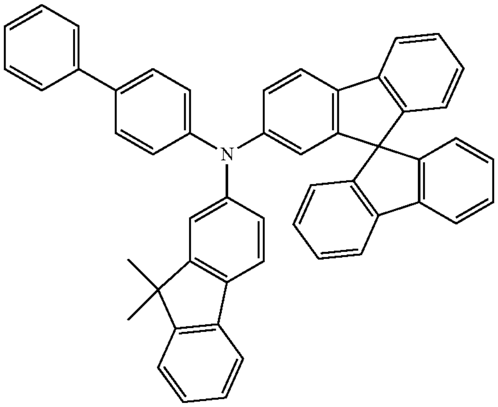
HT41
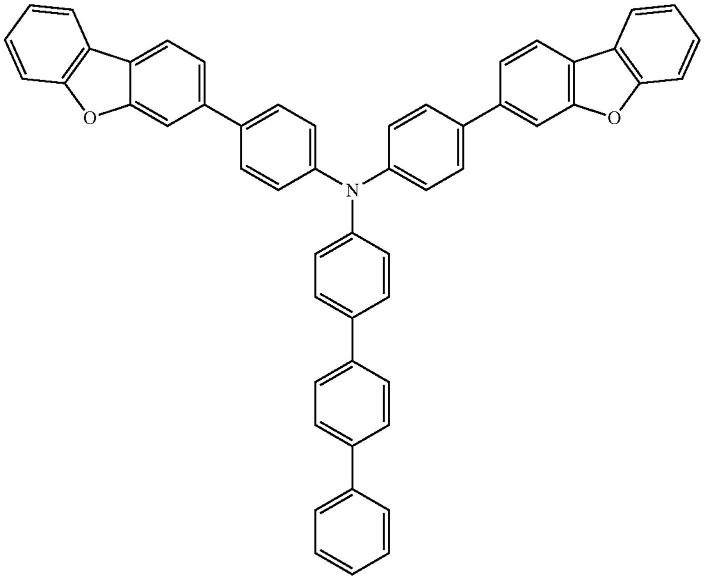

-continued
HT42
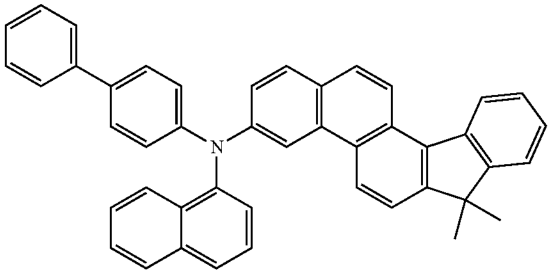
HT43
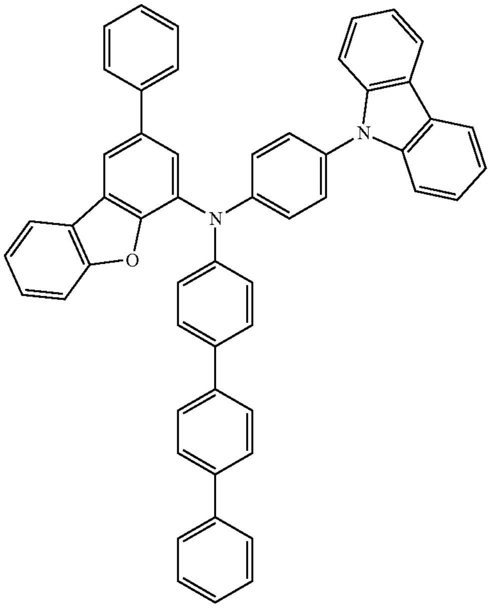
HT44
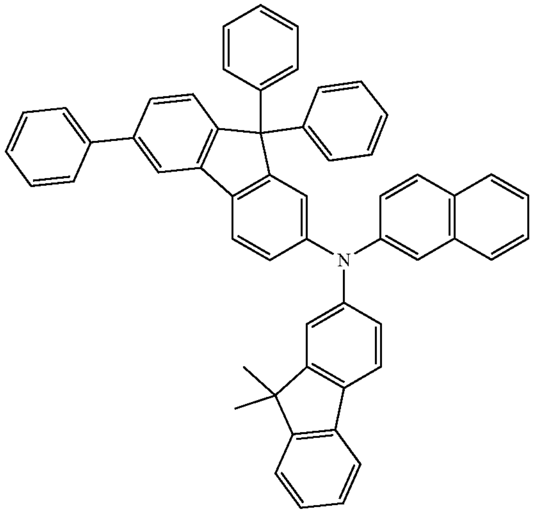
HT45
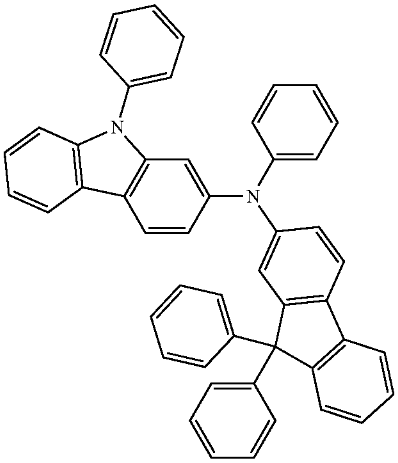

-continued
HT46
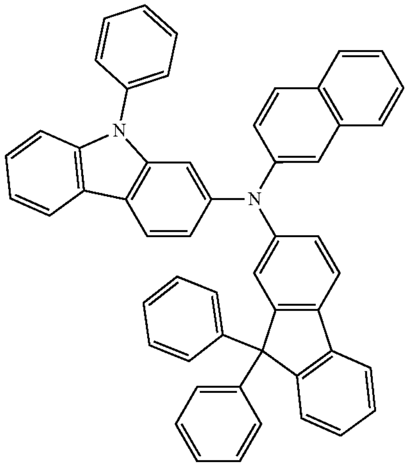
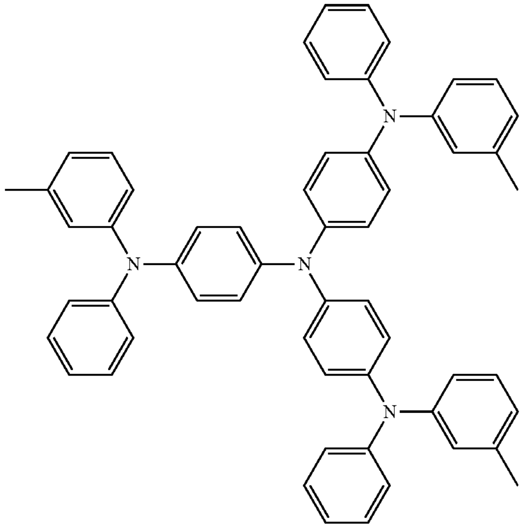
m-MTDATA
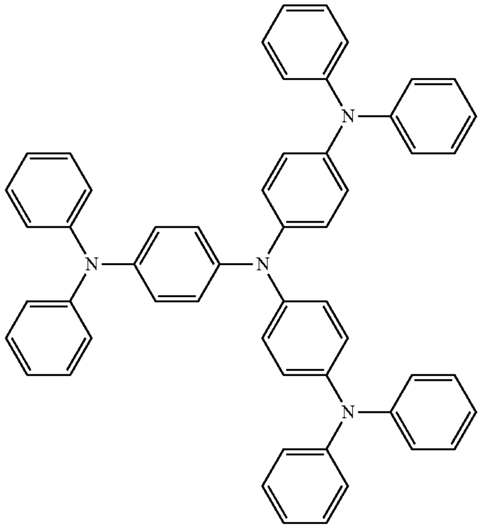
TDATA
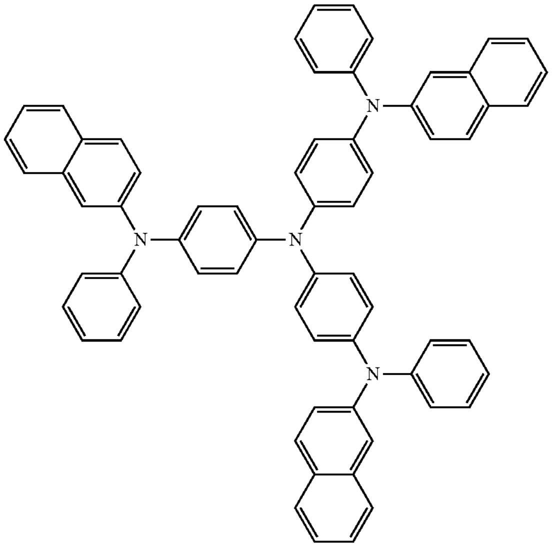
2-TNATA
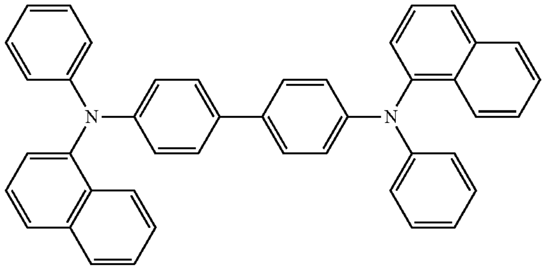
NPB
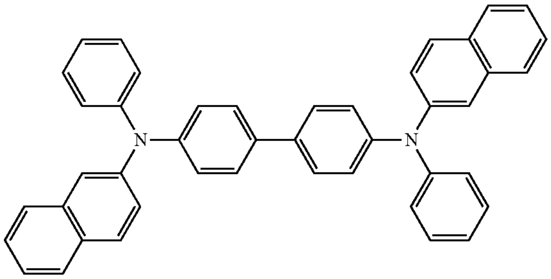
β-NPB -continued

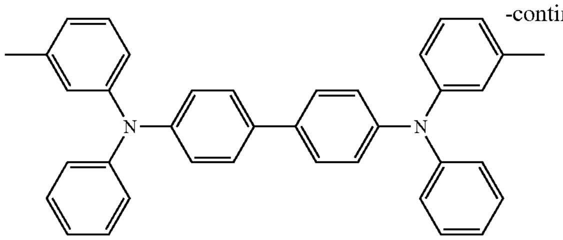

TPD

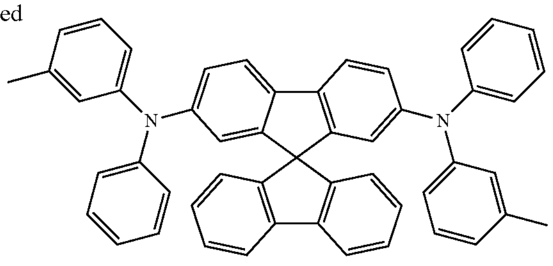

Spiro-TPD

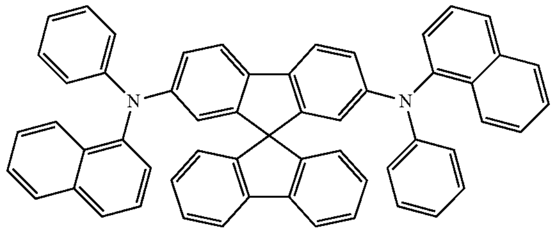

Spiro-NPB

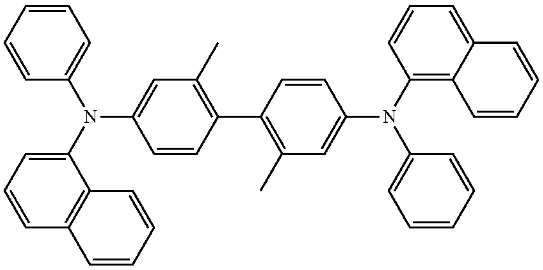

methylated-NPB

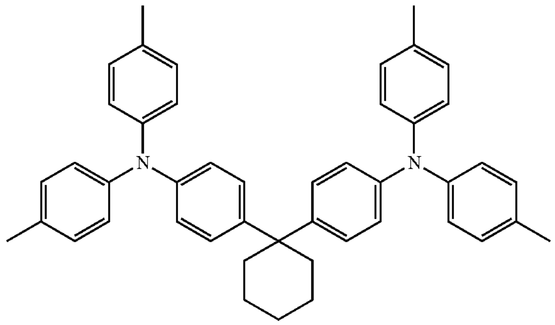

TAPC

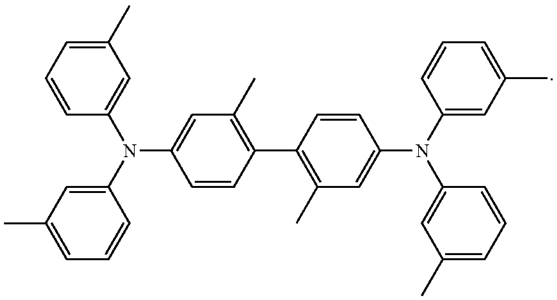

HMPTD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron-blocking layer may block or reduce the leakage of electrons from an emission layer to a hole transport region. Materials that may be included in the hole transport region may be included in the emission auxiliary layer and the electron-blocking layer.

p-Dopant

In one or more embodiments, the hole transport region may further include, in addition to these materials, a charge-generation material for the improvement of conductive properties. The charge-generation material may be substantially uniformly or non-uniformly dispersed in the hole transport region (for example, in the form of a single layer including (e.g., consisting of) a charge-generation material).

The charge-generation material may be, for example, a p-dopant.

For example, in some embodiments, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2, or any combination thereof.

Non-limiting examples of the quinone derivative may be tetracyanoquinodimethane (TCNQ), 2,3,5,6-tetrafluoro-7,7,8,8-tetracyanoquinodimethane (F4-TCNQ), etc.

Non-limiting examples of the cyano group-containing compound may be dipyrazino[2,3-f: 2',3'-h] quinoxaline-2,3,6,7,10,11-hexacarbonitrile (HAT-CN), and/or a compound represented by Formula 221:

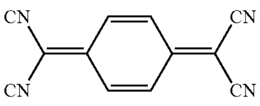

TCNQ

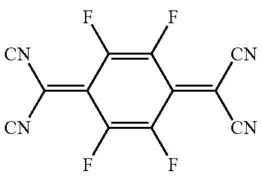

F4-TCNQ

-continued

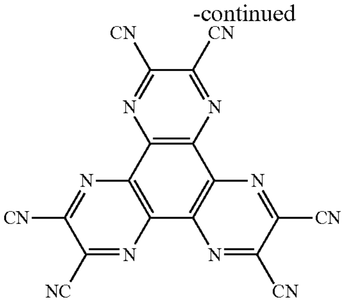

HAT-CN

Formula 221

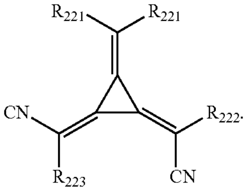

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from among $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Non-limiting examples of the metal may be an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and/or a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Non-limiting examples of the metalloid may be silicon (Si), antimony (Sb), and/or tellurium (Te).

Non-limiting examples of the non-metal may be oxygen (O) and/or halogen (for example, F, Cl, Br, I, etc.).

Non-limiting examples of the compound including element EL1 and element EL2 may be metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or any combination thereof.

Non-limiting examples of the metal oxide may be tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and/or rhenium oxide (for example, $ReO_3$, etc.).

Non-limiting examples of the metal halide may be alkali metal halide, alkaline earth metal halide, transition metal halide, post-transition metal halide, and/or lanthanide metal halide.

Non-limiting examples of the alkali metal halogen may include LiF, NaF, KF, RbF, CsF, LiCl, NaCl, KCl, RbCl, CsCl, LiBr, NaBr, KBr, RbBr, CsBr, LiI, NaI, KI, RbI, CsI. etc.

Non-limiting examples of the alkaline earth metal halide may be $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Non-limiting examples of the transition metal halide may be titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $COCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $Pt_{12}$, etc.), copper halide (for example, CuF, CuCl, CuBr, CuI, etc.), silver halide (for example, AgF, AgCl, AgBr, AgI, etc.), and/or gold halide (for example, AuF, AuCl, AuBr, AuI, etc.).

Non-limiting examples of the post-transition metal halide may be zinc halide (for example, $ZnF_2$, $ZnCl_2$, $ZnBr_2$, $ZnI_2$, etc.), indium halide (for example, $InI_3$, etc.), and/or tin halide (for example, $SnI_2$, etc.).

Non-limiting examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and/or the like.

An example of the metalloid halide may be antimony halide (for example, $SbCl_5$, etc.).

Non-limiting examples of the metal telluride may be alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and/or lanthanide metal telluride (for example, LaTe, CeTe, PrTe, NdTe, PmTe, EuTe, GdTe, TbTe, DyTe, HoTe, ErTe, TmTe, YbTe, LuTe, etc.)

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other to emit white light (e.g., combined white light). In one or more embodiments, the emission layer may include two or more materials selected from a red light-emitting material, a green light-emitting material, and a blue light-emitting material, in which the two or more materials are mixed with each other in a single layer to emit white light (e.g., combined white light).

In one or more embodiments, the emission layer may include a host and a dopant (or emitter). In one or more embodiments, the emission layer may further include an auxiliary dopant that promotes energy transfer to a dopant (or emitter), in addition to the host and the dopant (or emitter). When the emission layer includes the dopant (or emitter) and the auxiliary dopant, the dopant (or emitter) and the auxiliary dopant are different from each other.

The organometallic compound represented by Formula 1 in the present disclosure may serve as the dopant (or emitter), or may serve as the auxiliary dopant.

An amount (weight) of the dopant (or emitter) in the emission layer may be in a range of about 0.01 parts by weight to about 15 parts by weight based on 100 parts by weight of the host.

In one or more embodiments, the emission layer may include the organometallic compound represented by Formula 1. An amount (weight) of the organometallic compound in the emission layer may be in a range of about 0.01 parts by weight to about 30 parts by weight, about 0.1 parts by weight to about 20 parts by weight, or 0.1 parts by weight to about 15 parts by weight, based on 100 parts by weight of the emission layer.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

In one or more embodiments, the host in the emission layer may include the second compound or the third compound described in the present disclosure, or any combination thereof.

In one or more embodiments, the host may include a compound represented by Formula 301:

Formula 301

$$[Ar_{301}]_{xb11}-[(L_{301})_{xb1}-R_{301}]_{xb21}.$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each be the same as the description of $Q_1$ provided herein.

For example, in some embodiments, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

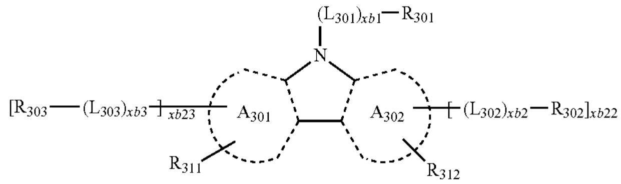

Formula 301-2

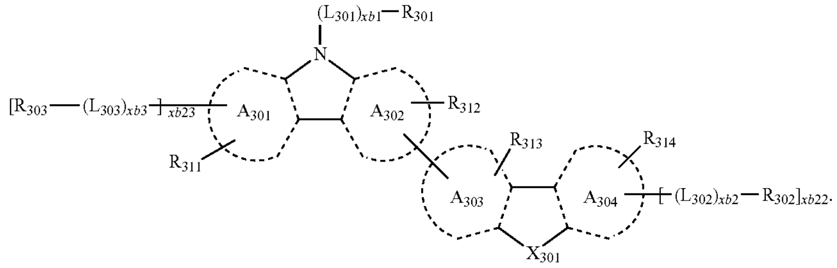

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described herein with respect to $L_{301}$, xb2 to xb4 may each independently be the same as described herein with respect to xb1, and $R_{302}$ to $R_{305}$ and $R_{311}$ to $R_{314}$ may each be the same as described herein with respect to $R_{301}$.

In one or more embodiments, the host may include an alkaline earth metal complex, a post-transition metal complex, or any combination thereof. For example, the host may include a Be complex (for example, Compound H55), an Mg complex, a Zn complex, or any combination thereof.

In one or more embodiments, the host may include at least one selected from among Compounds H1 to H130, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-yl)benzene (TCP), and/or any combination thereof:

H1

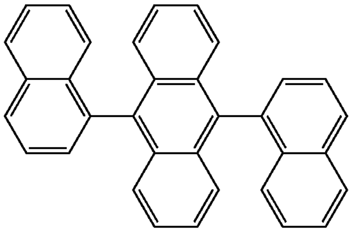

H2

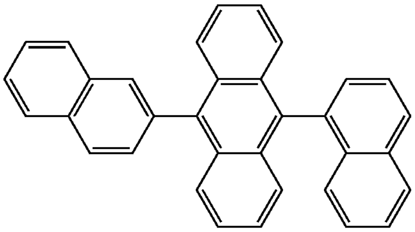

H3

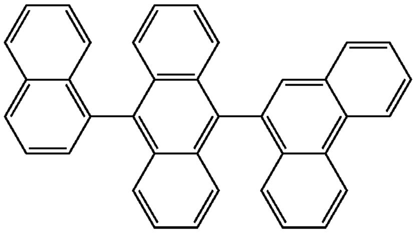

H4

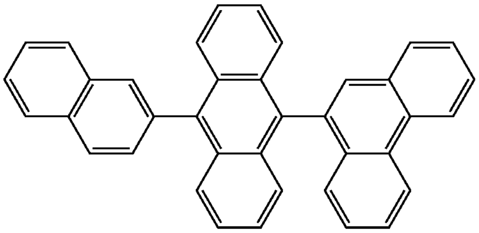

H5

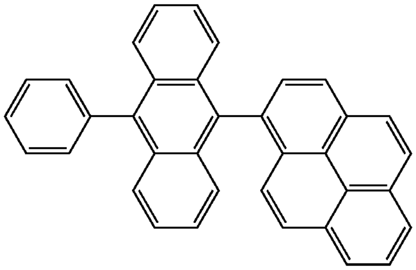

H6

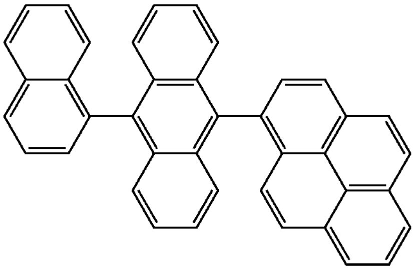

H7

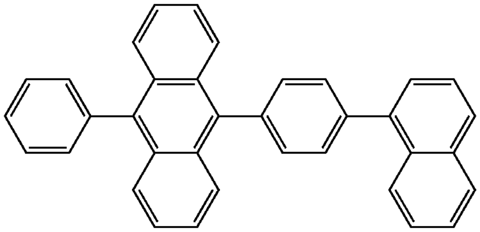

H8

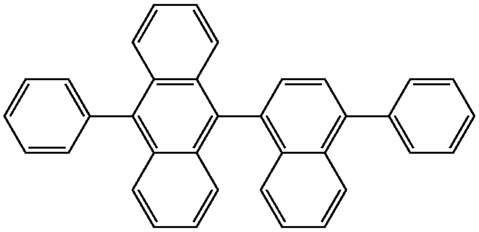

H9

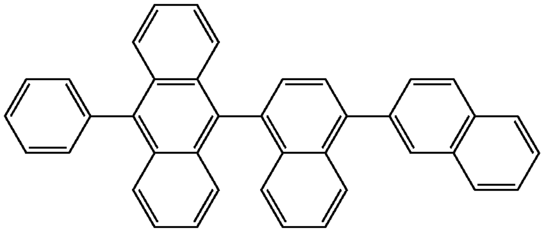

H10

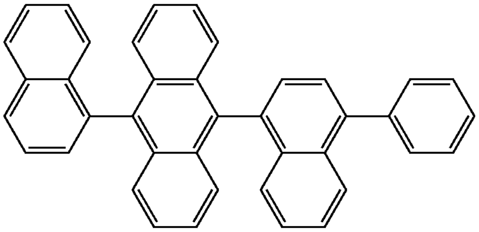

-continued
H11
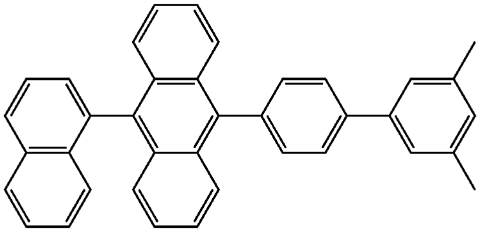
H12
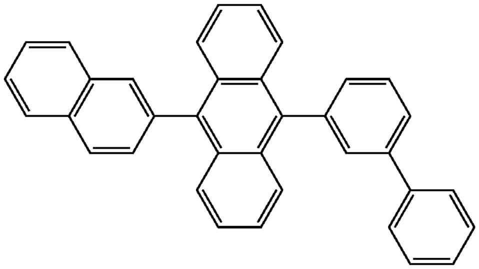
H13
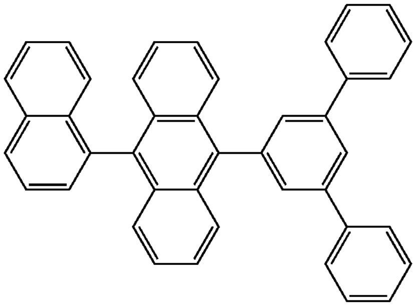
H14
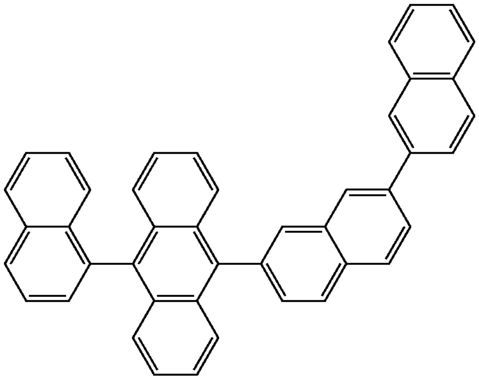
H15
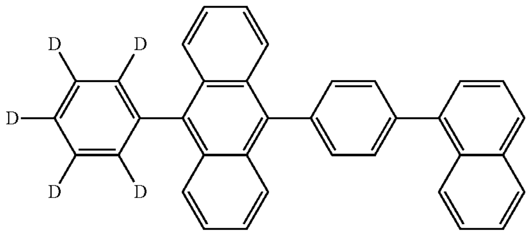
H16
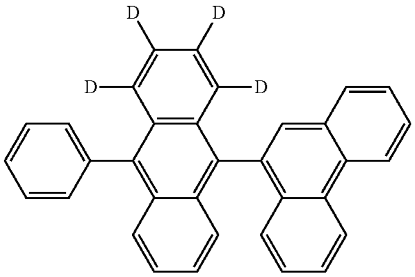
H17
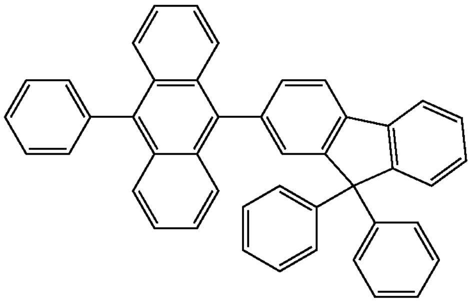
H18
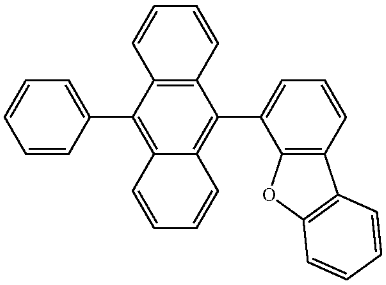
H19
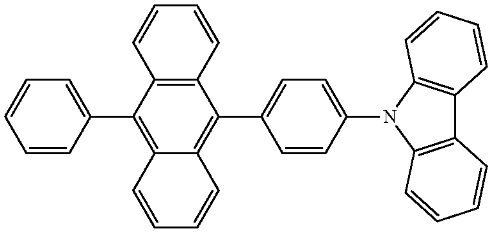
H20
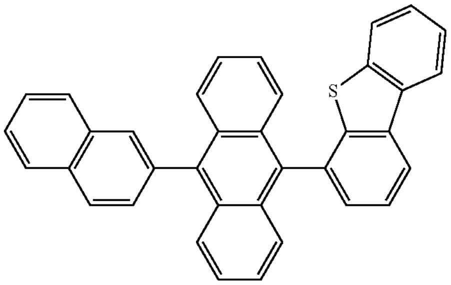

-continued
H21
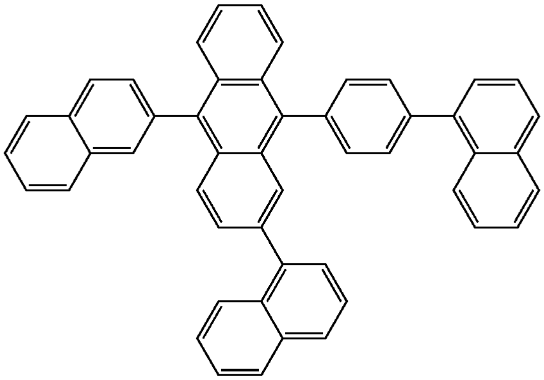
H22
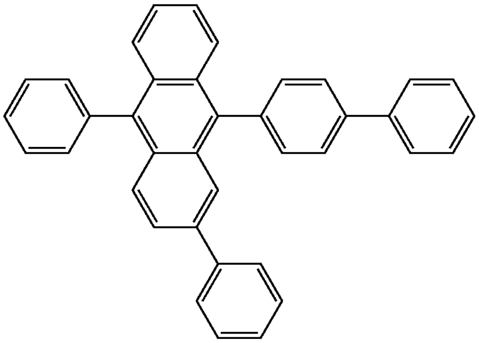
H23
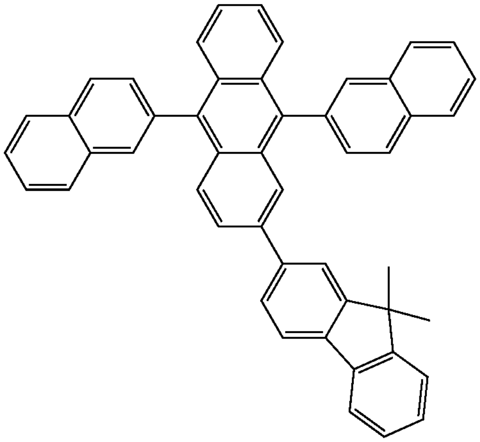
H24
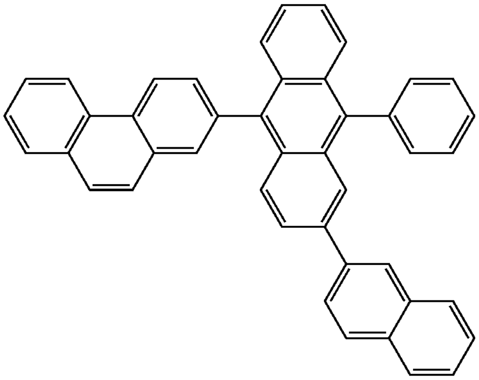
H25
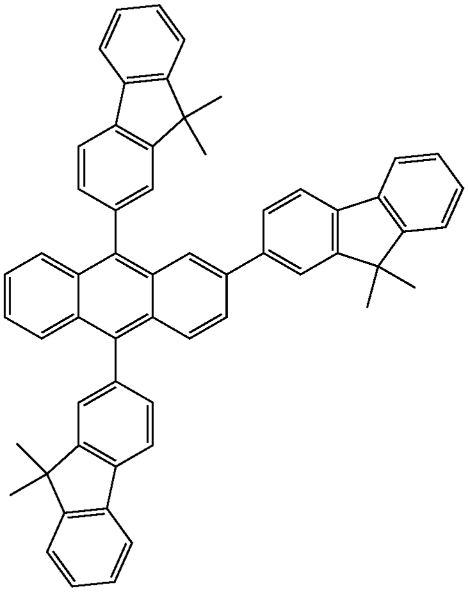
H26
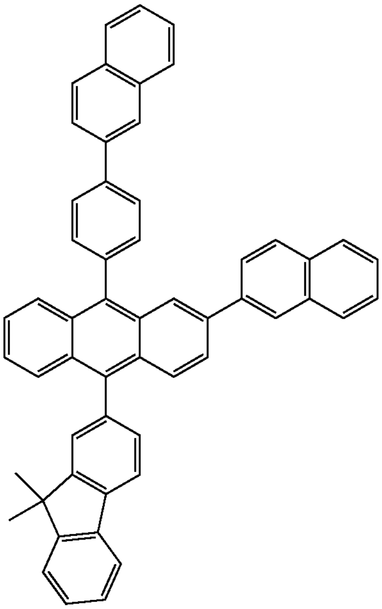

-continued
H27
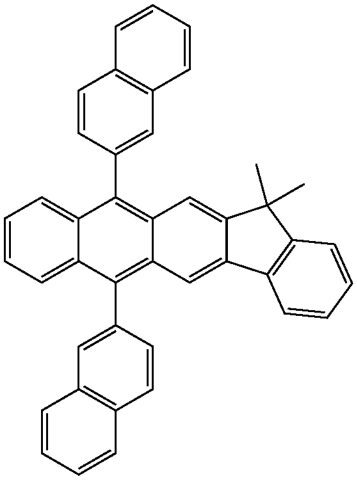
H28
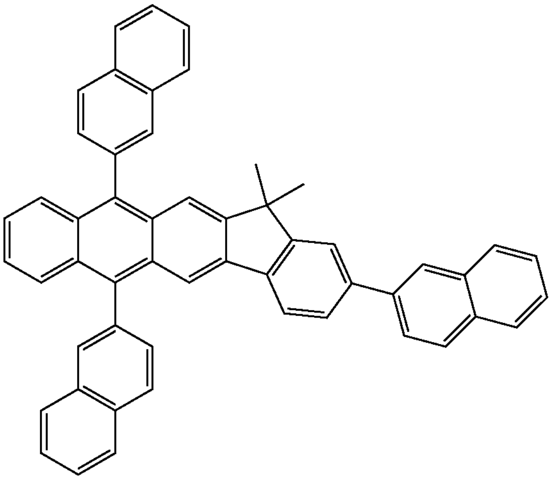
H29
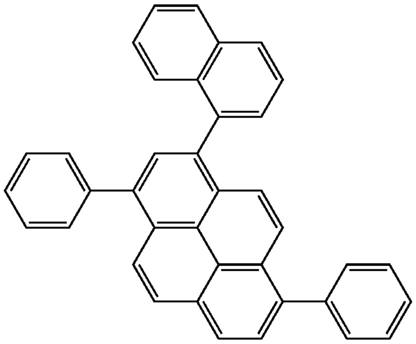
H30
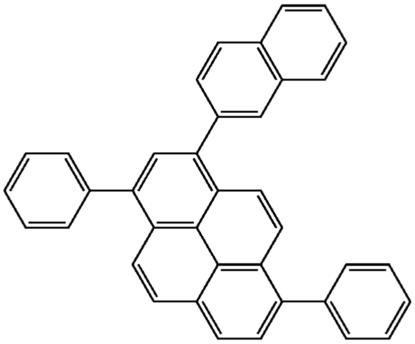
H31
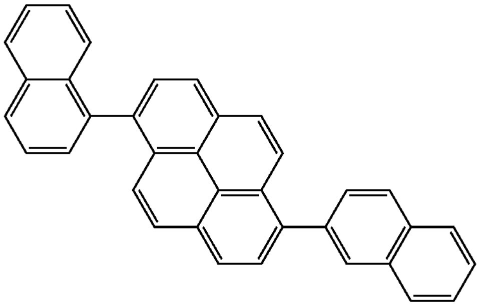
H32
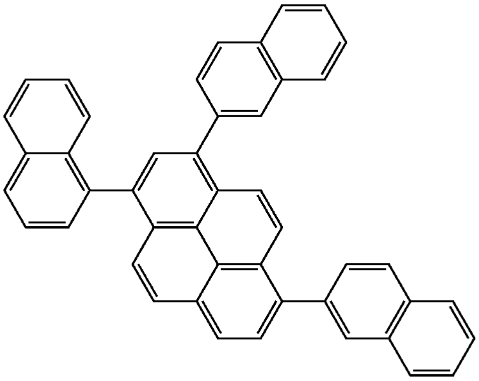
H33
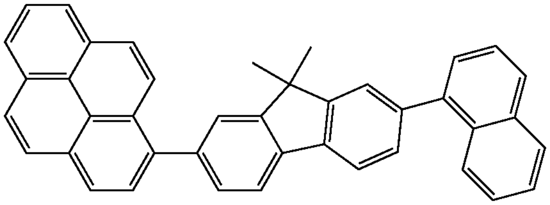
H34
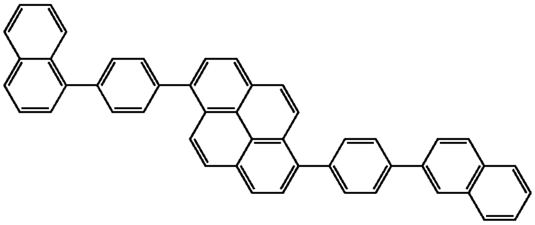

-continued
H35
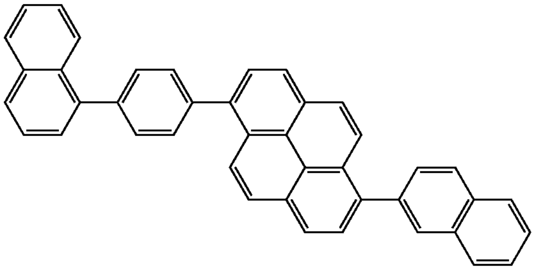
H36
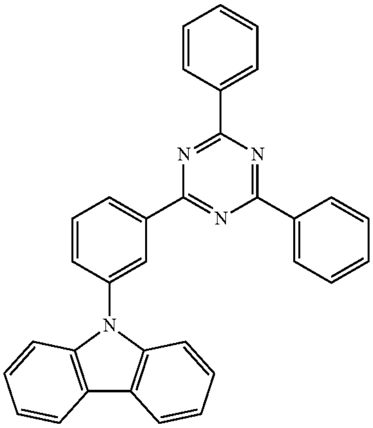
H37
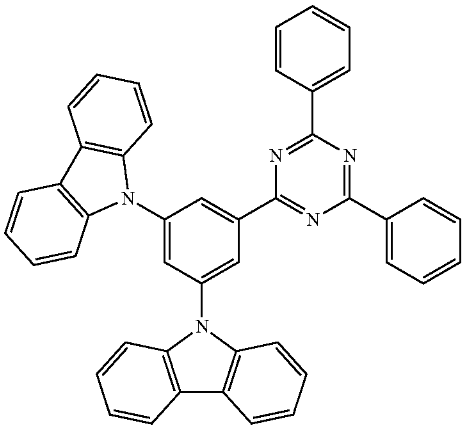
H38
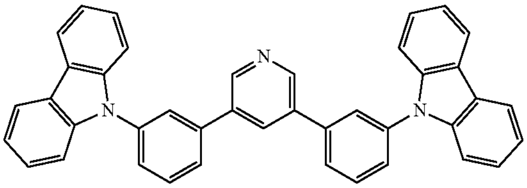
H39
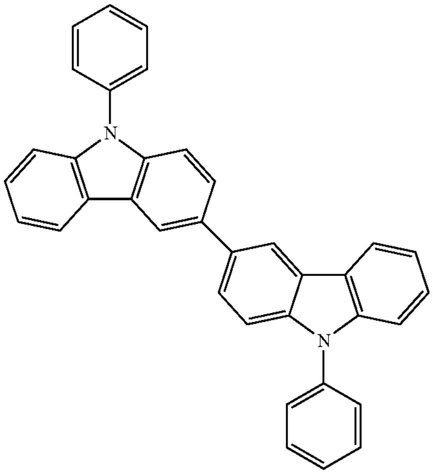
H40
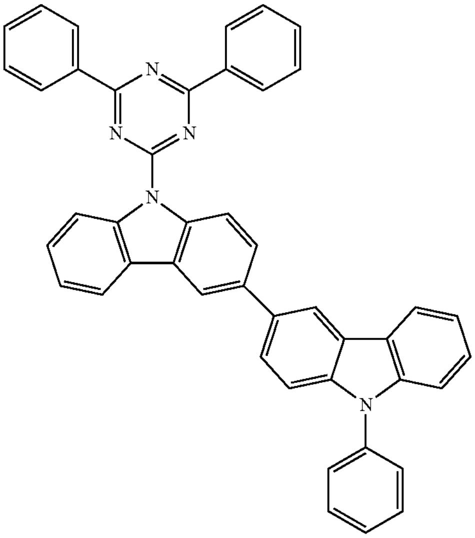

-continued
H41
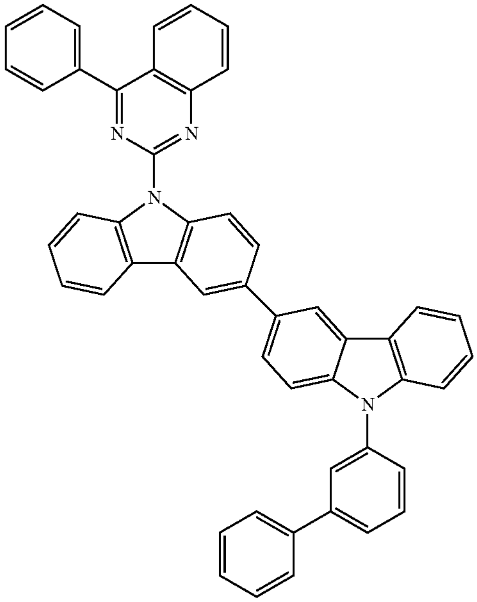
H42
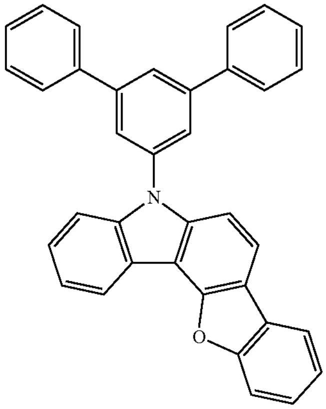
H43
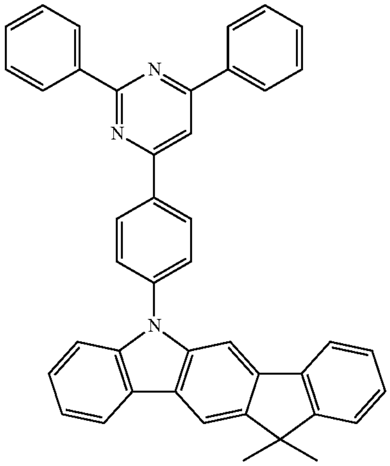
H44
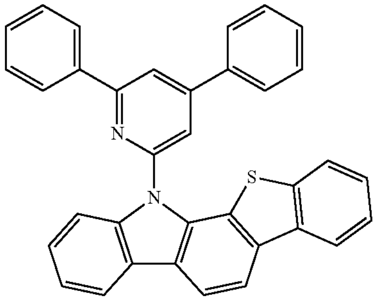
H45
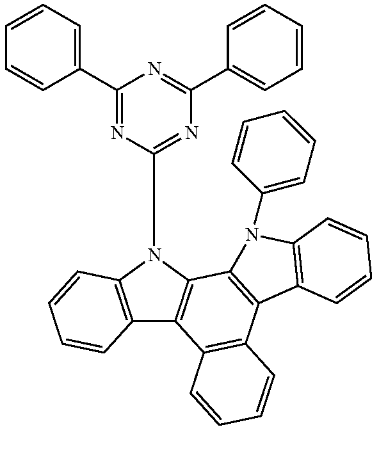
H46
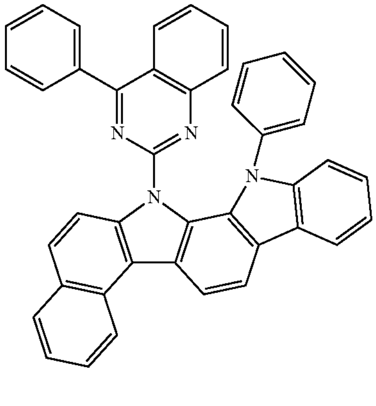

-continued
H47
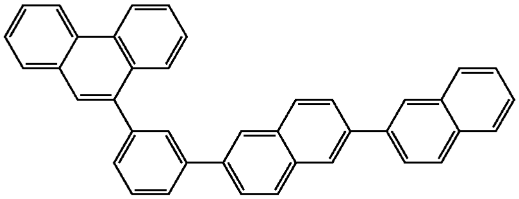
H48
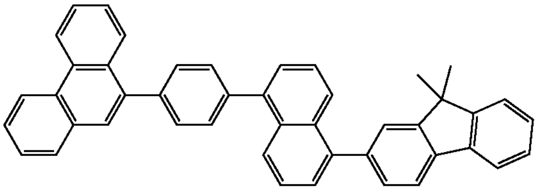
H49
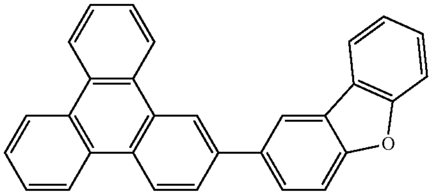
H50
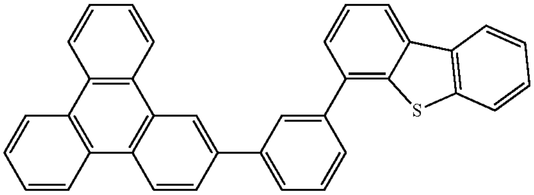
H51
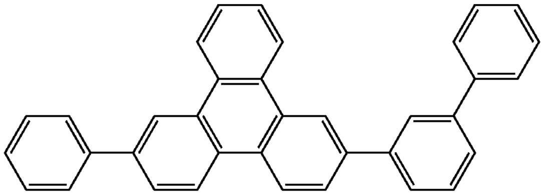
H52
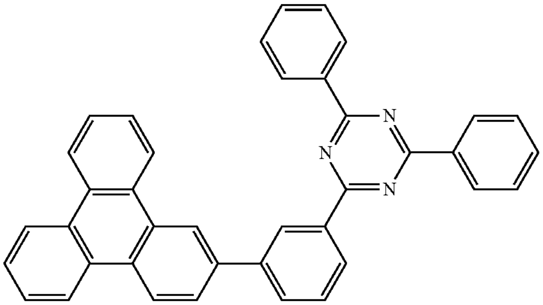
H53
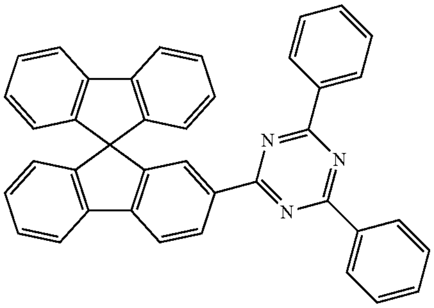
H54
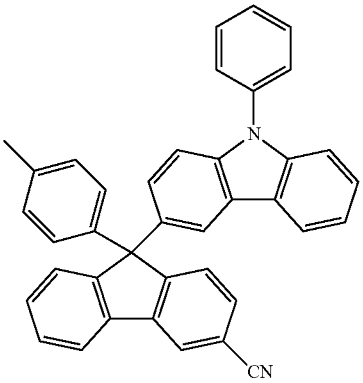
H55
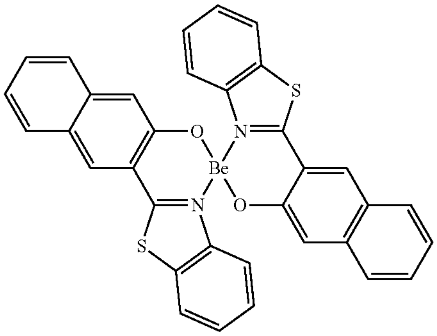
H56
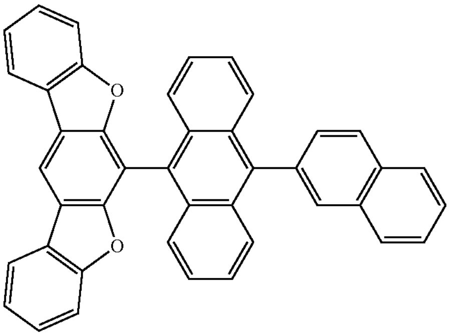

-continued
H57
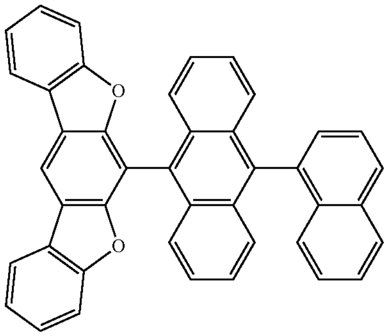
H58
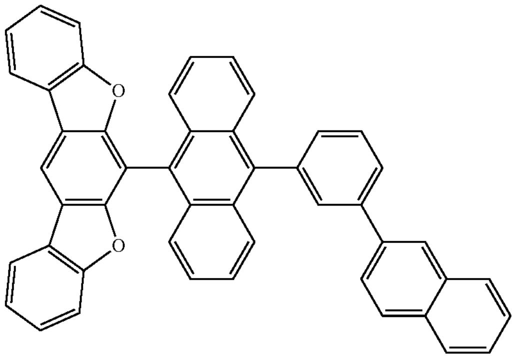
H59
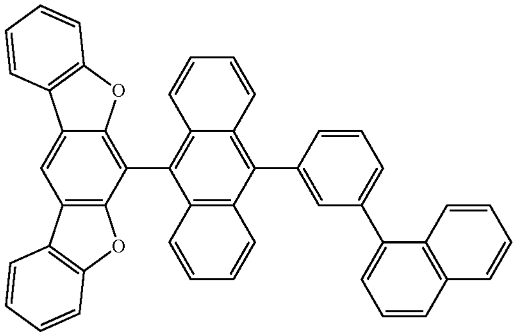
H60
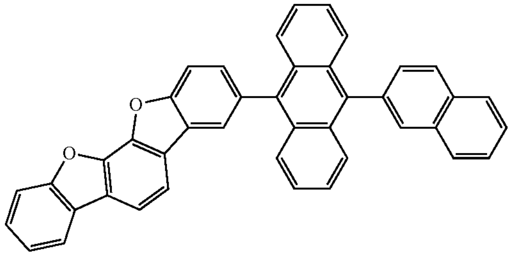
H61
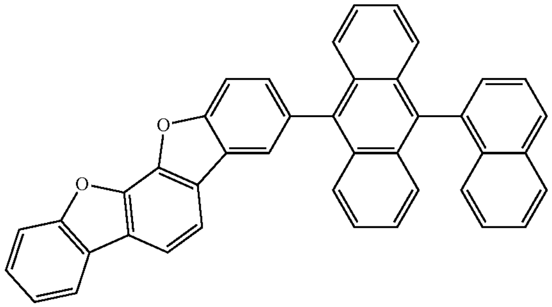
H62
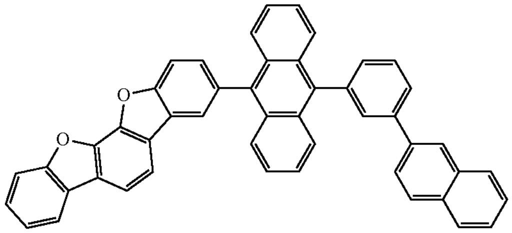
H63
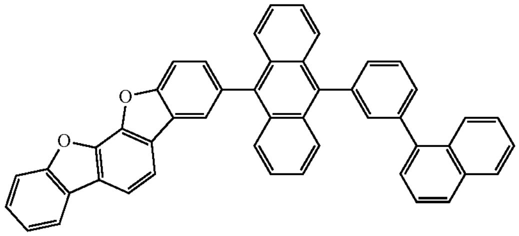
H64
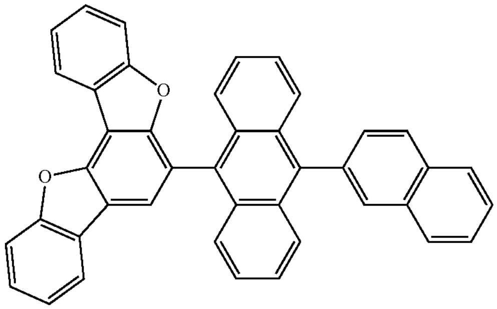

-continued
H65
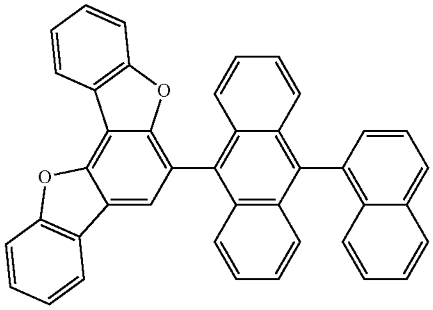
H66
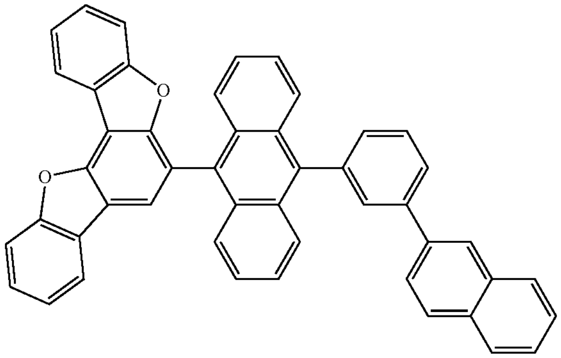
H67
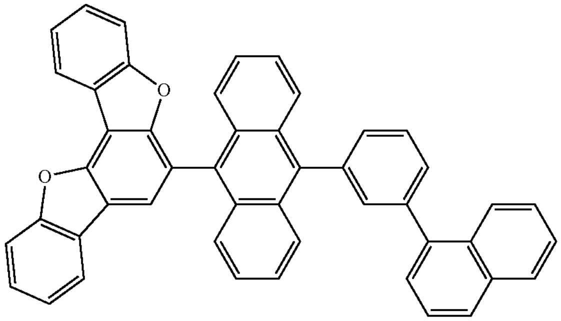
H68
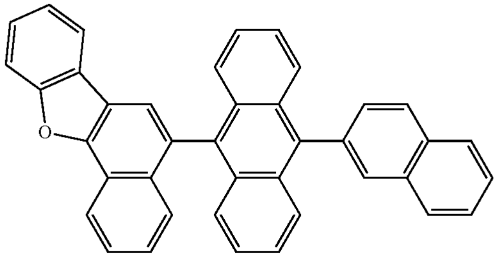
H69
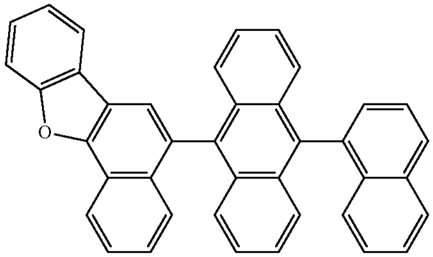
H70
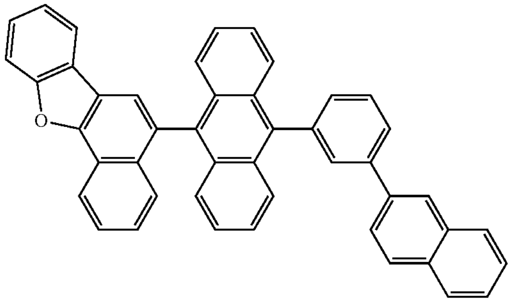
H71
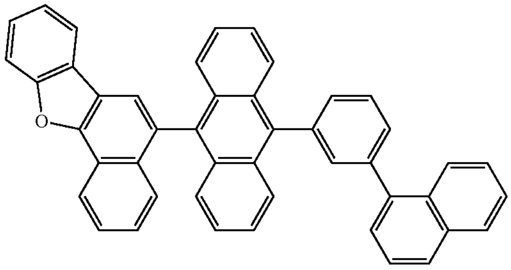
H72
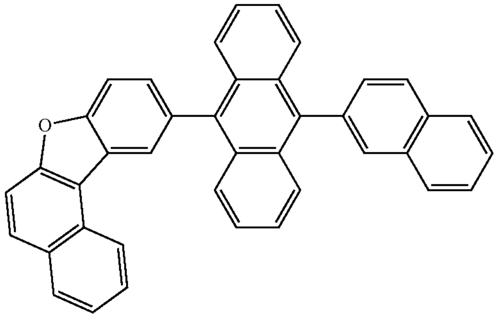

-continued
H73
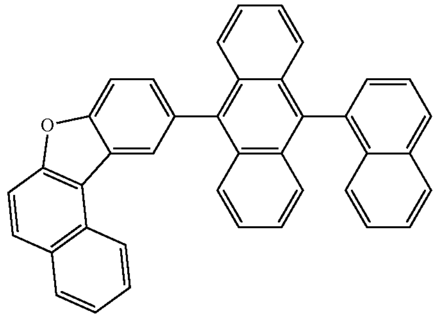
H74
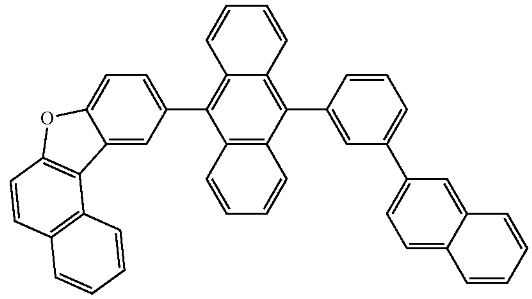
H75
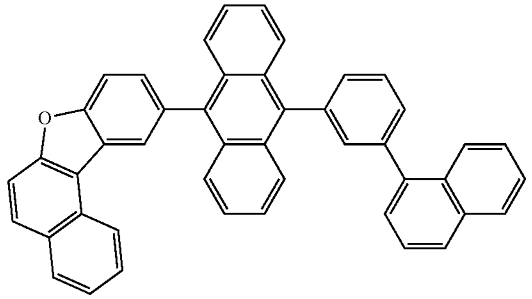
H76
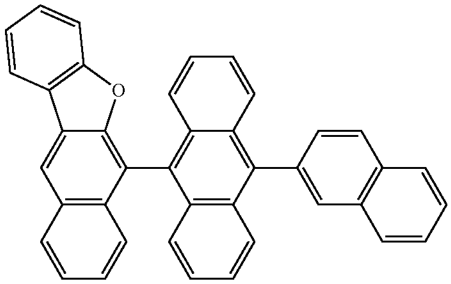
H77
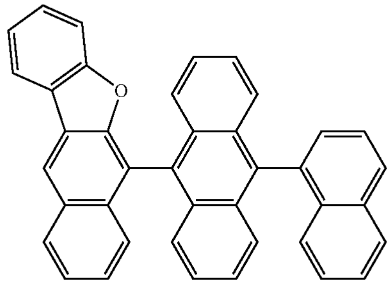
H78
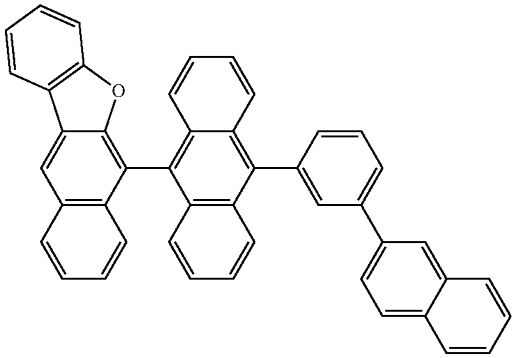
H79
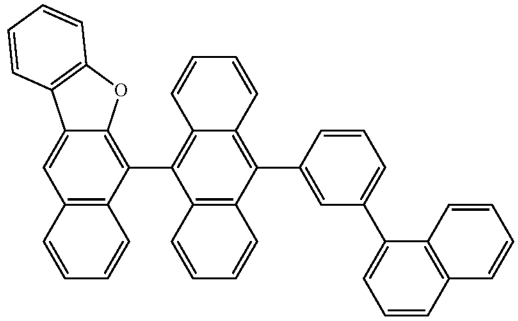
H80
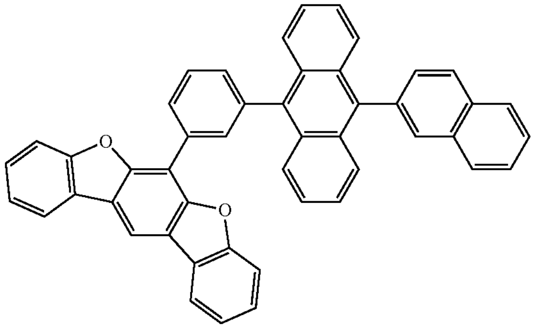

-continued
H81
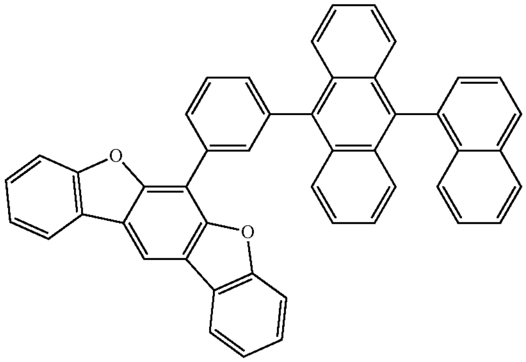
H82
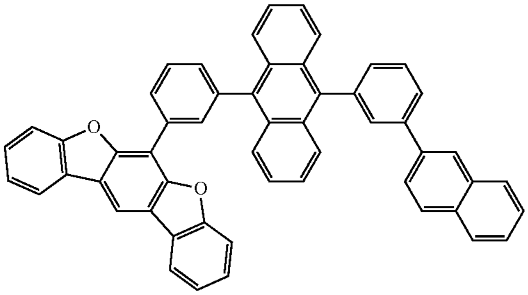
H83
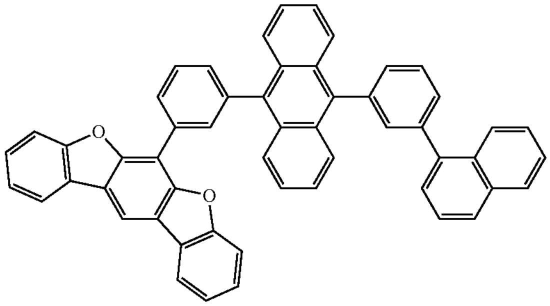
H84
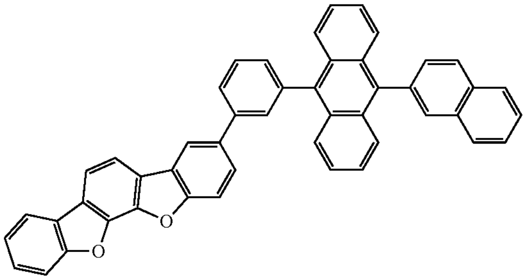
H85
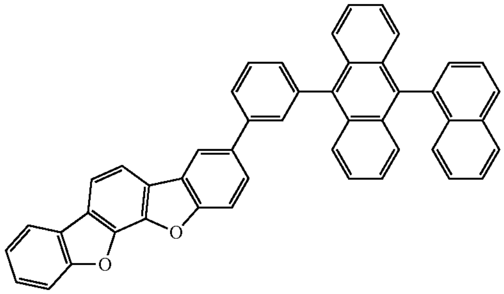
H86
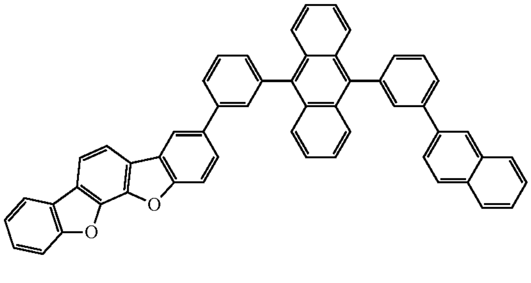
H87
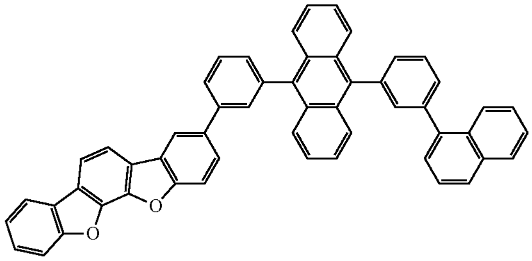
H88
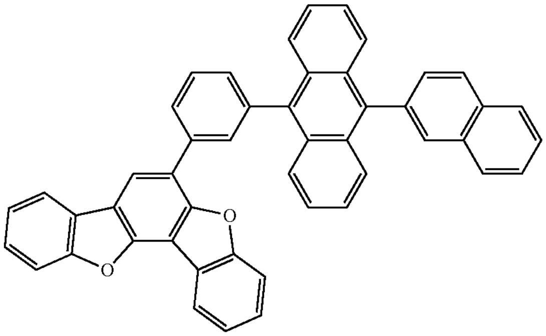

-continued
H89
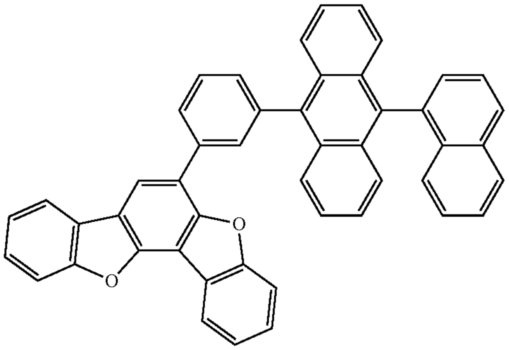
H90
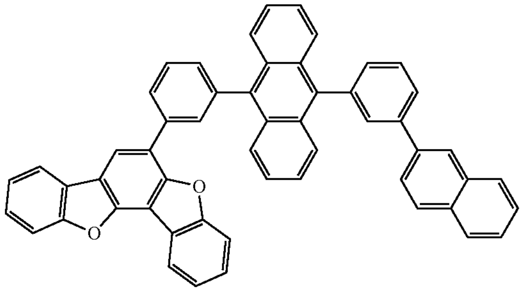
H91
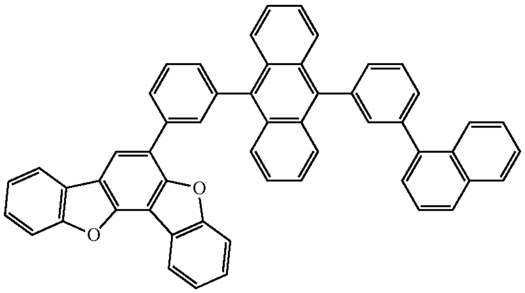
H92
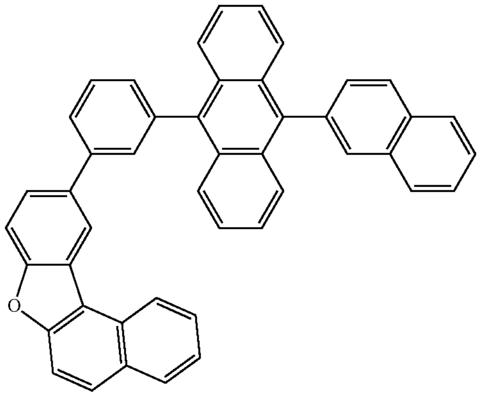
H93
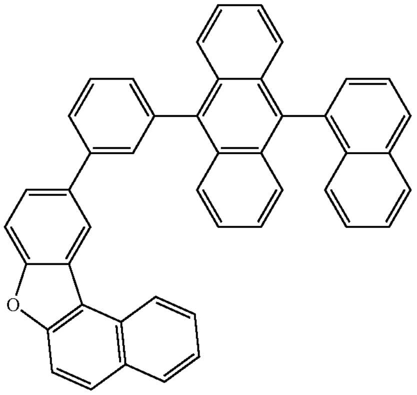
H94
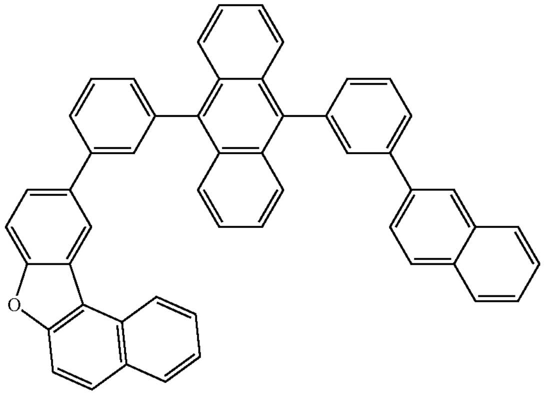
H95
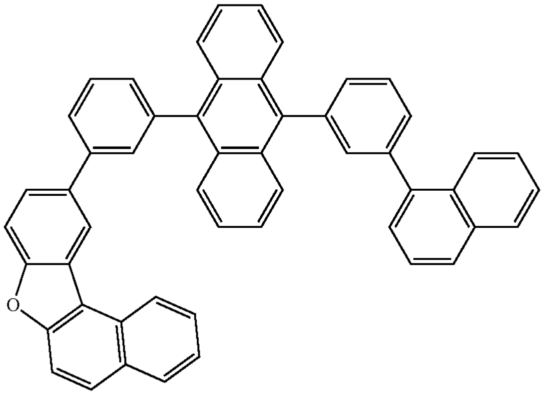
H96
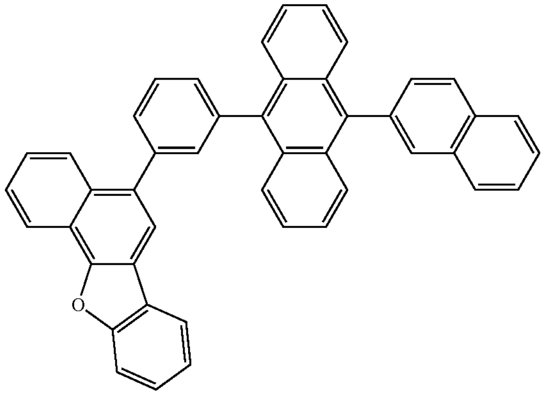

-continued
H97
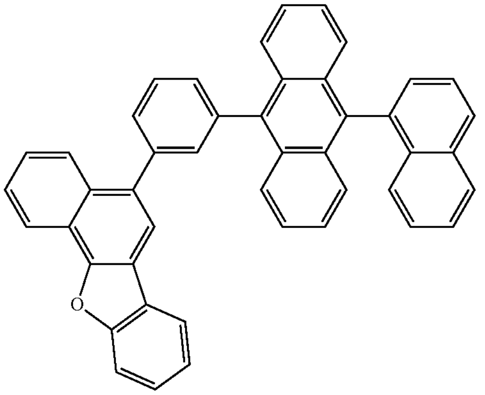
H98
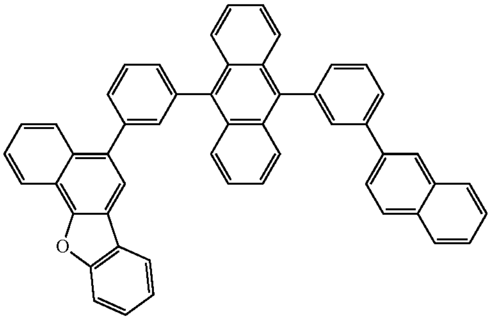
H99
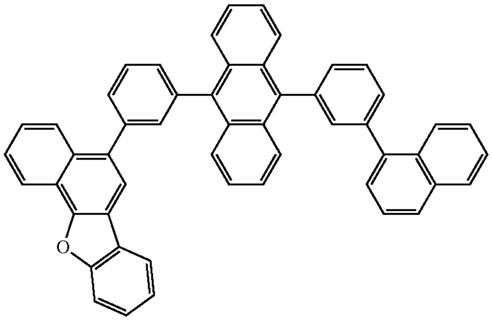
H100
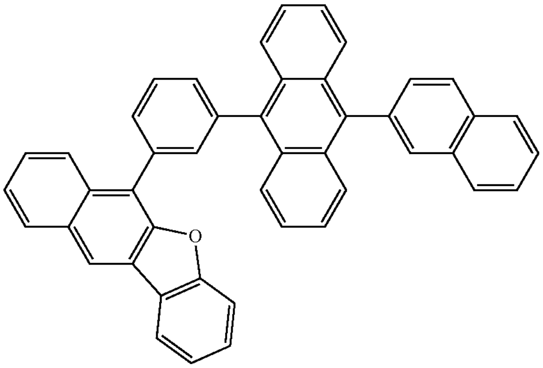
H101
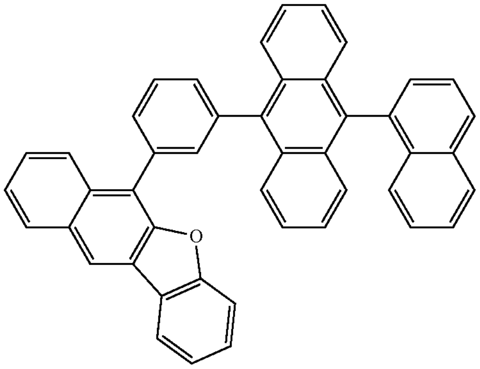
H102
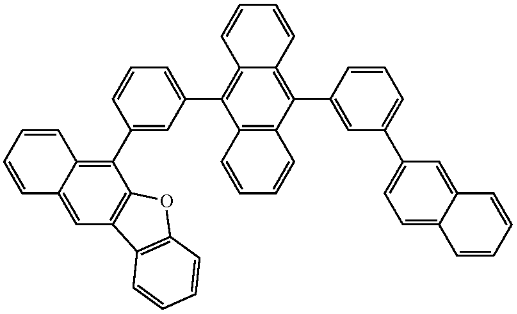
H103
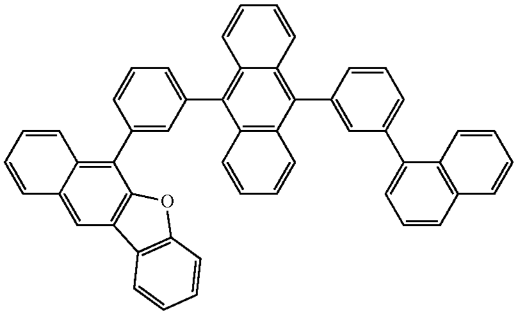
H104
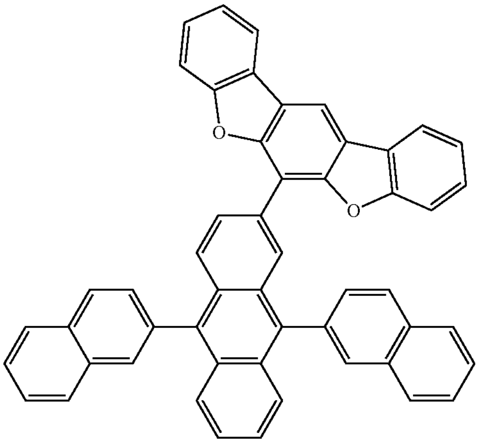

-continued
H105
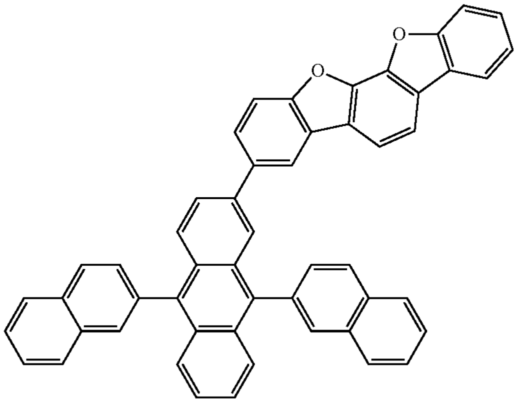
H106
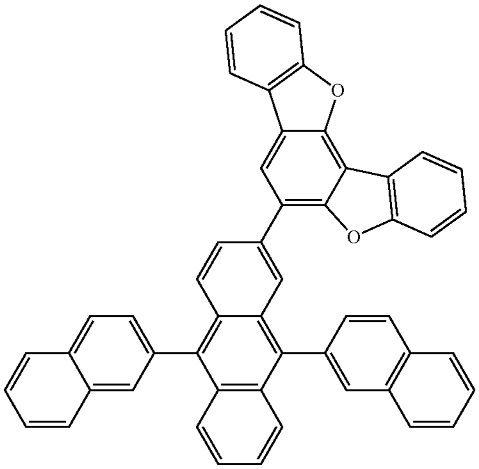
H107
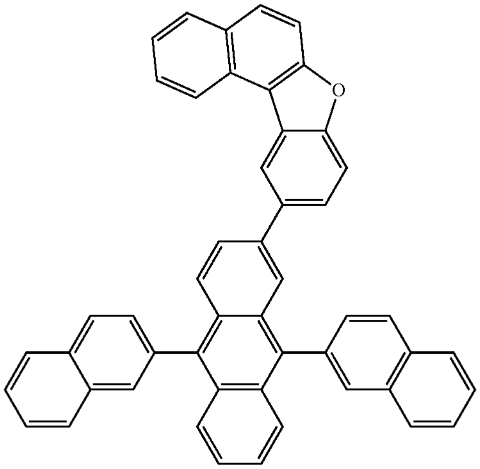
H108
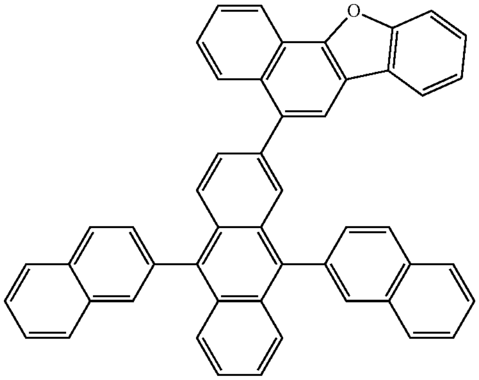
H109
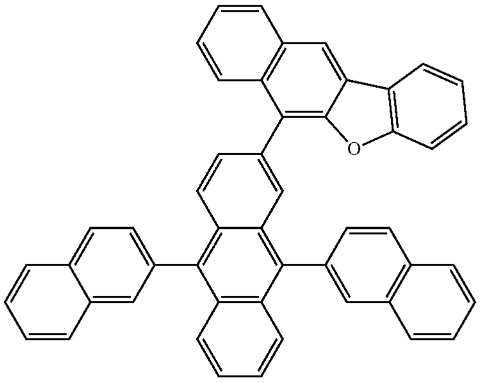
H110
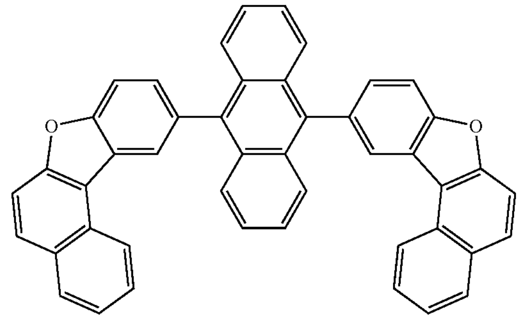
H111
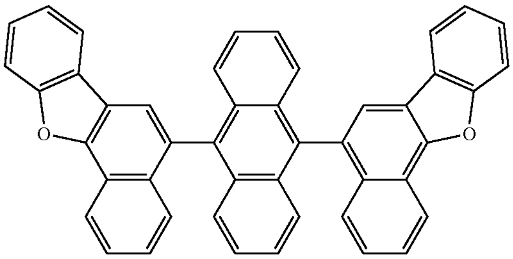
H112
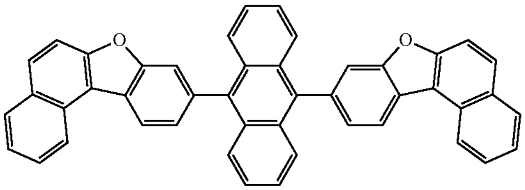

-continued
H113
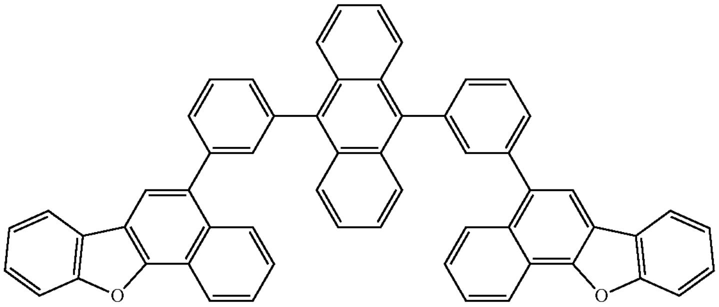
H114
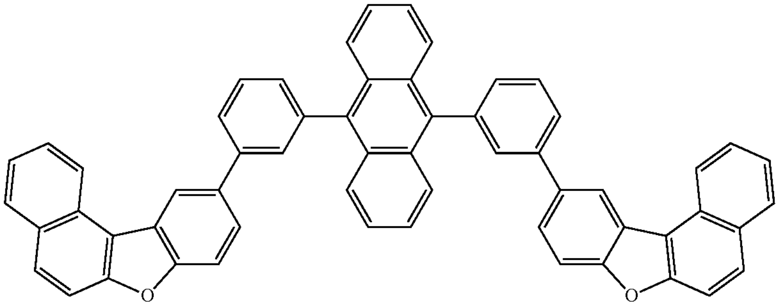
H115
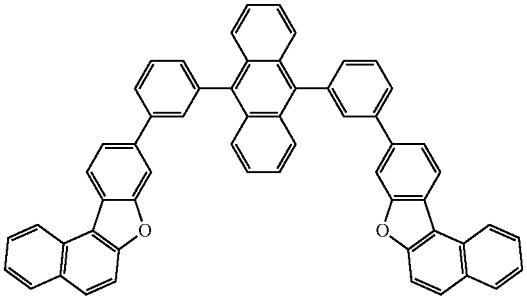
H116
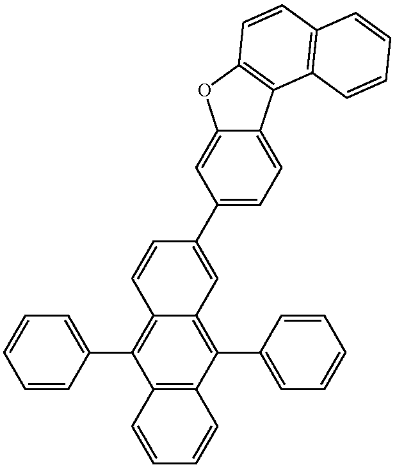
H117
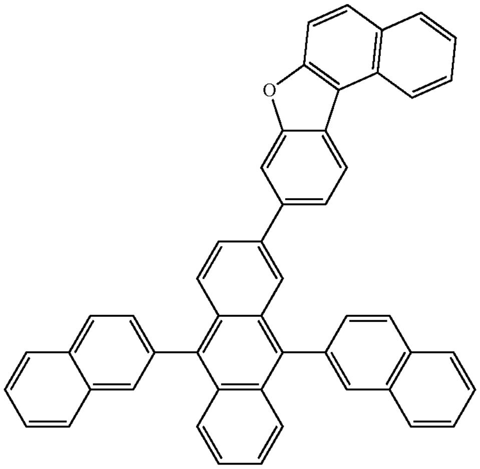
H118
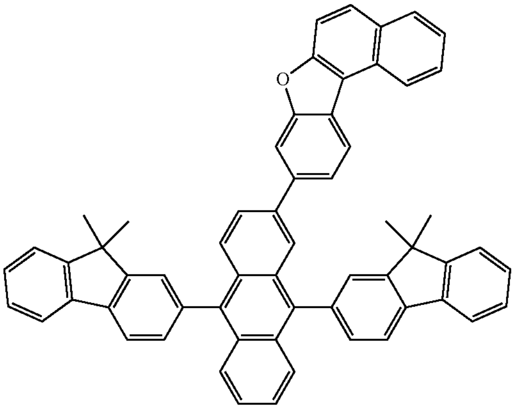

-continued
H119
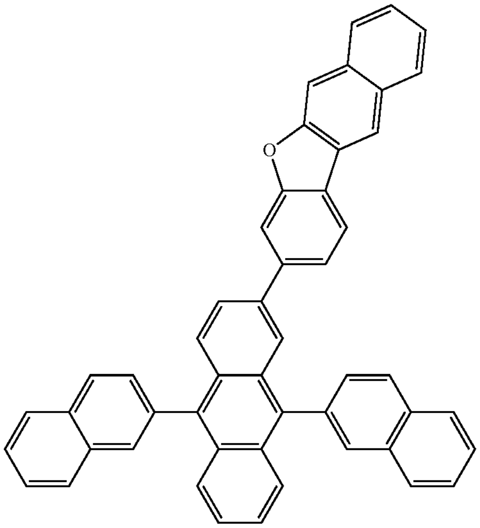
H120
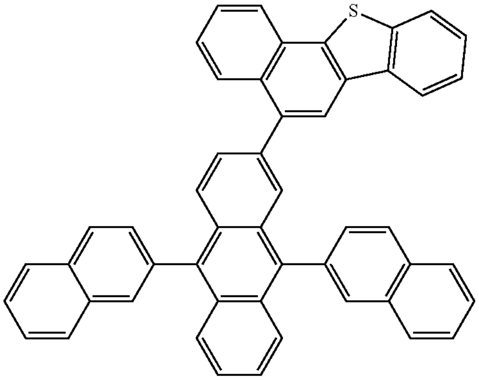
H121
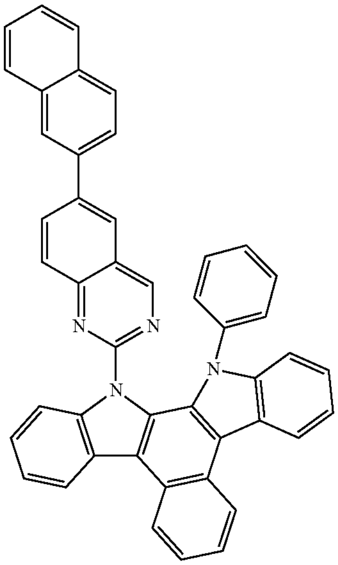
H122
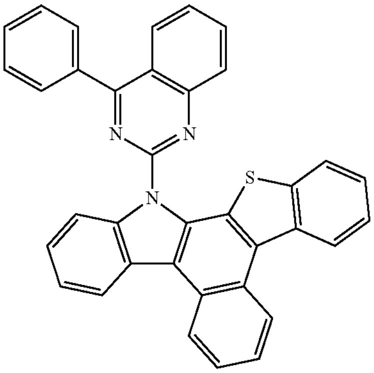
H123
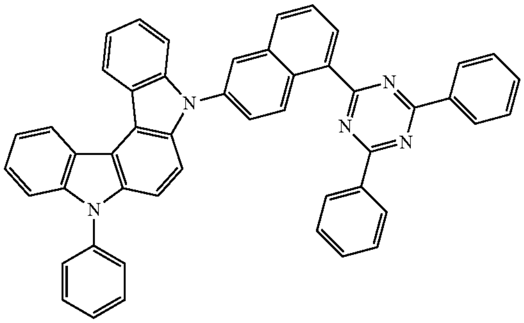
H124
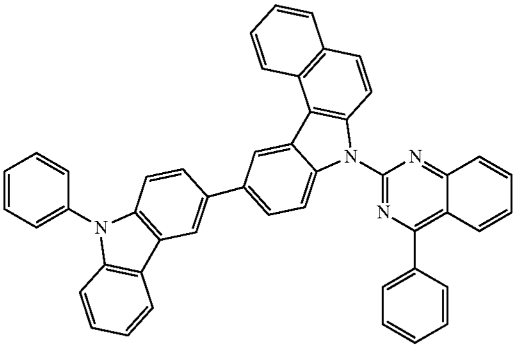
.

-continued
H125
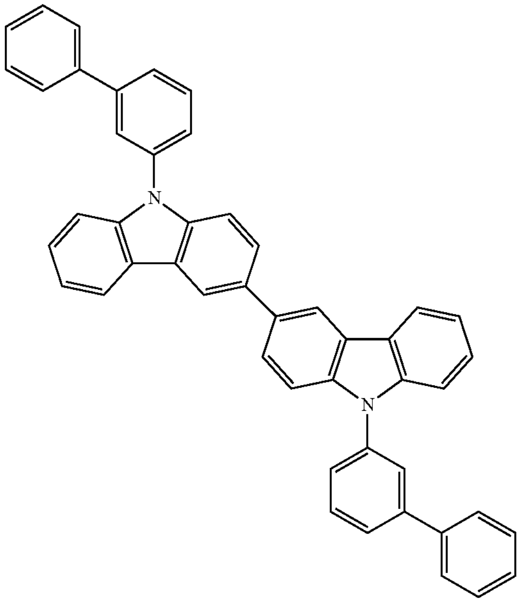
H126
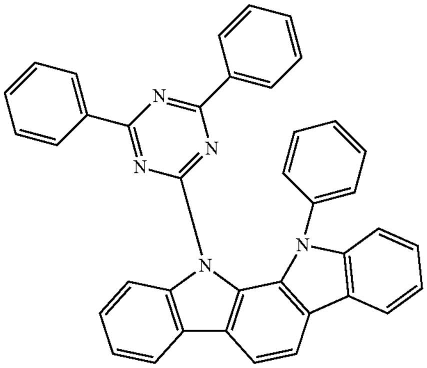
H127
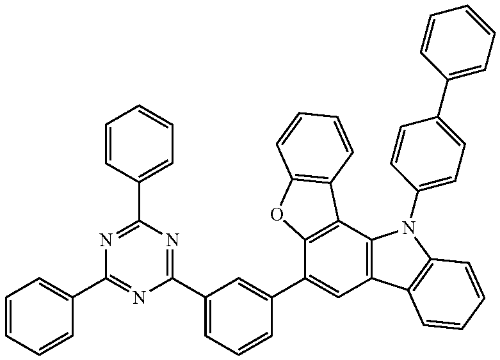
H128
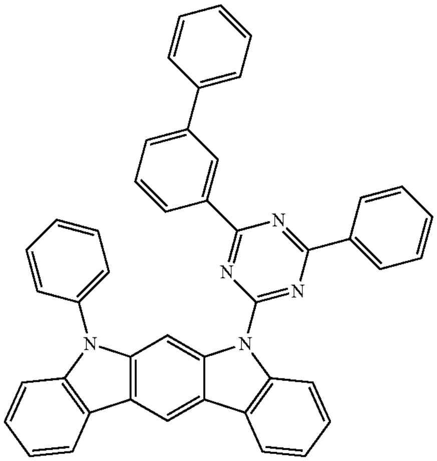
H129
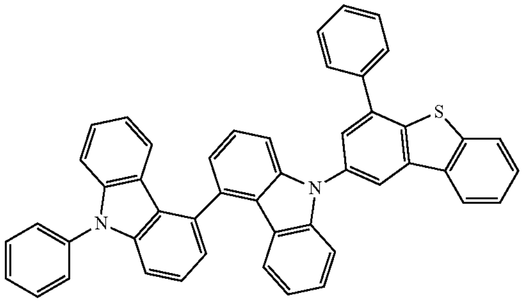
H130
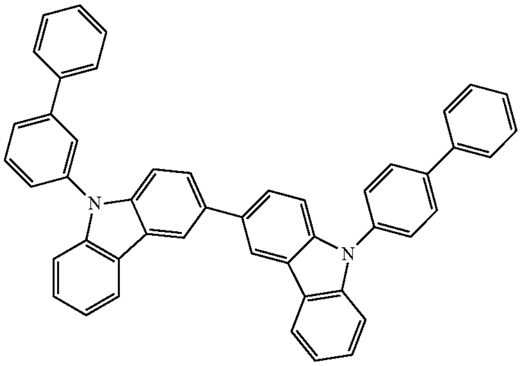
.

In one or more embodiments, the host may include a silicon-containing compound, a phosphine oxide-containing compound, or any combination thereof.

The host may have one or more suitable modifications. For example, the host may include only one kind or type of compound, or may include two or more kinds or types of different compounds.

Phosphorescent Dopant

In one or more embodiments, the emission layer may include, as a phosphorescent dopant, the organometallic compound represented by Formula 1 as described in the present disclosure.

In some embodiments, when the emission layer includes the organometallic compound represented by Formula 1 described herein, and the organometallic compound represented by Formula 1 described herein functions as an auxiliary dopant, the emission layer may include a phosphorescent dopant.

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

In some embodiments, the phosphorescent dopant may be electrically neutral.

For example, in some embodiments, the phosphorescent dopant may include an organometallic compound represented by Formula 401:

Formula 401

$M(L_{401})_{xc1}(L_{402})_{xc2}$

Formula 402

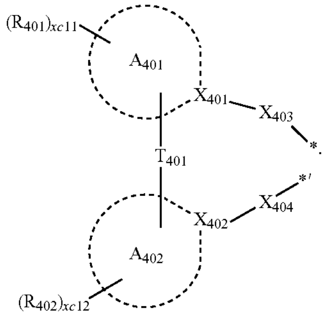

In Formulae 401 and 402, M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$ (s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)-*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described herein with respect to $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described herein with respect to $Q_1$, xc11 and xc12 may each independently be an integer from 0 to 10, and

* and *' in Formula 402 may each indicate a binding site to M in Formula 401.

For example, in some embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$ (s) in two or more of $L_{401}$ (s) may be optionally linked to each other via $T_{402}$, which is a linking group, and/or two ring $A_{402}$(s) may be optionally linked to each other via $T_{403}$, which is a linking group (see Compounds PD1 to PD4 and PD7). $T_{402}$ and $T_{403}$ may each be the same as described herein with respect to $T_{401}$.

$L_{402}$ in Formula 401 may be an organic ligand. For example, in one or more embodiments, $L_{402}$ may include a halogen, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

In one or more embodiments, the phosphorescent dopant may include, for example, at least one selected from among compounds PD1 to PD25, and/or any combination thereof:

PD1

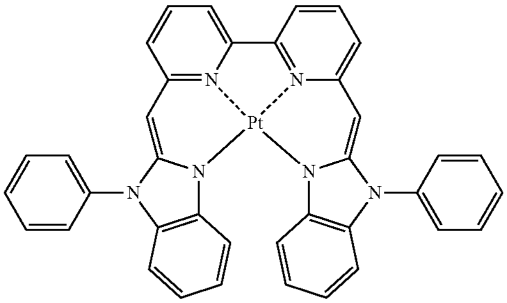

PD2
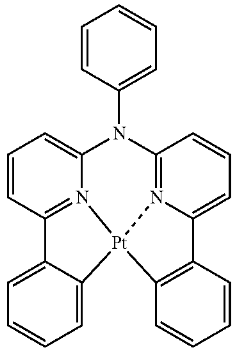
PD3
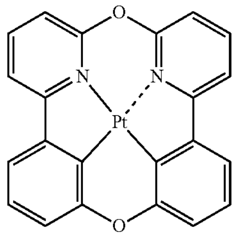
PD4
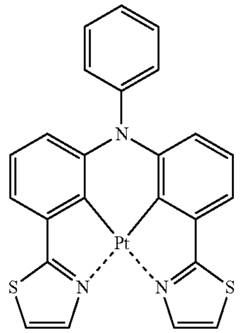
PD5
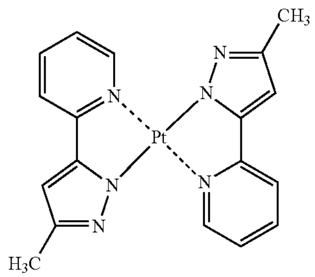
PD6
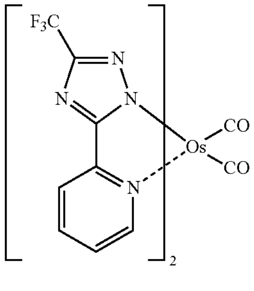
PD7
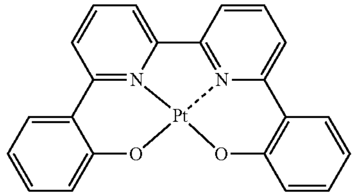
PD8
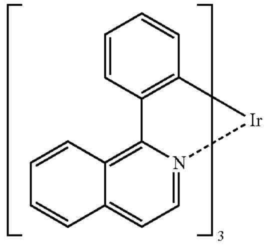
PD9
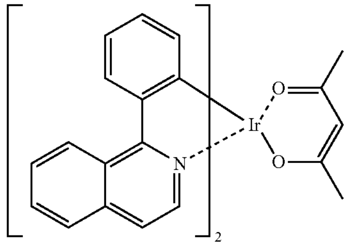
PD10
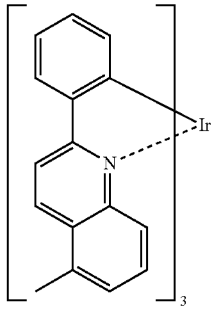
PD11
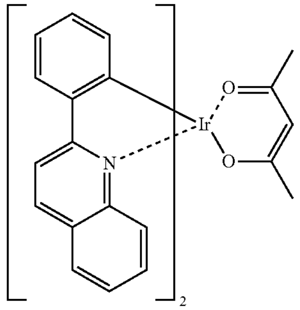

PD12
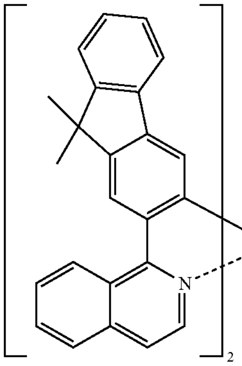
PD13
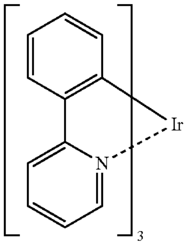
PD14
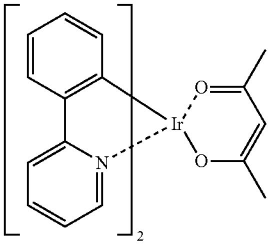
PD15
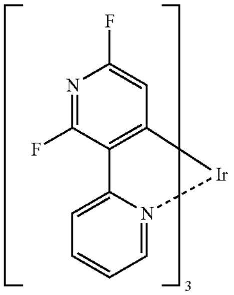
PD16
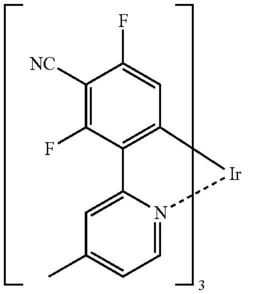
PD17
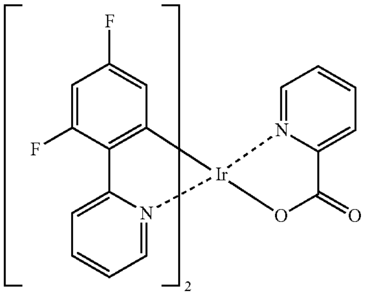
PD18
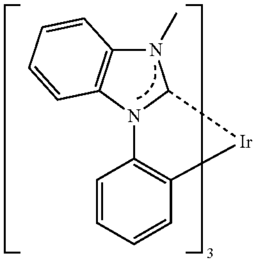
PD19
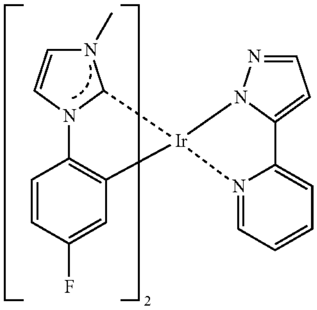
PD20
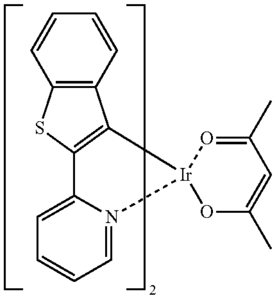
PD21
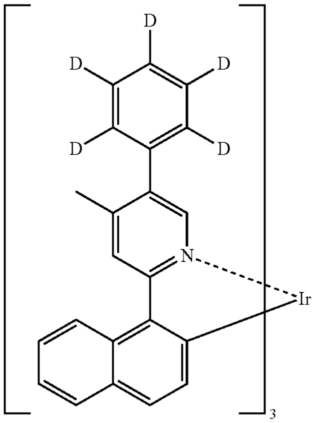

-continued

PD22

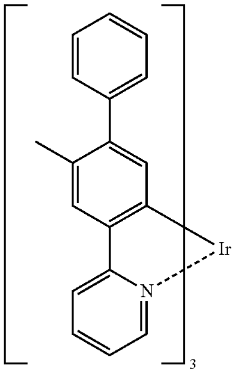

PD23

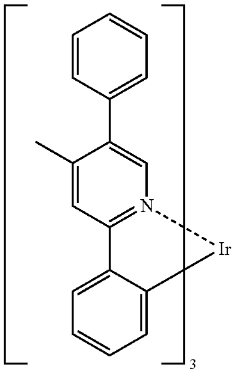

PD24

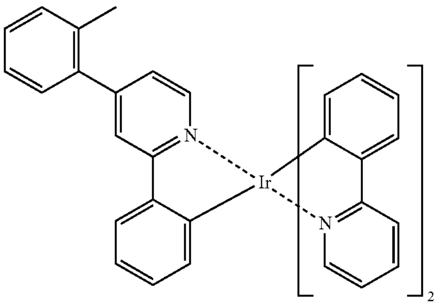

PD25

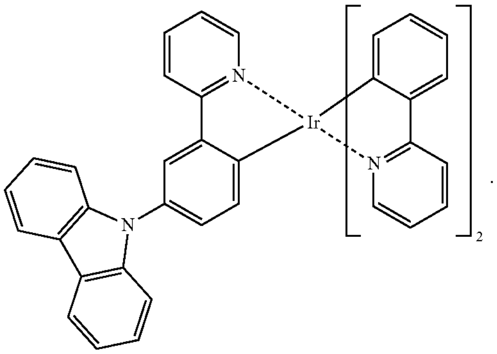

Fluorescent Dopant

In one or more embodiments, when the emission layer include the organometallic compound represented by Formula 1 described herein, and the organometallic compound represented by Formula 1 described herein functions as an auxiliary dopant, the emission layer may further include a fluorescent dopant.

In some embodiments, when the emission layer includes the organometallic compound represented by Formula 1 described herein, and the organometallic compound represented by Formula 1 described herein functions as a phosphorescent dopant, the emission layer may further include an auxiliary dopant.

The fluorescent dopant and the auxiliary dopant may each independently include an arylamine compound, a styrylamine compound, a boron-containing compound, or any combination thereof.

In one or more embodiments, the fluorescent dopant and the auxiliary dopant may each independently include a compound represented by Formula 501:

Formula 501

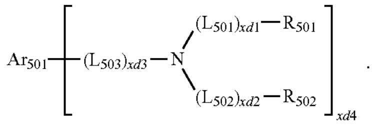

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, in some embodiments, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In one or more embodiments, the fluorescent dopant and the auxiliary dopant may each include at least one selected from among Compounds FD1 to FD36, 4,4'-bis(2,2-diphenylvinyl)-1,1'-biphenyl (DPVBi), 4,4'-bis[4-(di-p-tolylamino)styryl]biphenyl (DPAVBi), and/or any combination thereof:

FD1
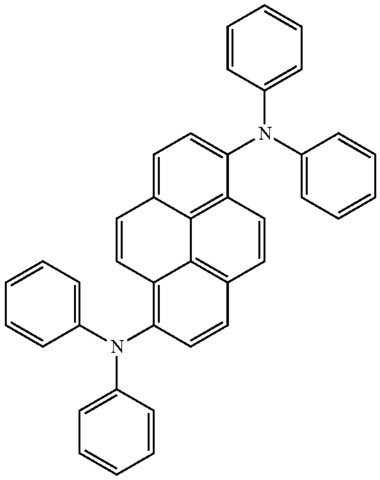
FD2
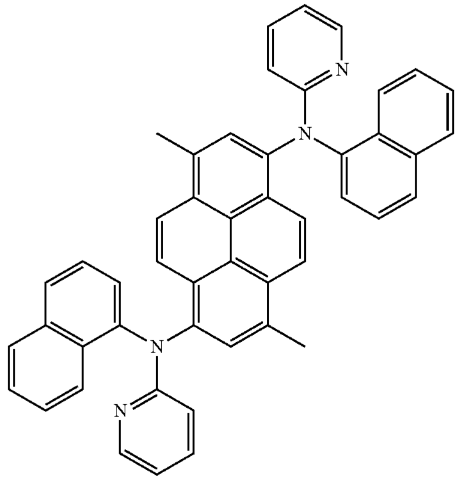
FD3
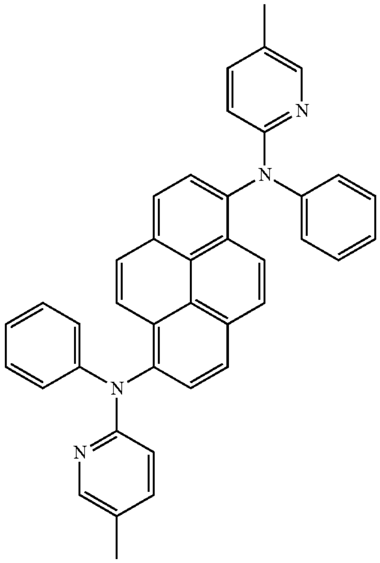
FD4
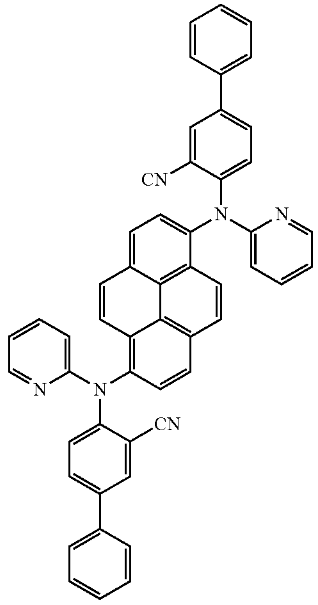
FD5
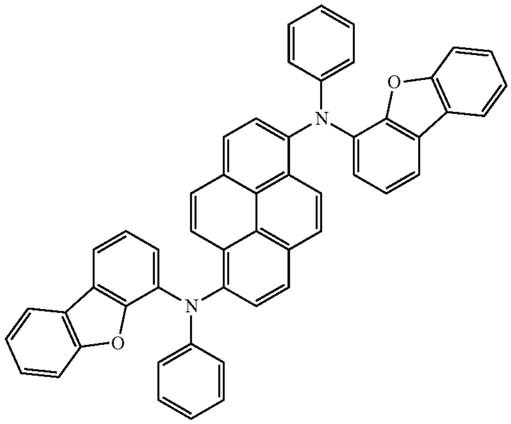
FD6
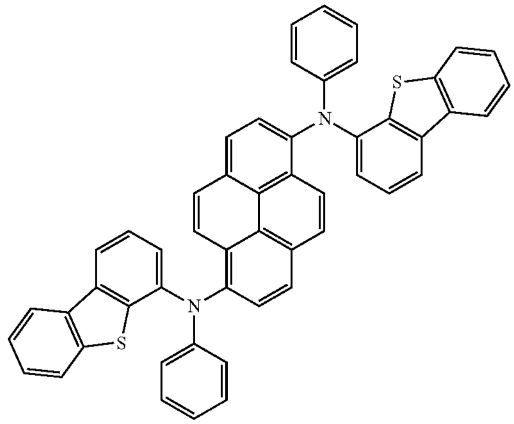

-continued
FD7
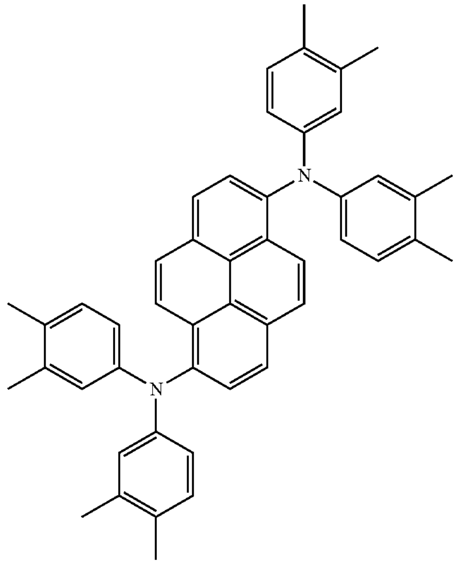
FD8
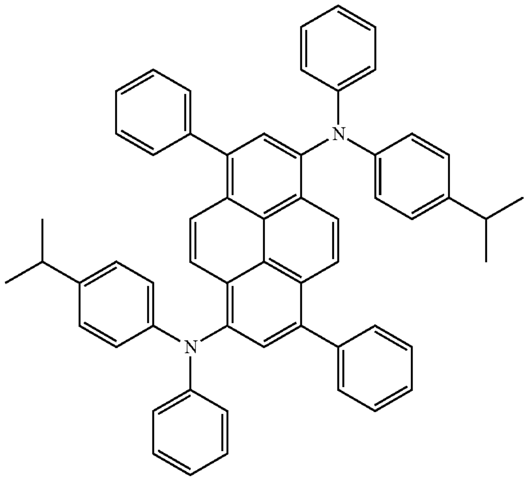
FD9
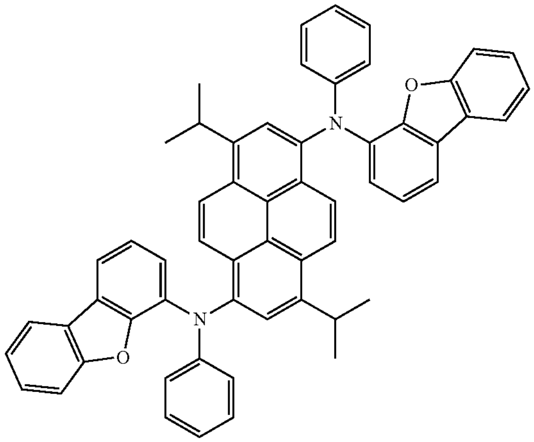
FD10
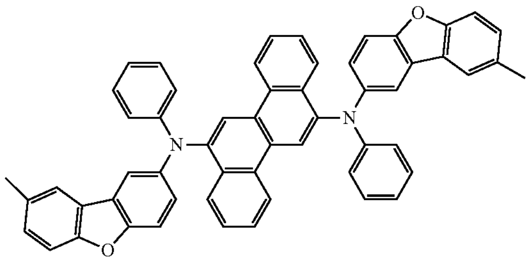
FD11
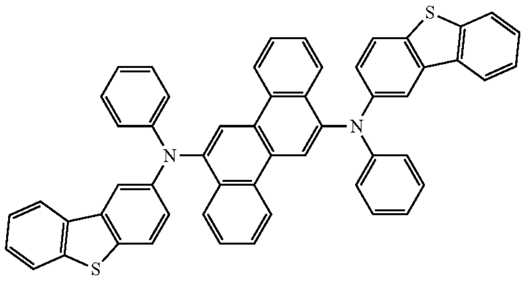
FD12
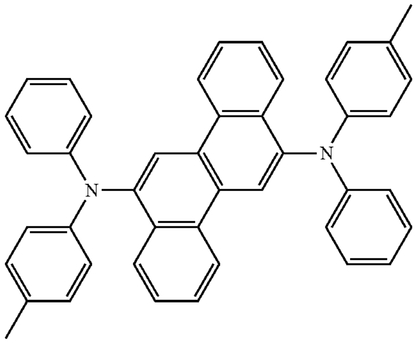

-continued
FD13
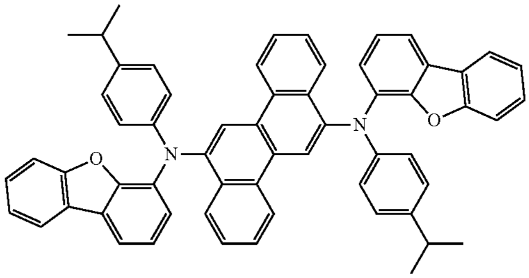
FD14
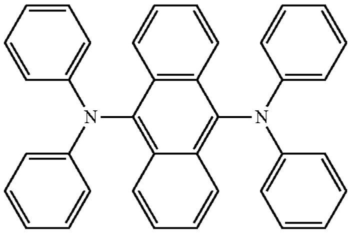
FD15
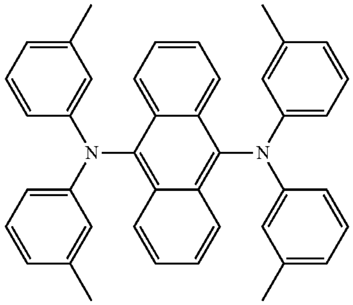
FD16
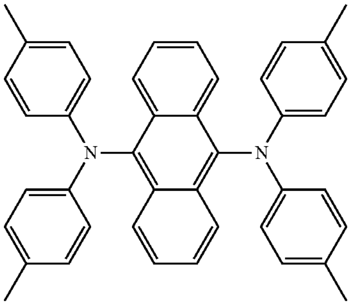
FD17
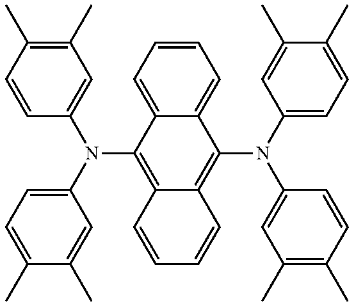
FD18
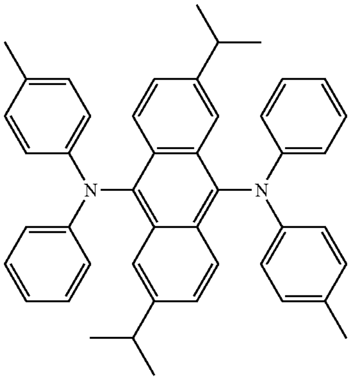
FD19
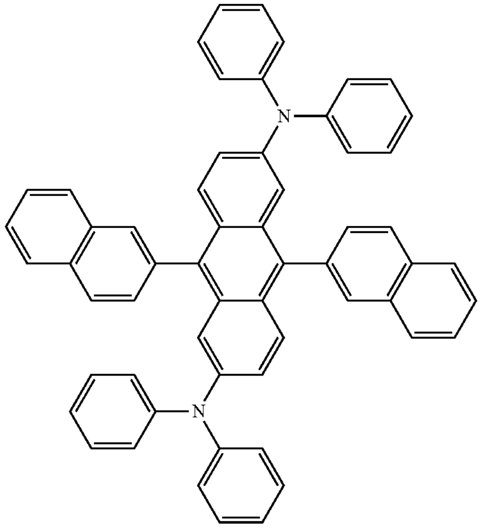
FD20
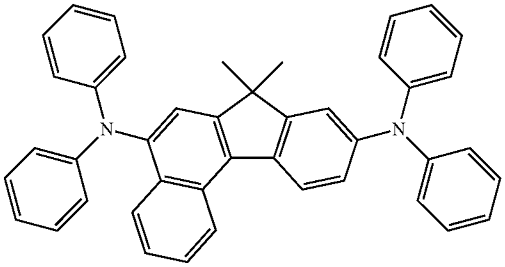

-continued
FD21
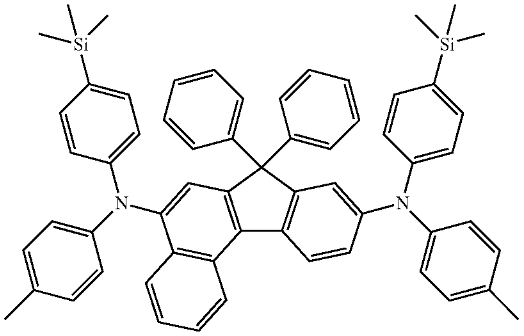
FD22
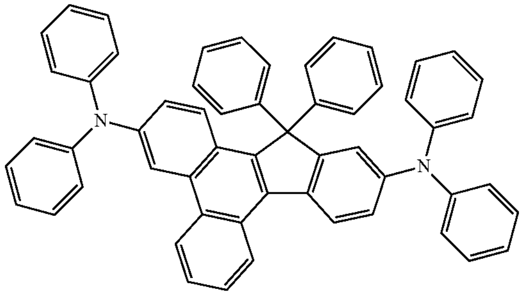
FD23
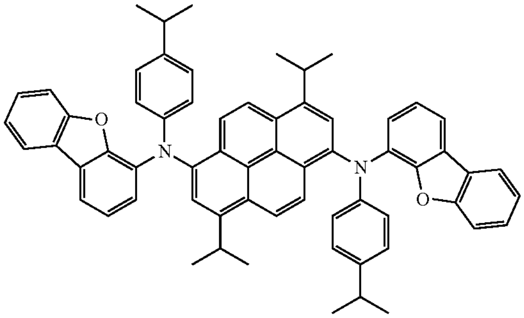
FD24
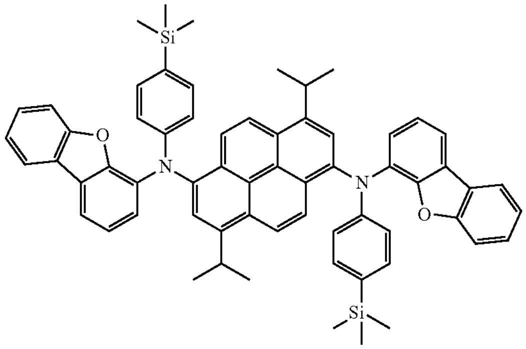
FD25
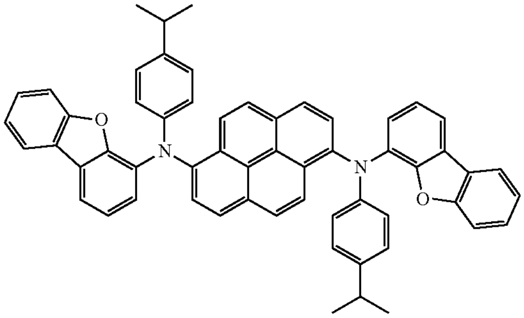
FD26
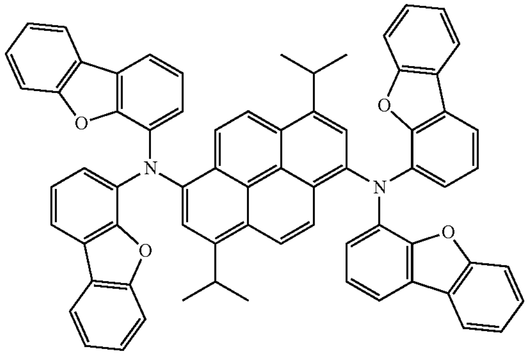
FD27
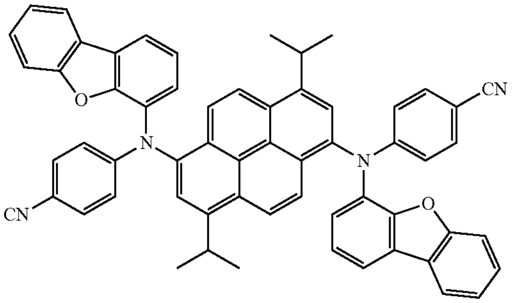
FD28
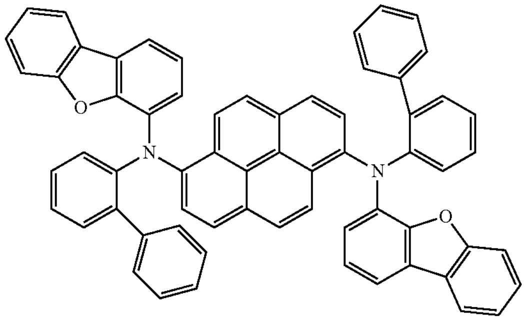

-continued
FD29
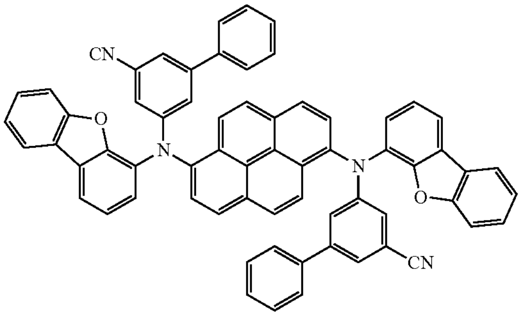
FD30
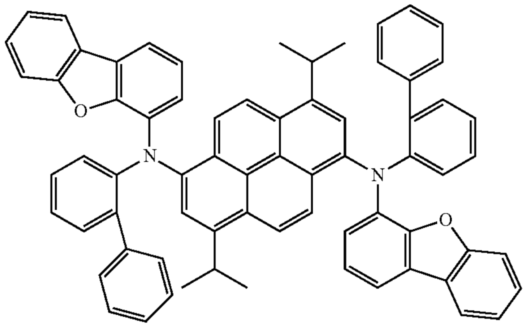
FD31
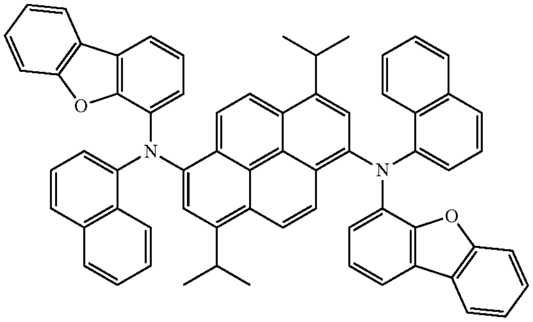
FD32
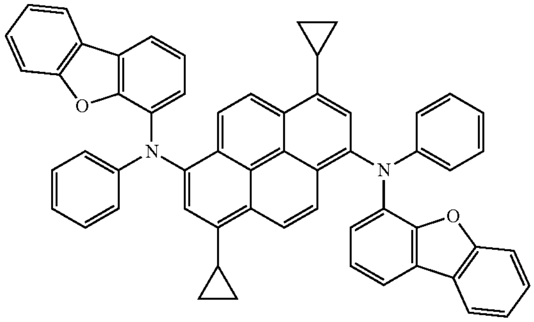
FD33
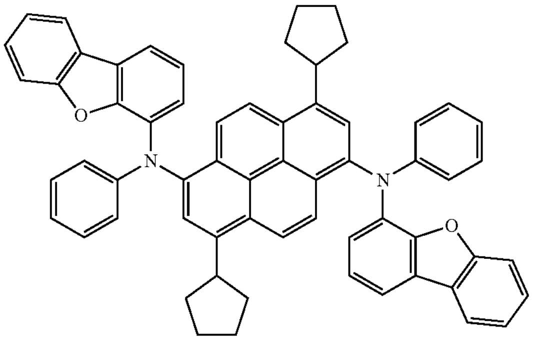
FD34
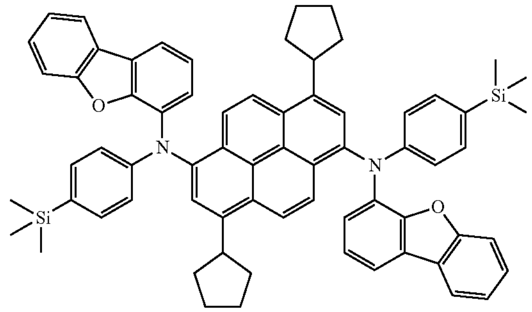
FD35
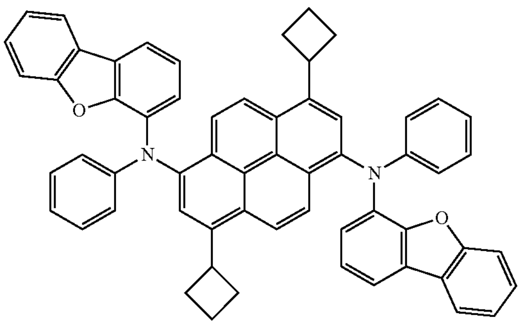
FD36
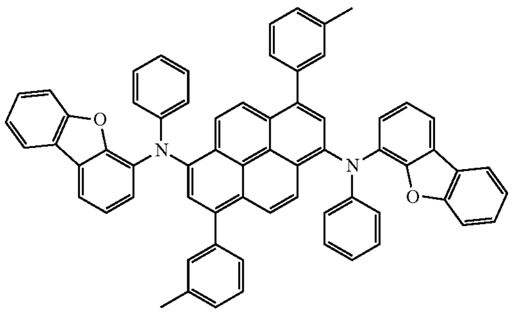

-continued

DPVBi

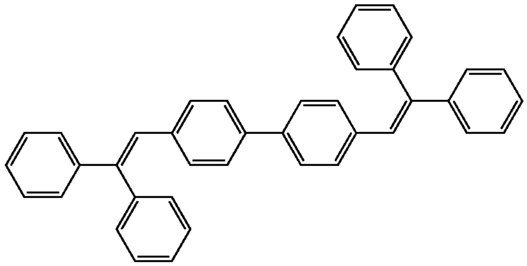

DPAVBi

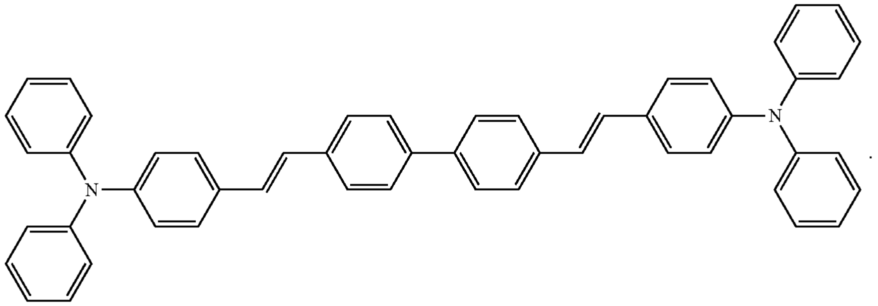

In one or more embodiments, the fluorescent dopant and the auxiliary dopant may each independently include the fourth compound represented by Formula 502 or 503 as described in the present disclosure.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole-blocking layer, an electron control layer, an electron-transporting layer, an electron injection layer, or any combination thereof.

For example, in some embodiments, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer in each stated order.

In one or more embodiments, the electron transport region (for example, the buffer layer, the hole-blocking layer, the electron control layer, or the electron transport layer in the electron transport region) may include a metal-free compound including at least one π electron-deficient nitrogen-containing $C_1$-$C_{60}$ heterocyclic group.

For example, in some embodiments, the electron transport region may include a compound represented by Formula 601:

Formula 601

$$[Ar_{601}]_{xe11}—[(L_{601})_{xe1}—R_{601}]_{xe21}.$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{601})(Q_{602})(Q_{603})$, $—C(=O)(Q_{601})$, $—S(=O)_2(Q_{601})$, or $—P(=O)(Q_{601})(Q_{602})$, $Q_{601}$ to $Q_{603}$ may each be the same as described herein with respect to $Q_1$, xe21 may be 1, 2, 3, 4, or 5, and at least one selected from among $Ar_{601}$, $L_{601}$, and $R_{601}$ may each independently be a π electron-deficient nitrogen-containing $C_1$-$C_{60}$ heterocyclic group unsubstituted or substituted with at least one $R_{10a}$.

For example, in some embodiments, when xe11 in Formula 601 is 2 or more, two or more of $Ar_{601}$(s) may be linked to each other via a single bond.

In some embodiments, $Ar_{601}$ in Formula 601 may be a substituted or unsubstituted anthracene group.

In some embodiments, the electron transport region may include a compound represented by Formula 601-1:

Formula 601-1

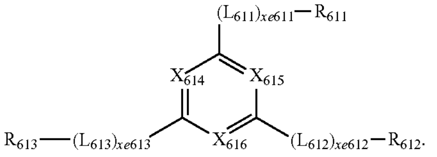

In Formula 601-1, $X_{614}$ may be N or $C(R_{614})$, $X_{615}$ may be N or $C(R_{615})$, $X_{616}$ may be N or $C(R_{616})$, and at least one selected from among $X_{614}$ to $X_{616}$ may be N, $L_{611}$ to $L_{613}$ may each be the same as described herein with respect to $L_{601}$, xe611 to xe613 may each be the same as described herein with respect to xe1, $R_{611}$ to $R_{613}$ may each be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

In one or more embodiments, the electron transport region may include at least one selected from among Compounds ET1 to ET46, 2,9-dimethyl-4,7-diphenyl-1,10-phenanthroline (BCP), 4,7-diphenyl-1,10-phenanthroline (Bphen), tris(8-hydroxyquinolinato)aluminum (Alq3), bis(2-methyl-8-quinolinolato-N1,O8)-(1,1'-biphenyl-4-olato)aluminum (BAlq), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), and/or any combination thereof:

ET1

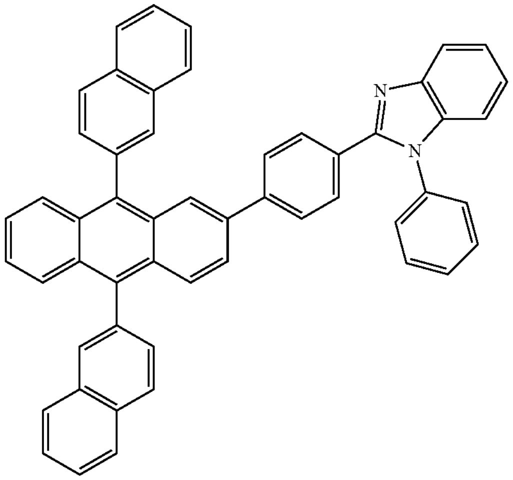

ET2

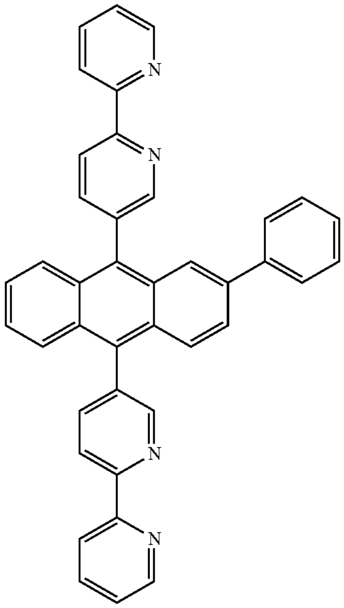

-continued

ET3

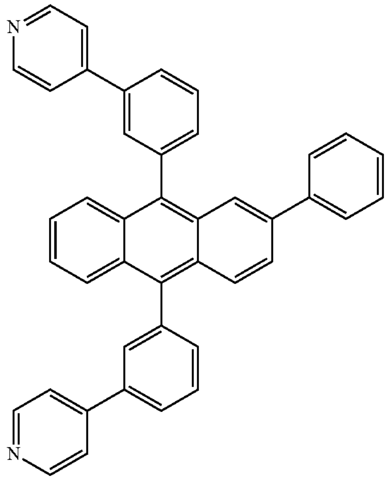

ET4

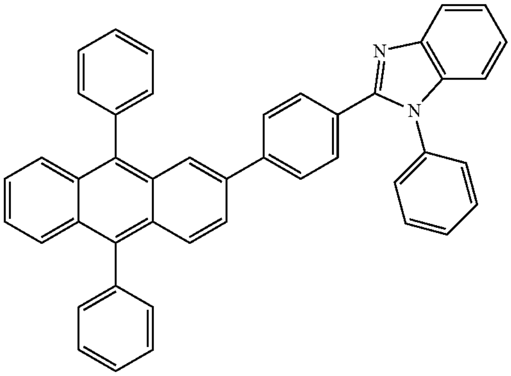

ET5

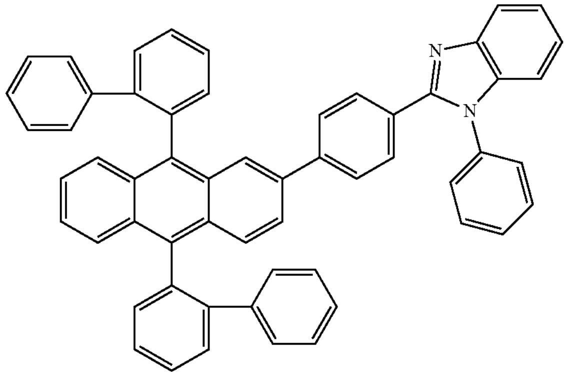

-continued
ET6
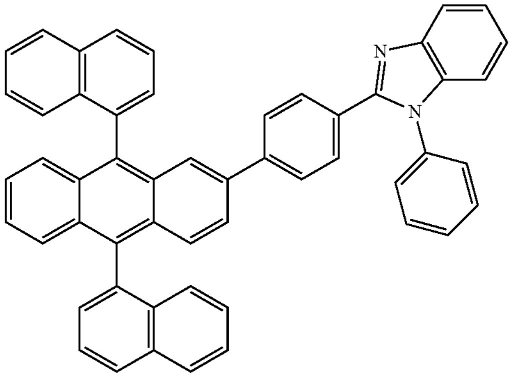
ET7
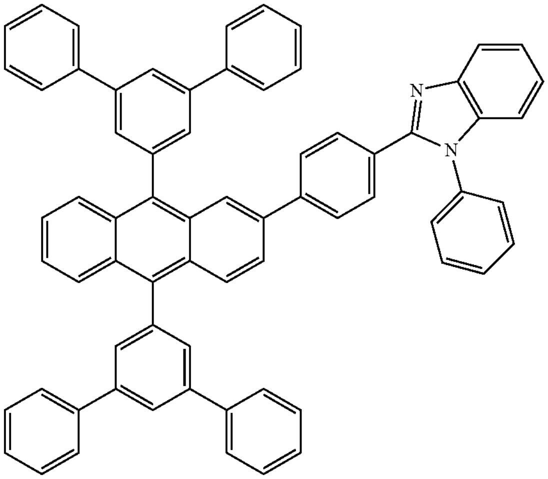
ET8
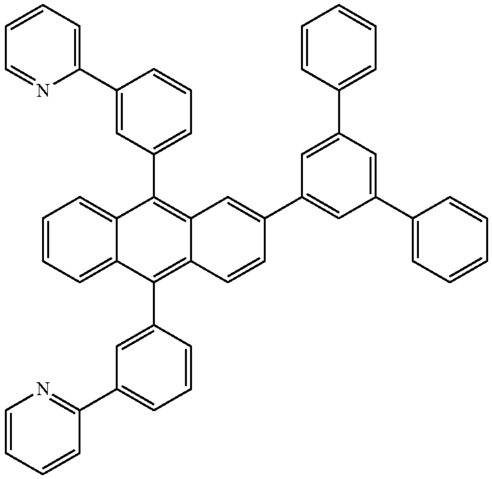
-continued
ET9
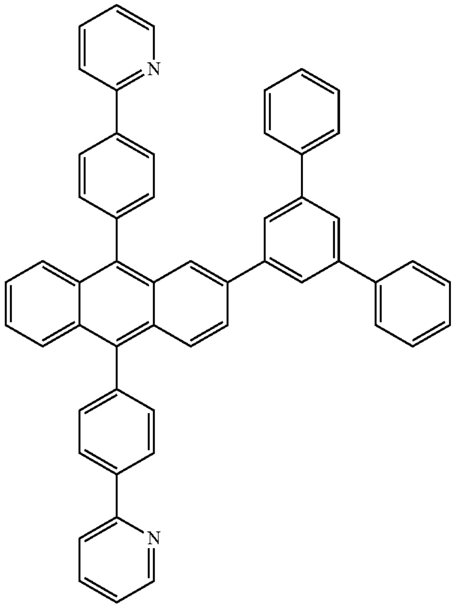
ET10
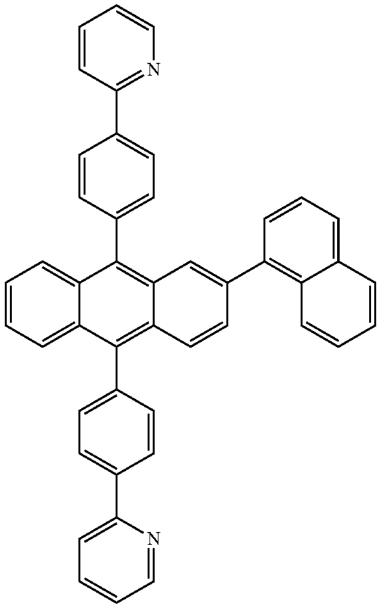

-continued
ET11
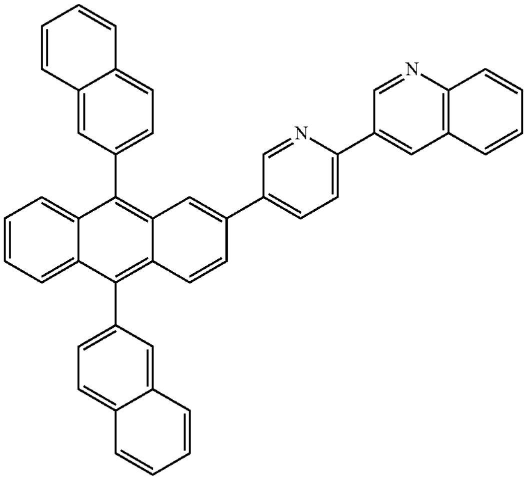
ET12
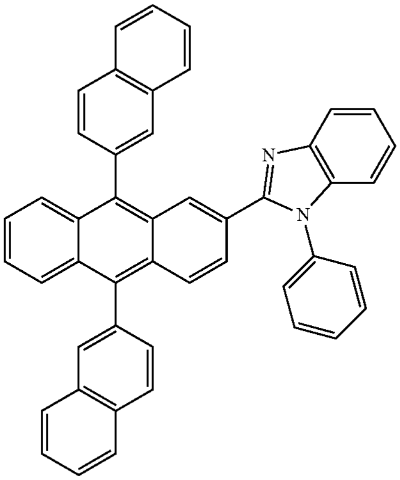
ET13
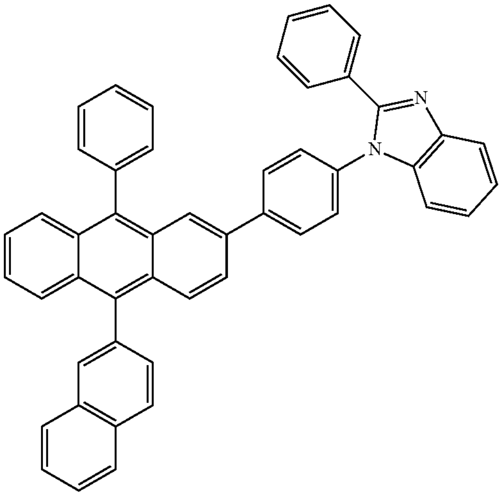
-continued
ET14
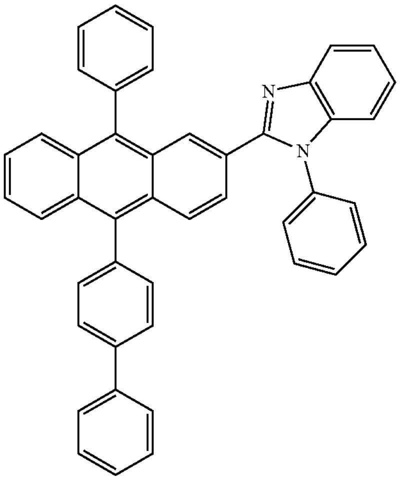
ET15
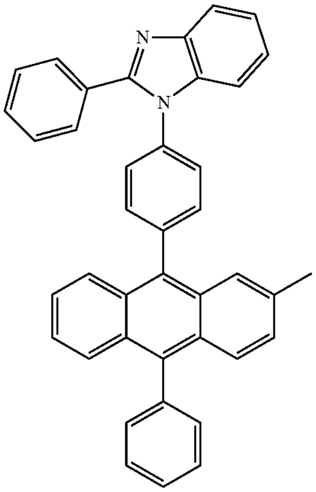
ET16
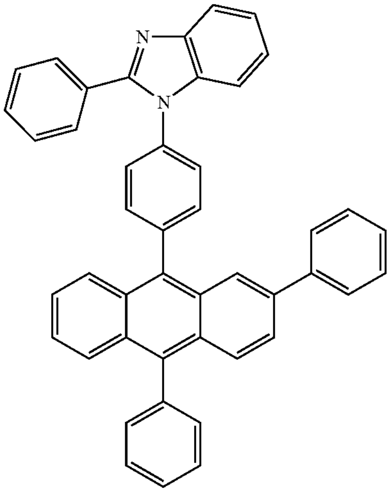

-continued
ET17
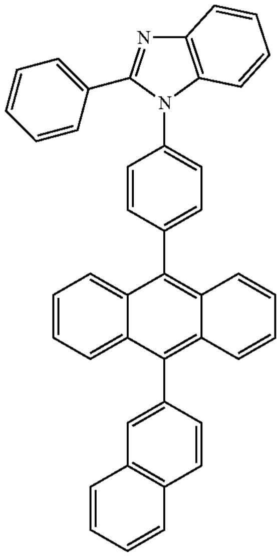
ET18
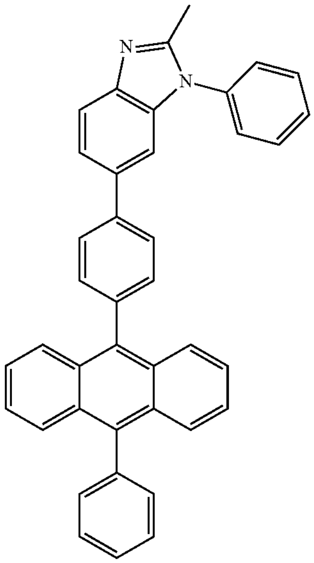
ET19
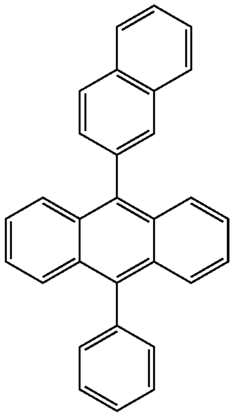
-continued
ET20
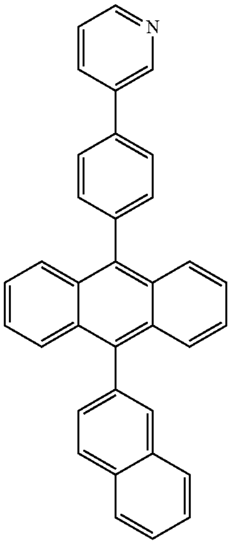
ET21
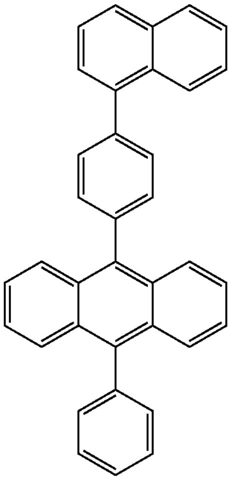
ET22
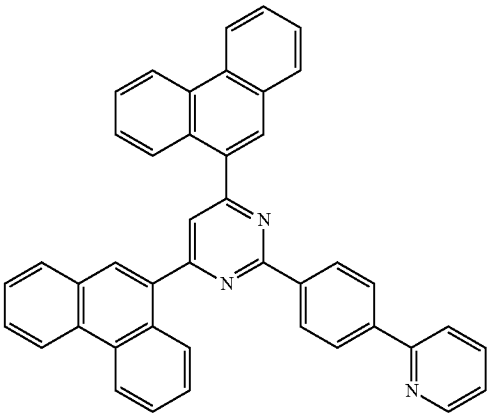

-continued
ET23
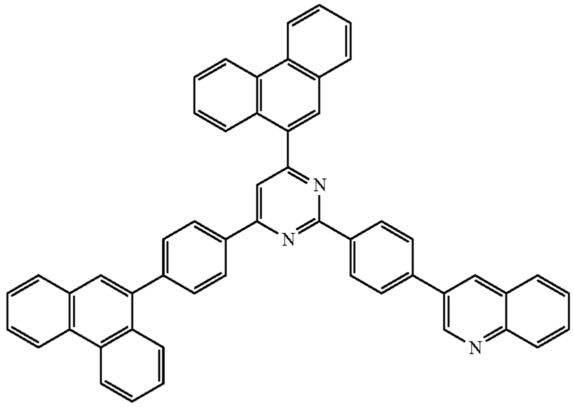
ET24
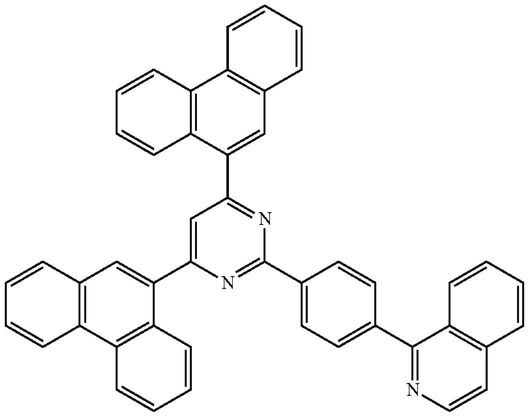
ET25
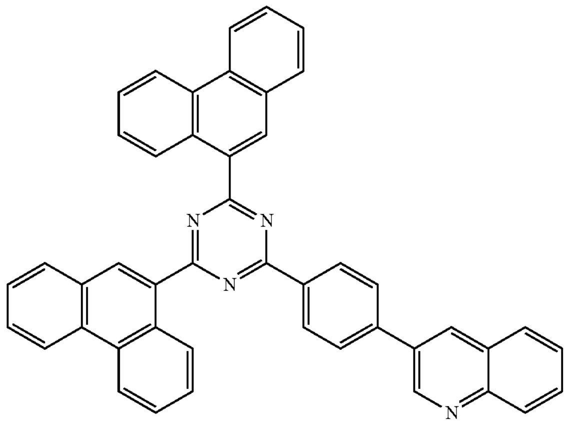
-continued
ET26
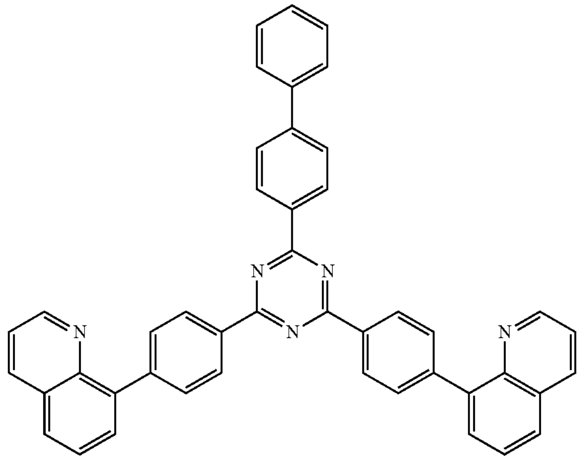
ET27
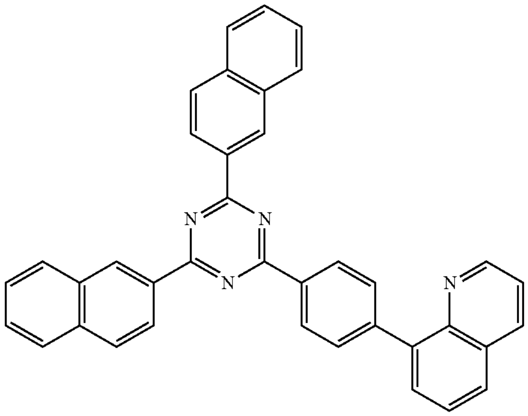
ET28
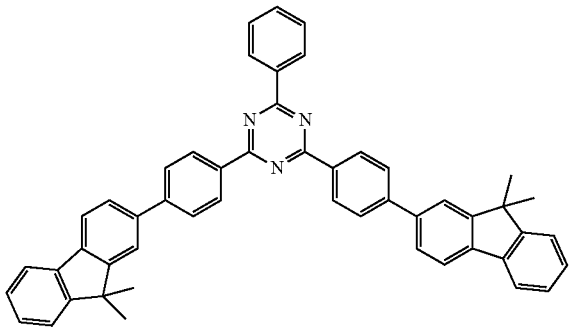

-continued
ET29
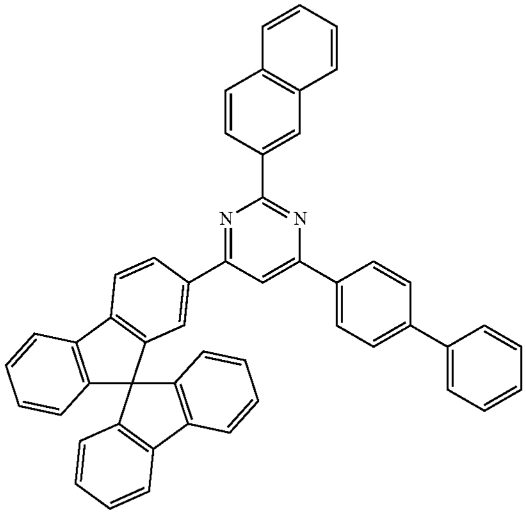
ET30
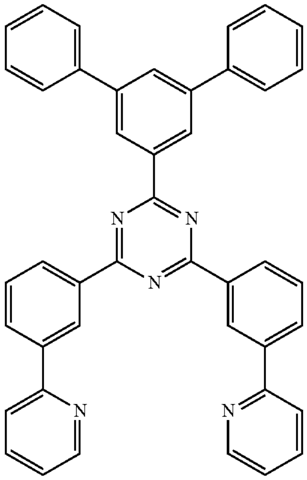
ET31
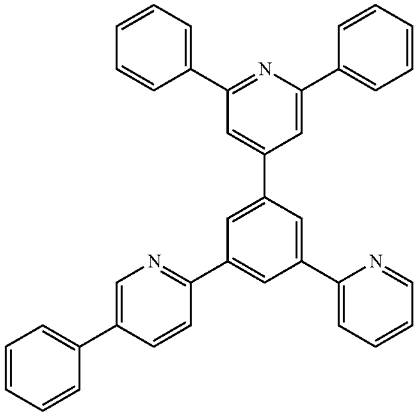
-continued
ET32
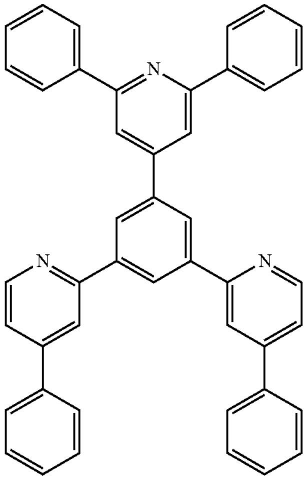
ET33
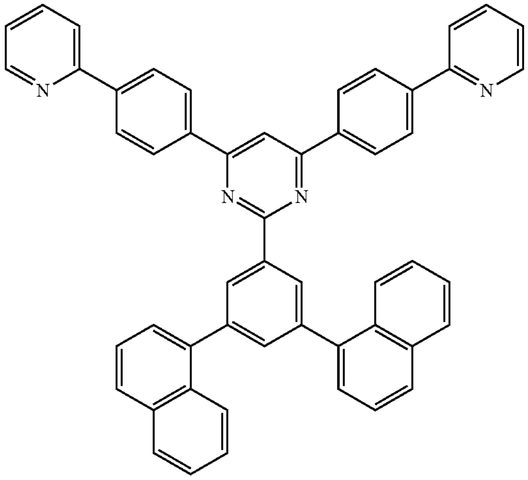
ET34
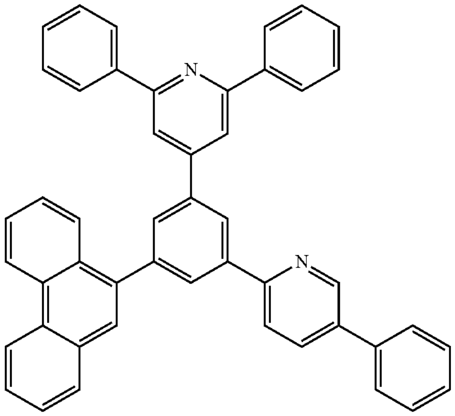

ET35
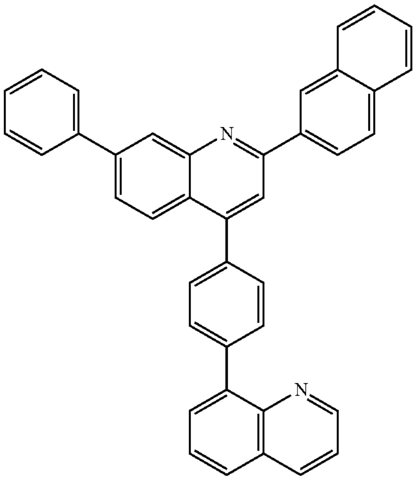
ET36
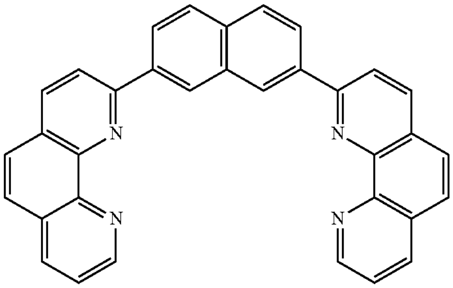
ET37
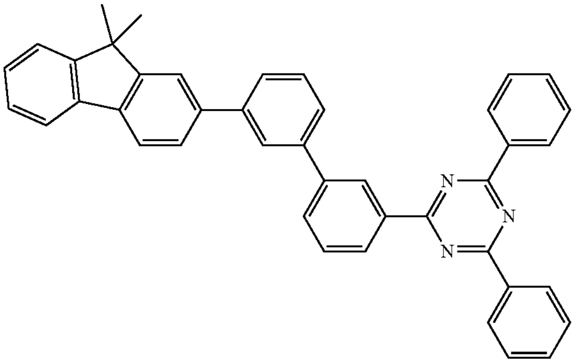
ET38
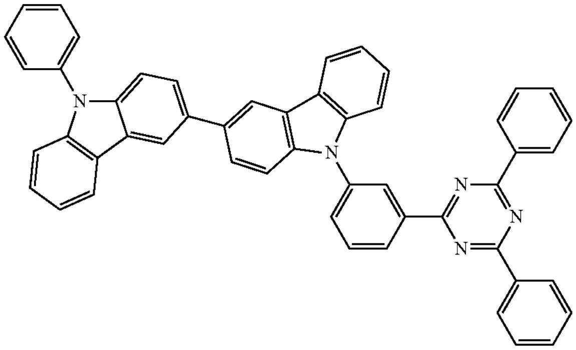
ET39
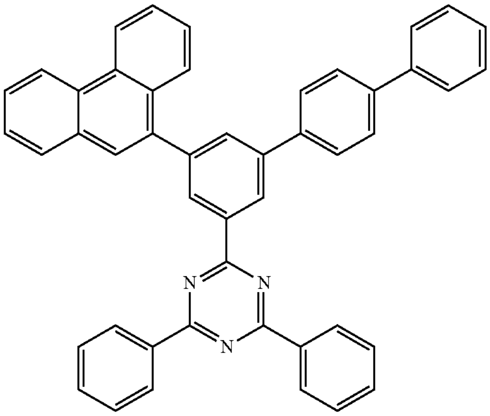
ET40
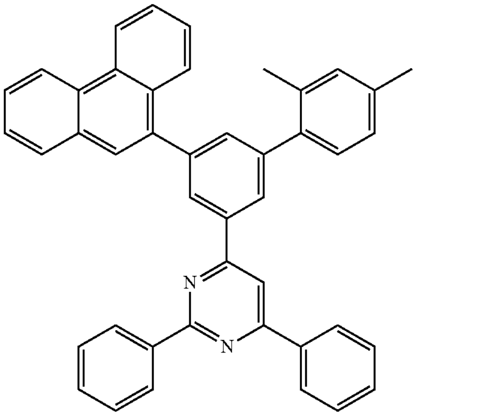
ET41
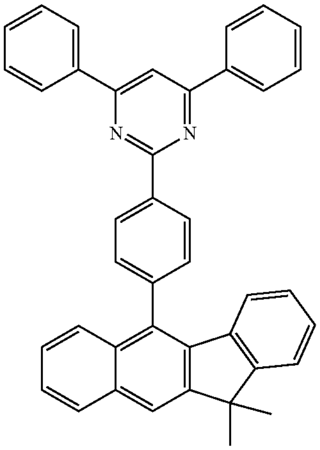

-continued
ET42
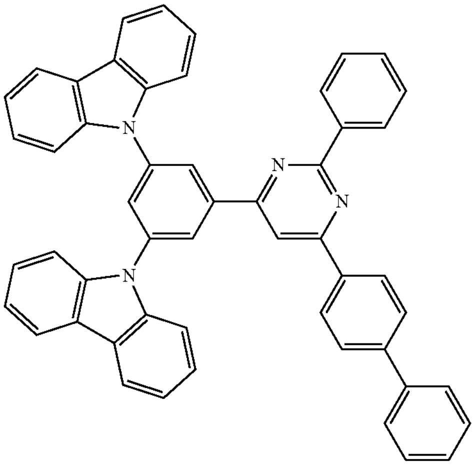
ET43
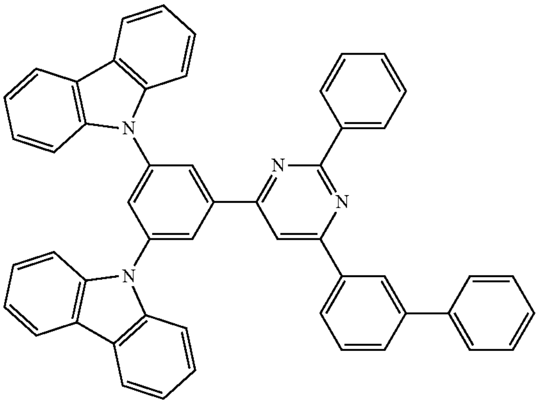
ET44
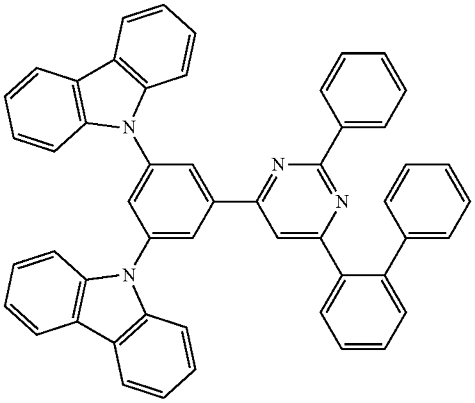
ET45
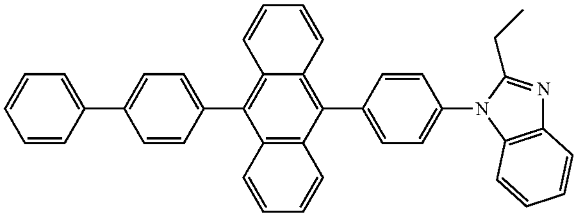
-continued
ET46
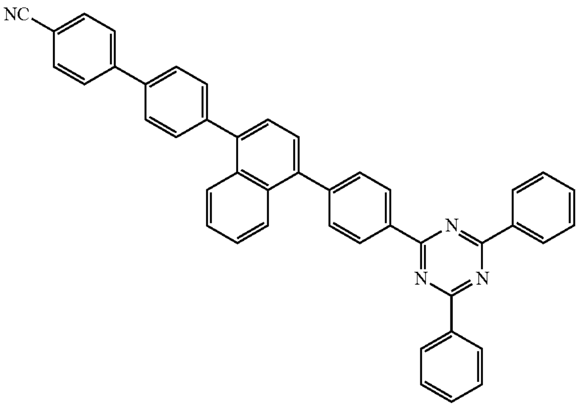
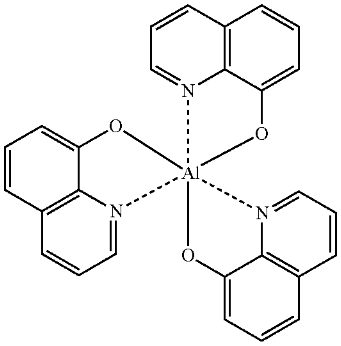
Alq3
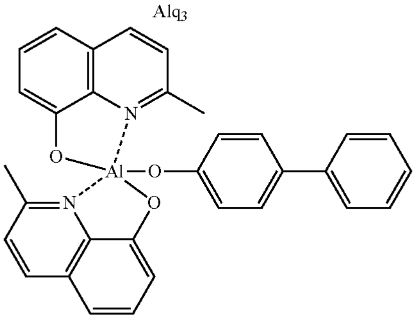
BAlq
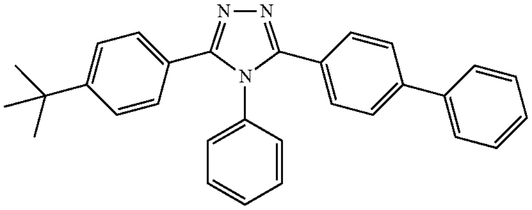
TAZ
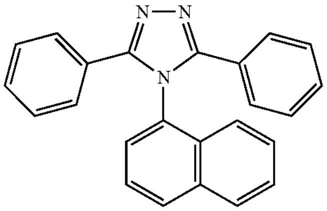
.
NTAZ
A thickness of the electron transport region may be from about 100 Å to about 5,000 Å, for example, about 160 Å to about 4,000 Å. When the electron transport region includes a buffer layer, a hole-blocking layer, an electron control layer, an electron transport layer, or any combination thereof, the thickness of the buffer layer, the hole-blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the buffer layer, the hole-blocking layer, the electron control layer, the electron transport layer, and/or the electron transport layer are within these ranges, satisfactory electron transporting characteristics may be obtained without a substantial increase in driving voltage.

In one or more embodiments, the electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, in some embodiments, the metal-containing material may include a Li complex. The Li complex may include, for example, Compound ET-D1 (LiQ) or ET-D2:

ET-D1

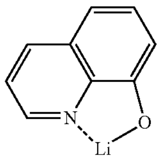

ET-D2

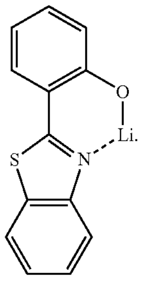

In one or more embodiments, the electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may respectively be oxides, halides (for example, fluorides, chlorides, bromides, or iodides), or tellurides of the alkali metal, the alkaline earth metal, and the rare earth metal, or any combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, KI, or RbI; or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Non-limiting examples of the lanthanide metal telluride may be LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and/or $Lu_2Te_3$.

The alkali metal complex, the alkaline earth-metal complex, and the rare earth metal complex may include i) one of metal ions of the alkali metal, the alkaline earth metal, and the rare earth metal, respectively, and ii) a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. For example, in some embodiments, the electron injection layer may be a KI:Yb co-deposited layer, an RbI:Yb co-deposited layer, a LiF:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be substantially uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

Second Electrode 150

The second electrode 150 may be on the interlayer 130 having a structure as described above. The second electrode 150 may be a cathode, which is an electron injection electrode, and as a material for the second electrode 150, a metal, an alloy, an electrically conductive compound, or any combination thereof, each having a low-work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

In some embodiments, light generated in an emission layer of the interlayer 130 of the light-emitting device 10 may be extracted toward the outside through the first electrode 110 which is a semi-transmissive electrode or a transmissive electrode, and the first capping layer. In some embodiments, light generated in an emission layer of the interlayer 130 of the light-emitting device 10 may be extracted toward the outside through the second electrode 150 which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

At least one selected from among the first capping layer and the second capping layer may each independently include carbocyclic compounds, heterocyclic compounds, amine group-containing compounds, porphine derivatives, phthalocyanine derivatives, a naphthalocyanine derivatives, alkali metal complexes, alkaline earth metal complexes, or any combination thereof. In some embodiments, the carbocyclic compound, the heterocyclic compound, and the amine group-containing compound may be substituted with a substituent including O, N, S, Se, Si, F, Cl, Br, I, or any combination thereof. In one or more embodiments, at least one selected from among the first capping layer and the second capping layer may each independently include an amine group-containing compound.

For example, in some embodiments, at least one selected from the first capping layer and the second capping layer may each independently include a compound represented by Formula 201, a compound represented by Formula 202, or any combination thereof.

In one or more embodiments, at least one selected from among the first capping layer and the second capping layer may each independently include at least one selected from Compounds HT28 to HT33, at least one selected from Compounds CP1 to CP6, β-NPB, and/or any combination thereof:

CP1

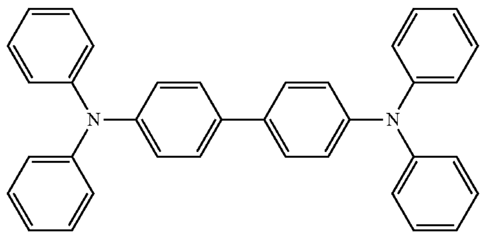

CP2

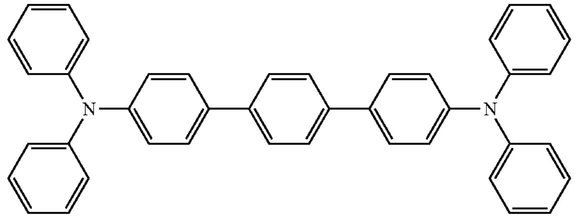

-continued

CP3

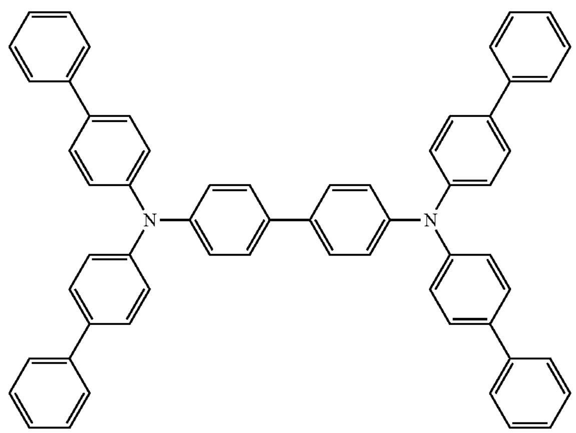

CP4

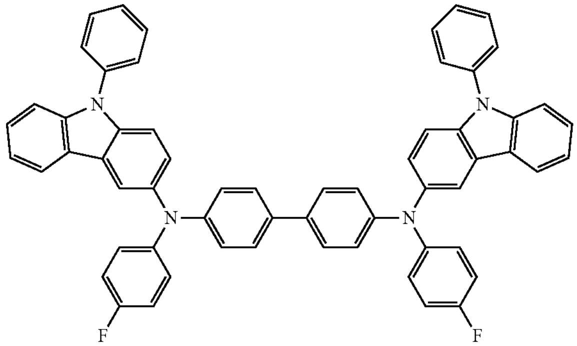

CP5

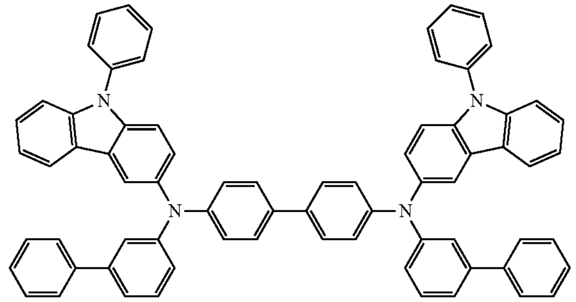

CP6

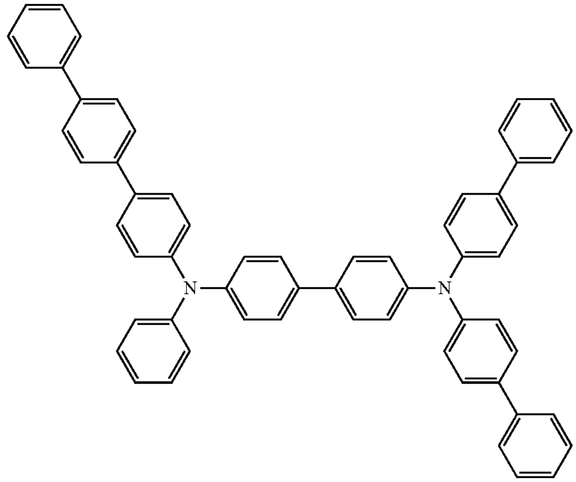

-continued

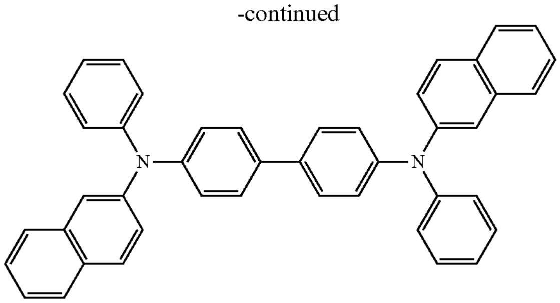

.

β-NPB

Electronic Device

The light-emitting device may be included in one or more suitable electronic devices. For example, in some embodiments, an electronic device including the light-emitting device may be a light-emitting apparatus, an authentication apparatus, and/or the like.

In one or more embodiments, the electronic device (for example, a light-emitting apparatus) may further include, in addition to the light-emitting device, i) a color filter, ii) a color conversion layer, or iii) a color filter and a color conversion layer. The color filter and/or the color conversion layer may be located in at least one direction in which light emitted from the light-emitting device travels. For example, in some embodiments, the light emitted from the light-emitting device may be blue light, green light, or white light (e.g., combined white light). For details on the light-emitting device, related description provided above may be referred to. In one or more embodiments, the color conversion layer may include a quantum dot.

The electronic device may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may further include a plurality of color conversion areas and light-shielding patterns located among the color conversion areas.

The plurality of color filter areas (or the plurality of color conversion areas) may include a first area emitting first color light, a second area emitting second color light, and/or a third area emitting third color light, wherein the first color light, the second color light, and/or the third color light may have different maximum emission wavelengths from one another. For example, in some embodiments, the first color light may be red light, the second color light may be green light, and the third color light may be blue light. For example, in one or more embodiments, the plurality of color filter areas (or the plurality of color conversion areas) may include quantum dots. In some embodiments, the first area may include a red quantum dot to emit red light, the second area may include a green quantum dot to emit green light, and the third area may not include (e.g., may exclude) a quantum dot. For details on the quantum dot, related descriptions provided herein may be referred to. The first area, the second area, and/or the third area may each include a scatter.

In some embodiments, the light-emitting device may be to emit first light, the first area may be to absorb the first light to emit first-first color light, the second area may be to absorb the first light to emit second-first color light, and the third area may be to absorb the first light to emit third-first color light. In this regard, the first-first color light, the second-first color light, and the third-first color light may have different maximum emission wavelengths. In some embodiments, the first light may be blue light, the first-first color light may be red light, the second-first color light may be green light, and the third-first color light may be blue light.

In one or more embodiments, the electronic device may further include a thin-film transistor, in addition to the light-emitting device as described above. The thin-film transistor may include a source electrode, a drain electrode, and an activation layer, wherein one selected from the source electrode and the drain electrode may be electrically connected to the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic device may further include a sealing portion for sealing the light-emitting device. The sealing portion may be located between the color filter and/or the color conversion layer and the light-emitting device. The sealing portion allows light from the light-emitting device to be extracted to the outside, and concurrently (e.g., simultaneously) prevents ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic device may be flexible.

Various functional layers may be additionally located on the sealing portion, in addition to the color filter and/or the color conversion layer, according to the utilization of the electronic device. Non-limiting examples of the functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device as described above, a biometric information collector.

The electronic device may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, one or more suitable measuring instruments, meters (for example, meters for a vehicle, an aircraft, and a vessel), projectors, and/or the like.

Figure 2:
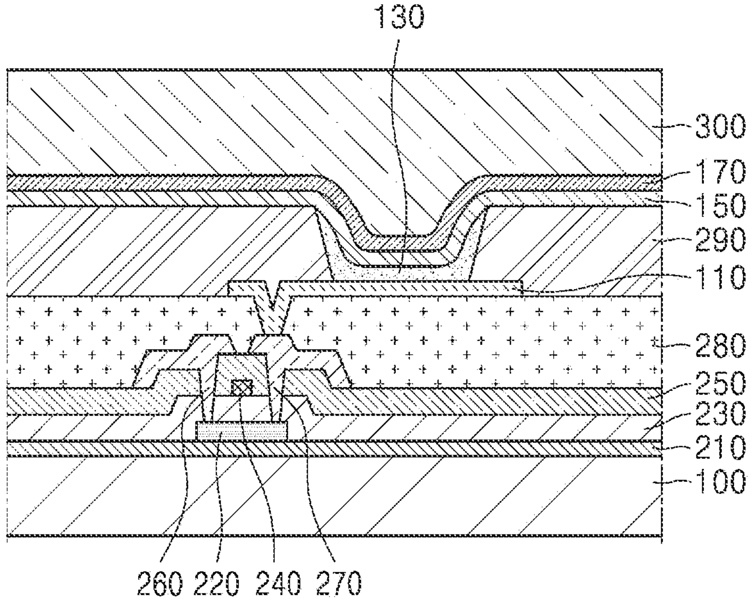
FIG. 2 is a schematic view of a structure of an electronic device according to one or more embodiments of the present disclosure.
Figure 3:
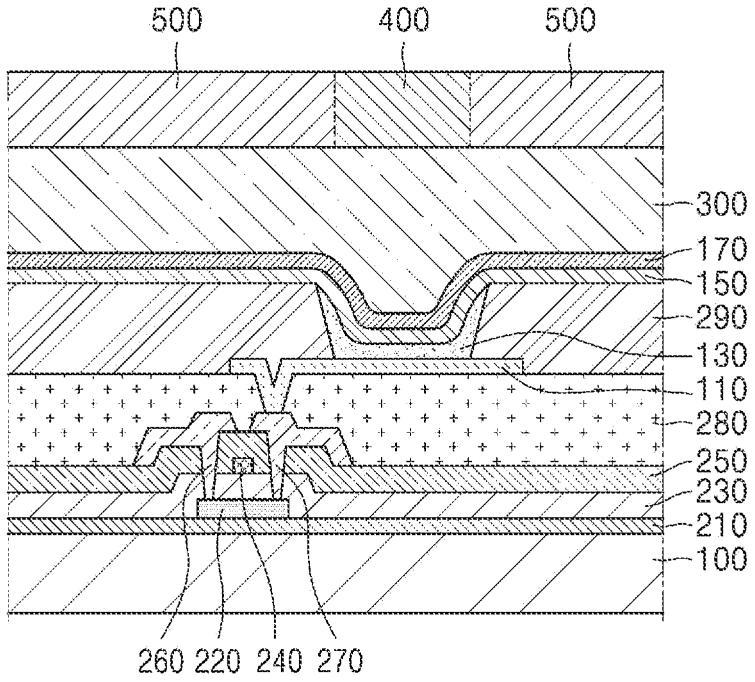
FIG. 3 is a schematic view of an electronic device according to one or more embodiments of the present disclosure.

Description of FIGS. 2 and 3

FIG. 2 is a cross-sectional view of a light-emitting apparatus, which is one of electronic devices, according to one or more embodiments of the present disclosure.

The light-emitting apparatus of FIG. 2 may include a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be on the substrate 100. The buffer layer 210 may prevent or reduce penetration of impurities through the substrate 100 and may provide a flat surface on the substrate 100.

A TFT may be on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be on the activation layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270, to insulate from one another.

The source electrode 260 and the drain electrode 270 may be on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220, respectively.

The TFT is electrically connected to a light-emitting device to drive the light-emitting device, and is covered and protected by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be on the passivation layer 280. The passivation layer 280 may be located to expose a portion of the drain electrode 270, not fully covering the drain electrode 270, and the first electrode 110 may be located to be connected to the exposed portion of the drain electrode 270.

A pixel defining layer 290 including an insulating material may be on the first electrode 110. The pixel defining layer 290 may expose a certain region of the first electrode 110, and the interlayer 130 may be formed in the exposed region of the first electrode 110. The pixel defining layer 290 may be a polyimide or polyacrylic organic film. In some embodiments, at least some layers of the interlayer 130 may extend beyond the upper portion of the pixel defining layer 290 to be located in the form of a common layer.

The second electrode 150 may be on the interlayer 130, and a second capping layer 170 may be additionally formed on the second electrode 150. The second capping layer 170 may be formed to cover the second electrode 150.

The encapsulation portion 300 may be on the second capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic films and the organic films.

FIG. 3 is a cross-sectional view of a light-emitting apparatus, which is one of electronic devices according to one or more embodiments of the present disclosure.

The light-emitting apparatus of FIG. 3 is substantially the same as the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Figure 4:
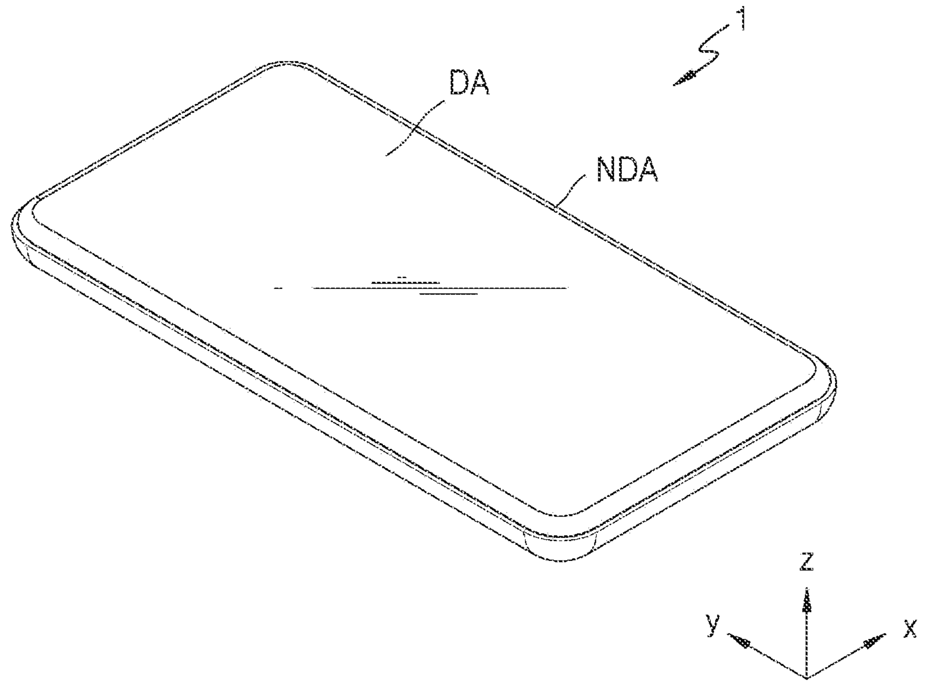
FIGS. 4, 5, 6A, 6B, and 6C are schematic views of structures of electronic apparatus according to one or more embodiments of the present disclosure.

Description of FIG. 4

FIG. 4 is a schematic perspective view of an electronic apparatus 1 including a light-emitting device according to one or more embodiments of the present disclosure. The electronic apparatus 1 may be an apparatus displaying a video or a still image and may include not only portable electronic apparatuses, such as a mobile phone, a smartphone, a tablet personal computer (PC), a mobile communication terminal, an electronic notebook, an electronic book, a portable multimedia player (PMP), a navigation, an ultra mobile PC, etc. but also one or more suitable products including a television, a laptop, a monitor, a signboard, internet of things (IOT), or a part thereof. In some embodiments, the electronic apparatus 1 may be a wearable device such as a smart watch, a watch phone, a glasses-type or kind display, a head mounted display (HMD), or a part thereof. However, embodiments of the present disclosure are not limited thereto. For example, in some embodiments, the electronic apparatus 1 may be a center information display (CID) on an instrument panel and a center fascia or dashboard of a vehicle, a room mirror display of a side mirror of a vehicle, an entertainment display for the rear seat of a car or a display placed on the back of the front seat, head up display (HUD) installed in the front of a vehicle or projected on a front window glass, or a computer generated hologram augmented reality head up display (CGH AR HUD). FIG. 4 illustrates an embodiment in which the electronic apparatus 1 is a smartphone for convenience in explanation.

The electronic apparatus 1 may include a display area DA and a non-display area NDA outside the display area DA. A display device of the electronic apparatus 1 may implement an image through an array of a plurality of pixels that are two-dimensionally arranged in the display area DA.

The non-display area NDA is an area that does not display an image, and may entirely surround the display area DA. In the non-display area NDA, a driver for providing electrical signals or power to display devices arranged in the display area DA may be arranged. in the non-display area NDA, a pad, which is an area to which an electronic element or a printing circuit board may be electrically connected, may be arranged.

A length of the electronic apparatus 1 in the x axis may be different from a length of the electronic apparatus 1 in the y axis. For example, as shown in FIG. 4, the length in the x-axis direction may be shorter than the length in the y-axis direction. In one or more embodiments, the length in the x-axis direction may be the same as the length in the y-axis direction. In one or more embodiments, the length in the x-axis direction may be longer than the length in the y-axis direction.

Descriptions of FIGS. 5 and 6A to 6C

Figure 5:
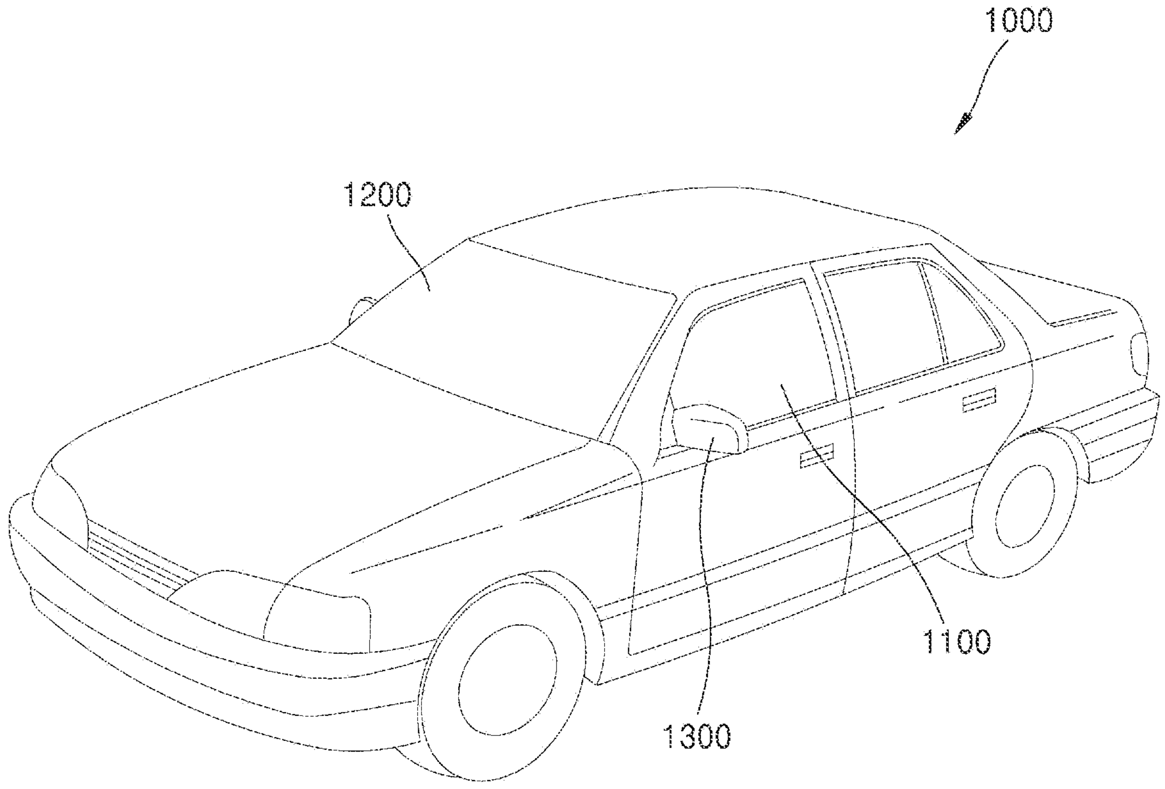
Figure 6A:
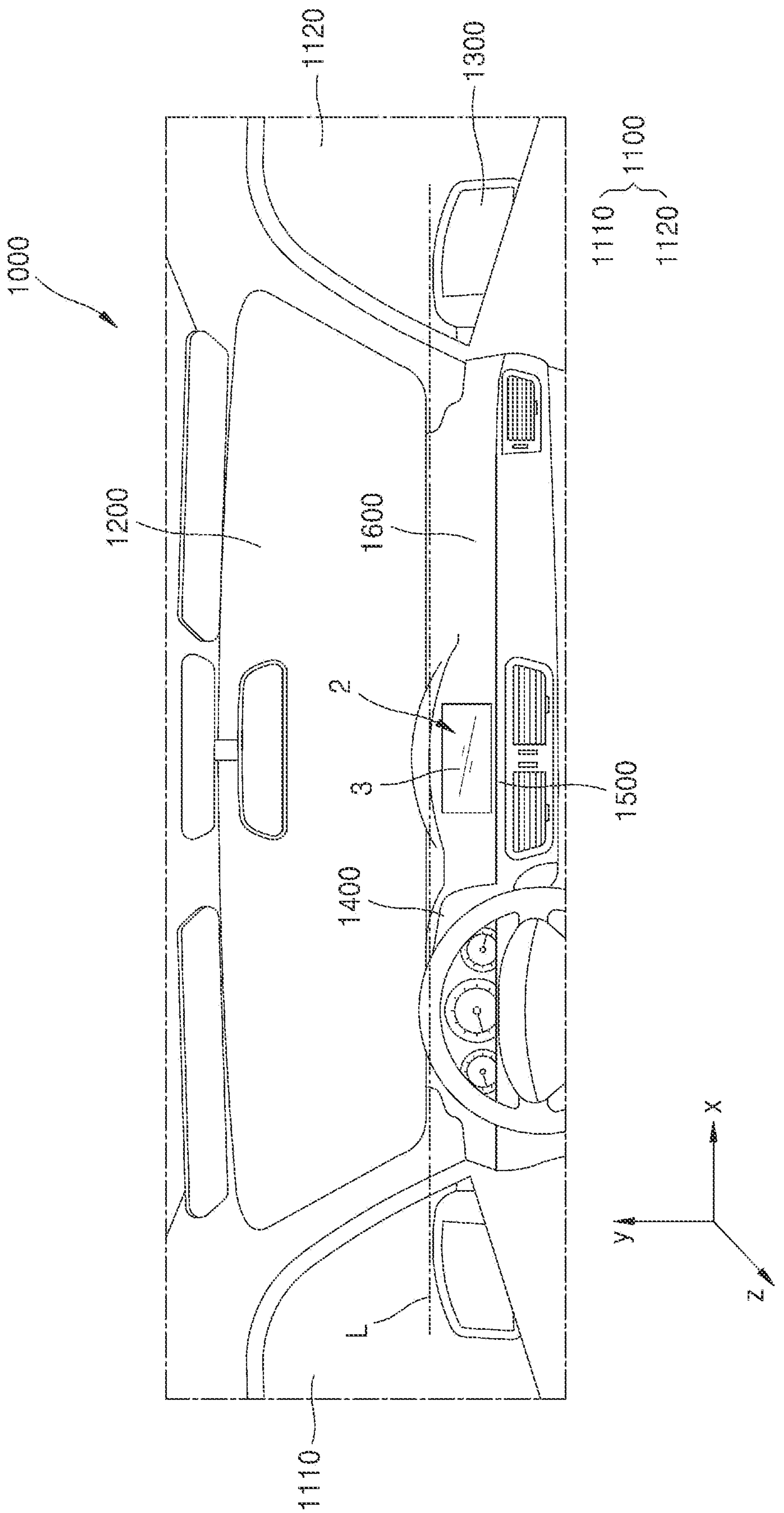
Figure 6B:
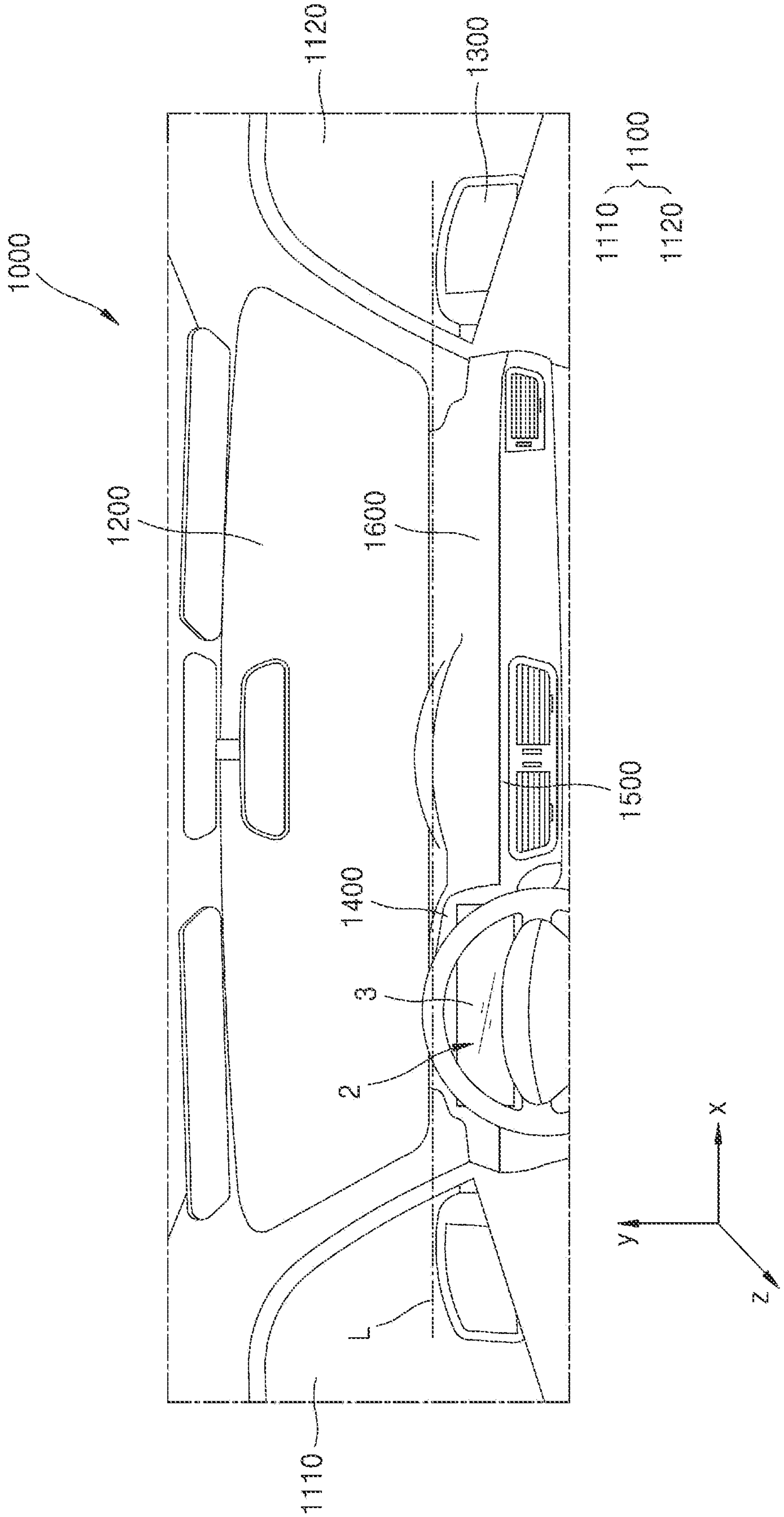
Figure 6C:
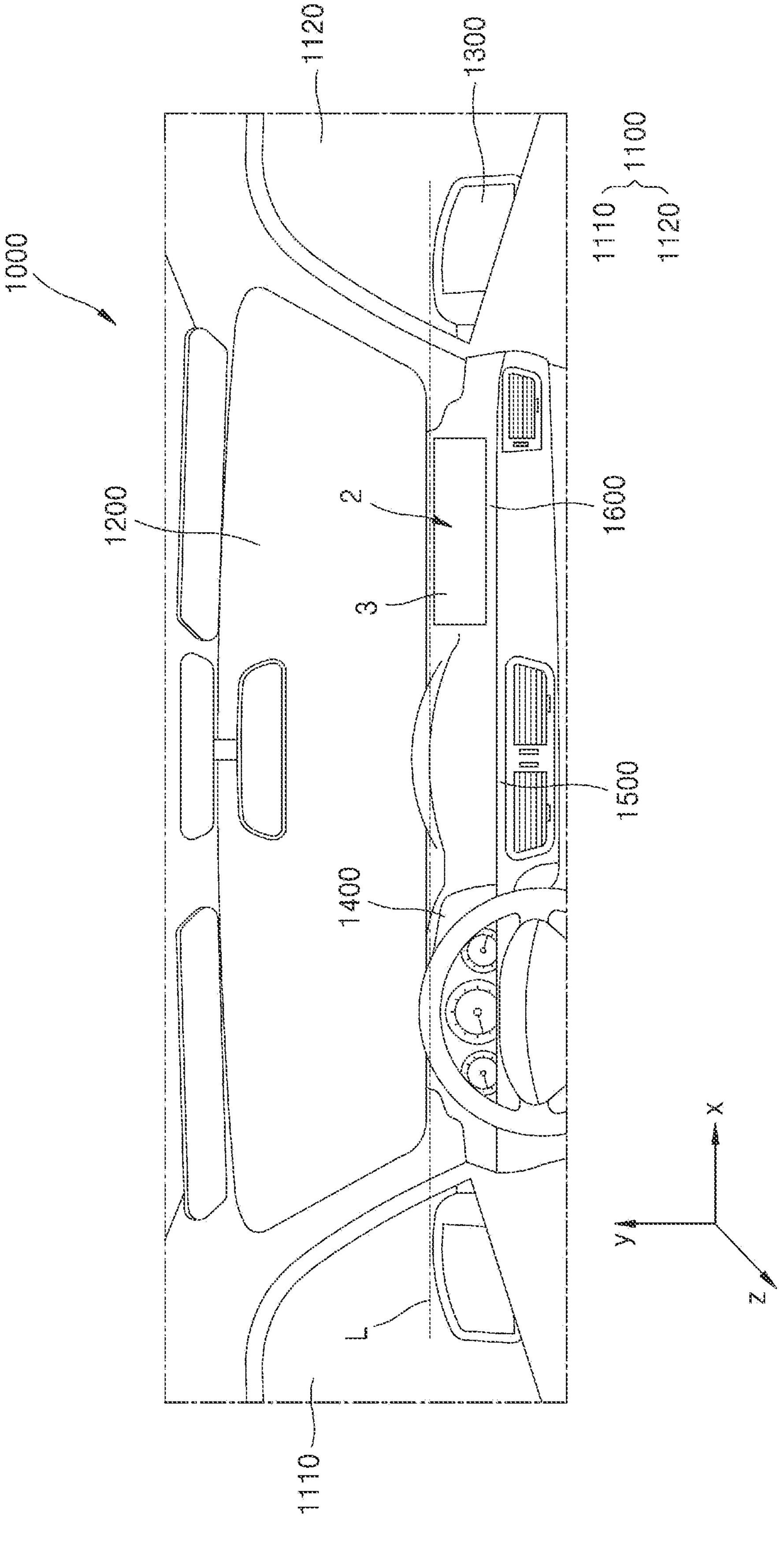

FIG. 5 is a schematic diagram of an exterior of a vehicle 1000 as an electronic apparatus including a light-emitting device according to one or more embodiments of the present disclosure. FIGS. 6A to 6C are each a schematic diagram of an interior of the vehicle 1000 according to one or more embodiments of the present disclosure.

Referring to FIGS. 5, 6A, 6B, and 6C, the vehicle 1000 may refer to one or more suitable apparatuses for moving an object to be transported, such as a human, an object, or an animal, from a departure point to a destination. The vehicle 1000 may include a vehicle traveling on a road or a track, a vessel moving over a sea or a river, an airplane flying in the sky utilizing the action of air, and/or the like.

In one or more embodiments, the vehicle 1000 may travel on a road or a track. The vehicle 1000 may move in a set or predetermined direction according to the rotation of at least one wheel. For example, the vehicle 1000 may include a three-wheeled or four-wheeled vehicle, a construction machine, a two-wheeled vehicle, a prime mover device, a bicycle, or a train running on a track.

The vehicle 1000 may include a body having an interior and an exterior, and a chassis in which mechanical apparatuses necessary for driving are installed as other parts except for the body. The exterior of the vehicle body may include a front panel, a bonnet, a roof panel, a rear panel, a trunk, a filler/pillar provided at a boundary between doors, and/or the like. The chassis of the vehicle 1000 may include a power generating device, a power transmitting device, a driving device, a steering device, a braking device, a suspension device, a transmission device, a fuel device, front and rear wheels, left and right wheels, and/or the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a filler arranged between the side window glass 1100 and the front window glass 1200.

The side window glass 1100 may be installed on the side of the vehicle 1000. In some embodiments, the side window glass 1100 may be installed on a door of the vehicle 1000. A plurality of side window glasses 1100 may be provided and may face each other. In some embodiments, the side window glass 1100 may include a first side window glass 1110 and a second side window glass 1120. In some embodiments, the first side window glass 1110 may be arranged adjacent to the cluster 1400. The second side window glass 1120 may be arranged adjacent to the passenger seat dashboard 1600.

In some embodiments, the side window glasses 1100 may be spaced apart from each other in the x-direction or the −x-direction. For example, the first side window glass 1110 and the second side window glass 1120 may be spaced apart from each other in the x direction or the −x direction. In other words, an imaginary straight line L connecting the side window glasses 1100 may extend in the x-direction or the −x-direction. For example, an imaginary straight line L connecting the first side window glass 1110 and the second side window glass 1120 to each other may extend in the x direction or the −x direction.

The front window glass 1200 may be installed in the front of the vehicle 1000. The front window glass 1200 may be arranged between the side window glasses 1100 facing each other.

The side mirror 1300 may provide a rear view of the vehicle 1000. The side mirror 1300 may be installed on the exterior of the vehicle body. In one embodiment, a plurality of side mirrors 1300 may be provided. Any one of the plurality of side mirrors 1300 may be arranged outside the first side window glass 1110. The other one of the plurality of side mirrors 1300 may be arranged outside the second side window glass 1120.

The cluster 1400 may be arranged in front of the steering wheel. The cluster 1400 may include a tachometer, a speedometer, a coolant thermometer, a fuel gauge turn indicator, a high beam indicator, a warning light, a seat belt warning light, an odometer, a hodometer, an automatic shift selector indicator light, a door open warning light, an engine oil warning light, and/or a low fuel warning light.

The center fascia 1500 may include a control panel on which a plurality of buttons for adjusting an audio device, an air conditioning device, and a heater of a seat are disposed. The center fascia 1500 may be arranged on one side of the cluster 1400.

The passenger seat dashboard 1600 may be spaced apart from the cluster 1400 with the center fascia 1500 arranged therebetween. In one embodiment, the cluster 1400 may be arranged to correspond to a driver seat, and the passenger seat dashboard 1600 may be disposed to correspond to a passenger seat. In one embodiment, the cluster 1400 may be adjacent to the first side window glass 1110, and the passenger seat dashboard 1600 may be adjacent to the second side window glass 1120.

In one or more embodiments, the display device 2 may include a display panel 3, and the display panel 3 may display an image. The display device 2 may be arranged inside the vehicle 1000. In some embodiments, the display device 2 may be arranged between the side window glasses 1100 facing each other. The display device 2 may be arranged on at least one selected from among the cluster 1400, the center fascia 1500, and the passenger seat dashboard 1600.

The display device 2 may include an organic light-emitting display device, an inorganic electroluminescent (EL) display device, a quantum dot display device, and/or the like. Hereinafter, as the display device 2 according to one or more embodiments of the present disclosure, an organic light-emitting display device display including the light-emitting device according to the present disclosure will be described as an example, but one or more suitable types (kinds) of display devices as described above may be utilized in embodiments of the present disclosure.

Referring to FIG. 6A, the display device 2 may be arranged on the center fascia 1500. In one embodiment, the display device 2 may display navigation information. In one embodiment, the display device 2 may display audio, video, or information regarding vehicle settings.

Referring to FIG. 6B, the display device 2 may be arranged on the cluster 1400. When the display device 2 is arranged on the cluster 1400, the cluster 1400 may display driving information and/or the like through the display device 2. For example, the cluster 1400 may be implemented digitally. The digital cluster 1400 may display vehicle information and driving information as images. For example, in some embodiments, a needle and a gauge of a tachometer and one or more suitable warning light icons may be displayed by a digital signal.

Referring to FIG. 6C, the display device 2 may be arranged on the dashboard 1600 of the passenger seat. The display device 2 may be embedded in the passenger seat dashboard 1600 or arranged on the passenger seat dashboard 1600. In some embodiments, the display device 2 arranged on the dashboard 1600 for the passenger seat may display an image related to information displayed on the cluster 1400 and/or information displayed on the center fascia 1500. In one or more embodiments, the display device 2 arranged on the passenger seat dashboard 1600 may display information different from information displayed on the cluster 1400 and/or information displayed on the center fascia 1500.

Manufacturing Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are each formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as utilized herein refers to a cyclic group including (e.g., consisting of) carbon only as a ring-forming atom and having three to sixty carbon atoms, and the term "$C_1$-$C_{60}$ heterocyclic group" as utilized herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group including (e.g., consisting of) one ring or a polycyclic group in which two or more rings are condensed with each other. For example, the $C_1$-$C_{60}$ heterocyclic group has 3 to 61 ring-forming atoms.

The term "cyclic group" as utilized herein may include the $C_3$-$C_{60}$ carbocyclic group, and the $C_1$-$C_{60}$ heterocyclic group.

The term "π electron-rich $C_3$-$C_{60}$ cyclic group" as utilized herein refers to a cyclic group that has 3 to 60 carbon atoms and does not include *—N=*' as a ring-forming moiety. The term "π electron-deficient nitrogen-containing $C_1$-$C_{60}$ heterocyclic group" as utilized herein refers to a heterocyclic group that has 1 to 60 carbon atoms and includes *—N=*' as a ring-forming moiety.

For example, the $C_3$-$C_{60}$ carbocyclic group may be i) a T1 group or ii) a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like.), the π electron-rich $C_3$-$C_{60}$ cyclic group may be i) a T1 group, ii) a condensed cyclic group in which at least two T1 groups are condensed with each other, iii) a T3 group, iv) a condensed cyclic group in which at least two T3 groups are condensed with each other, or v) a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like.), the π electron-deficient nitrogen-containing $C_1$-$C_{60}$ heterocyclic group may be i) a T4 group, ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ hetero cyclic group" as utilized herein refer to a group condensed to any cyclic group, a monovalent group, or a polyvalent group (for example, a divalent group, a trivalent group, a tetravalent group, etc.) according to the structure of a formula for which the corresponding term is utilized. For example, the "benzene group" may be a benzo group, a phenyl group, a phenylene group, and/or the like, which may be easily understood by one of ordinary skill in the art according to the structure of a formula including the "benzene group."

Non-limiting examples of the monovalent $C_3$-$C_{60}$ carbocyclic group and the monovalent $C_1$-$C_{60}$ heterocyclic group may be a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Non-limiting examples of the divalent $C_3$-$C_{60}$ carbocyclic group and the divalent $C_1$-$C_{60}$ heterocyclic group may be a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as utilized herein refers to a linear or branched aliphatic hydrocarbon monovalent group that has one to sixty carbon atoms, and non-limiting examples thereof may be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and non-limiting examples thereof may be an ethenyl group, a propenyl group, and a butenyl group. The term "$C_2$-$C_{60}$ alkenylene group" as utilized herein refers to a divalent group having the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and non-limiting examples thereof may include an ethynyl group, a propynyl group, and/or the like. The term "$C_2$-$C_{60}$ alkynylene group" as utilized herein refers to a divalent group having the same structure as the $C_2$-$C_{60}$ alkynyl group.

The term "$C_1$-$C_{60}$ alkoxy group" as utilized herein refers to a monovalent group represented by —$OA_{101}$ (wherein $A_{101}$ is the $C_1$-$C_{60}$ alkyl group), and non-limiting examples thereof may include a methoxy group, an ethoxy group, and an isopropyloxy group.

The term "$C_3$-$C_{10}$ cycloalkyl group" as utilized herein refers to a monovalent saturated hydrocarbon cyclic group having 3 to 10 carbon atoms, and non-limiting examples thereof may be a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as utilized herein refers to a divalent group having the same structure as the $C_3$-$C_{10}$ cycloalkyl group.

The term "$C_1$-$C_{10}$ heterocycloalkyl group" as utilized herein refers to a monovalent cyclic group of 1 to 10 carbon atoms, further including, in addition to carbon atoms, at least one heteroatom, as ring-forming atoms, and non-limiting examples thereof may be a 1,2,3,4-oxatriazolidinyl group, a tetrahydrofuranyl group, and a tetrahydrothiophenyl group. The term "$C_1$-$C_{10}$ heterocycloalkylene group" as utilized herein refers to a divalent group having the same structure as the $C_1$-$C_{10}$ heterocycloalkyl group.

The term $C_3$-$C_{10}$ cycloalkenyl group utilized herein refers to a monovalent cyclic group that has three to ten carbon atoms and at least one carbon-carbon double bond in the ring thereof and no aromaticity, and non-limiting examples thereof may be a cyclopentenyl group, a cyclohexenyl group, and a cycloheptenyl group. The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Non-limiting examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as utilized herein refers to a divalent group having the same structure as the $C_1$-$C_1$a heterocycloalkenyl group.

The term "$C_6$-$C_{60}$ aryl group" as utilized herein refers to a monovalent group having a carbocyclic aromatic system of 6 to 60 carbon atoms, and the term "$C_6$-$C_6$a arylene group" as utilized herein refers to a divalent group having a carbocyclic aromatic system of 6 to 60 carbon atoms. Non-limiting examples of the $C_6$-$C_{60}$ aryl group may be a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as utilized herein refers to a divalent group having a heterocyclic aromatic system of 1 to 60 carbon atoms, further including, in addition to carbon atoms, at least one heteroatom, as ring-forming atoms. Non-limiting examples of the $C_1$-$C_{60}$ heteroaryl group may be a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group (for example, having 8 to 60 carbon atoms) having two or more rings condensed to each other, only carbon atoms as ring-forming atoms, and no aromaticity in its entire molecular structure as a whole. Non-limiting examples of the monovalent non-aromatic condensed polycyclic group may be an indenyl group, a fluorenyl group, a spiro-bifluorenyl group, a benzofluorenyl group, an indenophenanthrenyl group, and an indeno anthracenyl group. The term "polyvalent (e.g., divalent) non-aromatic condensed polycyclic group" as utilized herein respectively refers to a polyvalent (e.g., divalent) group having the same structure as the monovalent non-aromatic condensed polycyclic group described above.

The term "monovalent non-aromatic condensed heteropolycyclic group" as utilized herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure as a whole. Non-limiting examples of the monovalent non-aromatic condensed heteropolycyclic group may be a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "polyvalent (e.g., divalent) non-aromatic condensed heteropolycyclic group" as utilized herein respectively refers to a polyvalent (e.g., divalent) group having the same structure as the monovalent non-aromatic condensed heteropolycyclic group described above.

The term "$C_6$-$C_{60}$ aryloxy group" as utilized herein indicates —$OA_{102}$ (wherein $A_{102}$ is the $C_1$-$C_{60}$ aryl group), and the term "$C_1$-$C_{60}$ arylthio group" as utilized herein indicates —$SA_{103}$ (wherein $A_{103}$ is the $C_1$-$C_{60}$ aryl group).

The term "$C_7$-$C_{60}$ arylalkyl group" utilized herein refers to -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroarylalkyl group" utilized herein refers to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as utilized herein refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ in the present disclosure may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as utilized herein refers to any atom other than a carbon atom. Non-limiting examples of the heteroatom may be O, S, N, P, Si, B, Ge, Se, and any combinations thereof.

The term "third-row transition metal" utilized herein includes hafnium (Hf), tantalum (Ta), tungsten (W), rhenium (Re), osmium (Os), iridium (Ir), platinum (Pt), gold (Au), and/or the like.

"Ph" as utilized herein refers to a phenyl group, "Me" as utilized herein refers to a methyl group, "Et" as utilized herein refers to an ethyl group, "tert-Bu" or "$Bu^t$" as utilized herein refers to a tert-butyl group, and "OMe" as utilized herein refers to a methoxy group.

The term "biphenyl group" as utilized herein refers to "a phenyl group substituted with a phenyl group." In other words, the "biphenyl group" is a substituted phenyl group having a $C_6$-$C_{60}$ aryl group as a substituent.

The term "terphenyl group" as utilized herein refers to "a phenyl group substituted with a biphenyl group". In other words, the "terphenyl group" is a substituted phenyl group having, as a substituent, a $C_1$-$C_{60}$ aryl group substituted with a $C_6$-$C_{60}$ aryl group.

* and *' as utilized herein, unless defined otherwise, each refer to a binding site to a neighboring atom in a corresponding formula or moiety.

Hereinafter, compounds according to one or more embodiments and light-emitting devices according to one or more embodiments will be described in more detail with reference to the following synthesis examples and examples. The wording "B was utilized instead of A" utilized in describing Synthesis Examples refers to that an identical molar equivalent of B was utilized in place of A.

EXAMPLES

Synthesis Example 1: Synthesis of Compound 1

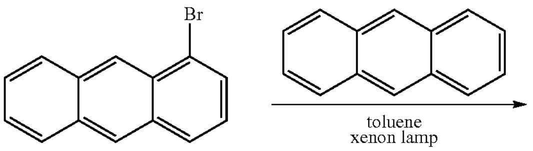

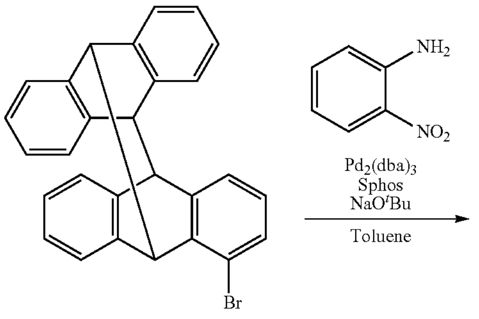

1-a

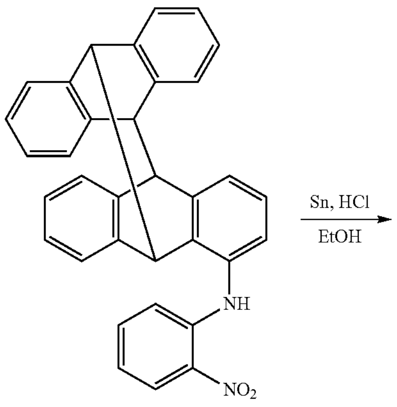

1-b

-continued

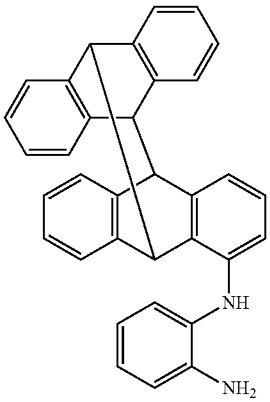

1-c

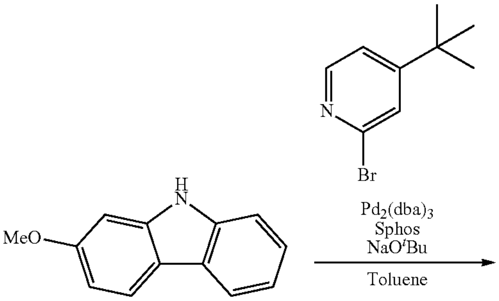

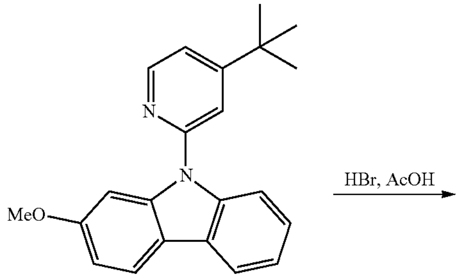

1-d

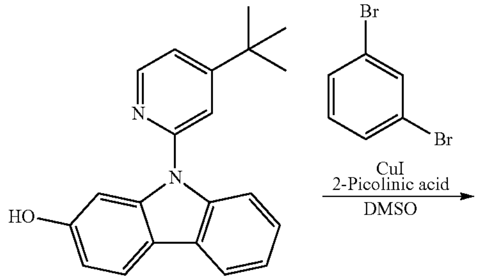

1-e

-continued

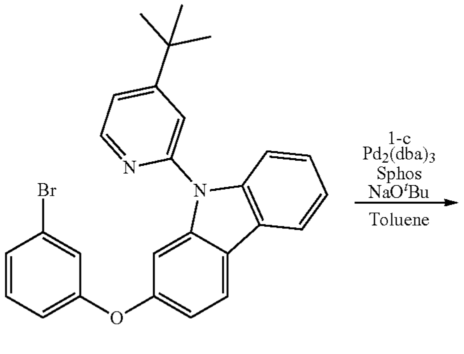

1-f

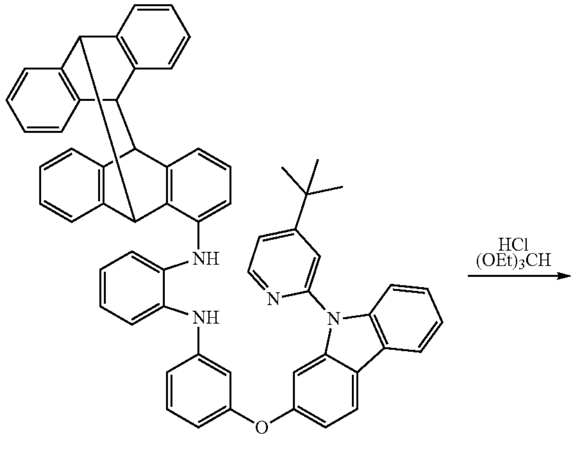

1-g

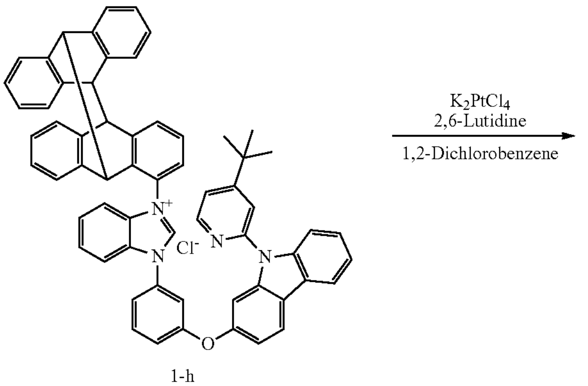

1-h

-continued

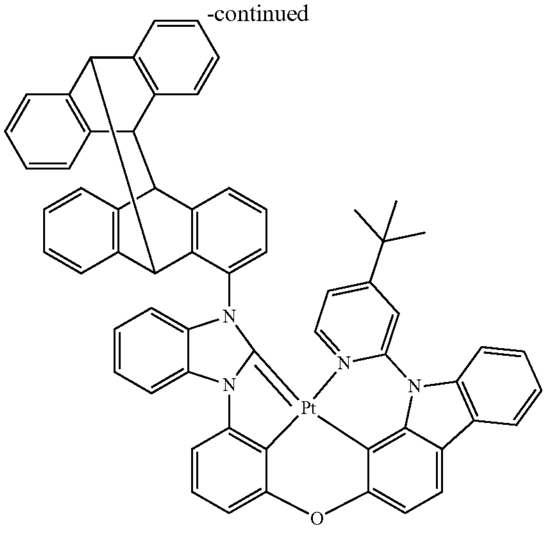

1

(1) Synthesis of Intermediate Compound 1-a 1-bromoanthracene (1.0 eq) and anthracene (10 eq) were dissolved in toluene (0.1 M) and stirred under irradiation by a xenon lamp in the nitrogen condition at 110° C. for 12 hours to obtain a reaction product. The reaction product was cooled to room temperature and subjected to an extraction process three times utilizing ethyl acetate (EA) and water to obtain an organic layer. The obtained organic layer was dried by utilizing magnesium sulfate and concentrated, and column chromatography (a volume ratio of EA hexane as an eluent=1:50) was utilized to synthesize Intermediate Compound 1-a (yield: 83%).

(2) Synthesis of Intermediate Compound 1-b 2-nitroaniline (1.2 eq), Intermediate Compound 1-a (1.0 eq), $Pd_2(dba)_3$ (10 mol %), Sphos (15 mol %), and sodium tert-butoxide (3.0 eq) were dissolved in toluene (0.1 M) and stirred at 110° C. for 15 hours to obtain a reaction product. The reaction product was cooled at room temperature and then subjected to an extraction process three times utilizing dichloromethane and water, to thereby obtain an organic layer. The organic layer thus obtained was dried by utilizing magnesium sulfate and concentrated, and column chromatography (methylene chloride (MC):hexane as an eluent=1:4 v/v) was utilized for synthesis of Intermediate Compound 1-b (yield: 71%).

(3) Synthesis of Intermediate Compound 1-c

Intermediate Compound 1-b (1.0 eq), Sn (4.5 eq), and HCl (7.5 eq) were dissolved in ethanol (0.1 M) and then stirred at 80° C. for 12 hours, to obtain a reaction product. The reaction product was cooled at room temperature and then neutralized utilizing a NaOH solution. The neutralized product was subjected to an extraction process by utilizing dichloromethane and water to obtain an organic layer, followed by filtration through celite/silica gel. The filtrate was dried by utilizing magnesium sulfate and concentrated to synthesize Intermediate Compound 1-c (yield: 93%).

(4) Synthesis of Intermediate Compound 1-d 2-methoxy-9H-carbazole (1.0 eq), 2-bromo-4-(tert-butyl) pyridine (1.1 eq), $Pd_2(dba)_3$ (5 mol %), Sphos (7 mol %), and sodium tert-butoxide (2.0 eq) were dissolved in toluene (0.1 M) and then stirred at 110° C. for 12 hours. The reaction mixture was cooled at room temperature, and the solvent was removed under reduced pressure. Then, an extraction process was performed thereon three times by utilizing ethyl acetate and water to obtain an organic layer. The obtained organic layer was dried by utilizing magnesium sulfate and concentrated, and column chromatography (a volume ratio of EA:hexane as an eluent=1:10) was utilized to synthesize Intermediate Compound 1-d (yield: 92%).

(5) Synthesis of Intermediate Compound 1-e

Intermediate Compound 1-d (1.0 eq), HBr (0.5 M), and acetic acid (0.5 M) were stirred at 120° C. for 12 hours. The reaction mixture was cooled at room temperature and then neutralized to pH 4 by utilizing a NaOH aqueous solution, followed by an extraction process three times by utilizing ethyl acetate and water, to thereby obtain an organic layer. The obtained organic layer was dried by utilizing magnesium sulfate and then subjected to filtration through silica gel, to thereby synthesize Intermediate Compound 1-e (yield: 75%).

(6) Synthesis of Intermediate Compound 1-f 1,3-dibromobenzene (1.5 eq), Intermediate Compound 1-e (1.0 eq), CuI (10 mol %), 2-picolinic acid (20 mol %), and potassium phosphate tribasic (2.0 eq) were dissolved in dimethyl sulfoxide (DMSO) (0.1 M) and then stirred at 100° C. for 4 hours. The reaction mixture was cooled at room temperature, and an extraction process was performed thereon three times by utilizing ethyl acetate and water to obtain an organic layer. The obtained organic layer was dried by utilizing magnesium sulfate and concentrated, and column chromatography (a volume ratio of EA:hexane as an eluent=1:20) was utilized to synthesize Intermediate Compound 1-f (yield: 60%).

(7) Synthesis of Intermediate Compound 1-g

Intermediate Compound 1-c (1.2 eq), Intermediate Compound 1-f (1.0 eq), $Pd_2(dba)_3$ (5 mol %), Sphos (7 mol %), and sodium tert-butoxide (2.0 eq) were dissolved in toluene (0.1 M) and then stirred at 110° C. for 2 hours to obtain a reaction product. The reaction product was cooled at room temperature and then subjected to an extraction process three times utilizing dichloromethane and water, to thereby obtain an organic layer. The obtained organic layer was dried by utilizing magnesium sulfate and concentrated, and column chromatography (ethyl acetate:hexane as an eluent=a volume ratio of 1:9) was utilized to synthesize Intermediate Compound 1-g (yield: 88%).

(8) Synthesis of Intermediate Compound 1-h

Intermediate Compound 1-g (1.0 eq) was dissolved in triethyl orthoformate (30 eq), and then 37% HCl (1.5 eq) was added thereto, followed by stirring for 12 hours at 80° C., to thereby obtain a reaction product. The reaction product was cooled at room temperature, and then triethyl orthoformate in the reaction product was concentrated, followed by an extraction process three times by utilizing dichloromethane and water, to thereby obtain an organic layer. The obtained organic layer was dried by utilizing magnesium sulfate and concentrated, and column chromatography (a volume ratio of MC:methanol as an eluent=95:5) was utilized to synthesize Intermediate Compound 1-h (yield: 92%).

(9) Synthesis of Compound 1

Intermediate Compound 1-h (1.0 eq), potassium platinum (II) chloride (1.1 eq), and 2,6-lutidine (4.0 eq) were dissolved in 1,2-dichlorobenzene (0.05 M) and then stirred under the nitrogen condition at 120° C. for 3 days to obtain a reaction product. After the reaction product was cooled at room temperature, 1,2-dichlorobenzene in the reaction product was concentrated and removed, followed by an extraction process three times by utilizing dichloromethane and water, to thereby obtain an organic layer. The obtained organic layer was dried by utilizing magnesium sulfate and concentrated, and column chromatography (a volume ratio of MC:hexane as an eluent=3:7) was utilized to synthesize Compound 1 (yield: 46%).

Synthesis Example 2: Synthesis of Compound 11

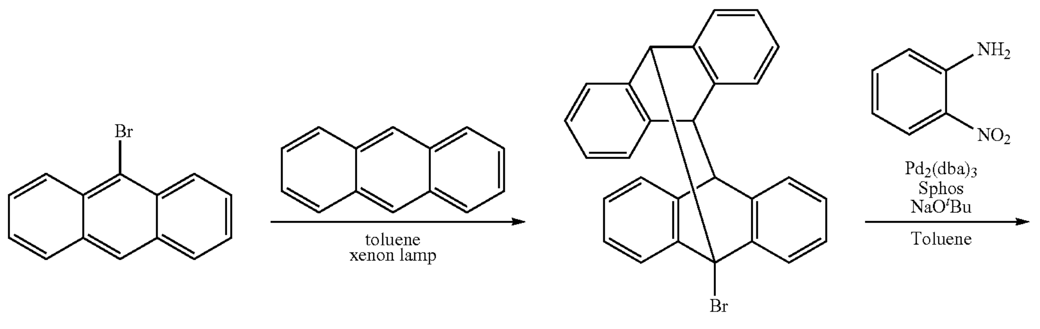

11-a

-continued
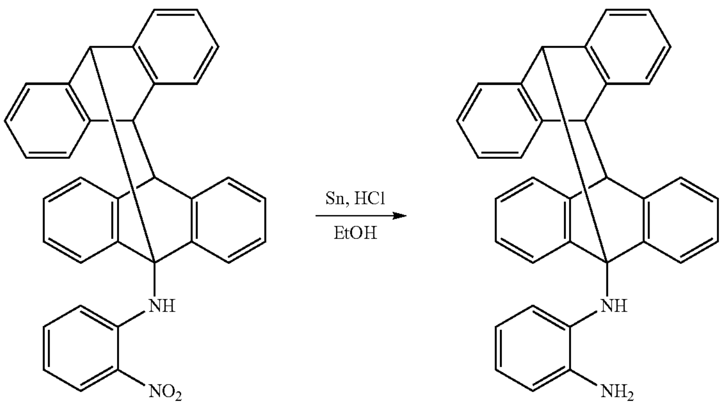
11-b 11-c
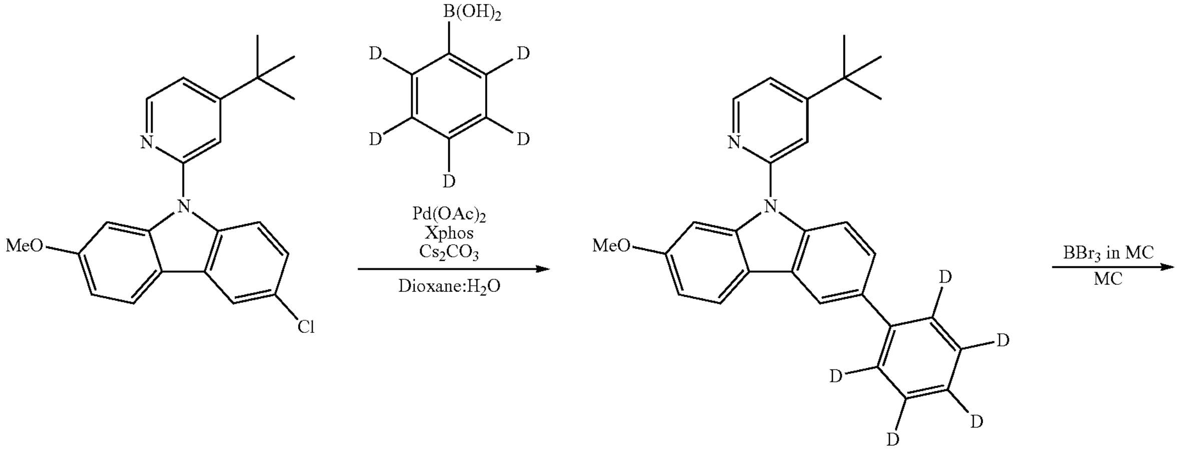
11-d
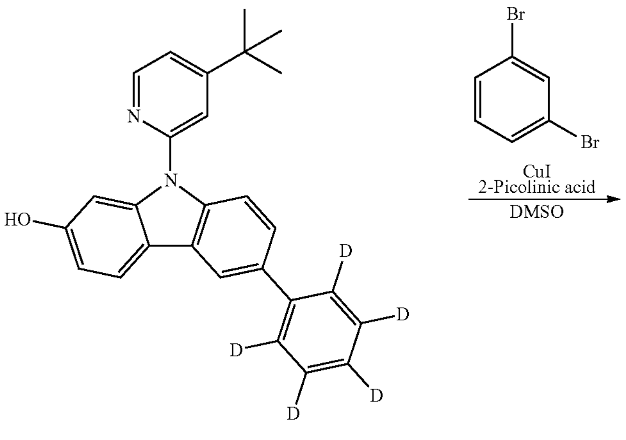
11-e

-continued
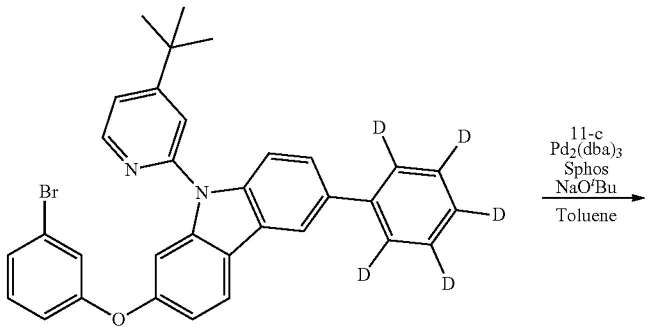
11-f
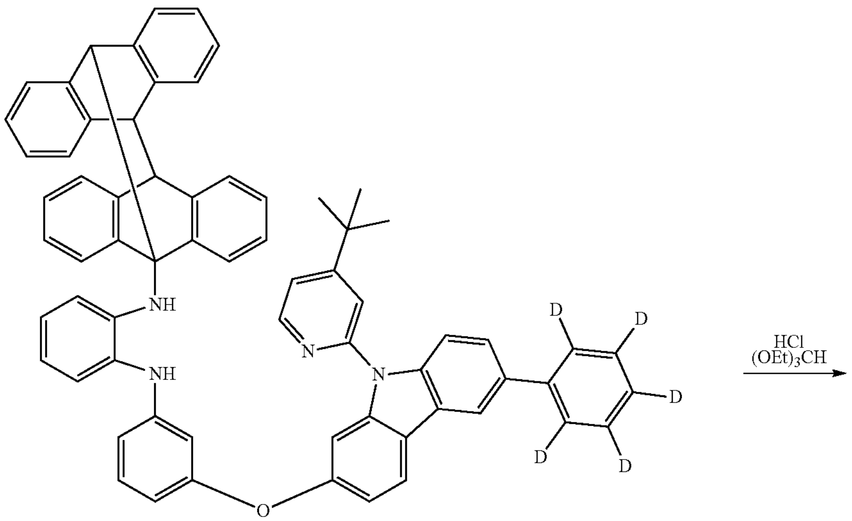
11-g
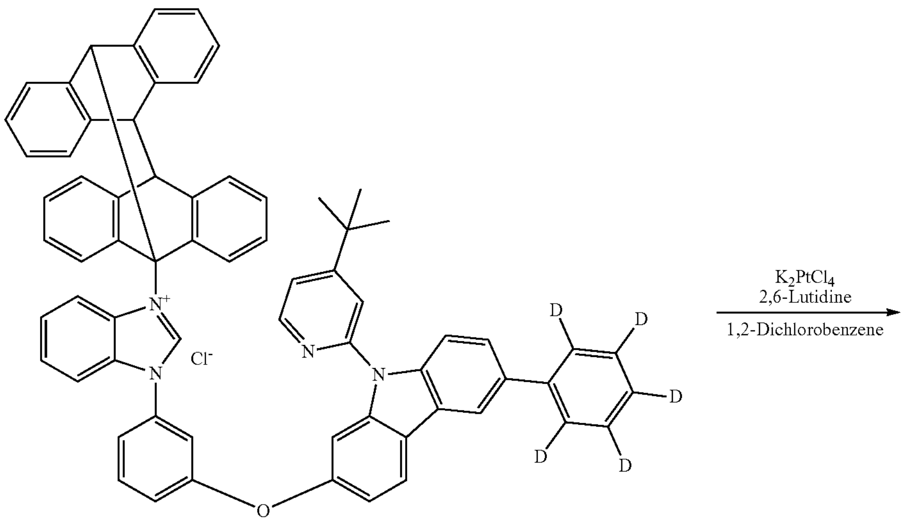
11-h

-continued

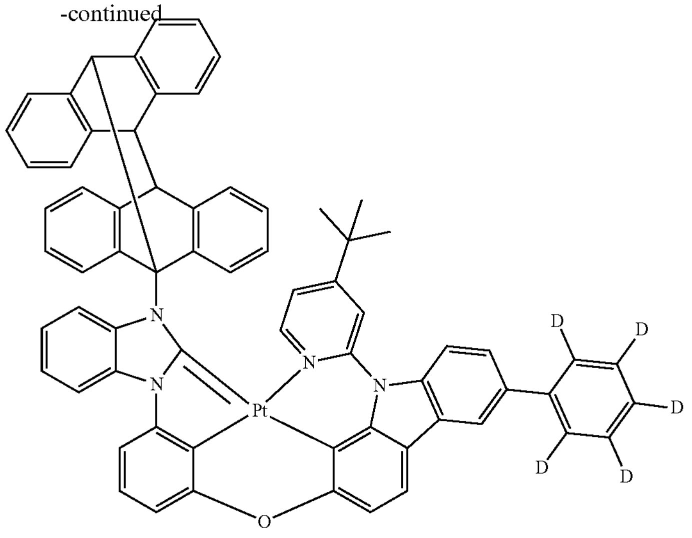

11

(1) Synthesis of Intermediate Compound 11-a 9-bromoanthracene (1.0 eq) and anthracene (10 eq) were dissolved in toluene (0.1 M) and stirred under irradiation by a xenon lamp in the nitrogen condition at 110° C. for 12 hours to obtain a reaction product. The reaction product was cooled to room temperature and subjected to an extraction process three times utilizing ethyl acetate (EA) and water to obtain an organic layer. The obtained organic layer was dried by utilizing magnesium sulfate and concentrated, and column chromatography (a volume ratio of EA hexane as an eluent=1:50) was utilized to synthesize Intermediate Compound 11-a (yield: 81%).

(2) Synthesis of Intermediate Compound 11-b 2-nitroaniline (1.2 eq), Intermediate Compound 11-a (1.0 eq), $Pd_2(dba)_3$ (10 mol %), Sphos (15 mol %), and sodium tert-butoxide (3.0 eq) were dissolved in toluene (0.1 M) and stirred at 110° C. for 15 hours to obtain a reaction product. The reaction product was cooled at room temperature and then subjected to an extraction process three times utilizing dichloromethane and water, to thereby obtain an organic layer. The organic layer thus obtained was dried by utilizing magnesium sulfate and concentrated, and column chromatography (MC:hexane as an eluent=1:4 v/v) was utilized for synthesis of Intermediate Compound 11-b (yield: 77%).

(3) Synthesis of Intermediate Compound 11-c

Intermediate Compound 11-b (1.0 eq), Sn (4.5 eq), and HCl (7.5 eq) were dissolved in ethanol (0.1 M) and then stirred at 80° C. for 12 hours, to obtain a reaction product. The reaction product was cooled at room temperature and then neutralized utilizing a NaOH solution. The neutralized product was subjected to an extraction process by utilizing dichloromethane and water to obtain an organic layer, followed by filtration through celite/silica gel. The filtrate was dried by utilizing magnesium sulfate and concentrated to synthesize Intermediate Compound 11-c (yield: 92%).

(4) Synthesis of Intermediate Compound 11-d 9-(4-(tert-butyl)pyridin-2-yl)-6-chloro-2-methoxy-9H-carbazole (1.0 eq), phenyl-$d_5$-boronic acid (1.2 eq), $Pd(OAc)_2$ (20 mol %), Xphos (10 mol %), and cesium carbonate (3.0 eq) were dissolved in dioxane:$H_2O$ (volume ratio of 3:1, 0.1 M), and then stirred at 100° C. for 12 hours. The reaction mixture was cooled at room temperature, and the solvent was removed under reduced pressure. Then, an extraction process was performed thereon three times by utilizing ethyl acetate and water to obtain an organic layer. The obtained organic layer was dried by utilizing magnesium sulfate and concentrated, and column chromatography (a volume ratio of EA:hexane as an eluent=1:4) was utilized to synthesize Intermediate Compound 11-d (yield: 86%).

(5) Synthesis of Intermediate Compound 11-e

After dissolving Intermediate Compound 11-d (1.0 eq) in MC (0.1 M), 1.0 M of $BBr_3$ solution in MC (2.0 eq) was slowly added thereto at 0° C., followed by stirring for 1 hour. Then, the reaction mixture was further stirred for 2 hours at room temperature. After adding distilled water to the reaction mixture, followed by stirring for 1 hour at room temperature, an extraction process was performed thereon three times by utilizing MC and water to obtain an organic layer. The obtained organic layer was dried by utilizing magnesium sulfate and then subjected to filtration through silica gel, to thereby synthesize Intermediate Compound 11-e (yield: 72%).

(6) Synthesis of Intermediate Compound 11-f 1,3-dibromobenzene (1.5 eq), Intermediate Compound 11-e (1.0 eq), CuI (10 mol %), 2-picolinic acid (20 mol %), and potassium phosphate tribasic (2.0 eq) were dissolved in DMSO (0.1 M) and then stirred at 100° C. for 4 hours. The reaction mixture was cooled at room temperature, and an extraction process was performed thereon three times by utilizing ethyl acetate and water to obtain an organic layer. The obtained organic layer was dried by utilizing magnesium sulfate and concentrated, and column chromatography (a volume ratio of EA:hexane as an eluent=1:20) was utilized to synthesize Intermediate Compound 11-f (yield: 70%).

(7) Synthesis of Intermediate Compound 11-g

Intermediate Compound 11-c (1.2 eq), Intermediate Compound 11-f (1.0 eq), $Pd_2(dba)_3$ (5 mol %), Sphos (7 mol %), and sodium tert-butoxide (2.0 eq) were dissolved in toluene (0.1 M) and then stirred at 110° C. for 2 hours to obtain a reaction product. The reaction product was cooled at room temperature and then subjected to an extraction process three times utilizing dichloromethane and water, to thereby obtain an organic layer. The obtained organic layer was dried by utilizing magnesium sulfate and concentrated, and column chromatography (ethyl acetate:hexane as an eluent=a volume ratio of 1:9) was utilized to synthesize Intermediate Compound 11-g (yield: 83%).

(8) Synthesis of Intermediate Compound 11-h

Intermediate Compound 11-g (1.0 eq) was dissolved in triethyl orthoformate (30 eq), and then 37% HCl (1.5 eq) was added thereto, followed by stirring for 18 hours at 80° C., to thereby obtain a reaction product. The reaction product was cooled at room temperature, and then triethyl orthoformate in the reaction product was concentrated, followed by an extraction process three times by utilizing dichloromethane and water, to thereby obtain an organic layer. The obtained organic layer was dried by utilizing magnesium sulfate and concentrated, and column chromatography (a volume ratio of MC:methanol as an eluent=95:5) was utilized to synthesize Intermediate Compound 11-h (yield: 85%).

(9) Synthesis of Compound 11

Intermediate Compound 11-h (1.0 eq), potassium platinum (II) chloride (1.1 eq), and 2,6-lutidine (4.0 eq) were dissolved in 1,2-dichlorobenzene (0.05 M) and then stirred under the nitrogen condition at 120° C. for 3 days to obtain a reaction product. After the reaction product was cooled at room temperature, 1,2-dichlorobenzene in the reaction product was concentrated and removed, followed by an extraction process three times by utilizing dichloromethane and water, to thereby obtain an organic layer. The obtained organic layer was dried by utilizing magnesium sulfate and concentrated, and column chromatography (a volume ratio of MC:hexane as an eluent=3:7) was utilized to synthesize Compound 11 (yield: 41%).

Synthesis Example 3: Synthesis of Compound 17

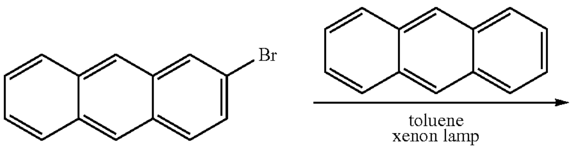

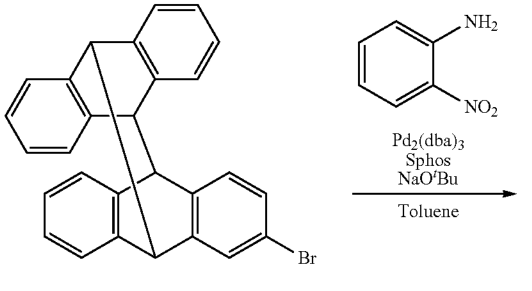

17-a

-continued

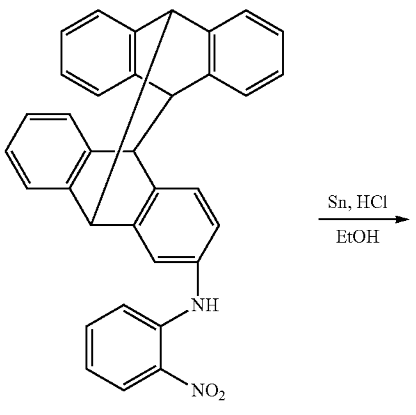

17-b

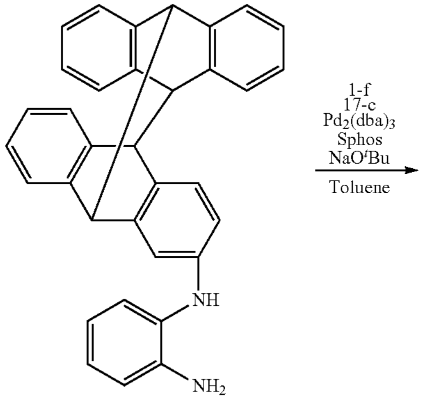

17-c

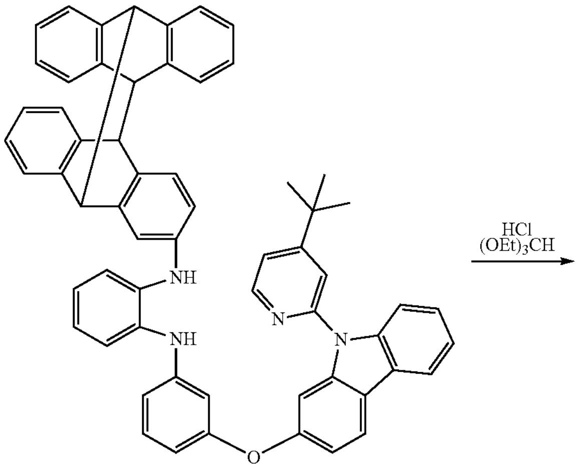

17-d

-continued

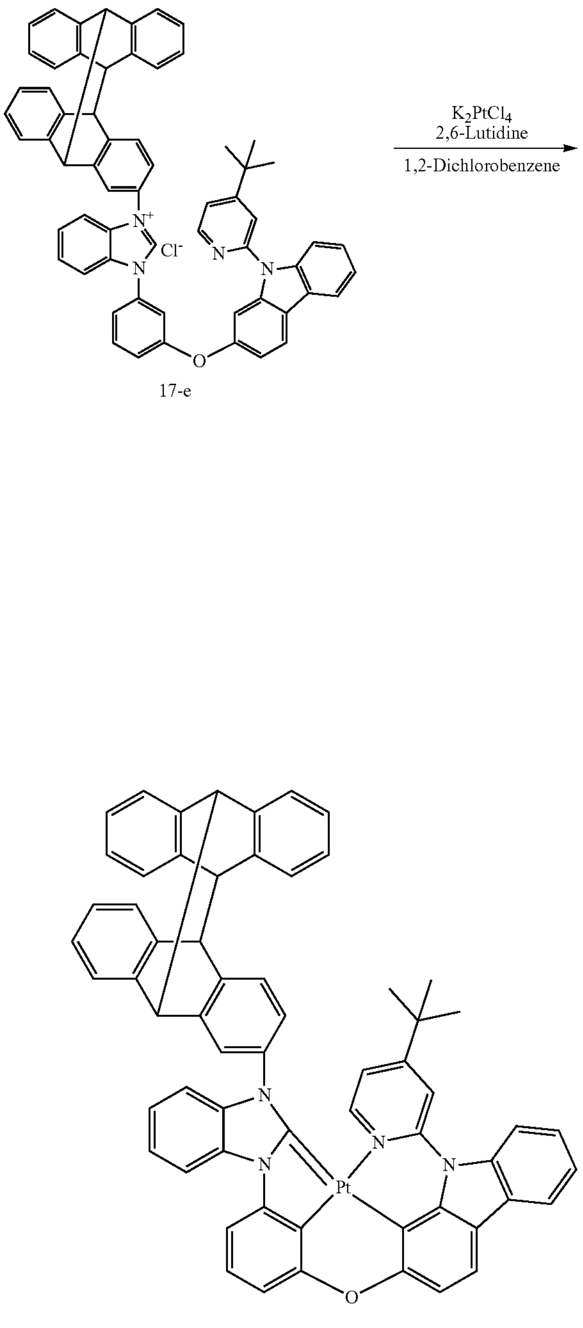

17-e

17

(1) Synthesis of Intermediate Compound 17-a 2-bromoanthracene (1.0 eq) and anthracene (10 eq) were dissolved in toluene (0.1 M) and stirred under irradiation by a xenon lamp in the nitrogen condition at 110° C. for 12 hours to obtain a reaction product. The reaction product was cooled to room temperature and subjected to an extraction process three times utilizing ethyl acetate (EA) and water to obtain an organic layer. The obtained organic layer was dried by utilizing magnesium sulfate and concentrated, and column chromatography (a volume ratio of EA hexane as an eluent=1:50) was utilized to synthesize Intermediate Compound 17-a (yield: 85%).

(2) Synthesis of Intermediate Compound 17-b 2-nitroaniline (1.2 eq), Intermediate Compound 17-a (1.0 eq), $Pd_2(dba)_3$ (10 mol %), Sphos (15 mol %), and sodium tert-butoxide (3.0 eq) were dissolved in toluene (0.1 M) and stirred at 110° C. for 12 hours to obtain a reaction product. The reaction product was cooled at room temperature and then subjected to an extraction process three times utilizing dichloromethane and water, to thereby obtain an organic layer. The organic layer thus obtained was dried by utilizing magnesium sulfate and concentrated, and column chromatography (MC:hexane as an eluent=1:4 v/v) was utilized for synthesis of Intermediate Compound 17-b (yield: 74%).

(3) Synthesis of Intermediate Compound 17-c

Intermediate Compound 17-b (1.0 eq), Sn (4.5 eq), and HCl (7.5 eq) were dissolved in ethanol (0.1 M) and then stirred at 80° C. for 12 hours, to obtain a reaction product. The reaction product was cooled at room temperature and then neutralized utilizing a NaOH solution. The neutralized product was subjected to an extraction process by utilizing dichloromethane and water to obtain an organic layer, followed by filtration through celite/silica gel. The filtrate was dried by utilizing magnesium sulfate and concentrated to synthesize Intermediate Compound 17-c (yield: 91%).

(4) Synthesis of Intermediate Compound 17-d

Intermediate Compound 1-f (1.0 eq), Intermediate Compound 17-c (1.2 eq), $Pd_2(dba)_3$ (5 mol %), Sphos (7 mol %), and sodium tert-butoxide (2.0 eq) were dissolved in toluene (0.1 M) and then stirred at 110° C. for 3 hours to obtain a reaction product. The reaction product was cooled at room temperature and then subjected to an extraction process three times utilizing dichloromethane and water, to thereby obtain an organic layer. The obtained organic layer was dried by utilizing magnesium sulfate and concentrated, and column chromatography (ethyl acetate:hexane as an eluent=a volume ratio of 1:9) was utilized to synthesize Intermediate Compound 17-d (yield: 85%).

(5) Synthesis of Intermediate Compound 17-e

Intermediate Compound 17-d (1.0 eq) was dissolved in triethyl orthoformate (30 eq), and then 37% HCl (1.5 eq) was added thereto, followed by stirring for 18 hours at 80° C., to thereby obtain a reaction product. The reaction product was cooled at room temperature, and then triethyl orthoformate in the reaction product was concentrated, followed by an extraction process three times by utilizing dichloromethane and water, to thereby obtain an organic layer. The obtained organic layer was dried by utilizing magnesium sulfate and concentrated, and column chromatography (a volume ratio of MC:methanol as an eluent=95:5) was utilized to synthesize Intermediate Compound 17-e (yield: 88%).

(6) Synthesis of Compound 17

Intermediate Compound 17-e (1.0 eq), potassium platinum (II) chloride (1.1 eq), and 2,6-lutidine (4.0 eq) were dissolved in 1,2-dichlorobenzene (0.05 M) and then stirred under the nitrogen condition at 120° C. for 3 days to obtain a reaction product. After the reaction product was cooled at room temperature, 1,2-dichlorobenzene in the reaction product was concentrated and removed, followed by an extraction process three times by utilizing dichloromethane and water, to thereby obtain an organic layer. The obtained organic layer was dried by utilizing magnesium sulfate and concentrated, and column chromatography (a volume ratio of MC:hexane as an eluent=3:7) was utilized to synthesize Compound 17 (yield: 47%).

Synthesis Example 4: Synthesis of Compound 40
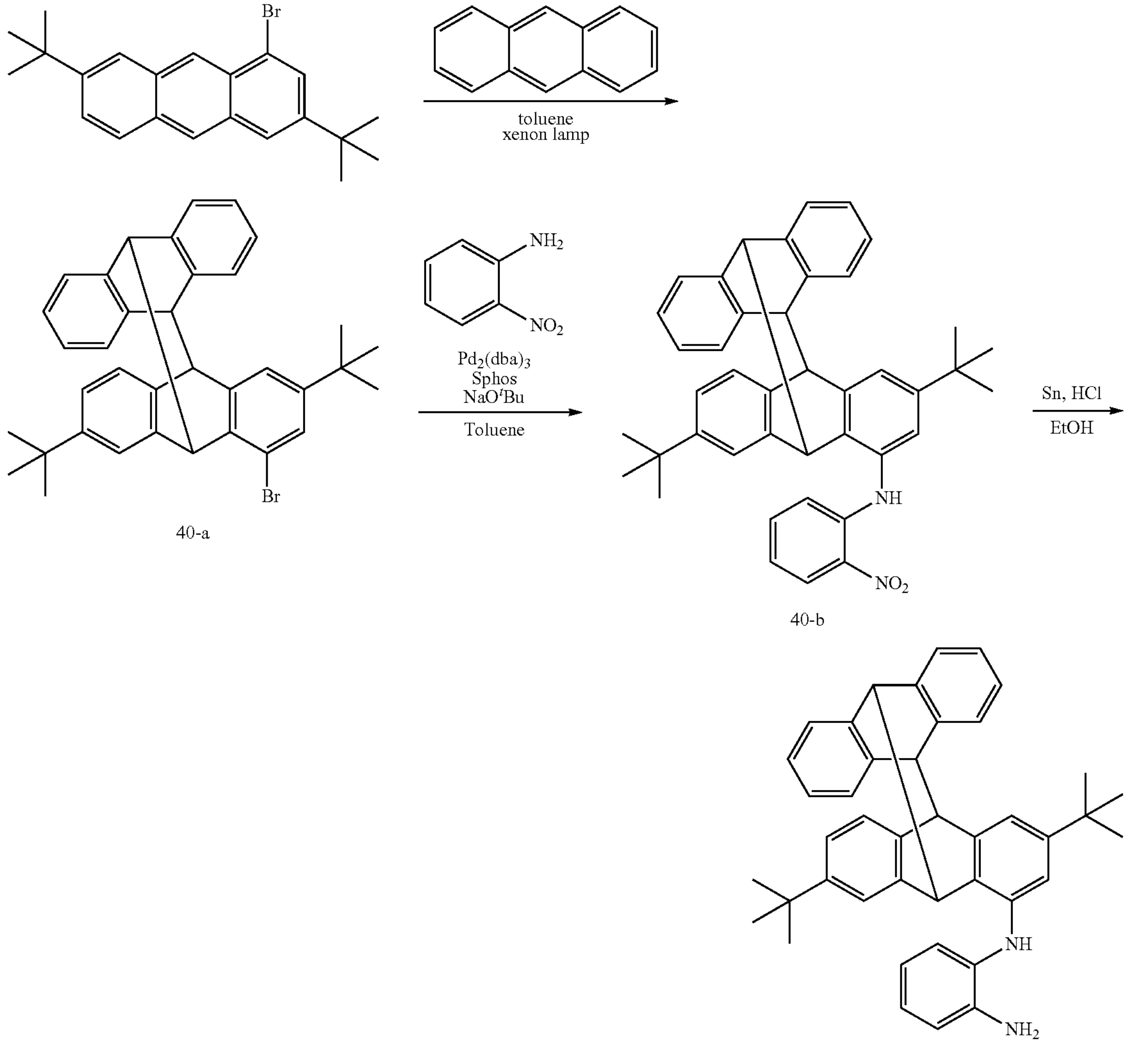
40-a
40-b
40-c
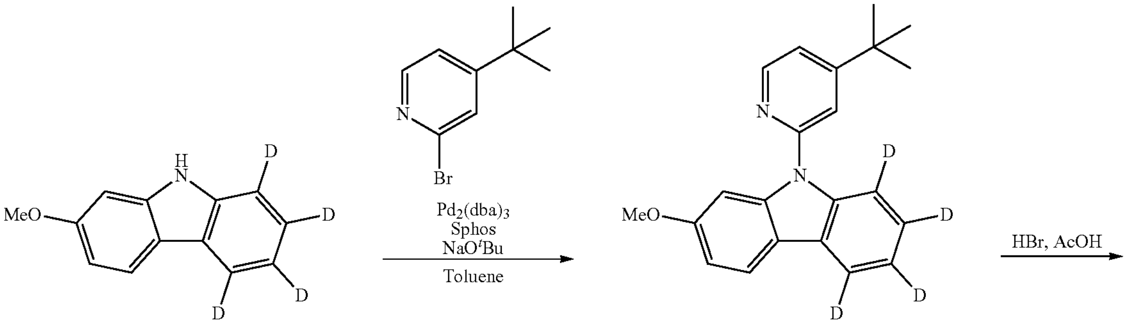
40-d -continued
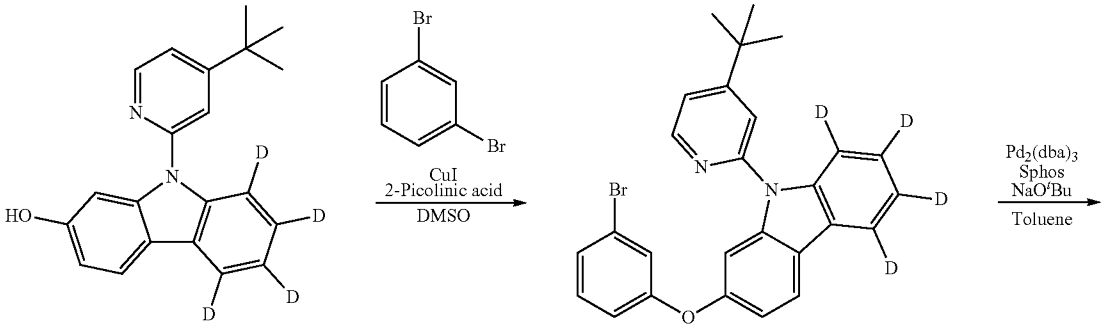
40-e 40-f
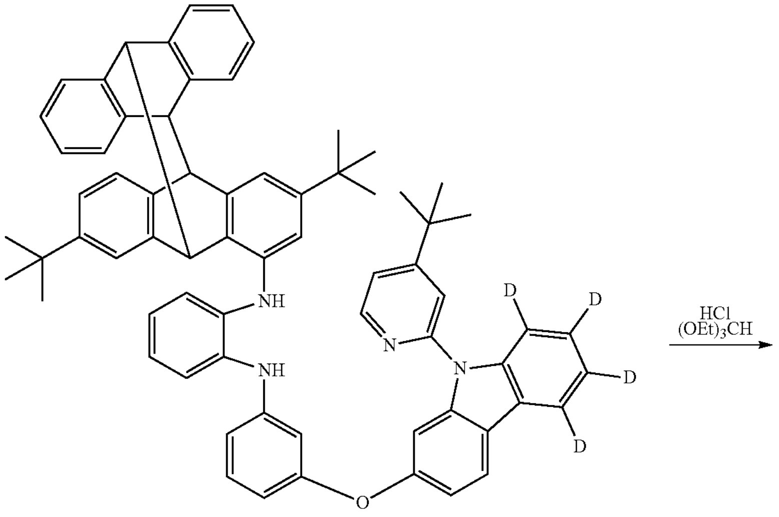
40-g
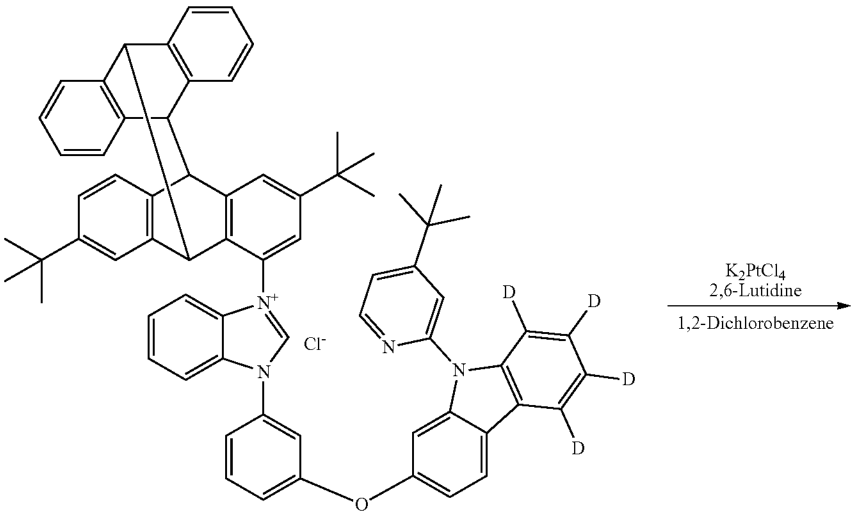
40-h -continued

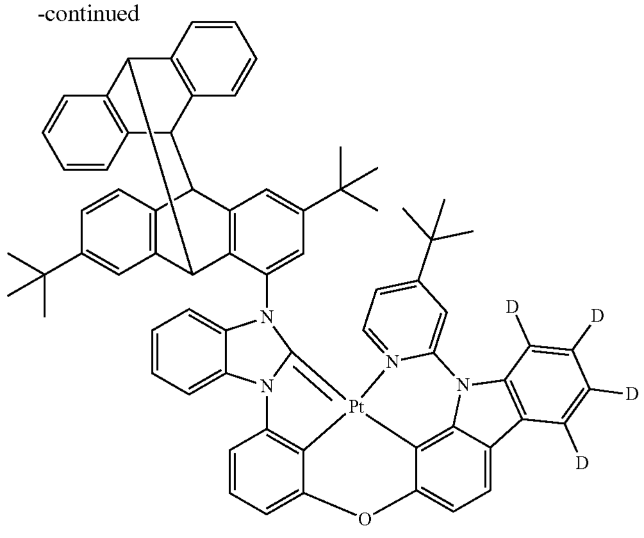

40

(1) Synthesis of Intermediate Compound 40-a 1-bromo-3,7-di-tert-butylanthracene (1.0 eq) and anthracene (10 eq) were dissolved in toluene (0.1 M) and stirred under irradiation by a xenon lamp in the nitrogen condition at 110° C. for 12 hours to obtain a reaction product. The reaction product was cooled to room temperature and subjected to an extraction process three times utilizing ethyl acetate (EA) and water to obtain an organic layer. The obtained organic layer was dried by utilizing magnesium sulfate and concentrated, and column chromatography (a volume ratio of EA:hexane as an eluent=1:50) was utilized to synthesize Intermediate Compound 40-a (yield: 75%).

(2) Synthesis of Intermediate Compound 40-b 2-nitroaniline (1.2 eq), Intermediate Compound 40-a (1.0 eq), $Pd_2(dba)_3$ (10 mol %), Sphos (15 mol %), and sodium tert-butoxide (3.0 eq) were dissolved in toluene (0.1 M) and stirred at 110° C. for 12 hours to obtain a reaction product. The reaction product was cooled at room temperature and then subjected to an extraction process three times utilizing dichloromethane and water, to thereby obtain an organic layer. The organic layer thus obtained was dried by utilizing magnesium sulfate and concentrated, and column chromatography (MC:hexane as an eluent=1:4 v/v) was utilized for synthesis of Intermediate Compound 40-b (yield: 78%).

(3) Synthesis of Intermediate Compound 40-c

Intermediate Compound 40-b (1.0 eq), Sn (4.5 eq), and HCl (7.5 eq) were dissolved in ethanol (0.1 M) and then stirred at 80° C. for 18 hours, to obtain a reaction product. The reaction product was cooled at room temperature and then neutralized utilizing a NaOH solution. The neutralized product was subjected to an extraction process by utilizing dichloromethane and water to obtain an organic layer, followed by filtration through celite/silica gel. The filtrate was dried by utilizing magnesium sulfate and concentrated to synthesize Intermediate Compound 40-c (yield: 93%).

(4) Synthesis of Intermediate Compound 40-d 2-methoxy-9H-carbazole-5,6,7,8-d4 (1.0 eq), 2-bromo-4-(tert-butyl)pyridine (1.1 eq), $Pd_2(dba)_3$ (5 mol %), Sphos (7 mol %), and sodium tert-butoxide (2.0 eq) were dissolved in toluene (0.1 M) and stirred at 110° C. for 12 hours. The reaction mixture was cooled at room temperature, and the solvent was removed under reduced pressure. Then, an extraction process was performed thereon three times by utilizing ethyl acetate and water to obtain an organic layer. The obtained organic layer was dried by utilizing magnesium sulfate and concentrated, and column chromatography (a volume ratio of EA hexane as an eluent=1:10) was utilized to synthesize Intermediate Compound 40-d (yield: 97%).

(5) Synthesis of Intermediate Compound 40-e

Intermediate Compound 40-d (1.0 eq), HBr (0.5 M), and acetic acid (0.5 M) were stirred at 120° C. for 12 hours. The reaction mixture was cooled at room temperature and then neutralized to pH 4 by utilizing a NaOH aqueous solution, followed by an extraction process three times by utilizing ethyl acetate and water, to thereby obtain an organic layer. The obtained organic layer was dried by utilizing magnesium sulfate and then subjected to filtration through silica gel, to thereby synthesize Intermediate Compound 40-e (yield: 70%).

(6) Synthesis of Intermediate Compound 40-f 1,3-dibromobenzene (1.5 eq), Intermediate Compound 40-e (1.0 eq), CuI (10 mol %), 2-picolinic acid (20 mol %), and potassium phosphate tribasic (2.0 eq) were dissolved in DMSO (0.1 M) and then stirred at 100° C. for 4 hours. The reaction mixture was cooled at room temperature, and an extraction process was performed thereon three times by utilizing ethyl acetate and water to obtain an organic layer. The obtained organic layer was dried by utilizing magnesium sulfate and concentrated, and column chromatography (a volume ratio of EA:hexane as an eluent=1:20) was utilized to synthesize Intermediate Compound 40-f (yield: 78%).

(7) Synthesis of Intermediate Compound 40-g

Intermediate Compound 40-c (1.2 eq), Intermediate Compound 40-f (1.0 eq), $Pd_2(dba)_3$ (5 mol %), Sphos (7 mol %), and sodium tert-butoxide (2.0 eq) were dissolved in toluene (0.1 M) and then stirred at 110° C. for 2 hours to obtain a reaction product. The reaction product was cooled at room temperature and then subjected to an extraction process three times utilizing dichloromethane and water, to thereby obtain an organic layer. The obtained organic layer was dried by utilizing magnesium sulfate and concentrated, and column chromatography (ethyl acetate:hexane as an eluent=a volume ratio of 1:9) was utilized to synthesize Intermediate Compound 40-g (yield: 84%).

(8) Synthesis of Intermediate Compound 40-h

Intermediate Compound 40-g (1.0 eq) was dissolved in triethyl orthoformate (30 eq), and then 37% HCl (1.5 eq) was added thereto, followed by stirring for 12 hours at 80° C., to thereby obtain a reaction product. The reaction product was cooled at room temperature, and then triethyl orthoformate in the reaction product was concentrated, followed by an extraction process three times by utilizing dichloromethane and water, to thereby obtain an organic layer. The obtained organic layer was dried by utilizing magnesium sulfate and concentrated, and column chromatography (a volume ratio of MC:methanol as an eluent=95:5) was utilized to synthesize Intermediate Compound 40-h (yield: 85%).

(9) Synthesis of Compound 40

Intermediate Compound 40-h (1.0 eq), potassium platinum (II) chloride (1.1 eq), and 2,6-lutidine (4.0 eq) were dissolved in 1,2-dichlorobenzene (0.05 M) and then stirred under the nitrogen condition at 120° C. for 3 days to obtain a reaction product. After the reaction product was cooled at room temperature, 1,2-dichlorobenzene in the reaction product was concentrated and removed, followed by an extraction process three times by utilizing dichloromethane and water, to thereby obtain an organic layer. The obtained organic layer was dried by utilizing magnesium sulfate and concentrated, and column chromatography (a volume ratio of MC:hexane as an eluent=3:7) was utilized to synthesize Compound 40 (yield: 45%).

Synthesis Example 5: Synthesis of Compound 44

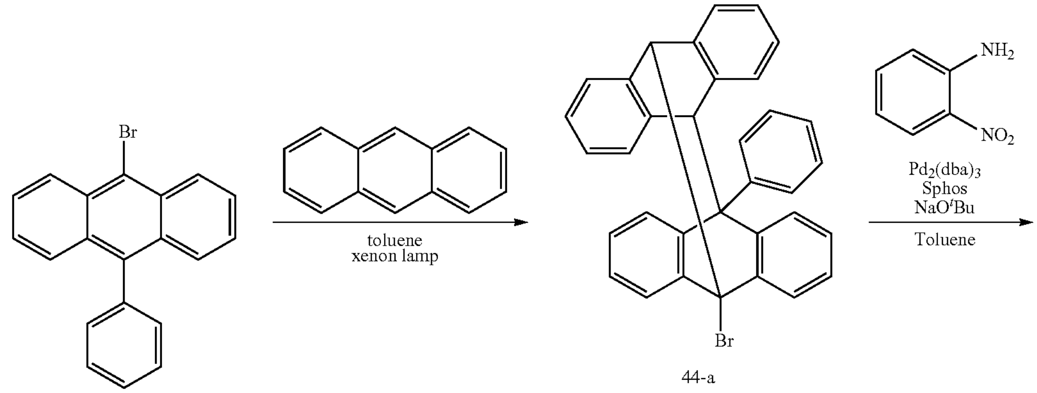

44-a

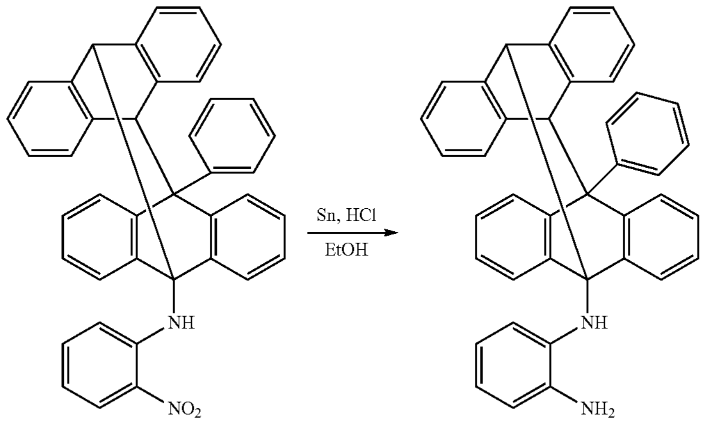

44-b 44-c

-continued
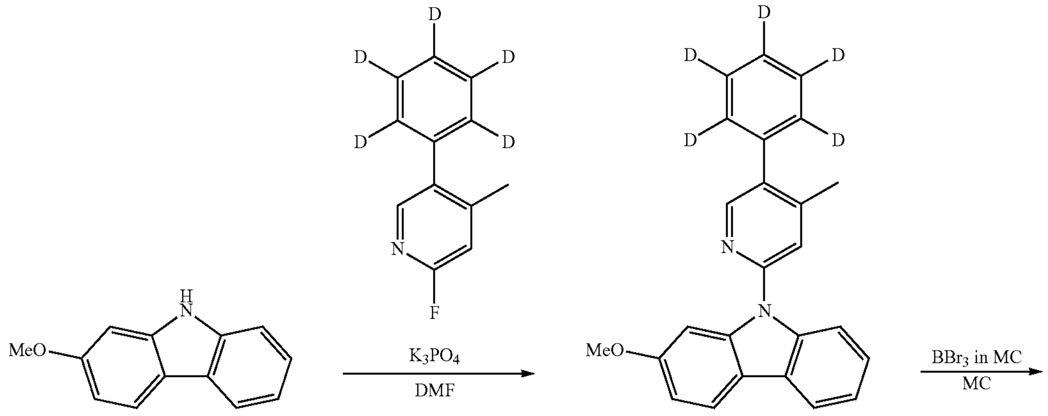
44-d
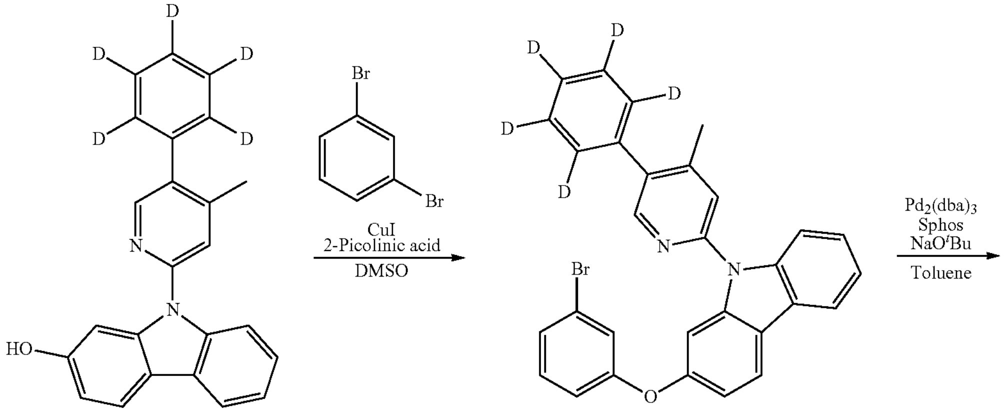
44-e
44-f
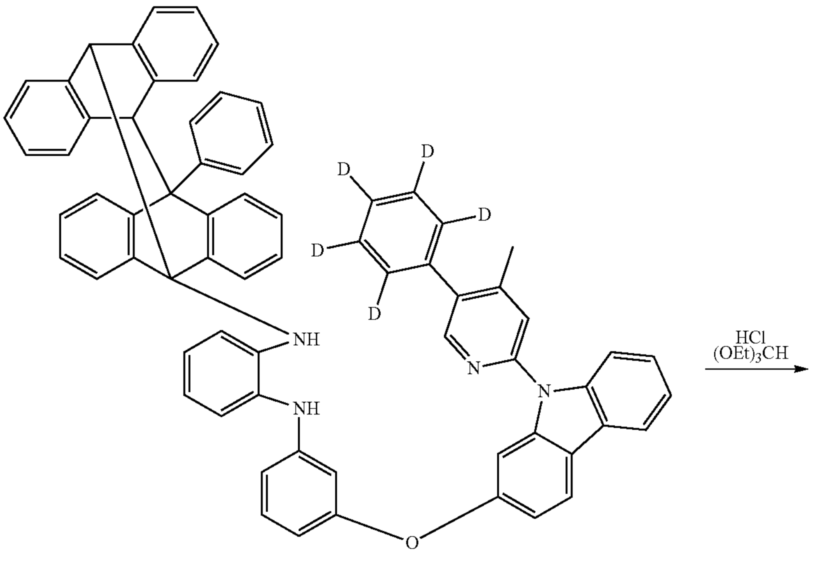
44-g

-continued

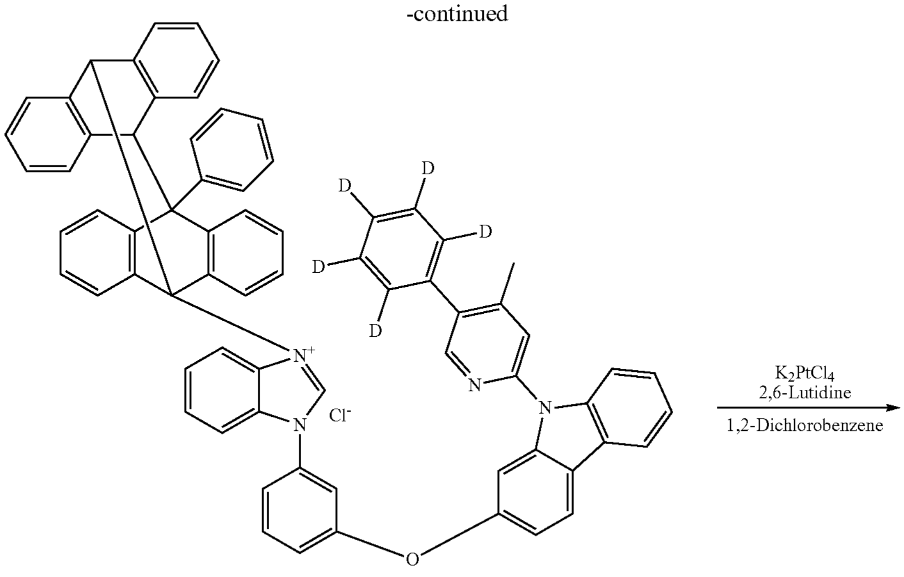

44-h

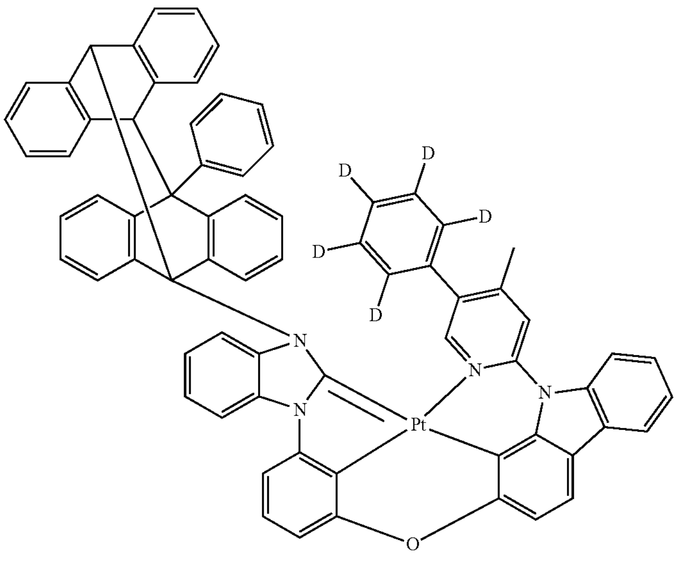

44

(1) Synthesis of Intermediate Compound 44-a 9-bromo-10-phenylanthracene (1.0 eq) and anthracene (10 eq) were dissolved in toluene (0.1 M) and stirred under irradiation by a xenon lamp in the nitrogen condition at 110° C. for 12 hours to obtain a reaction product. The reaction product was cooled to room temperature and subjected to an extraction process three times utilizing ethyl acetate (EA) and water to obtain an organic layer. The obtained organic layer was dried by utilizing magnesium sulfate and concentrated, and column chromatography (a volume ratio of EA:hexane as an eluent=1:30) was utilized to synthesize Intermediate Compound 44-a (yield: 70%).

(2) Synthesis of Intermediate Compound 44-b 2-nitroaniline (1.2 eq), Intermediate Compound 44-a (1.0 eq), $Pd_2(dba)_3$ (10 mol %), Sphos (15 mol %), and sodium tert-butoxide (3.0 eq) were dissolved in toluene (0.1 M) and stirred at 110° C. for 12 hours to obtain a reaction product. The reaction product was cooled at room temperature and then subjected to an extraction process three times utilizing dichloromethane and water, to thereby obtain an organic layer. The organic layer thus obtained was dried by utilizing magnesium sulfate and concentrated, and column chromatography (MC:hexane as an eluent=1:4 v/v) was utilized for synthesis of Intermediate Compound 44-b (yield: 74%).

(3) Synthesis of Intermediate Compound 44-c

Intermediate Compound 44-b (1.0 eq), Sn (4.5 eq), and HCl (7.5 eq) were dissolved in ethanol (0.1 M) and then stirred at 80° C. for 12 hours, to obtain a reaction product. The reaction product was cooled at room temperature and then neutralized utilizing a NaOH solution. The neutralized product was subjected to an extraction process by utilizing dichloromethane and water to obtain an organic layer, followed by filtration through celite/silica gel. The filtrate was dried by utilizing magnesium sulfate and concentrated to synthesize Intermediate Compound 44-c (yield: 93%).

(4) Synthesis of Intermediate Compound 44-d 2-methoxy-9H-carbazole (1.0 eq), 2-fluoro-4-methyl-5-(phenyl-d5)pyridine (1.1 eq), and potassium phosphate tribasic (2.0 eq) were dissolved in DMF (0.1 M) and stirred at 160° C. for 12 hours. The reaction mixture was cooled at room temperature, and the solvent was removed under reduced pressure. Then, an extraction process was performed thereon three times by utilizing dichloromethane and water to obtain an organic layer. The organic layer thus obtained was dried by utilizing magnesium sulfate and concentrated, and column chromatography (MC:hexane as an eluent=1:4 v/v) was utilized for synthesis of Intermediate Compound 44-d (yield: 79%).

(5) Synthesis of Intermediate Compound 44-e

After dissolving Intermediate Compound 44-d (1.0 eq) in MC (0.1 M), 1.0 M of $BBr_3$ solution in MC (2.0 eq) was slowly added thereto at 0° C., followed by stirring for 1 hour. Then, the reaction mixture was further stirred for 2 hours at room temperature. After adding distilled water to the reaction mixture, followed by stirring for 1 hour at room temperature, an extraction process was performed thereon three times by utilizing MC and water to obtain an organic layer. The obtained organic layer was dried by utilizing magnesium sulfate and then subjected to filtration through silica gel, to thereby synthesize Intermediate Compound 44-e (yield: 77%).

(6) Synthesis of Intermediate Compound 44-f 1,3-dibromobenzene (1.5 eq), Intermediate Compound 44-e (1.0 eq), CuI (10 mol %), 2-picolinic acid (20 mol %), and potassium phosphate tribasic (2.0 eq) were dissolved in DMSO (0.1 M) and then stirred at 100° C. for 4 hours. The reaction mixture was cooled at room temperature, and an extraction process was performed thereon three times by utilizing dichloromethane and water to obtain an organic layer. The obtained organic layer was dried by utilizing magnesium sulfate and concentrated, and column chromatography (a volume ratio of MC:hexane as an eluent=1:10) was utilized to synthesize Intermediate Compound 44-f (yield: 70%).

(7) Synthesis of Intermediate Compound 44-g

Intermediate Compound 44-c (1.2 eq), Intermediate Compound 44-f (1.0 eq), $Pd_2(dba)_3$ (5 mol %), Xphos (10 mol %), and sodium tert-butoxide (2.5 eq) were dissolved in dioxane (0.1M) and stirred at 110° C. for 1.5 hours. The reaction product was cooled at room temperature and then subjected to an extraction process three times utilizing dichloromethane and water, to thereby obtain an organic layer. The organic layer thus obtained was dried by utilizing magnesium sulfate and concentrated, and column chromatography (MC:hexane as an eluent=1:4 v/v) was utilized for synthesis of Intermediate Compound 44-g (yield: 90%).

(8) Synthesis of Intermediate Compound 44-h

Intermediate Compound 44-g (1.0 eq) was dissolved in triethyl orthoformate (30 eq), and then 37% HCl (1.5 eq) was added thereto, followed by stirring for 12 hours at 80° C., to thereby obtain a reaction product. The reaction product was cooled at room temperature, and then triethyl orthoformate in the reaction product was concentrated, followed by an extraction process three times by utilizing dichloromethane and water, to thereby obtain an organic layer. The obtained organic layer was dried by utilizing magnesium sulfate and concentrated, and column chromatography (a volume ratio of MC:methanol as an eluent=95:5) was utilized to synthesize Intermediate Compound 44-h (yield: 89%).

(9) Synthesis of Compound 44

Intermediate Compound 44-h (1.0 eq), potassium platinum (II) chloride (1.1 eq), and 2,6-lutidine (4.0 eq) were dissolved in 1,2-dichlorobenzene (0.05 M) and then stirred under the nitrogen condition at 120° C. for 3 days to obtain a reaction product. After the reaction product was cooled at room temperature, 1,2-dichlorobenzene in the reaction product was concentrated and removed, followed by an extraction process three times by utilizing dichloromethane and water, to thereby obtain an organic layer. The obtained organic layer was dried by utilizing magnesium sulfate and concentrated, and column chromatography (a volume ratio of MC:hexane as an eluent=3:7) was utilized to synthesize Compound 44 (yield: 42%).

Synthesis Example 6: Synthesis of Compound 57

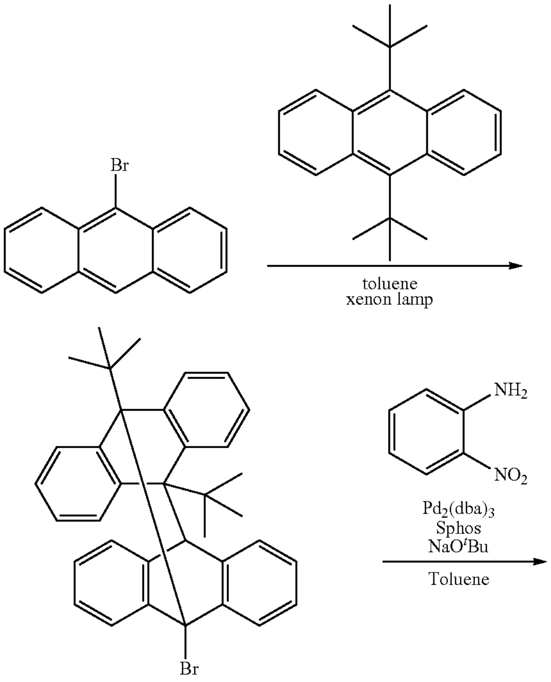

57-a

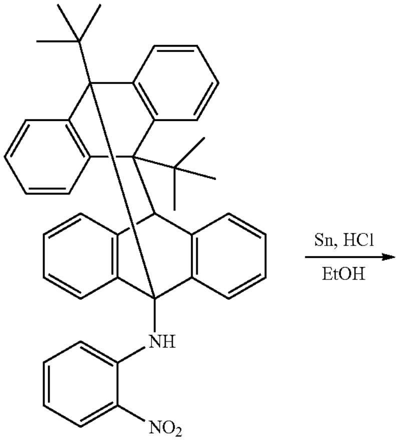

57-b

-continued

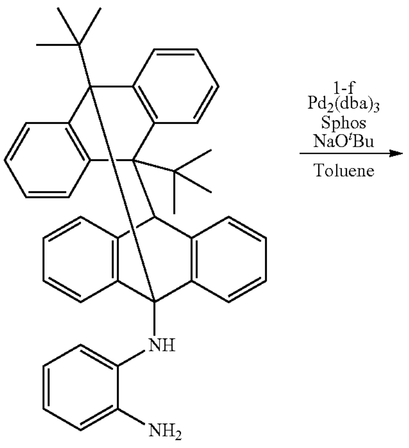

57-c

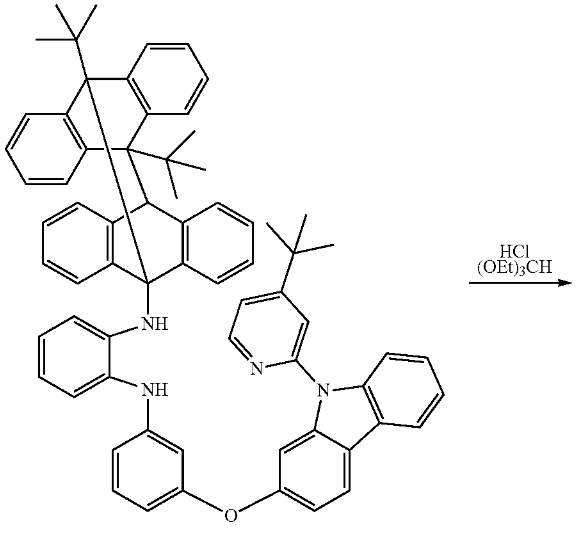

57-d

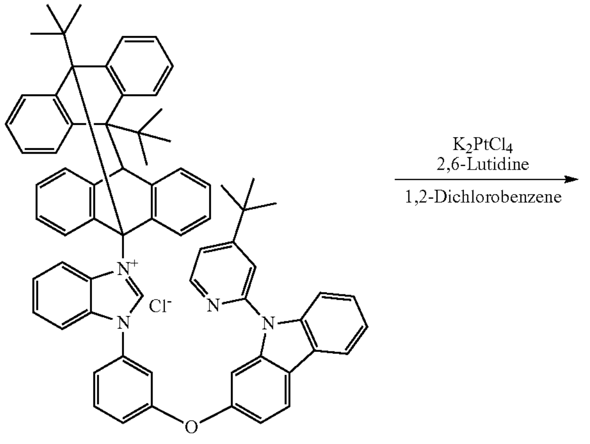

57-e

-continued

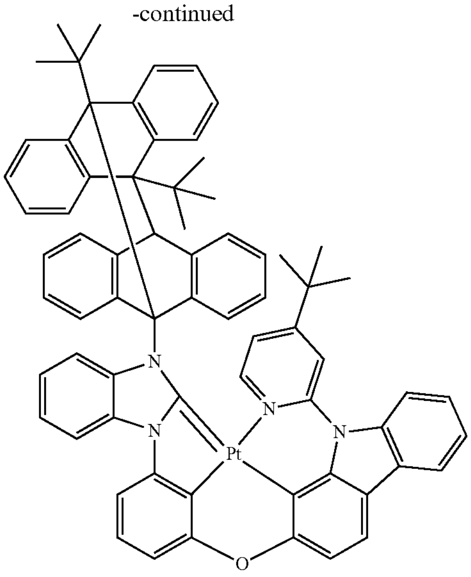

57

(1) Synthesis of Intermediate Compound 57-a 9-bromoanthracene (1.0 eq) and 9,10-di-tert-butylanthracene (10 eq) were dissolved in toluene (0.1 M) and stirred under irradiation by a xenon lamp in the nitrogen condition at 110° C. for 12 hours. The reaction product was cooled to room temperature and subjected to an extraction process three times utilizing ethyl acetate (EA) and water to obtain an organic layer. The obtained organic layer was dried by utilizing magnesium sulfate and concentrated, and column chromatography (a volume ratio of EA:hexane as an eluent=1:20) was utilized to synthesize Intermediate Compound 57-a (yield: 80%).

(2) Synthesis of Intermediate Compound 57-b 2-nitroaniline (1.2 eq), Intermediate Compound 57-a (1.0 eq), $Pd_2(dba)_3$ (10 mol %), Sphos (15 mol %), and sodium tert-butoxide (3.0 eq) were dissolved in toluene (0.1 M) and stirred at 110° C. for 18 hours to obtain a reaction product. The reaction product was cooled at room temperature and then subjected to an extraction process three times utilizing dichloromethane and water, to thereby obtain an organic layer. The organic layer thus obtained was dried by utilizing magnesium sulfate and concentrated, and column chromatography (MC:hexane as an eluent=1:4 v/v) was utilized for synthesis of Intermediate Compound 57-b (yield: 65%).

(3) Synthesis of Intermediate Compound 57-c

Intermediate Compound 57-b (1.0 eq), Sn (4.5 eq), and HCl (7.5 eq) were dissolved in ethanol (0.1 M) and then stirred at 80° C. for 12 hours, to obtain a reaction product. The reaction product was cooled at room temperature and then neutralized utilizing a NaOH solution. The neutralized product was subjected to an extraction process by utilizing dichloromethane and water to obtain an organic layer, followed by filtration through celite/silica gel. The filtrate was dried by utilizing magnesium sulfate and concentrated to synthesize Intermediate Compound 57-c (yield: 91%).

(4) Synthesis of Intermediate Compound 57-d

Intermediate Compound 1-f (1.0 eq), Intermediate Compound 57-c (1.2 eq), $Pd_2(dba)_3$ (5 mol %), Sphos (7 mol %), and sodium tert-butoxide (2.0 eq) were dissolved in toluene (0.1M) and then stirred at 110° C. for 3 hours to obtain a reaction product. The reaction product was cooled at room temperature and then subjected to an extraction process three times utilizing dichloromethane and water, to thereby obtain an organic layer. The obtained organic layer was dried by utilizing magnesium sulfate and concentrated, and column chromatography (ethyl acetate:hexane as an eluent=a volume ratio of 1:9) was utilized to synthesize Intermediate Compound 57-d (yield: 87%).

(5) Synthesis of Intermediate Compound 57-e

Intermediate Compound 57-d (1.0 eq) was dissolved in triethyl orthoformate (30 eq), and then 37% HCl (1.5 eq) was added thereto, followed by stirring for 18 hours at 80° C., to thereby obtain a reaction product. The reaction product was cooled at room temperature, and then triethyl orthoformate in the reaction product was concentrated, followed by an extraction process three times by utilizing dichloromethane and water, to thereby obtain an organic layer. The obtained organic layer was dried by utilizing magnesium sulfate and concentrated, and column chromatography (a volume ratio of MC:methanol as an eluent=95:5) was utilized to synthesize Intermediate Compound 57-e (yield: 88%).

(6) Synthesis of Compound 57

Intermediate Compound 57-e (1.0 eq), potassium platinum (II) chloride (1.1 eq), and 2,6-lutidine (4.0 eq) were dissolved in 1,2-dichlorobenzene (0.05 M) and then stirred under the nitrogen condition at 120° C. for 3 days to obtain a reaction product. After the reaction product was cooled at room temperature, 1,2-dichlorobenzene in the reaction product was concentrated and removed, followed by an extraction process three times by utilizing dichloromethane and water, to thereby obtain an organic layer. The obtained organic layer was dried by utilizing magnesium sulfate and concentrated, and column chromatography (a volume ratio of MC:hexane as an eluent=3:7) was utilized to synthesize Compound 57 (yield: 40%).

Synthesis Example 7: Synthesis of Compound 72

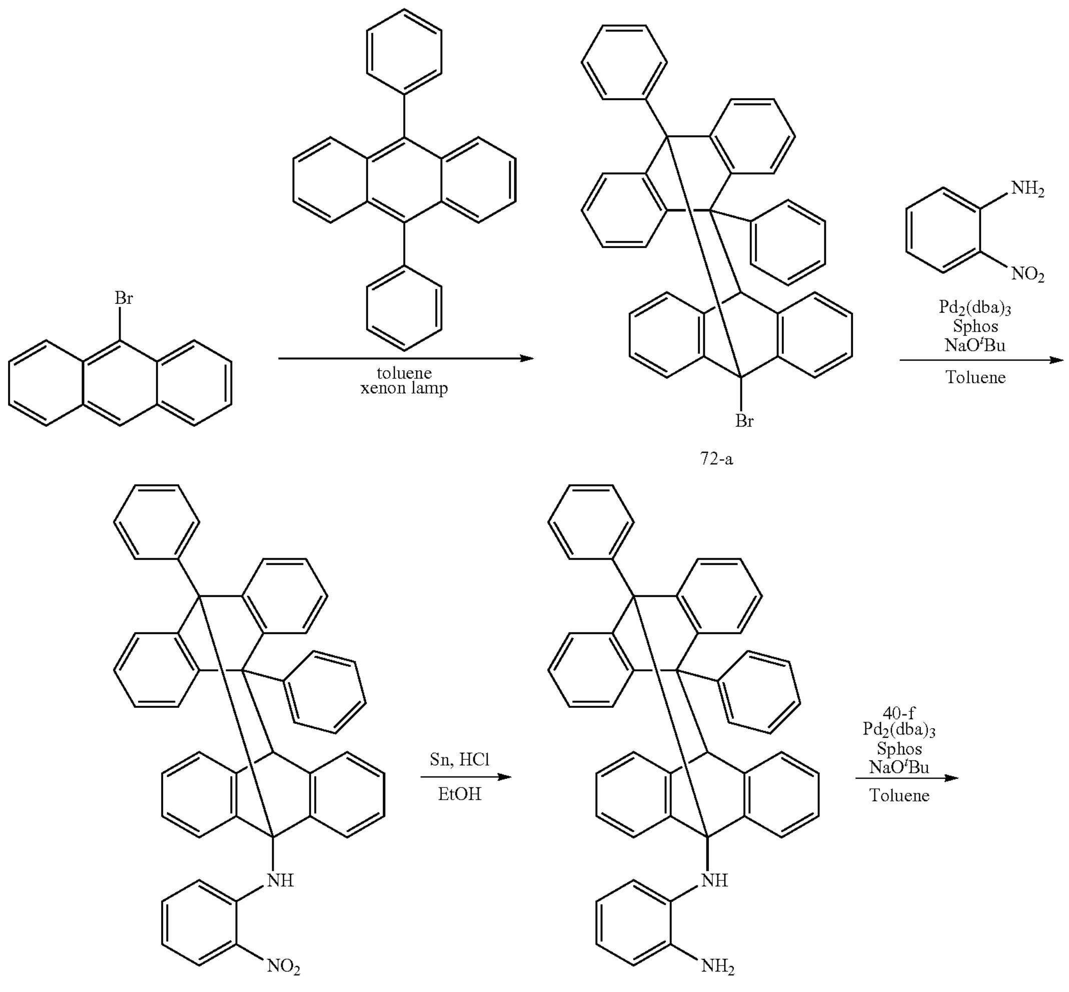

72-a 72-b 72-c

-continued
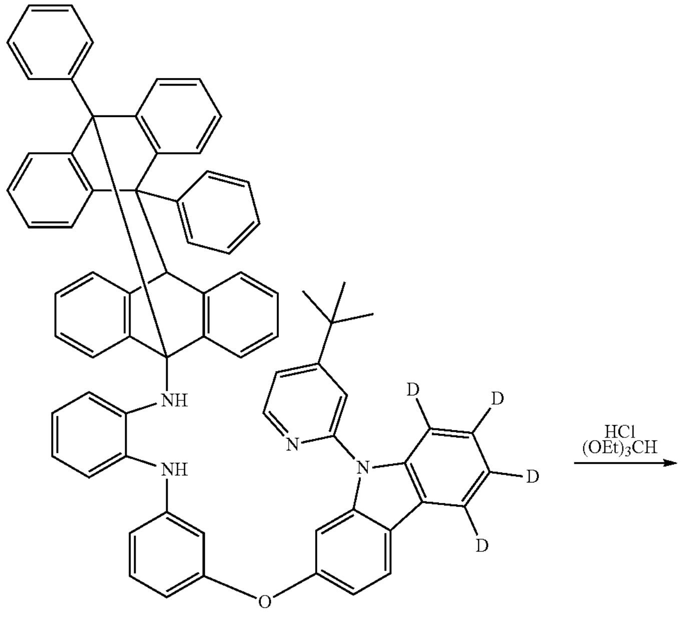
72-d
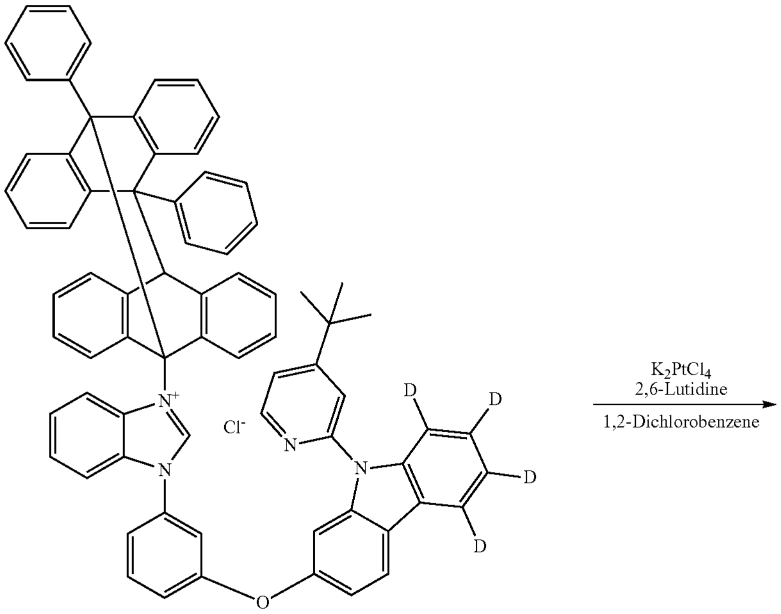
72-e

-continued

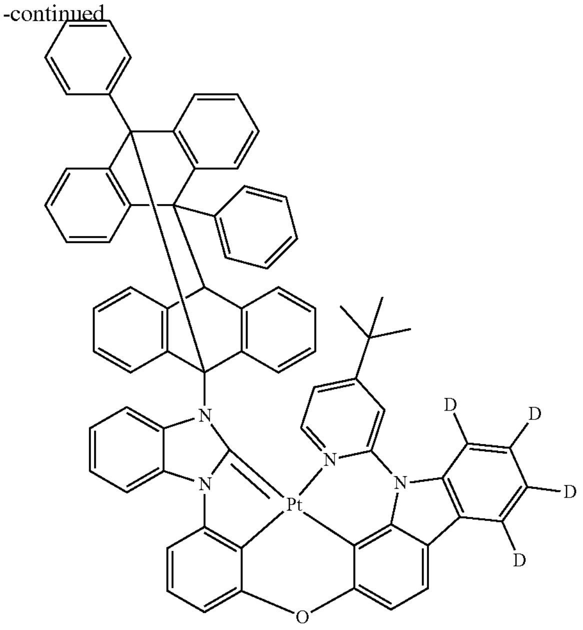

72

(1) Synthesis of Intermediate Compound 72-a 9-bromoanthracene (1.0 eq) and 9,10-diphenylanthracene (10 eq) were dissolved in toluene (0.1 M) and stirred under irradiation by a xenon lamp in the nitrogen condition at 110° C. for 12 hours. The reaction product was cooled to room temperature and subjected to an extraction process three times utilizing ethyl acetate (EA) and water to obtain an organic layer. The obtained organic layer was dried by utilizing magnesium sulfate and concentrated, and column chromatography (a volume ratio of EA:hexane as an eluent=1:20) was utilized to synthesize Intermediate Compound 72-a (yield: 85%).

(2) Synthesis of Intermediate Compound 72-b 2-nitroaniline (1.2 eq), Intermediate Compound 72-a (1.0 eq), $Pd_2(dba)_3$ (10 mol %), Sphos (15 mol %), and sodium tert-butoxide (3.0 eq) were dissolved in toluene (0.1 M) and stirred at 110° C. for 18 hours to obtain a reaction product. The reaction product was cooled at room temperature and then subjected to an extraction process three times utilizing dichloromethane and water, to thereby obtain an organic layer. The organic layer thus obtained was dried by utilizing magnesium sulfate and concentrated, and column chromatography (MC:hexane as an eluent=1:4 v/v) was utilized for synthesis of Intermediate Compound 72-b (yield: 70%).

(3) Synthesis of Intermediate Compound 72-c

Intermediate Compound 72-b (1.0 eq), Sn (4.5 eq), and HCl (7.5 eq) were dissolved in ethanol (0.1 M) and then stirred at 80° C. for 12 hours, to obtain a reaction product. The reaction product was cooled at room temperature and then neutralized utilizing a NaOH solution. The neutralized product was subjected to an extraction process by utilizing dichloromethane and water to obtain an organic layer, followed by filtration through celite/silica gel. The filtrate was dried by utilizing magnesium sulfate and concentrated to synthesize Intermediate Compound 72-c (yield: 93%).

(4) Synthesis of Intermediate Compound 72-d

Intermediate Compound 40-f (1.0 eq), Intermediate Compound 72-c (1.2 eq), $Pd_2(dba)_3$ (5 mol %), Xphos (10 mol %), and sodium tert-butoxide (2.5 eq) were dissolved in dioxane (0.1 M) and stirred at 110° C. for 2 hours to obtain a reaction product. The reaction product was cooled at room temperature and then subjected to an extraction process three times utilizing dichloromethane and water, to thereby obtain an organic layer. The obtained organic layer was dried by utilizing magnesium sulfate and concentrated, and column chromatography (ethyl acetate:hexane as an eluent=a volume ratio of 1:10) was utilized to synthesize Intermediate Compound 72-d (yield: 81%).

(5) Synthesis of Intermediate Compound 72-e

Intermediate Compound 72-d (1.0 eq) was dissolved in triethyl orthoformate (30 eq), and then 37% HCl (1.5 eq) was added thereto, followed by stirring for 18 hours at 80° C., to thereby obtain a reaction product. The reaction product was cooled at room temperature, and then triethyl orthoformate in the reaction product was concentrated, followed by an extraction process three times by utilizing dichloromethane and water, to thereby obtain an organic layer. The obtained organic layer was dried by utilizing magnesium sulfate and concentrated, and column chromatography (a volume ratio of MC:methanol as an eluent=95:5) was utilized to synthesize Intermediate Compound 72-e (yield: 88%).

(6) Synthesis of Compound 72

Intermediate Compound 72-e (1.0 eq), potassium platinum (II) chloride (1.1 eq), and 2,6-lutidine (4.0 eq) were dissolved in 1,2-dichlorobenzene (0.05 M) and then stirred under the nitrogen condition at 120° C. for 3 days to obtain a reaction product. After the reaction product was cooled at room temperature, 1,2-dichlorobenzene in the reaction product was concentrated and removed, followed by an extraction process three times by utilizing dichloromethane and water, to thereby obtain an organic layer. The obtained organic layer was dried by utilizing magnesium sulfate and concentrated, and column chromatography (a volume ratio of MC:hexane as an eluent=3:7) was utilized to synthesize Compound 72 (yield: 41%).

Measurement results of $^1H$ NMR and HR-MS (High-Resolution Mass) of the compounds synthesized in Synthesis Examples 1 to 7 are shown in Table 1. Synthesis methods of compounds other than the compounds of Synthesis Examples 1 to 7 may be easily recognized by those skilled in the art by referring to the synthesis paths and source materials.

TABLE 1

| Compound No. | $^1H$-NMR ($CDCl_3$, 500 MHz) | MS/FAB calc. | MS/FAB Found[M + 1] |
|---|---|---|---|
| 1 | 8.74 (1H, dd), 8.55(1H, s), 8.08 (1H, d), 7.94 (1H, s), 7.41 (1H, s), 7.40 (1H, dd), 7.35 (1H, s), 7.31 (6H, m), 7.19 (6H, m), 7.17 (1H, s), 7.16 (3H, m), 7.14 (2H, d), 6.97 (2H, dd), 6.95 (2H, d), 6.90 (1H, s), 6.66 (1H, s), 4.67 (4H, s), 3.80 (1H, s), 1.32 (9H, s) | 1055.32 | 1055.31 |
| 11 | 8.74 (1H, dd), 8.30 (1H, s), 8.13 (1H, s), 8.08 (1H, s), 7.89 (1H, s), 7.41 (1H, s), 7.40 (1H, s), 7.31 (8H, m), 7.19 (8H, m), 7.17 (1H, s), 7.16 (1H, s), 7.00-6.90 (3H, m), 6.66 (1H, s), 6.63 (1H, s), 6.53 (1H, d), 4.67 (1H, s), 4.62 (1H, s), 3.81 (1H, s), 1.33 (9H, s | 1136.38 | 1136.35 |
| 17 | 8.73 (1H, dd), 8.53 (1H, s), 8.08 (1H, s), 7.94 (1H, s), 7.41 (1H, dd), 7.40 (1H, s), 7.35 (1H, s), 7.31 (6H, m), 7.27 (1H, d), 7.19 (6H, m), 7.17 (1H, s), 7.16 (2H, dd), 7.14 (2H, dd), 7.09 (1H, s), 6.97 (1H, s), 6.95 (2H, m), 6.90 (1H, s), 6.66 (1H, t), 4.67 (3H, s), 3.79 (1H, s), 1.32 (9H, s) | 1055.32 | 1055.33 |
| 40 | 8.74 (1H, dd), 8.39 (1H, s), 7.41 (1H, dd), 7.40 (1H, s), 7.34 (1H, s), 7.31 (4H, m), 7.23-7.19 (6H, m), 7.17 (1H, s), 7.14 (2H, d), 7.00 (2H, dd), 6.95 (2H, m), 6.90 (1H, s), 6.69 (1H, s), 6.66 (1H, s), 4.67 (4H, s), 3.82 (1H, s), 1.41 (9H, s), 1.32 (9H, s), 1.28 (9H, s) | 1171.47 | 1171.44 |
| 44 | 9.09 (1H, s), 8.55 (1H, dd), 8.08 (1H, dd), 7.94 (1H, d), 7.59 (1H, s), 7.35 (1H, s), 7.31 (8H, m), 7.29-7.22 (3H, m), 7.19-7.17 (11H, m), 7.16 (2H, m), 7.00 (1H, d), 6.90 (2H, dd), 6.66 (1H, dd), 6.63 (1H, d), 6.53 (1H, dd), 5.05 (1H, s), 4.62 (1H, s), 3.80 (1H, s), 2.68 (3H, s) | 1170.36 | 1170.35 |
| 57 | 8.75 (1H, dd), 8.55 (1H, dd), 8.08 (1H, d), 7.94 (1H, d), 7.41-7.40 (2H, m), 7.35-7.19 (17H, m), 7.17 (1H, dd), 7.16 (1H, d), 7.00 (1H, s), 6.90 (2H, dd), 6.66 (1H, t), 6.63 (1H, t), 6.53 (1H, t), 4.57 (1H, s), 3.78 (1H, s), 1.32 (9H, s), 0.89 (18H, s) | 1167.44 | 1167.42 |
| 72 | 8.74 (1H, dd), 8.39 (1H, d), 7.41 (1H, m), 7.40 (1H, m), 7.31-7.22 (13H, m), 7.19-7.17 (13H, m), 7.00 (1H, dd), 6.90 (1H, s), 6.69-6.63 (3H, m), 6.53 (1H, d), 5.05 (1H, s), 3.80 (1H, s), 1.32 (9H, s) | 1211.40 | 1211.45 |

Evaluation Example 1

A HOMO energy level (eV), a LUMO energy level (eV), a simulation maximum emission wavelength ($\lambda_{max}^{sim}$), an actual maximum emission wavelength ($\lambda_{max}^{exp}$), and a ratio of presence of triplet metal-to-ligand charge transfer state ($^3$MLCT) (%) of Compounds 1, 11, 17, 40, 44, 57, and 72 were evaluated by utilizing the DFT method of the Gaussian program structure-optimized at the B3LYP/6-31G(d,p) level, and the results thereof are shown in Table 2.

TABLE 2

| Compound No. | HOMO (eV) | LUMO (eV) | $\lambda_{max}^{sim}$ (nm) | $\lambda_{max}^{exp}$ (nm) | $^3$MLCT (%) |
|---|---|---|---|---|---|
| 1 | −4.98 | −1.47 | 453 | 457 | 12.37 |
| 11 | −4.98 | −1.47 | 454 | 458 | 12.11 |
| 17 | −4.97 | −1.44 | 454 | 458 | 12.46 |
| 40 | −4.98 | −1.45 | 453 | 459 | 12.66 |
| 44 | −4.98 | −1.47 | 454 | 457 | 12.35 |
| 57 | −4.99 | −1.48 | 454 | 458 | 12.54 |
| 72 | −4.98 | −1.44 | 454 | 459 | 12.73 |

Example 1

As an anode, a glass substrate (product of Corning Inc.) with a 15 Ω/cm$^2$ (1,200 Å) ITO formed thereon was cut to a size of 50 mm×50 mm×0.7 mm, sonicated in isopropyl alcohol and pure water each for 5 minutes, cleaned by irradiation of ultraviolet rays and exposure of ozone thereto for 30 minutes, and then mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred as "NPB") was vacuum-deposited on the hole injection layer to form a hole transport layer having a thickness of 300 Å.

Compound 1 (organometallic compound represented by Formula 1), Compound ETH2 (second compound), and Compound HTH29 (third compound) were vacuum-deposited on the hole transport layer to form an emission layer having a thickness of 380 Å. Here, an amount of Compound 1 was 13 wt % based on the total weight (100 wt %) of the emission layer, and a weight ratio of Compound ETH2 to Compound HTH29 was adjusted to 3.5:6.5.

Compound ETH34 was vacuum-deposited on the emission layer to form a hole blocking layer having a thickness of 50 Å, and ET46 and LiQ were vacuum-deposited on the hole blocking layer at a weight ratio of 4:6 to form an electron transport layer having a thickness of 310 Å. Next, Yb was vacuum-deposited on the electron transport layer to form an electron injection layer having a thickness of 15 Å, and then Mg was vacuum-deposited thereon to form a cathode having a thickness of 800 Å, thereby completing manufacture of an organic light-emitting device.

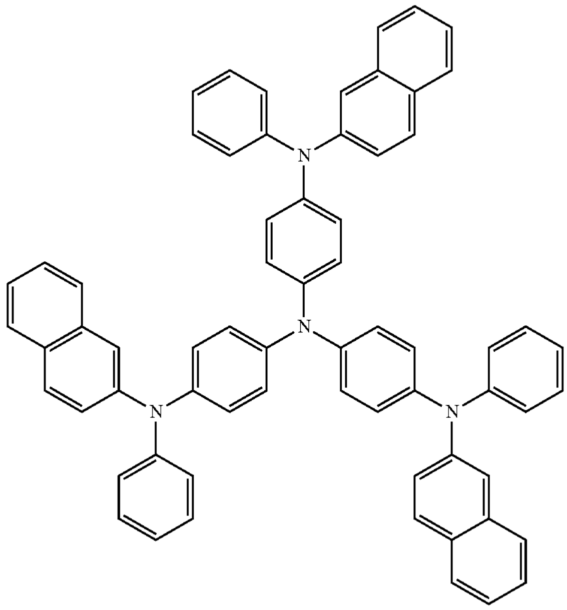

2-TNATA

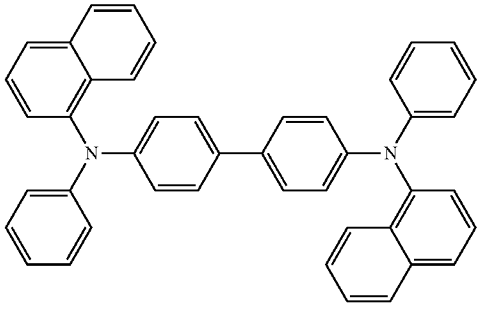

NPB

ETH2

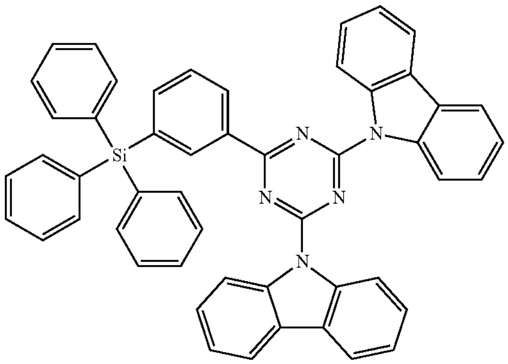

-continued

HTH29

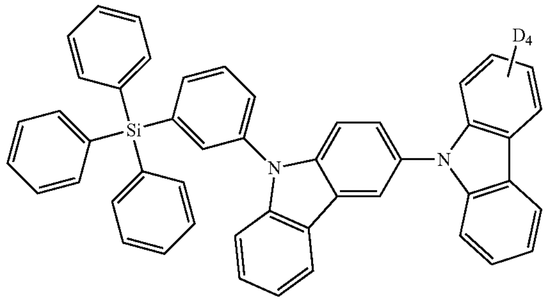

ETH34

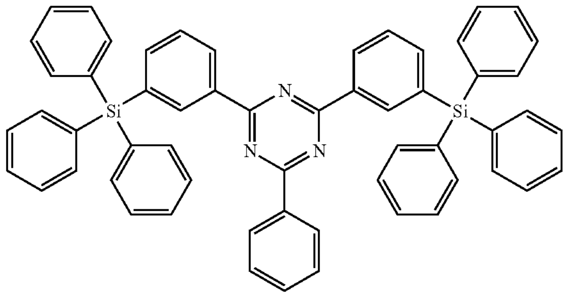

ET46

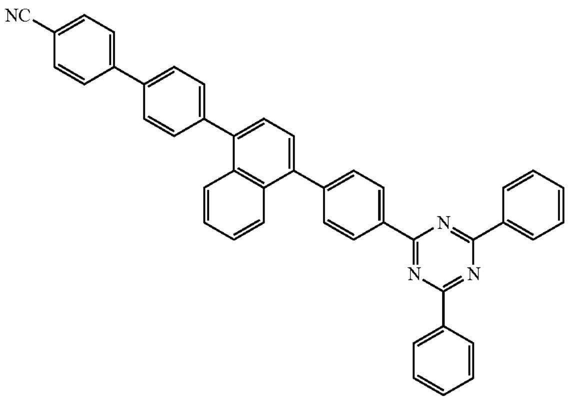

Examples 1 to 8 and Comparative Examples 1 to 4

Organic light-emitting devices were manufactured in substantially the same manner as in Example 1, except that, in forming the emission layer, the organometallic compound represented by Formula 1, the second compound, the third compound, and/or the fourth compounds were utilized and their respective amounts were changed as shown in Table 3. In Table 3, the weight in parentheses indicates a weight of a compound based on 100 wt % of the emission layer.

TABLE 3

| | Organo-metallic compound | Second compound | Third compound | Fourth compound | Weight ratio of Second compound to Third compound |
|---|---|---|---|---|---|
| Example 1 | 1 (13 wt %) | ETH2 | HTH29 | — | 3.5:6.5 |

TABLE 3-continued

| | Organo-metallic compound | Second compound | Third compound | Fourth compound | Weight ratio of Second compound to Third compound |
|---|---|---|---|---|---|
| Example 2 | 11 (13 wt %) | ETH2 | HTH29 | — | 3.5:6.5 |
| Example 3 | 17 (13 wt %) | ETH2 | HTH29 | — | 3.5:6.5 |
| Example 4 | 40 (13 wt %) | ETH2 | HTH29 | — | 3.5:6.5 |
| Example 5 | 44 (13 wt %) | ETH2 | HTH29 | — | 3.5:6.5 |
| Example 6 | 57 (13 wt %) | ETH2 | HTH29 | — | 3.5:6.5 |
| Example 7 | 72 (13 wt %) | ETH2 | HTH29 | — | 3.5:6.5 |
| Example 8 | 1 (13 wt %) | ETH2 | HTH29 | DFD1 (0.5 wt %) | 3.5:6.5 |
| Comparative Example 1 | CE1 (13 wt %) | ETH2 | HTH29 | — | 3.5:6.5 |
| Comparative Example 2 | CE2 (13 wt %) | ETH2 | HTH29 | — | 3.5:6.5 |
| Comparative Example 3 | CE3 (13 wt %) | ETH2 | HTH29 | — | 3.5:6.5 |
| Comparative Example 4 | CE3 (13 wt %) | ETH2 | HTH29 | DFD1 (0.5 wt %) | 3.5:6.5 |

1

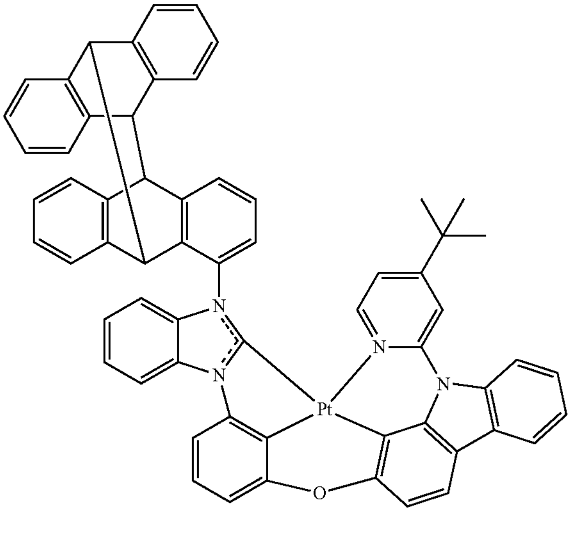

-continued

11

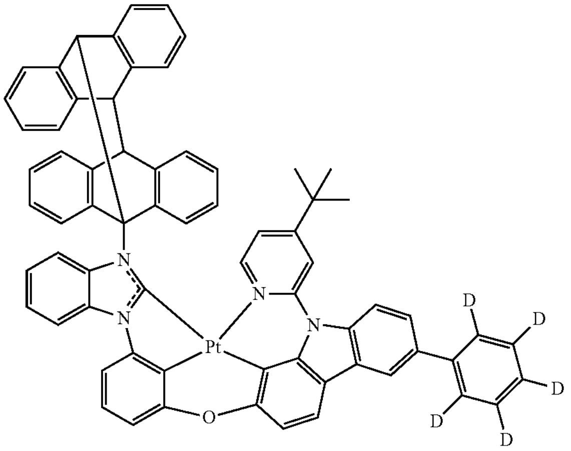

17

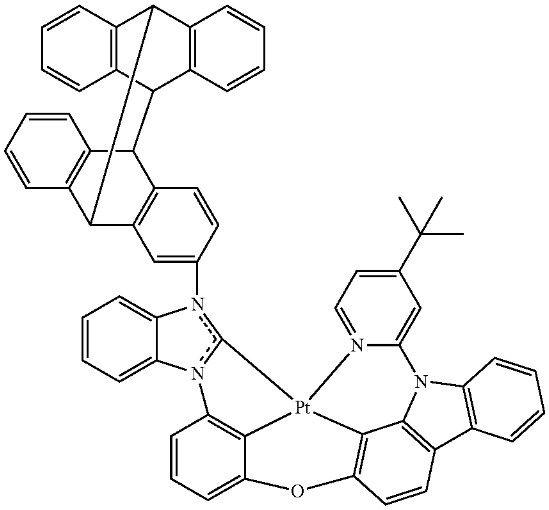

40

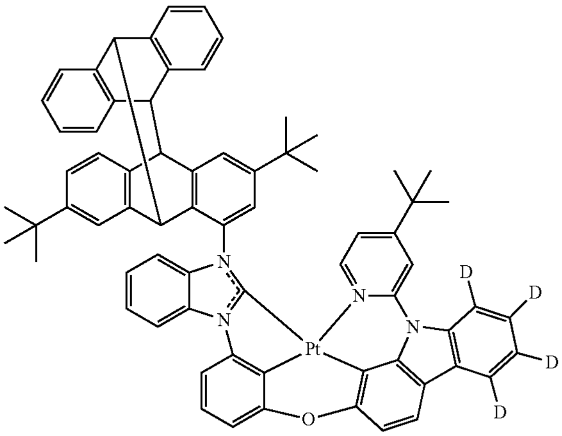

-continued
44
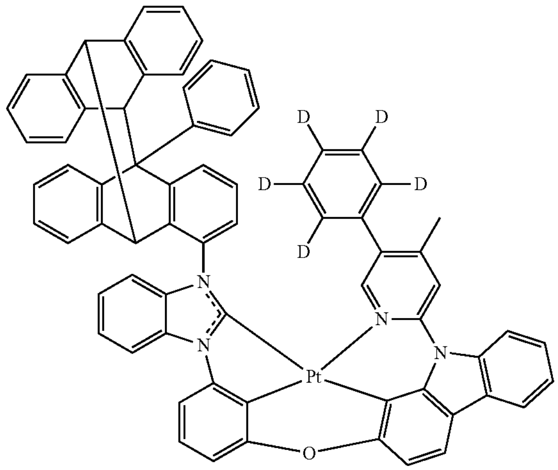
57
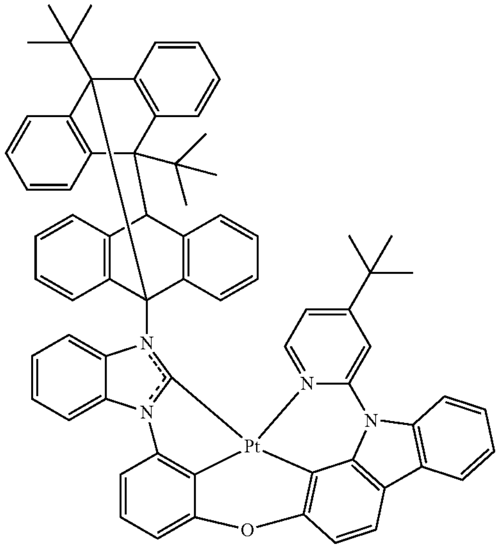
72
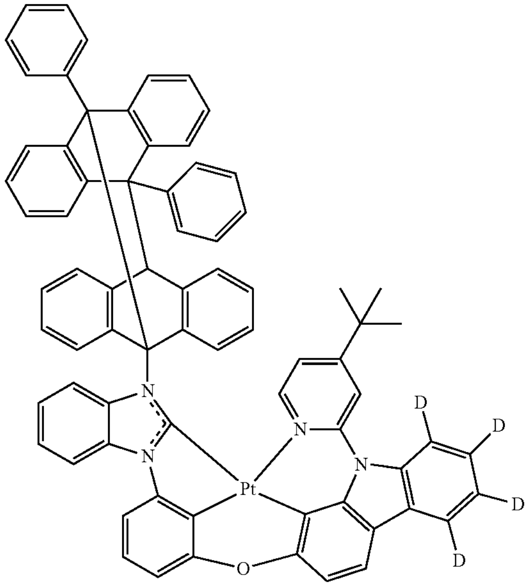
-continued
DFD1
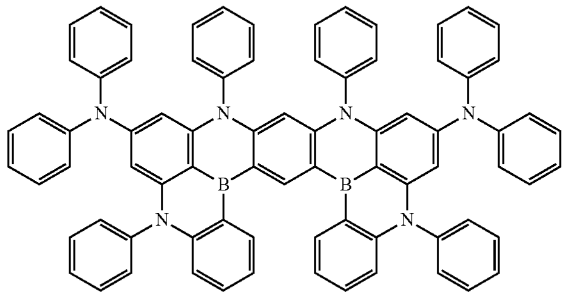
CE1
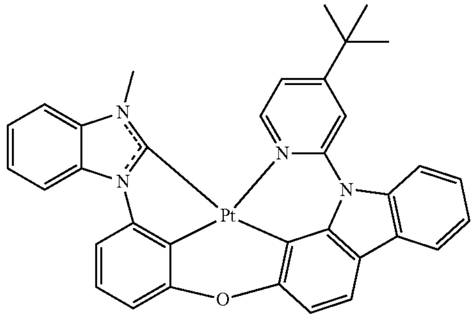
CE2
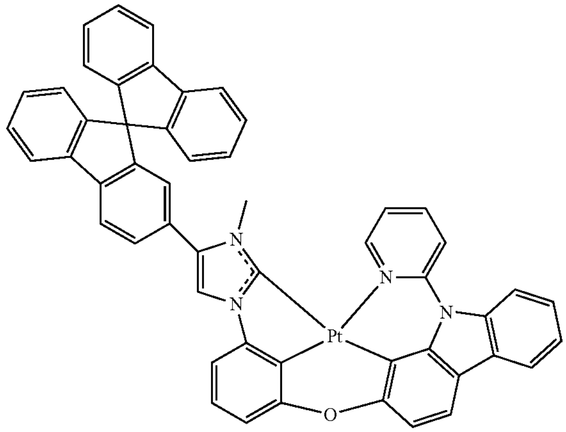
CE3
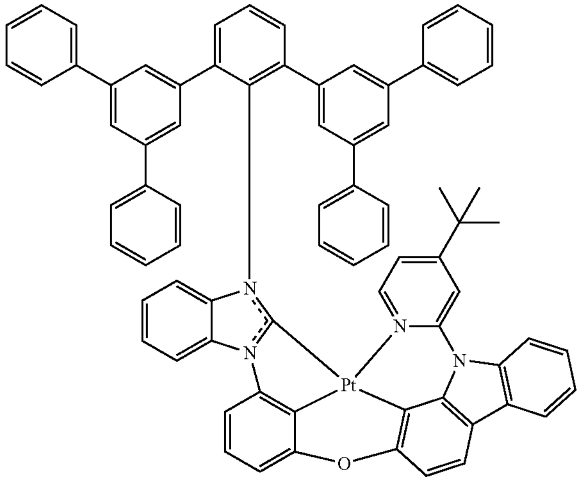

Evaluation Example 2

The driving voltage (V) at 1,000 cd/$m^2$, color purity (CIEx,y), luminescence efficiency (cd/A), color conversion efficiency (cd/A/y), maximum emission wavelength (nm), and device lifespan ($T_{95}$) of the organic light-emitting devices manufactured according to Examples 1 to 8 and Comparative Examples 1 to 4 were each measured by utilizing a Keithley SMU 236 and a luminance meter PR650, and results thereof are shown in Table 4. In Table 4, the device lifespan ($T_{95}$) indicates a time for the luminance to reach 95% of its initial luminance.

TABLE 4

| | Dopant compound | Luminance (cd/$m^2$) | Driving Voltage Voltage (V) | $CIE_{(x, y)}$ | Efficiency (cd/A) | Color conversion efficiency (cd/A/y) | Maximum emission wavelength (nm) | Lifespan of device ($T_{95}$, h) |
|---|---|---|---|---|---|---|---|---|
| Example 1 | 1 | 1000 | 4.7 | 0.136, 0.174 | 23.1 | 156.5 | 460 | 86 |
| Example 2 | 11 | 1000 | 4.7 | 0.136, 0.174 | 22.6 | 149.2 | 461 | 84 |
| Example 3 | 17 | 1000 | 4.7 | 0.137, 0.174 | 22.8 | 149.5 | 460 | 80 |
| Example 4 | 40 | 1000 | 4.6 | 0.136, 0.174 | 22.6 | 149.3 | 461 | 83 |
| Example 5 | 44 | 1000 | 4.7 | 0.137, 0.174 | 23.5 | 157.1 | 462 | 85 |
| Example 6 | 57 | 1000 | 4.7 | 0.133, 0.174 | 23.1 | 157.8 | 460 | 82 |
| Example 7 | 72 | 1000 | 4.7 | 0.137, 0.174 | 22.0 | 142.6 | 462 | 82 |
| Example 8 | 1 | 1000 | 4.6 | 0.133, 0.174 | 50.1 | 298.4 | 460 | 110 |
| Comparative Example 1 | CE1 | 1000 | 4.9 | 0.138, 0.213 | 10.1 | 80.2 | 464 | 24 |
| Comparative Example 2 | CE2 | 1000 | 5.0 | 0.141, 0.204 | 15.3 | 100.6 | 465 | 48 |
| Comparative Example 3 | CE3 | 1000 | 5.0 | 0.137, 0.184 | 17.7 | 105.8 | 465 | 55 |
| Comparative Example 4 | CE3 | 1000 | 5.0 | 0.136, 0.188 | 23.9 | 160.6 | 465 | 71 |

From Table 4, it was confirmed that the organic light-emitting devices according to Examples 1 to 8 had superior driving voltage, emission efficiency, color conversion efficiency, and lifespan characteristics as compared to those of the organic light-emitting devices according to Comparative Examples 1 to 4.

By utilizing the organometallic compound of the present disclosure, a light-emitting device having improved color purity and efficiency and reduced driving voltage and a high-quality electronic device including the light-emitting device may be manufactured.

In the present disclosure, singular expressions may include plural expressions unless the context clearly indicates otherwise. It will be further understood that the terms "comprise," "include," or "have" when utilized in the present disclosure, specify the presence of stated features, integers, steps, operations, elements, and/or components, but do not preclude the presence or addition of one or more other features, integers, steps, operations, elements, components, and/or groups thereof. The "/" utilized herein may be interpreted as "and" or as "or" depending on the situation.

Throughout the present disclosure, when a component such as a layer, a film, a region, or a plate is mentioned to be placed "on" another component, it will be understood that it may be directly on another component or that another component may be interposed therebetween. In some embodiments, "directly on" may refer to that there are no additional layers, films, regions, plates, etc., between a layer, a film, a region, a plate, etc. and the other part. For example, "directly on" may refer to two layers or two members are disposed without utilizing an additional member such as an adhesive member therebetween.

In the present disclosure, although the terms "first," "second," "third," "fourth," etc., may be utilized herein to describe one or more elements, components, regions, and/or layers, these elements, components, regions, and/or layers should not be limited by these terms. These terms are only utilized to distinguish one component from another component.

As utilized herein, the singular forms "a," "an," "one," and "the" are intended to include the plural forms as well, unless the context clearly indicates otherwise. Further, the use of "may" when describing embodiments of the present disclosure refers to "one or more embodiments of the present disclosure".

As utilized herein, the terms "substantially," "about," or similar terms are used as terms of approximation and not as terms of degree, and are intended to account for the inherent deviations in measured or calculated values that would be recognized by those of ordinary skill in the art. "About" as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The light-emitting device, the display device, the display apparatus, the electronic apparatus, the electronic device, or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A light-emitting device comprising:

a first electrode;

a second electrode facing the first electrode;

an interlayer located between the first electrode and the second electrode and comprising an emission layer; and an organometallic compound represented by Formula 1 as a first compound:

Formula 1

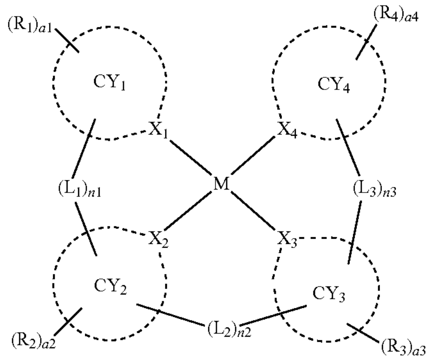

Formula 2-1

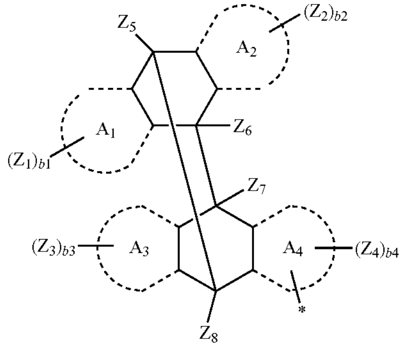

Formula 2-2

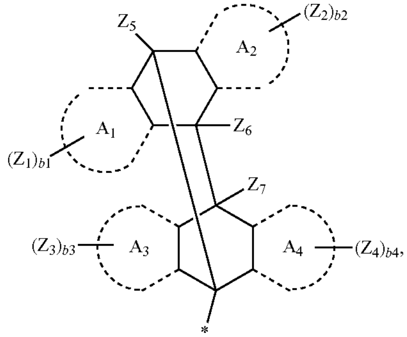

wherein, in Formula 1,

M is platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $X_1$ to $X_4$ are each independently C or N, ring $CY_1$ to ring $CY_4$ are each independently a $C_5$-$C_{30}$ carbocyclic group or a $C_1$-$C_{30}$ heterocyclic group, $L_1$ to $L_3$ are each independently a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—N($R_{1a}$)—*', *—O—*', *—P($R_{1a}$)—*', *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' each indicate a binding site to a neighboring atom, n1 to n3 are each independently an integer from 1 to 5, $R_1$ to $R_4$, $R_{1a}$, and $R_{1b}$ are each independently a group represented by Formula 2-1, a group represented by Formula 2-2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a1 to a4 are each independently an integer from 1 to 10, and at least one of $R_1$(s) in the number of a1, at least one of $R_2$(s) in the number of a2, at least one $R_3$(s) in the number of a3, at least one of $R_4$(s) in the number of a4, or any combination thereof is a group represented by Formula 2-1 or a group represented by Formula 2-2, and wherein in Formulae 2-1 and 2-2, ring $A_1$ to ring $A_4$ are each independently a $C_5$-$C_{30}$ carbocyclic group or a $C_1$-$C_{30}$ heterocyclic group, $Z_1$ to $Z_8$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_1$-$C_{60}$ aryloxy group unsubstituted or substituted with at least one $R_{10a}$, a $C_1$-$C_{60}$ arylthio group unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b1 to b4 are each independently an integer from 1 to 4,

* indicates a binding site to a neighboring atom, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The light-emitting device of claim 1, wherein the emission layer comprises a host and a dopant, and the dopant comprises the organometallic compound.

3. The light-emitting device of claim 1, further comprising a second compound comprising at least one π electron-deficient nitrogen-containing $C_1$-$C_{60}$ heterocyclic group, a third compound comprising a group represented by Formula 3, a fourth compound capable of emitting delayed fluorescence, or any combination thereof, wherein the organometallic compound, the second compound, the third compound, and the fourth compound are different from each other:

Formula 3

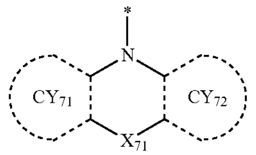

, and wherein, in Formula 3, ring $CY_{71}$ and ring $CY_{72}$ are each independently a π electron-rich $C_3$-$C_{60}$ cyclic group or a pyridine group, $X_{71}$ is a single bond or a linking group comprising O, S, N, B, C, Si, or any combination thereof, and

* indicates a binding site to an atom included in a part of the third compound excluding a part represented by Formula 3.

4. The light-emitting device of claim 3, wherein the second compound comprises a pyridine group, a pyrimidine group, a pyrazine group, a pyridazine group, a triazine group, or any combination thereof, and the fourth compound is a compound comprising at least one cyclic group comprising, as ring-forming atoms, each of boron (B) and nitrogen (N).

5. The light-emitting device of claim 3, wherein the emission layer comprises:

i) the organometallic compound; and ii) the second compound, the third compound, the fourth compound, or any combination thereof, and the emission layer is to emit blue light.

6. An electronic device comprising the light-emitting device of claim 1.

7. The electronic device of claim 6, further comprising a thin-film transistor, wherein the thin-film transistor comprises a source electrode and a drain electrode, and the first electrode of the light-emitting device is electrically connected to the source electrode or the drain electrode of the thin-film transistor.

8. The electronic device of claim 6, further comprising a color filter, a color conversion layer, a touch screen layer, a polarizing layer, or any combination thereof.

9. An electronic apparatus comprising the light-emitting device of claim 1.

10. The electronic apparatus of claim 9, wherein the electronic apparatus is at least one selected from a flat panel display, a curved display, a computer monitor, a medical monitor, a television, a billboard, an indoor or outdoor light and/or light for signal, a head-up display, a fully or partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality or augmented reality display, a vehicle, a video wall with multiple displays tiled together, a theater or stadium screen, a phototherapy device, and a signboard.

11. An organometallic compound represented by Formula 1:

Formula 1

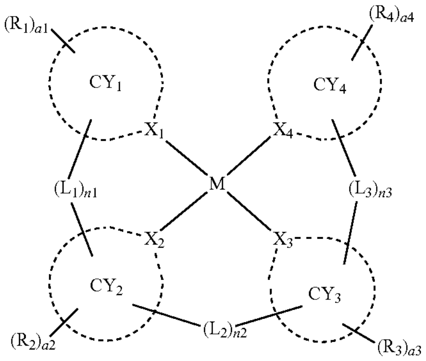

Formula 2-1

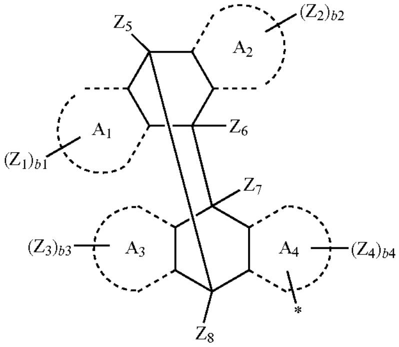

Formula 2-2

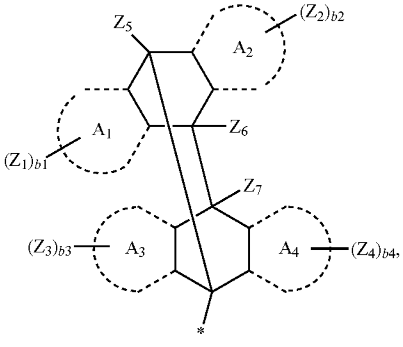

wherein, in Formula 1,

M is platinum (Pt), palladium (Pd), copper (Cu), silver (Ag), gold (Au), rhodium (Rh), ruthenium (Ru), osmium (Os), titanium (Ti), zirconium (Zr), hafnium (Hf), europium (Eu), terbium (Tb), or thulium (Tm), $X_1$ to $X_4$ are each independently C or N, ring $CY_1$ to ring $CY_4$ are each independently a $C_5$-$C_{30}$ carbocyclic group or a $C_1$-$C_{30}$ heterocyclic group, $L_1$ to $L_3$ are each independently a single bond, *—C($R_{1a}$)($R_{1b}$)—*', *—C($R_{1a}$)=*', *=C($R_{1a}$)—*', *—C($R_{1a}$)=C($R_{1b}$)—*', *—C(=O)—*', *—C(=S)—*', *—C≡C—*', *—B($R_{1a}$)—*', *—N($R_{1a}$)—*', *—O—*', *—P($R_{1a}$)—*', *—Si($R_{1a}$)($R_{1b}$)—*', *—P(=O)($R_{1a}$)—*', *—S—*', *—S(=O)—*', *—S(=O)$_2$—*', or *—Ge($R_{1a}$)($R_{1b}$)—*', and * and *' each indicate a binding site to a neighboring atom, n1 to n3 are each independently an integer from 1 to 5, $R_1$ to $R_4$, $R_{1a}$, and $R_{1b}$ are each independently a group represented by Formula 2-1, a group represented by Formula 2-2, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a1 to a4 are each independently an integer from 1 to 10, and at least one of $R_1$(s) in the number of a1, at least one of $R_2$(s) in the number of a2, at least one $R_3$(s) in the number of a3, at least one of $R_4$(s) in the number of a4, or any combination thereof is the group represented by Formula 2-1 or the group represented by Formula 2-2, and wherein in Formulae 2-1 and 2-2, ring $A_1$ to ring $A_4$ are each independently a $C_5$-$C_{30}$ carbocyclic group or a $C_1$-$C_{30}$ heterocyclic group, $Z_1$ to $Z_8$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b1 to b4 are each independently an integer from 1 to 4,

* indicates a binding site to a neighboring atom, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_1$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_1$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_1$-$C_{60}$ aryloxy group, a $C_1$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen;

deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

12. The organometallic compound of claim 11, wherein $X_1$ is C, and a bond between $X_1$ and M is a coordinate bond.

13. The organometallic compound of claim 11, wherein $X_1$ is C, and ring CY1 is an imidazole group, a triazole group, a benzimidazole group, a naphthoimidazole group, or an imidazopyridine group.

14. The organometallic compound of claim 11, wherein $R_1$ to $R_4$, $R_{1a}$, and $R_{1b}$ are each independently:

the group represented by Formula 2-1 or the group represented by Formula 2-2;

hydrogen, deuterium, —F, —Cl, —Br, —I, or a $C_1$-$C_{20}$ alkyl group;

a $C_1$-$C_{20}$ alkyl group unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof; or a phenyl group, a biphenyl group, a terphenyl group, a ($C_1$-$C_{10}$ alkyl)phenyl group, or a naphthyl group, each unsubstituted or substituted with deuterium, —F, —Cl, —Br, —I, —$CD_3$, —$CD_2H$, —$CDH_2$, —$CF_3$, —$CF_2H$, —$CFH_2$, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, a ($C_1$-$C_{10}$ alkyl)phenyl group, or any combination thereof.

15. The organometallic compound of claim 11, wherein, in Formula 1, at least one of $R_1$(s) in the number of a1 is the group represented by Formula 2-1 or the group represented by Formula 2-2.

16. The organometallic compound of claim 11, wherein ring $A_1$ to ring $A_4$ are each independently a benzene group, a naphthalene group, or a pyridine group.

17. The organometallic compound of claim 11, wherein, in Formula 1, a group represented by

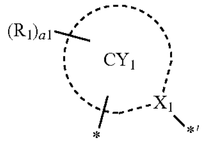

is a group represented by one selected from Formulae CY1(1) to CY1(5):

CY1(1)

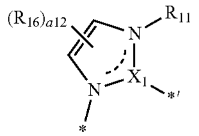

CY1(2)

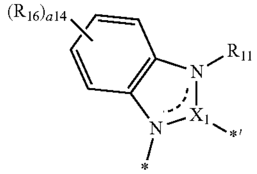

CY1(3)

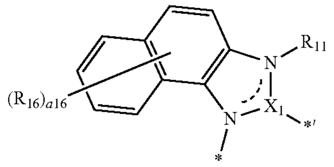

CY1(4)

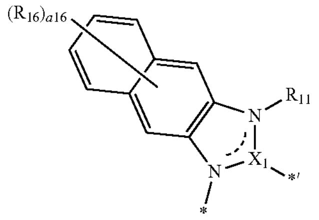

CY1(5)

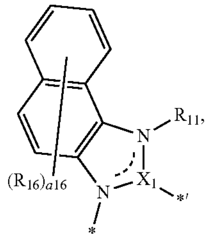

wherein, in Formulae CY1(1) to CY1(5), $X_1$ is the same as described with respect to $X_1$ in Formula 1, $R_{11}$ and $R_{16}$ are each the same as described with respect to $R_1$ in Formula 1, a12 is an integer from 1 to 2, a14 is an integer from 1 to 4, a16 is an integer from 1 to 6,

* indicates a binding site to $L_1$ in Formula 1, and

** indicates a binding site to M in Formula 1.

18. The organometallic compound of claim 17, wherein, in Formulae CY1(1) to CY1(5), $R_{11}$ is the group represented by Formula 2-1 or the group represented by Formula 2-2.

19. The organometallic compound of claim 11, wherein the group represented by Formula 2-1 is a group represented by one selected from Formulae 2-1(1) to 2-1(12), and the group represented by Formula 2-2 is a group represented by one selected from Formulae 2-2(1) to 2-2(6):

2-1(1)

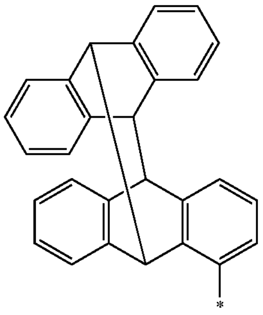

2-1(2)

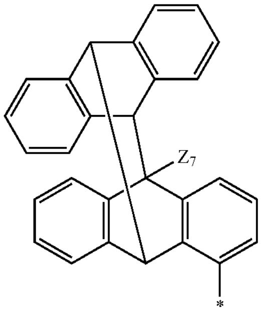

2-1(3)

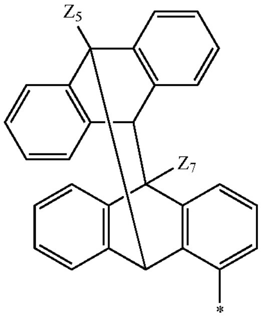

-continued 2-1(4)

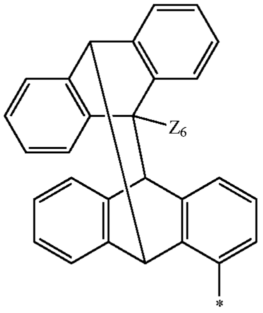

2-1(5)

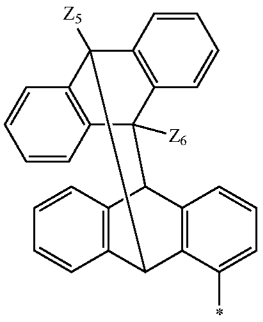

2-1(6)

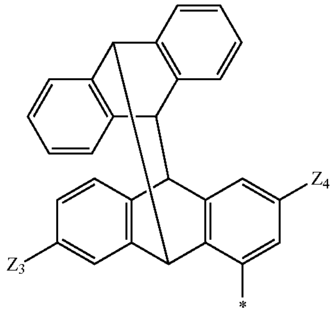

2-1(7)

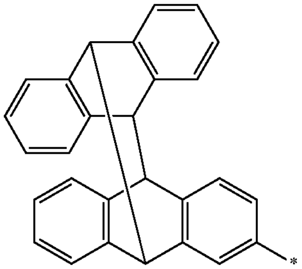

2-1(8)

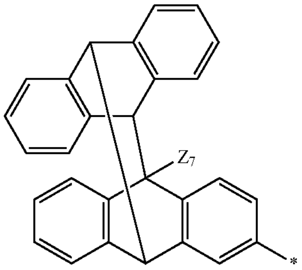

-continued
2-1(9)
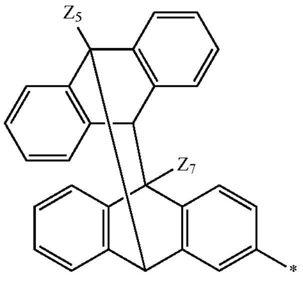
2-1(10)
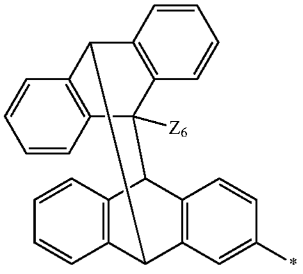
2-1(11)
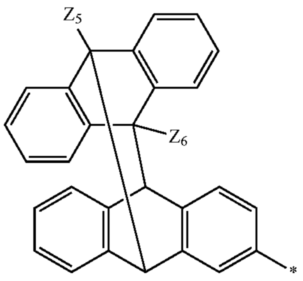
2-1(12)
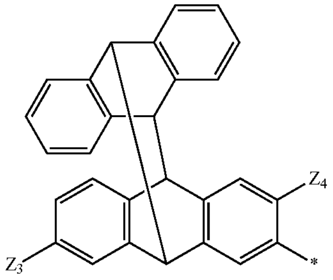
2-2(1)
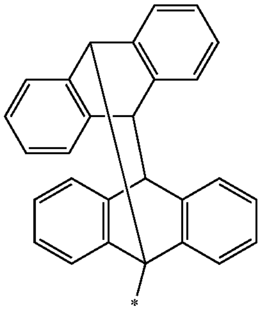
-continued
2-2(2)
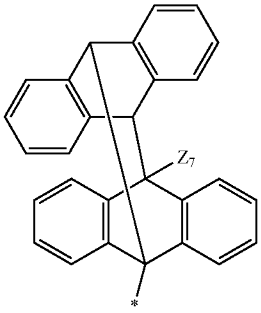
2-2(3)
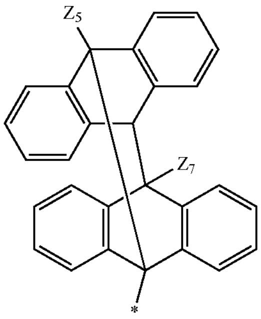
2-2(4)
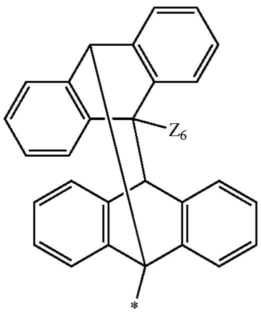
2-2(5)
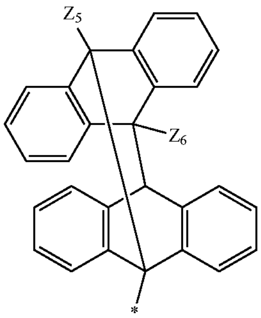
2-2(6)
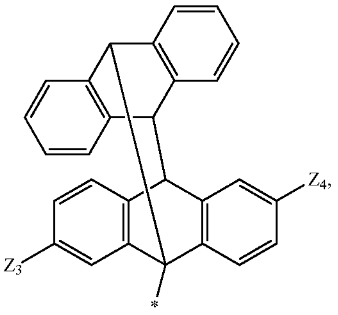
wherein, in Formulae 2-1(1) to 2-1(12) and 2-2(1) to 2-2(6), $Z_3$ to $Z_7$ are each the same as described with respect to $Z_3$ to $Z_7$ in Formula 2-1 and Formula 2-2, respectively, and $Z_3$ to $Z_7$ are each not hydrogen, and

* indicates a binding site to a neighboring atom in Formula 1.

20. The organometallic compound of claim 11, wherein the organometallic compound represented by Formula 1 is an organometallic compound represented by Formula 1-1:

Formula 1-1

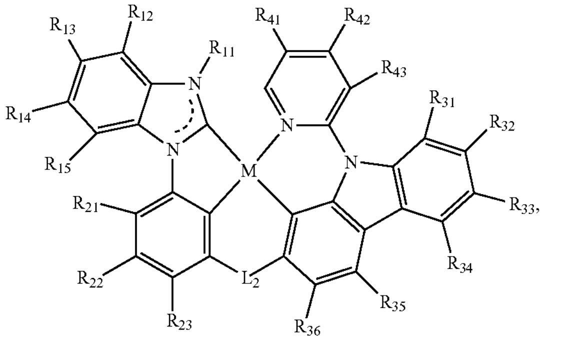

and wherein, in Formula 1-1,

M and $L_2$ are each respectively the same as described with respect to M and $L_2$ in Formula 1, $R_{11}$ to $R_{15}$ are each the same as described with respect to $R_1$ in Formula 1, $R_{21}$ to $R_{23}$ are each the same as described with respect to $R_2$ in Formula 1, $R_{31}$ to $R_{36}$ are each the same as described with respect to $R_3$ in Formula 1, $R_{41}$ to $R_{44}$ are each the same as described with respect to $R_4$ in Formula 1, and at least one selected from among $R_{11}$ to $R_{15}$, at least one selected from among $R_{21}$ to $R_{23}$, at least one selected from among $R_{31}$ to $R_{36}$, at least one selected from among $R_{41}$ to $R_{44}$, or any combination thereof is the group represented by Formula 2-1 or the group represented by Formula 2-2.

* * * * *